US012604650B2

(12) United States Patent
Yamazaki et al.

(10) Patent No.: US 12,604,650 B2
(45) Date of Patent: Apr. 14, 2026

(54) METHOD FOR MANUFACTURING LIGHT-EMITTING ELEMENT AND LIGHT-EMITTING DEVICE USING PHOTOLITHOGRAPHY TECHNIQUE

(71) Applicant: Semiconductor Energy Laboratory Co., Ltd., Atsugi (JP)

(72) Inventors: Shunpei Yamazaki, Setagaya (JP); Sachiko Kawakami, Atsugi (JP); Nobuharu Ohsawa, Zama (JP); Yuji Iwaki, Isehara (JP); Ryota Hodo, Atsugi (JP); Kentaro Sugaya, Atsugi (JP); Shinya Sasagawa, Chigasaki (JP); Takahiro Fujie, Isehara (JP); Yoshikazu Hiura, Atsugi (JP); Toshiki Sasaki, Kawasaki (JP); Takeyoshi Watabe, Atsugi (JP); Kunihiko Suzuki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 664 days.

(21) Appl. No.: 18/079,994

(22) Filed: Dec. 13, 2022

(65) Prior Publication Data

US 2023/0200198 A1 Jun. 22, 2023

(30) Foreign Application Priority Data

Dec. 20, 2021 (JP) ................................ 2021-206530
Dec. 20, 2021 (JP) ................................ 2021-206533

(51) Int. Cl.
*H10K 71/00* (2023.01)
*H10K 50/17* (2023.01)
*H10K 85/60* (2023.01)

(52) U.S. Cl.
CPC ......... *H10K 71/00* (2023.02); *H10K 85/6572* (2023.02); *H10K 50/171* (2023.02)

(58) Field of Classification Search
CPC ........ H10K 71/00; H10K 50/15; H10K 50/17; H10K 50/11; H10K 2101/40;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Caleb E Henry
(74) *Attorney, Agent, or Firm* — Eric J. Robinson; Robinson Intellectual Property Law Office, P.C.

(57) ABSTRACT

To provide a light-emitting element in which an organic compound layer can be processed at once by a photolithography technique. A first electrode and an organic compound layer including an electron-injection layer are formed over an insulating surface. The electron-injection layer is the outermost layer of the organic compound layer and contains an organic compound having a basic skeleton and an acid dissociation constant pKa of greater than or equal to 1. A sacrificial layer and a mask are formed over the electron-injection layer and the sacrificial layer is processed into an
(Continued)

island shape using the mask. With use of the island-shaped sacrificial layer as a mask, the organic compound layer is processed into an island shape to cover the first electrode. Part of the island-shaped sacrificial layer is removed with an acidic chemical solution to expose the electron-injection layer. A second electrode is formed to cover the electron-injection layer.

13 Claims, 40 Drawing Sheets

(58) Field of Classification Search
CPC ........... H10K 2101/00; H10K 85/6572; H10K 50/171; H10K 59/1201; H10K 71/231; H01L 51/56; H01L 2251/55; H01L 51/5088; H01L 51/5056
See application file for complete search history.

(56) References Cited

U.S. PATENT DOCUMENTS

| | | | | |
|---|---|---|---|---|
| 7,164,151 | B2 * | 1/2007 | Yamazaki | H10K 50/15 257/E27.111 |
| 9,054,315 | B2 * | 6/2015 | Otsuka | H10K 71/233 |
| 2002/0072139 | A1 | 6/2002 | Kashiwabara | |
| 2004/0056590 | A1 * | 3/2004 | Lim | H10K 50/852 313/506 |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0056719 | A1 * | 3/2013 | Komatsu | H10K 50/17 438/34 |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0126840 | A1 * | 5/2013 | Fujimura | H05B 33/22 438/46 |
| 2013/0126842 | A1 * | 5/2013 | Takeuchi | H10K 50/17 438/30 |
| 2013/0134474 | A1 * | 5/2013 | Takeuchi | H10H 20/833 438/22 |
| 2013/0210176 | A1 * | 8/2013 | Fushimi | H10K 71/221 438/26 |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0197394 | A1 * | 7/2014 | Otsuka | H10K 59/35 438/46 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2015/0364716 | A1 * | 12/2015 | Shiobara | H10K 59/8051 345/204 |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2017/0309833 | A1 * | 10/2017 | Lei | H10K 50/17 |
| 2018/0190908 | A1 | 7/2018 | Ke et al. | |
| 2018/0226024 | A1 * | 8/2018 | Tang | H10K 50/814 |
| 2018/0269421 | A1 * | 9/2018 | Pan | H10K 50/818 |
| 2019/0081116 | A1 * | 3/2019 | Kondo | H10K 59/35 |
| 2019/0081239 | A1 * | 3/2019 | Fukagawa | H10K 50/81 |
| 2019/0267438 | A1 * | 8/2019 | Goto | H10K 71/00 |
| 2020/0013977 | A1 * | 1/2020 | Wang | H10H 29/10 |
| 2020/0161594 | A1 * | 5/2020 | Kondo | H10K 71/135 |
| 2020/0203662 | A1 | 6/2020 | Mollard et al. | |
| 2020/0279897 | A1 * | 9/2020 | Nendai | H10K 59/131 |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |
| JP | 2021-166280 | A | 10/2021 |
| WO | WO-2021/045020 | | 3/2021 |
| WO | WO-2022/106949 | | 5/2022 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 7A1
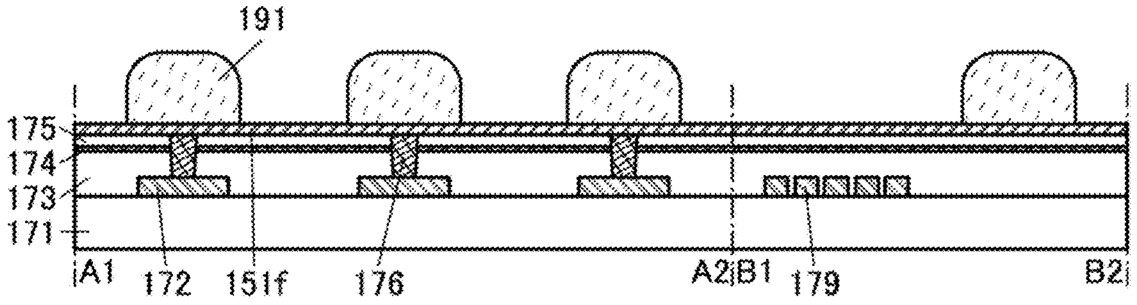
FIG. 7A2
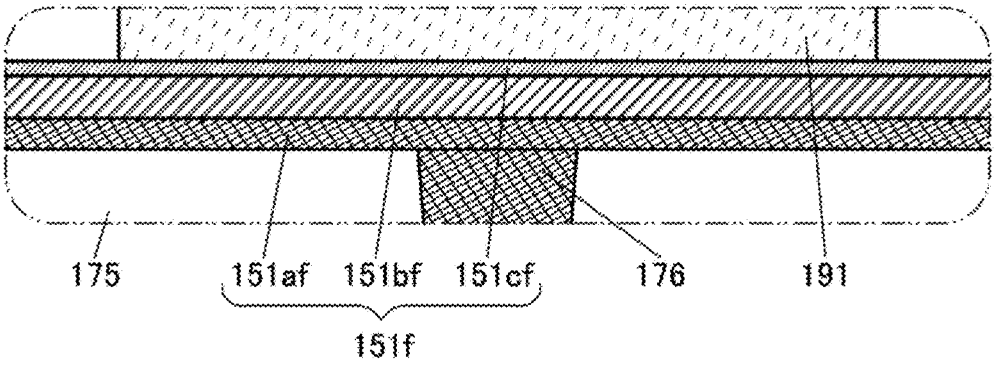
FIG. 7B1
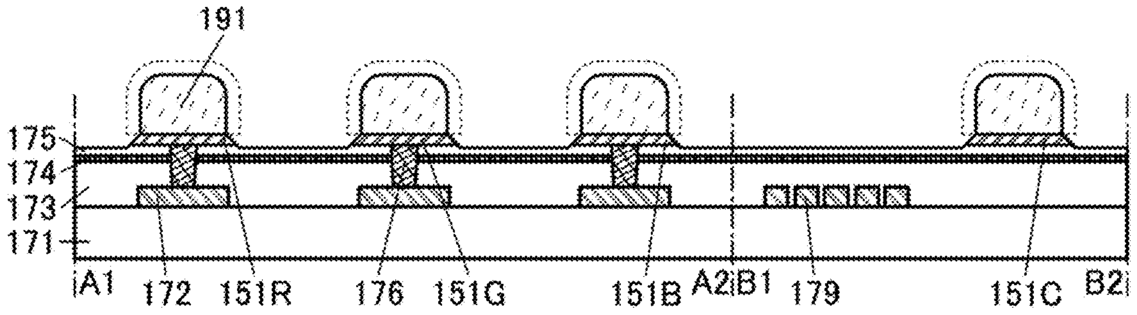
FIG. 7B2
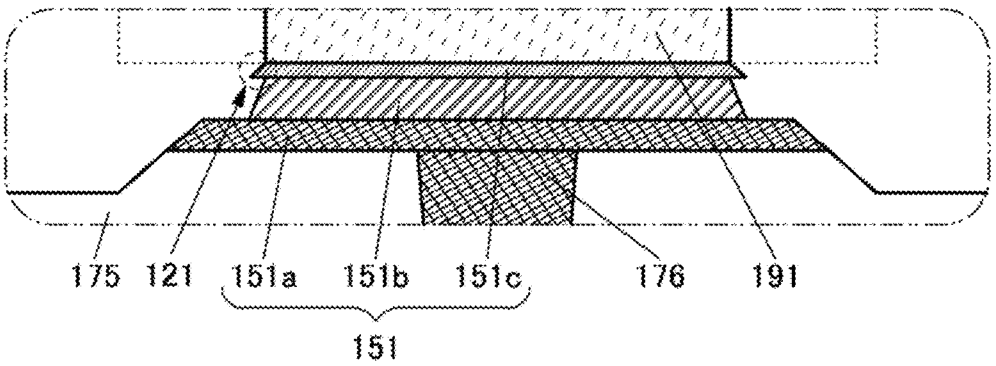

FIG. 8A
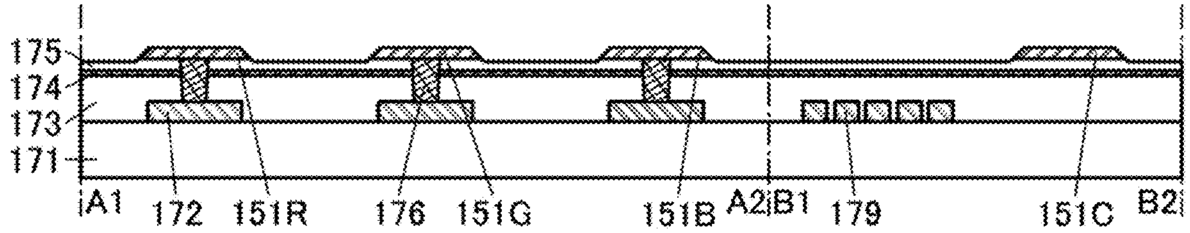
FIG. 8B
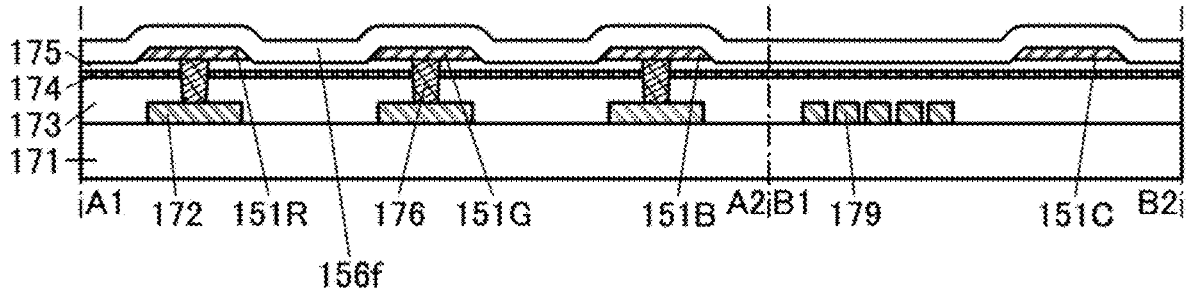
FIG. 8C1
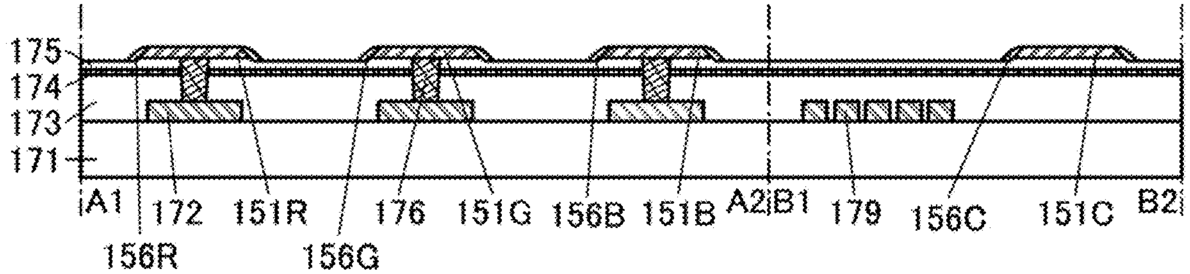
FIG. 8C2
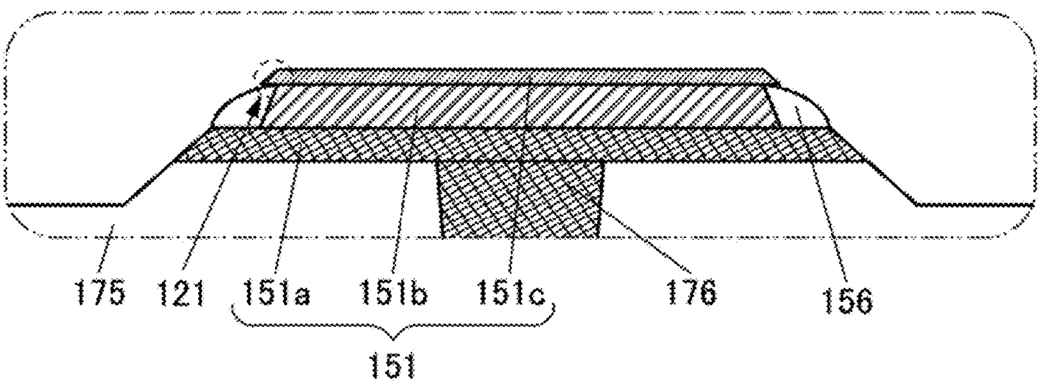

FIG. 9A
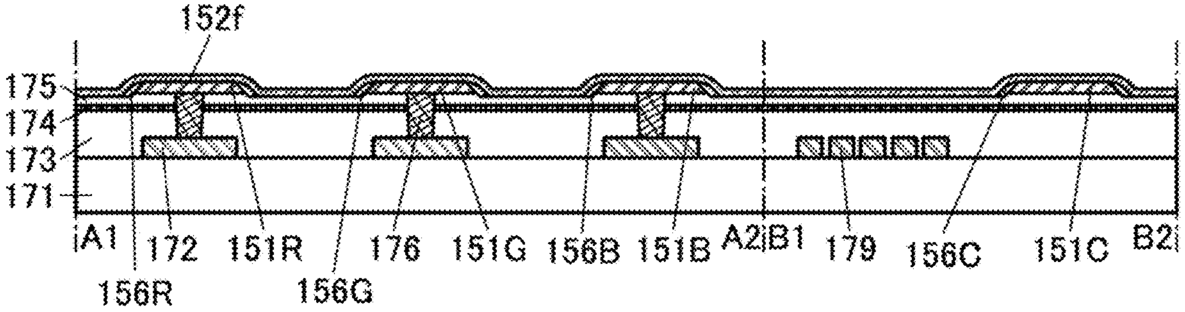
FIG. 9B1
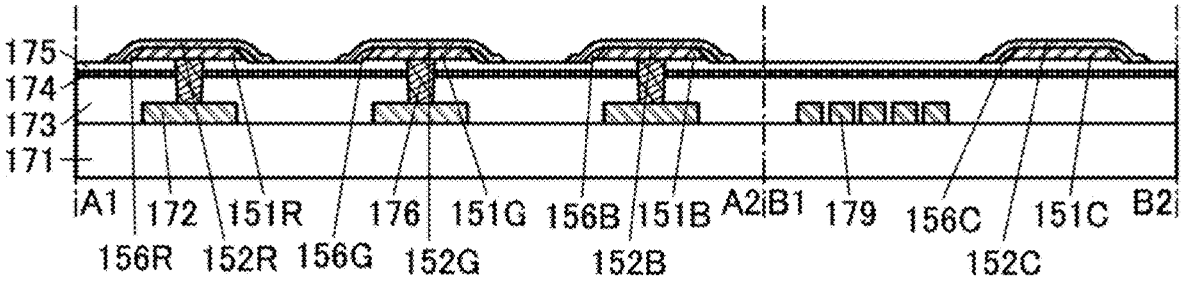
FIG. 9B2
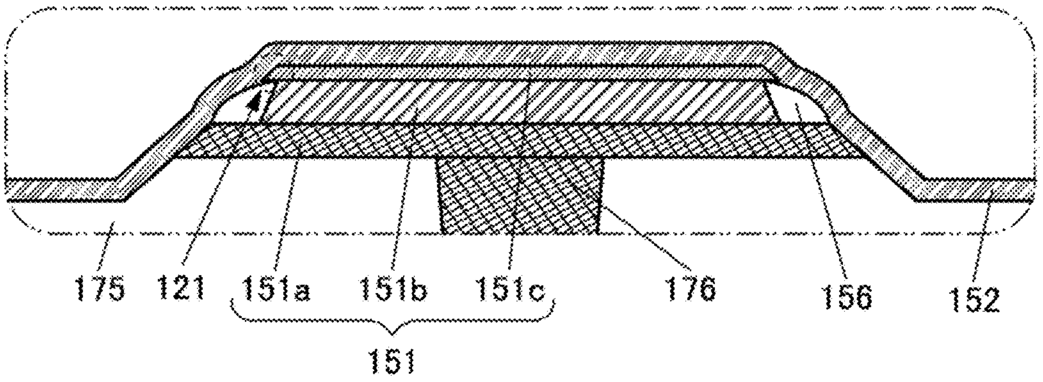

FIG. 10A1
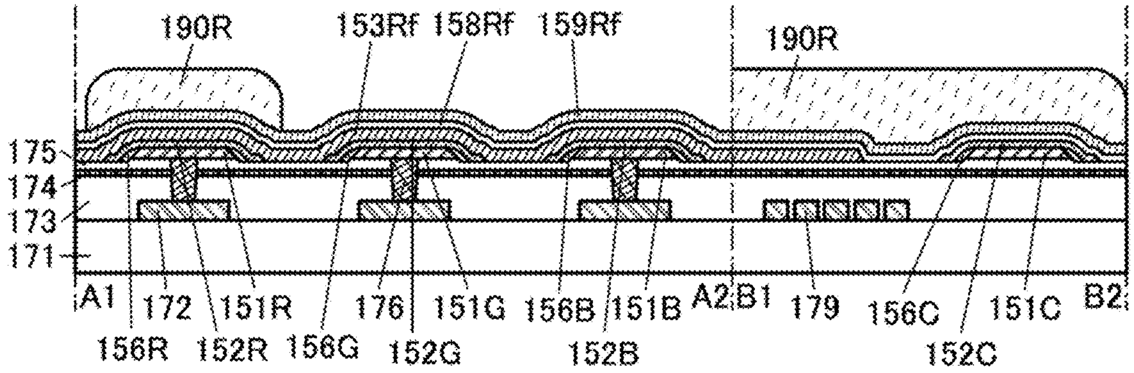
FIG. 10A2
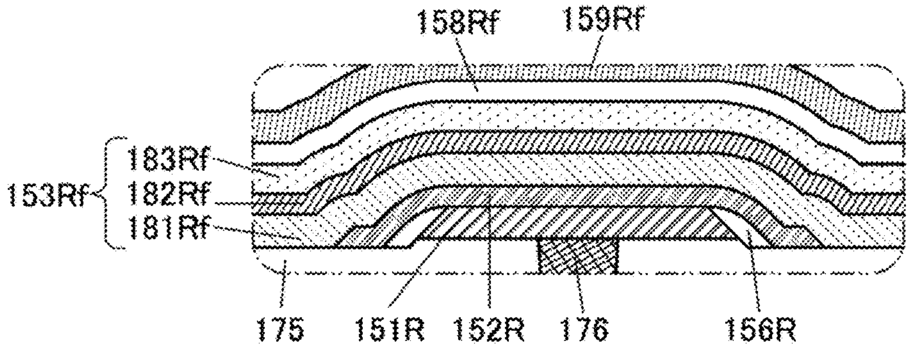
FIG. 10B1
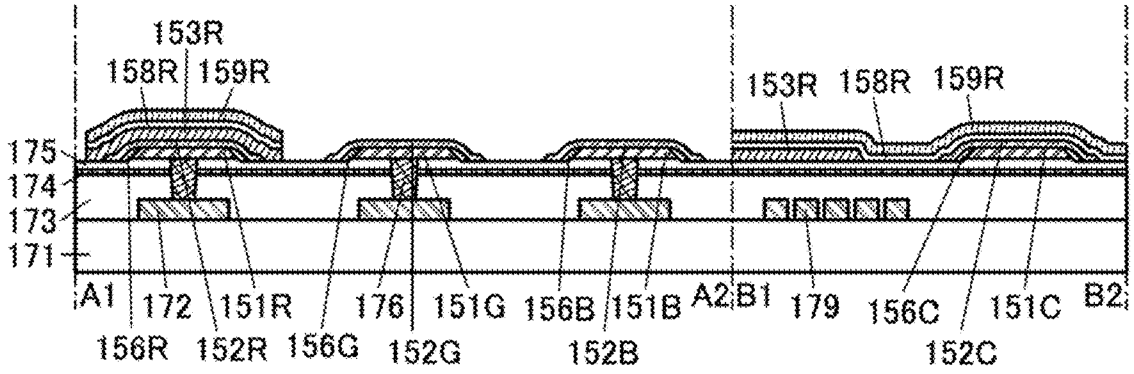
FIG. 10B2
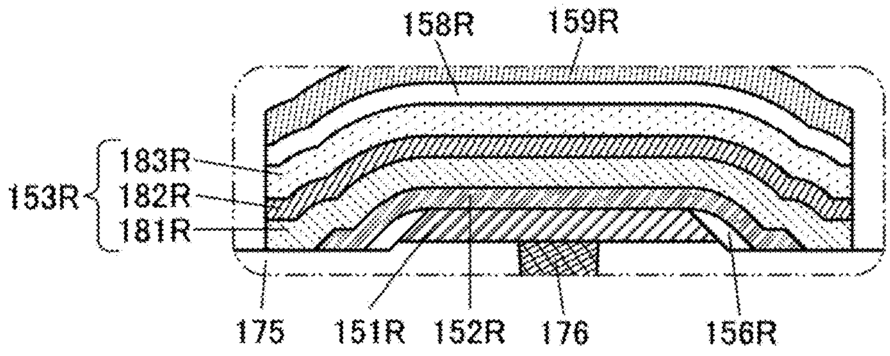

9171

9172

9173

9200

9201

9201

9201

Acidic chemical solution, incident light

Acidic chemical solution, Subpixel 1110R

Acidic chemical solution, Subpixel 1110G

Acidic chemical solution, Subpixel 1110B

Alkaline chemical solution, incident light

Alkaline chemical solution, Subpixel 1110R

Alkaline chemical solution, Subpixel 1110G

Alkaline chemical solution, Subpixel 1110B

METHOD FOR MANUFACTURING LIGHT-EMITTING ELEMENT AND LIGHT-EMITTING DEVICE USING PHOTOLITHOGRAPHY TECHNIQUE

BACKGROUND OF THE INVENTION

1. Field of the Invention

One embodiment of the present invention relates to a light-emitting element, a light-emitting apparatus, and a method for manufacturing the light-emitting element. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting elements (also referred to as light-emitting devices) including organic compounds and utilizing electroluminescence (EL) have been put to practical use. In the basic structure of such organic EL devices, an organic compound layer containing a light-emitting material (also referred to as an EL layer) is interposed between a pair of electrodes. Carriers are injected by application of voltage to the device, and recombination energy of the carriers is used, whereby light emission can be obtained from the light-emitting material.

Such light-emitting devices are of self-luminous type and thus have advantages over liquid crystal displays, such as high visibility and no need for backlight when used as pixels of a display, and are particularly suitable for flat panel displays. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be used for lighting devices and the like.

Light-emitting apparatuses including light-emitting devices can be used suitably for a variety of electronic devices as described above, and research and development of light-emitting devices have progressed for more favorable characteristics.

In order to obtain a higher-resolution light-emitting apparatus using an organic EL device, patterning an organic layer by a photolithography technique using a photoresist or the like, instead of an evaporation method using a metal mask, has been studied. By using the photolithography technique, a high-resolution light-emitting apparatus in which the distance between organic compound layers is several micrometers can be obtained (see Patent Document 1, for example).

REFERENCE

Patent Document

[Patent Document 1] Japanese Translation of PCT International Application No. 2018-521459

SUMMARY OF THE INVENTION

An object of one embodiment of the present invention is to provide a light-emitting element that enables manufacture of a high-resolution display device with favorable characteristics. An object of another embodiment of the present invention is to provide a high-resolution display device with favorable display quality. An object of another embodiment of the present invention is to provide a high-resolution display device with favorable yield. An object of another embodiment of the present invention is to provide an inexpensive high-resolution display device.

An embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound having a basic skeleton and an acid dissociation constant pKa of greater than or equal to 1; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound having a basic skeleton with an acid dissociation constant pKa of greater than 10; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound having a basic skeleton with an acid dissociation constant pKa of greater than 13; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound having a basic skeleton with an acid dissociation constant pKa of greater than 14; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound including a bicyclo ring structure having 2 or more nitrogen atoms in the bicyclo ring and a heteroaromatic ring having 2 to 30 carbon atoms in the ring or an aromatic hydrocarbon ring having 6 to 30 carbon atoms in the ring; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound having a 1,3,4,6,7,8-hexahydro-2H-pyrimido[1,2-a]pyridine skeleton and a heteroaromatic ring having 2 to 30 carbon atoms in the ring or an aromatic hydrocarbon ring having 6 to 30 carbon atoms in the ring; all layers included in the organic compound layer have substantially the same contour; and the organic compound layer is separated from organic compound layers of the other light-emitting elements of the plurality of light-emitting elements.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound represented by General Formula (G1) below; all layers included in the organic compound layer have substantially the same contour; and the organic compound layer is separated from organic compound layers of the other light-emitting elements of the plurality of light-emitting elements.

[Chemical Formula 1]

(G1)

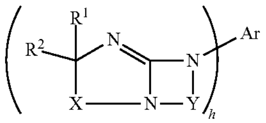

In the organic compound represented by General Formula (G1) above, X represents a group represented by General Formula (G1-1) below, and Y represents a group represented by General Formula (G1-2) below. $R^1$ and $R^2$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

[Chemical Formula 2]

(G1-1)

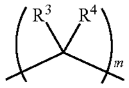

(G1-2)

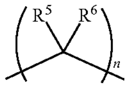

In General Formulae (G1-1) and (G1-2) above, $R^3$ to $R^6$ each independently represent hydrogen or deuterium, m represents an integer of 0 to 4, n represents an integer of 1 to 5, and m+1 n is satisfied. In the case where m or n is 2 or more, $R^3$s may be the same or different from each other, and the same applies to $R^4$, $R^5$, and $R^6$.

Another embodiment of the present invention is a light-emitting element which is one of a plurality of light-emitting elements formed over an insulating surface and includes a first electrode, a second electrode, and an organic compound layer; the organic compound layer is positioned between the first electrode and the second electrode; the organic compound layer includes a light-emitting layer and an electron-injection layer; the electron-injection layer is in contact with the second electrode; the electron-injection layer includes an organic compound represented by any one of General Formulae (G2-1) to (G2-6) below; all layers included in the organic compound layer have substantially the same contour; and the organic compound layer is separated from organic compound layers of the other light-emitting elements of the plurality of light-emitting elements.

[Chemical Formula 3]

(G2-1)

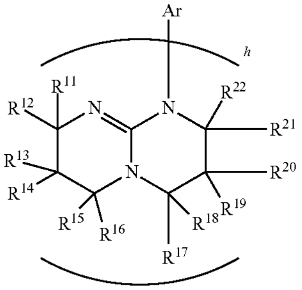

(G2-2)

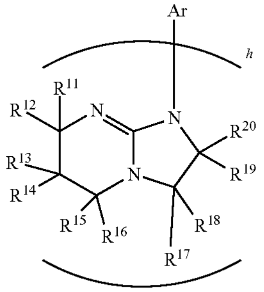

(G2-3)

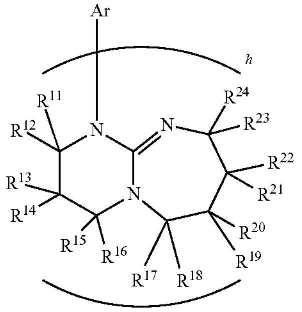

(G2-4)

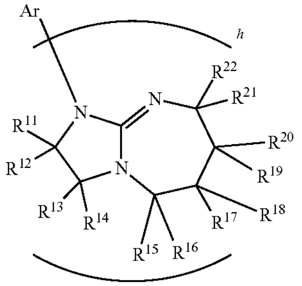

(G2-5)

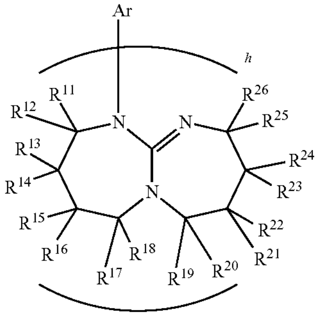

-continued (G2-6)

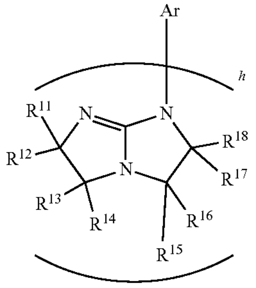

$R^{11}$ to $R^{26}$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

Another embodiment of the present invention is the light-emitting element where, in the above-described structure, the substituted or unsubstituted heteroaromatic ring having 2 to 30 carbon atoms in the ring or the substituted or unsubstituted aromatic hydrocarbon ring having 6 to 30 carbon atoms in the ring that is represented by Ar is represented by any one of Structural Formulae (Ar-1) to (Ar-27) below.

[Chemical Formula 4]

(Ar-1)

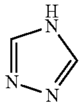

(Ar-2)

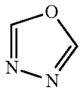

(Ar-3)

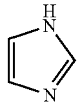

(Ar-4)

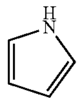

(Ar-5)

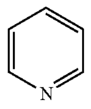

(Ar-6)

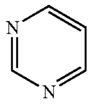

(Ar-7)

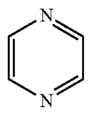

-continued
(Ar-8)
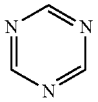
(Ar-9)
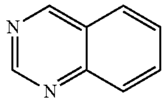
(Ar-10)
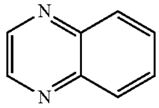
(Ar-11)
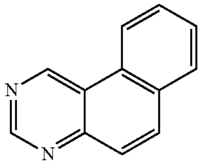
(Ar-12)
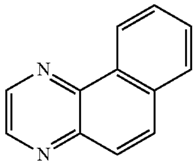
(Ar-13)
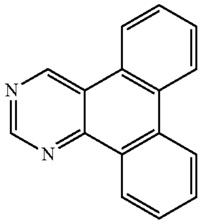
(Ar-14)
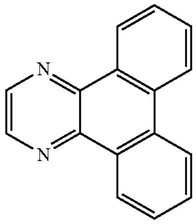
(Ar-15)
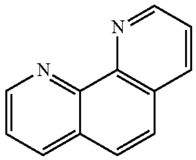
(Ar-16)
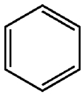
(Ar-17)
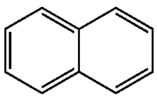
-continued
(Ar-18)
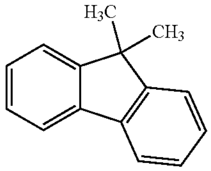
(Ar-19)
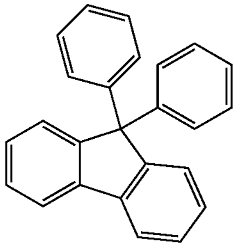
(Ar-20)
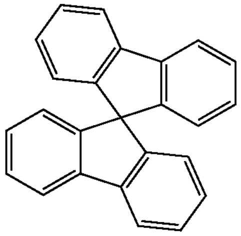
(Ar-21)
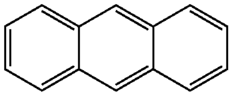
(Ar-22)
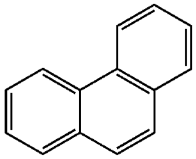
(Ar-23)
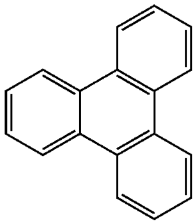
(Ar-24)
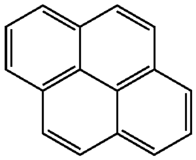
(Ar-25)
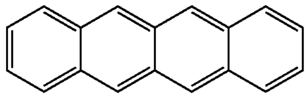

-continued (Ar-26)

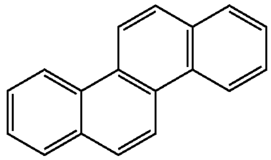

(Ar-27)

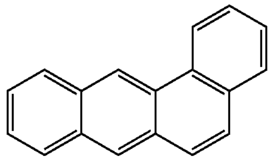

Another embodiment of the present invention is the light-emitting element where, in the above-described structure, Ar has a nitrogen atom in its ring and is bonded to the skeleton within parentheses in General Formula (G1) by a bond of the nitrogen atom or a carbon atom adjacent to the nitrogen atom.

Another embodiment of the present invention is the light-emitting element where, in the above-described structure, the second electrode contains aluminum.

Another embodiment of the present invention is the light-emitting element where, in the above-described structure, the second electrode has a stacked-layer structure and a layer positioned closest to the organic compound layer in the stacked-layer structure is a layer containing aluminum.

Another embodiment of the present invention is the light-emitting element where, in the above-described structure, the thickness of the layer positioned closest to the organic compound layer is less than or equal to 1 nm.

Another embodiment of the present invention is the light-emitting element where, in the above-described structure, the thickness of the layer positioned closest to the organic compound layer is less than or equal to 0.5 nm.

Another embodiment of the present invention is a display device which includes a light-emitting element A and a light-emitting element B over an insulating surface; the light-emitting element A and the light-emitting element B are adjacent to each other; the light-emitting element A includes a first electrode A, a second electrode, and an organic compound layer A; the light-emitting element B includes a first electrode B, the second electrode, and an organic compound layer B; the organic compound layer A includes a light-emitting layer A and an electron-injection layer A; the organic compound layer B includes a light-emitting layer B and an electron-injection layer B; the electron-injection layer A and the electron-injection layer B are in contact with the second electrode; the electron-injection layer A and the electron-injection layer B each include an organic compound having a basic skeleton and an acid dissociation constant pKa of greater than or equal to 1; the organic compound layer A and the organic compound layer B are separated from each other; and the distance between an end portion of the first electrode A and an end portion of the first electrode B facing the end portion of the first electrode A is greater than or equal to 0.5 μm and less than or equal to 5 μm.

Another embodiment of the present invention is the display device where, in the above-described structure, the light-emitting layer A contains a light-emitting substance A, the light-emitting layer B contains a light-emitting substance B, and the light-emitting substance A and the light-emitting substance B are different substances.

Another embodiment of the present invention is the display device where, in the above-described structure, all layers included in the organic compound layer A have substantially the same contour, and all layers included in the organic compound layer B have substantially the same contour.

Another embodiment of the present invention is the display device where, in the above-described structure, the organic compound having a basic skeleton and an acid dissociation constant pKa of greater than or equal to 1 is an organic compound having a basic skeleton with an acid dissociation constant pKa of greater than 10.

Another embodiment of the present invention is the display device where, in the above-described structure, the organic compound having a basic skeleton and an acid dissociation constant pKa of greater than or equal to 1 is an organic compound having a basic skeleton with an acid dissociation constant pKa of greater than 13.

Another embodiment of the present invention is the display device where, in the above-described structure, the organic compound having a basic skeleton and an acid dissociation constant pKa of greater than or equal to 1 is an organic compound having a basic skeleton with an acid dissociation constant pKa of greater than 14.

Another embodiment of the present invention is the display device where, in the above-described structure, the organic compound having a basic skeleton and an acid dissociation constant pKa of greater than or equal to 1 is an organic compound including a bicyclo ring structure having 2 or more nitrogen atoms in the bicyclo ring and a heteroaromatic ring having 2 to 30 carbon atoms in the ring or an aromatic hydrocarbon ring having 6 to 30 carbon atoms in the ring.

Another embodiment of the present invention is the display device where, in the above-described structure, the organic compound having a basic skeleton and an acid dissociation constant pKa of greater than or equal to 1 is an organic compound including a bicyclo ring structure having 2 or more nitrogen atoms in the bicyclo ring and a heteroaromatic ring having 2 to 30 carbon atoms in the ring.

Another embodiment of the present invention is the display device where, in the above-described structure, the organic compound having a basic skeleton and an acid dissociation constant pKa of greater than or equal to 1 is an organic compound including a 1,3,4,6,7,8-hexahydro-2H-pyrimido[1,2-a]pyridine skeleton and a heteroaromatic ring having 2 to 30 carbon atoms in the ring or an aromatic hydrocarbon ring having 6 to 30 carbon atoms in the ring.

Another embodiment of the present invention is the display device where, in the above-described structure, the organic compound having a basic skeleton and an acid dissociation constant pKa of greater than or equal to 1 is an organic compound including a 1,3,4,6,7,8-hexahydro-2H-pyrimido[1,2-a]pyridine skeleton and a heteroaromatic ring having 2 to 30 carbon atoms in the ring.

Another embodiment of the present invention is the display device where, in the above-described structure, the organic compound having a basic skeleton and an acid dissociation constant pKa of greater than or equal to 1 is an organic compound represented by General Formula (G1) below.

[Chemical Formula 5]

(G1)

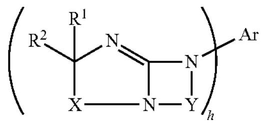

In the organic compound represented by General Formula (G1) above, X represents a group represented by General Formula (G1-1) below, and Y represents a group represented by General Formula (G1-2) below. $R^1$ and $R^2$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

[Chemical Formula 6]

(G1-1)

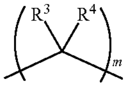

(G1-2)

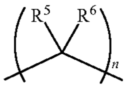

In General Formulae (G1-1) and (G1-2) above, $R^3$ to $R^6$ each independently represent hydrogen or deuterium, m represents an integer of 0 to 4, n represents an integer of 1 to 5, and m+1≥n is satisfied. Note that in the case where m or n is 2 or more, $R^3$s may be the same or different from each other, and the same applies to $R^4$, $R^5$, and $R^6$.

Another embodiment of the present invention is the display device where, in the above-described structure, the organic compound having a basic skeleton and an acid dissociation constant pKa of greater than or equal to 1 is an organic compound represented by any one of General Formulae (G2-1) to (G2-6) below.

[Chemical Formula 7]

(G2-1)

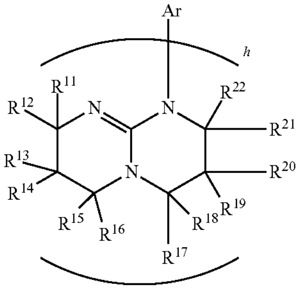

-continued (G2-2)

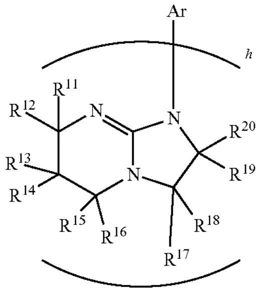

(G2-3)

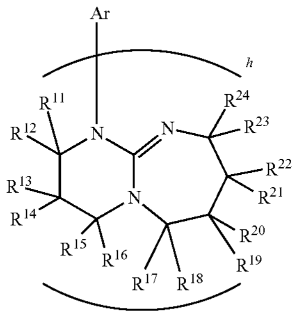

(G2-4)

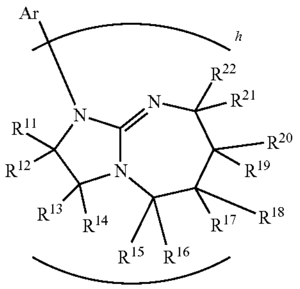

(G2-5)

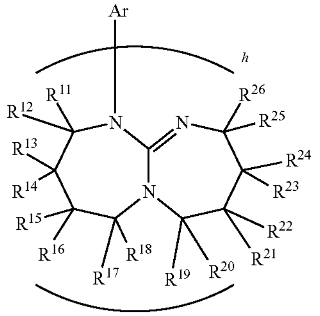

(G2-6)

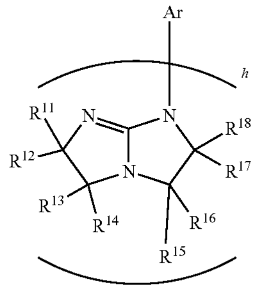

Note that $R^{11}$ to $R^{26}$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

Another embodiment of the present invention is the display device where, in the above-described structure, the substituted or unsubstituted heteroaromatic ring having 2 to 30 carbon atoms in the ring or the substituted or unsubstituted aromatic hydrocarbon ring having 6 to 30 carbon atoms in the ring that is represented by Ar is represented by any one of Structural Formulae (Ar-1) to (Ar-27) below.

[Chemical Formula 8]

(Ar-1)

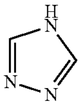

(Ar-2)

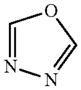

(Ar-3)

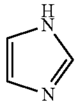

(Ar-4)

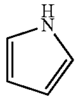

(Ar-5)

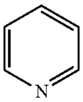

(Ar-6)

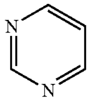

(Ar-7)

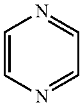

(Ar-8)

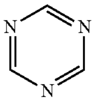

(Ar-9)

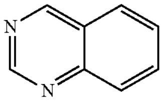

(Ar-10)

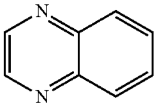

-continued (Ar-11)

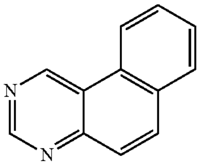

(Ar-12)

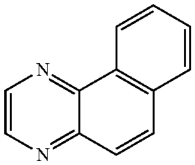

(Ar-13)

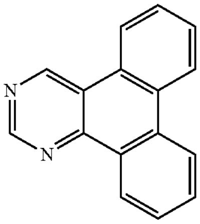

(Ar-14)

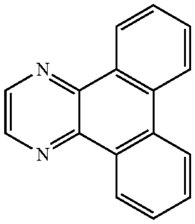

(Ar-15)

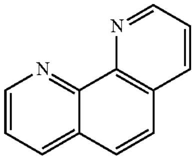

(Ar-16)

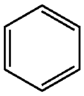

(Ar-17)

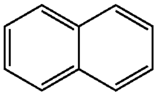

(Ar-18)

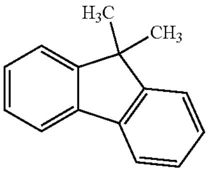

-continued (Ar-19)

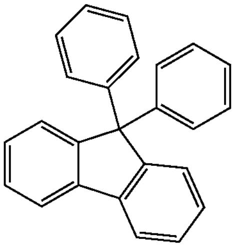

(Ar-20)

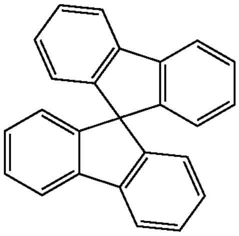

(Ar-21)

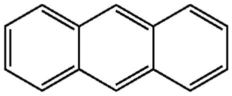

(Ar-22)

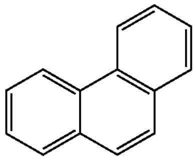

(Ar-23)

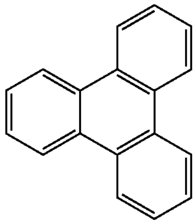

(Ar-24)

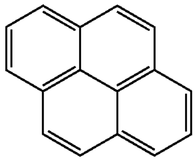

(Ar-25)

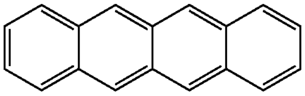

(Ar-26)

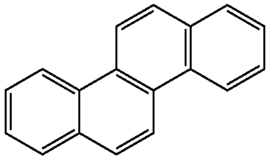

-continued (Ar-27)

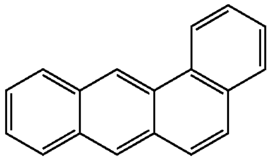

Another embodiment of the present invention is the display device where, in the above-described structure, Ar has a nitrogen atom in its ring and is bonded to the skeleton within parentheses in General Formula (G1) by a bond of the nitrogen atom or a carbon atom adjacent to the nitrogen atom.

Another embodiment of the present invention is the display device where, in the above-described structure, the second electrode contains aluminum.

Another embodiment of the present invention is the display device where, in the above-described structure, the second electrode has a stacked-layer structure and a layer positioned closest to the organic compound layer in the stacked-layer structure is a layer containing aluminum.

Another embodiment of the present invention is the display device where, in the above-described structure, the thickness of the layer positioned closest to the organic compound layer is less than or equal to 1 nm.

Another embodiment of the present invention is the display device where, in the above-described structure, the thickness of the layer positioned closest to the organic compound layer is less than or equal to 0.5 nm.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; processing the organic compound layer into an island shape covering at least part of the first electrode by a photolithography technique; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing the sacrificial layer and the organic compound layer into an island shape covering at least part of the first electrode by a photolithography technique using the mask; removing the sacrificial layer; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing the sacrificial layer and the organic compound layer into an island shape covering at least part of the first electrode by a lithography technique using the mask; forming an insulating layer covering a side surface of the island-shaped organic compound layer; removing the sacrificial layer; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing the sacrificial layer and the organic compound layer into an island shape covering at least part of the first electrode by a lithography technique using the mask; forming an inorganic insulating layer covering at least a top surface and a side surface of the island-shaped organic compound layer; forming, over the inorganic insulating layer, an organic insulating film having an opening portion provided over the first electrode; removing the inorganic insulating layer and the sacrificial layer over the top surface of the organic compound layer at a position overlapping the opening portion; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; removing part of the island-shaped sacrificial layer with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing the sacrificial layer into an island shape covering at least part of the first electrode by a lithography technique using the mask; processing, with use of the island-shaped sacrificial layer as a mask, the organic compound layer into an island shape covering at least part of the first electrode; removing part of the island-shaped sacrificial layer with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; forming an insulating film covering the island-shaped sacrificial layer and a side surface of the island-shaped organic compound layer; removing part of the island-shaped sacrificial layer and part of the insulating film with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; forming an insulating film covering a top surface and a side surface of the island-shaped sacrificial layer and a side surface of the island-shaped organic compound layer; forming, over the insulating film, an organic insulating film including an opening portion over the first electrode; removing, with an acidic chemical solution, the sacrificial layer and the insulating film over the top surface of the island-shaped organic compound layer at a position overlapping the opening portion; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any one or more of a metal, a metal compound, and a metal complex; processing the organic compound layer into an island shape covering at least part of the first electrode by a photolithography technique; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any one or more of a metal, a metal compound, and a metal complex; forming a sacrificial layer over the electron-injection layer; forming a mask with a photoresist over the sacrificial layer; processing the sacrificial layer and the organic compound layer into an island shape covering at least part of the first electrode by a lithography technique using the mask; removing the sacrificial layer; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any one or more of a metal, a metal compound, and a metal complex; forming a sacrificial layer over the electron-injection layer; forming a mask with a photoresist over the sacrificial layer; processing the sacrificial layer and the organic compound layer into an island shape covering at least part of the first electrode by a lithography technique using the mask; forming an insulating layer covering a side surface of the island-shaped organic compound layer; removing the sacrificial layer; and forming a second electrode covering the first electrode and the island-shaped organic compound layer.

Another embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any one or more of a metal, a metal compound, and a metal complex; forming a sacrificial layer over the electron-injection layer; forming a mask with a photoresist over the sacrificial layer; processing the sacrificial layer and the organic compound layer into an island shape covering at least part of the first electrode by a lithography technique using the mask; forming an inorganic insulating layer covering at least a top surface and a side surface of the island-shaped organic compound layer; forming, over the inorganic insulating layer, an organic insulating film having an opening portion provided over the first electrode; removing the inorganic insulating layer and the sacrificial layer over the top surface of the organic compound layer at a position overlapping the opening portion; and forming a second electrode covering the first electrode and the island-shaped organic compound layer.

Another embodiment of the present invention is the method for manufacturing the light-emitting element where, in the above-described structure, the electron-injection layer has a stacked-layer structure of a layer containing the organic compound having an acid dissociation constant pKa of greater than or equal to 1 and a layer containing any one or more of the metal, the metal compound, and the metal complex.

Another embodiment of the present invention is the method for manufacturing the light-emitting element where, in the above-described structure, the thickness of the layer containing any one or more of the metal, the metal compound, and the metal complex is less than or equal to 1 nm.

Another embodiment of the present invention is the method for manufacturing the light-emitting element where, in the above-described structure, the thickness of the layer containing any one or more of the metal, the metal compound, and the metal complex is less than or equal to 0.5 nm.

Another embodiment of the present invention is the method for manufacturing the light-emitting element where, in the above-described structure, the layer containing any one or more of the metal, the metal compound, and the metal complex is positioned closer to the second electrode than the layer containing the organic compound is.

Another embodiment of the present invention is the method for manufacturing the light-emitting element where, in the above-described structure, the electron-injection layer is formed using a mixed material containing the organic compound having an acid dissociation constant pKa of greater than or equal to 1 and any one or more of the metal, the metal compound, and the metal complex.

Another embodiment of the present invention is the method for manufacturing the light-emitting element where, in the above-described structure, any of the metal, the metal compound, and the metal complex contains aluminum.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any of a metal, a metal compound, and a metal complex; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; removing part of the island-shaped sacrificial layer with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any of a metal, a metal compound, and a metal complex; forming a sacrificial layer over the electron-injection layer; forming a mask with a photoresist over the sacrificial layer; processing the sacrificial layer into an island shape covering at least part of the first electrode by a lithography technique using the mask; processing, with use of the island-shaped sacrificial layer as a mask, the organic compound layer into an island shape covering at least part of the first electrode; removing part of the island-shaped sacrificial layer with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having an acid dissociation constant pKa of greater than or equal to 1 and any of a metal, a metal compound, and a metal complex; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; forming an insulating film covering the island-shaped sacrificial layer and a side surface of the island-shaped organic compound layer; removing part of the island-shaped sacrificial layer and part of the insulating film with an acidic chemical solution to expose the outermost surface of the island-shaped organic compound layer; and forming a second electrode covering the first electrode and the island-shaped organic compound layer.

One embodiment of the present invention is a method for manufacturing a light-emitting element, including the following steps: forming a first electrode over an insulating surface; forming an organic compound layer over the first electrode, the organic compound layer including at least a light-emitting layer and an electron-injection layer, the electron-injection layer being the outermost layer of the organic compound layer and containing an organic compound having a basic skeleton and an acid dissociation constant pKa of greater than or equal to 1; forming a sacrificial layer over the electron-injection layer; forming a mask with a photoresist over the sacrificial layer; processing at least the sacrificial layer into an island shape by a lithography technique using the mask; processing, with use of the island-shaped sacrificial layer as a mask, the organic compound layer into an island shape covering at least part of the first electrode; forming an insulating film covering a top surface and a side surface of the island-shaped sacrificial layer and a side surface of the island-shaped organic compound layer; forming, over the insulating film, an organic insulating film including an opening portion over the first electrode; removing, with an acidic chemical solution, the sacrificial layer and the insulating film over the top surface of the island-shaped organic compound layer at a position overlapping the opening portion; and forming a second electrode covering the first electrode and the island-shaped organic compound layer.

One embodiment of the present invention is the method for manufacturing the light-emitting element where, in the above-described structure, the sacrificial layer contains aluminum.

One embodiment of the present invention is the method for manufacturing the light-emitting element where, in the above-described structure, the insulating film contains aluminum.

One embodiment of the present invention is the method for manufacturing the light-emitting element where, in the above-described structure, the acidic chemical solution is a chemical solution containing one or more of phosphoric acid, hydrofluoric acid, nitric acid, acetic acid, oxalic acid, and sulfuric acid or a mixed chemical solution containing two or more of these acids.

Note that the light-emitting apparatus in this specification includes, in its category, an image display device that uses an organic EL device. The light-emitting apparatus may also include a module in which an organic EL device is provided with a connector such as an anisotropic conductive film or a tape carrier package (TCP), a module in which a printed wiring board is provided at the end of a TCP, and a module in which an integrated circuit (IC) is directly mounted on an organic EL device by a chip on glass (COG) method. Furthermore, a lighting device or the like may include the light-emitting apparatus.

With one embodiment of the present invention, a light-emitting element that enables manufacture of a high-resolution display device with favorable characteristics can be provided. With another embodiment of the present invention, a high-resolution display device with favorable display quality can be provided. With another embodiment of the present invention, a high-resolution display device with favorable yield can be provided. With another embodiment of the present invention, an inexpensive high-resolution display device can be provided.

Note that the description of these effects does not preclude the existence of other effects. One embodiment of the present invention does not necessarily have all these effects. Other effects will be apparent from and can be derived from the descriptions of the specification, the drawings, the claims, and the like.

BRIEF DESCRIPTION OF THE DRAWINGS

FIGS. 7A1, 7A2, 7B1, and 7B2 are cross-sectional views illustrating an example of a method for manufacturing a display device.

FIGS. 8A, 8B, 8C1, and 8C2 are cross-sectional views illustrating an example of a method for manufacturing a display device.

FIGS. 9A, 9B1, and 9B2 are cross-sectional views illustrating an example of a method for manufacturing a display device.

FIGS. 10A1, 10A2, 10B1, and 10B2 are cross-sectional views illustrating an example of a method for manufacturing a display device.

DETAILED DESCRIPTION OF THE INVENTION

Figure 1:
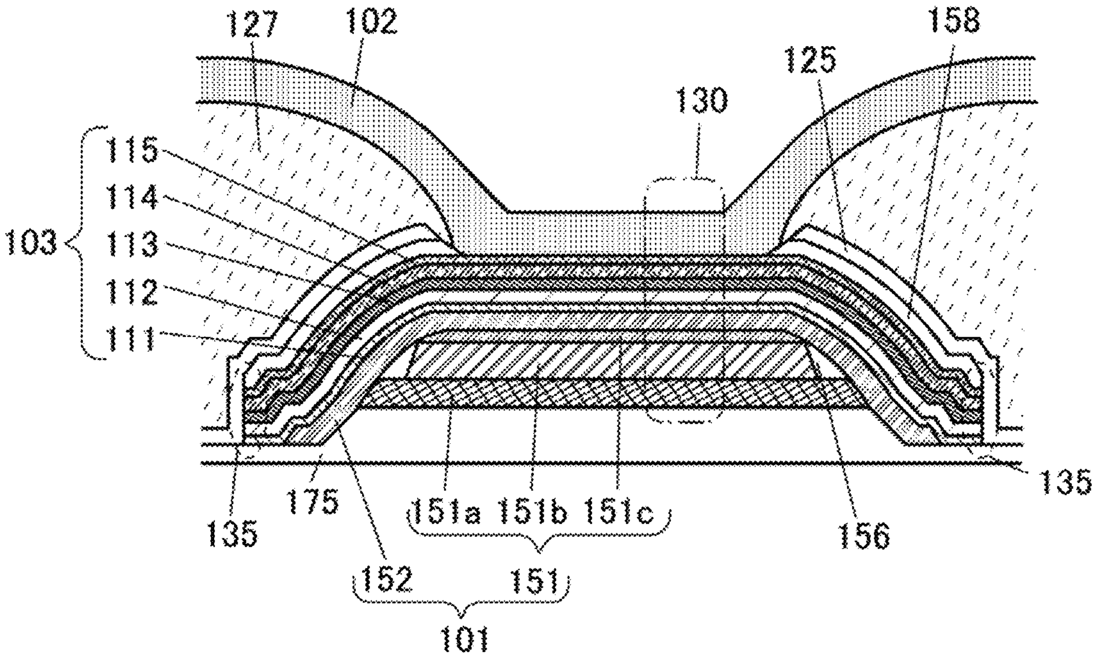
FIG. 1 illustrates a light-emitting element.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

In this specification and the like, a film that has not been subjected to shape processing after being formed is referred to as a "film", and a film that has been subjected to shape processing after being formed is referred to as a "layer", in many cases. However, these two terms are used with a view to making the progression of the process easy to understand and have no big difference therebetween; thus, a "film" can be read as a "layer", and vice versa. In particular, these two terms are synonymous for the case of referring to an object that is not subjected to processing.

Embodiment 1

As a method for forming an organic semiconductor film in a predetermined shape, a vacuum evaporation method with a metal mask (mask vapor deposition) is widely used. However, in these days of higher density and higher resolution, mask vapor deposition has come close to the limit of increasing the resolution for various reasons such as the alignment accuracy and the distance between the mask and the substrate. By contrast, a finer pattern can be formed by shape processing of an organic semiconductor film by a photolithography technique. Moreover, because of the easiness of large-area processing, the processing of an organic semiconductor film by a photolithography technique is being researched.

A light-emitting element includes an organic compound layer including a light-emitting layer containing a light-emitting substance between electrodes (between a first electrode and a second electrode), and energy generated by recombination of carriers (holes and electrons) injected to the organic compound layer from the electrodes causes light emission.

However, carrier injection to the organic compound layer is not easy because of a high energy barrier. Therefore, the voltage is sometimes reduced by using an alkali metal such as lithium (Li) or a compound of an alkali metal in an electron-injection layer in contact with the cathode.

Here, in manufacturing a light-emitting element by a photolithography technique, processing the layer containing an alkali metal or a compound of an alkali metal may cause diffusion of the metal or the compound into equipment for performing the processing and have an adverse effect such as a change in electrical characteristics on the other elements or the equipment.

As a means for solving the above-described problem, there is a method of performing a photolithography step halfway through a process of forming an organic compound layer of a light-emitting element (before forming a layer containing an alkali metal or a compound of an alkali metal). In other words, this method circumvents the contamination problem by an alkali metal or a compound of an alkali metal by performing lithography and processing an organic compound layer in a step before formation of an electron-injection layer and then performing subsequent steps such as formation of the electron-injection layer.

However, since the photolithography step is performed under normal pressure, e.g., in an air atmosphere, gaseous components in the atmosphere may be adsorbed on or diffused into the organic compound layer to have an adverse effect. The research by the present inventors has revealed that the light-emitting layer in the organic compound layer is especially susceptible and characteristics deteriorate more when the position of a layer exposed to the air is closer to the light-emitting layer.

Therefore, the photolithography step is preferably performed on a layer positioned as far from the light-emitting layer as possible.

Lithography on the electron-injection layer has been avoided owing to the contamination problem by an alkali metal or a compound of an alkali metal as described above. However, the present inventors have found that the photolithography step can be performed after formation of the electron-injection layer without causing contamination by an alkali metal or a compound of an alkali metal when an organic compound having a basic skeleton and an acid dissociation constant pKa of greater than or equal to 1 is used for the electron-injection layer.

Note that a layer that contains an organic compound having an acid dissociation constant pKa of greater than or equal to 1 and any one or more of a metal, a metal compound, and a metal complex may be used as the electron-injection layer. Providing the layer that contains the organic compound and any one or more of a metal, a metal compound, and a metal complex can more stably inhibit contamination by an alkali metal or a compound of an alkali metal.

Even when not containing an alkali metal or a compound of an alkali metal, such an electron-injection layer can inject electrons from the electrode to the organic compound layer without largely increasing drive voltage. Accordingly, contamination is not caused by the photolithography step performed after formation of the electron-injection layer and the photolithography step can be performed at a position farther from the light-emitting layer; thus, a light-emitting element with more favorable characteristics can be obtained.

Note that the organic compound having an acid dissociation constant pKa of greater than or equal to 1 preferably has a basic skeleton with an acid dissociation constant pKa of greater than 10. The acid dissociation constant pKa of the basic skeleton is further preferably greater than 13, still further preferably greater than 14.

As the acid dissociation constant pKa of the basic skeleton, the acid dissociation constant value of the organic compound formed by substituting hydrogen for part of the skeleton can be used. As an indicator of acidity of an organic compound having a basic skeleton, the acid dissociation constant pKa of the basic skeleton can be used. As for an organic compound having a plurality of basic skeletons, the acid dissociation constant pKa of the basic skeleton having the highest acid dissociation constant pKa can be used as the indicator of acidity of the organic compound.

The acid dissociation constant pKa is preferably a value measured using water as a solvent.

As specific examples of the organic compound having a high acid dissociation constant pKa, organic compounds having basic skeletons represented by Structural Formulae (120) to (123) below can be given.

[Chemical Formula 9]

(120)

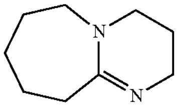

DBU (121)

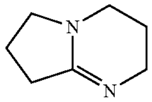

DBN (122)

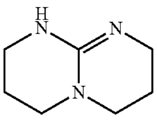

TBD (123)

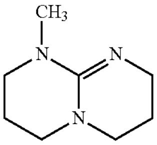

MTBD

It is preferable that the organic compound having any of the above basic skeletons and an acid dissociation constant pKa of greater than or equal to 1 be specifically an organic compound which includes a bicyclo ring structure having 2 or more nitrogen atoms in the bicyclo ring and a heteroaromatic ring having 2 to 30 carbon atoms in the ring or an aromatic hydrocarbon ring having 6 to 30 carbon atoms in the ring, and more specifically be an organic compound which includes a 1,3,4,6,7,8-hexahydro-2H-pyrimido[1,2-a]pyridine skeleton and a heteroaromatic ring having 2 to 30 carbon atoms in the ring or an aromatic hydrocarbon ring having 6 to 30 carbon atoms in the ring. An organic compound which includes a bicyclo ring structure having 2 or more nitrogen atoms in the bicyclo ring and a heteroaromatic ring having 2 to 30 carbon atoms in the ring, more specifically an organic compound which includes a 1,3,4,6,7,8-hexahydro-2H-pyrimido[1,2-a]pyridine skeleton and a heteroaromatic ring having 2 to 30 carbon atoms in the ring is further preferred.

Further specifically, the organic compound having any of the above basic skeletons and an acid dissociation constant pKa of greater than or equal to 1 is preferably an organic compound represented by General Formula (G1) below.

[Chemical Formula 10]

(G1)

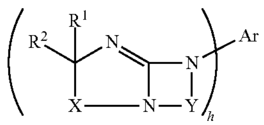

In the organic compound represented by General Formula (G1) above, X represents a group represented by General Formula (G1-1) below, and Y represents a group represented by General Formula (G1-2) below. $R^1$ and $R^2$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

[Chemical Formula 11]

(G1-1)

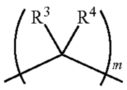

(G1-2)

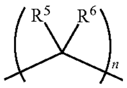

In General Formulae (G1-1) and (G1-2) above, $R^3$ to $R^6$ each independently represent hydrogen or deuterium, m represents an integer of 0 to 4, n represents an integer of 1 to 5, and m+n is satisfied. Note that in the case where m or n is 2 or more, $R^3$s may be the same or different from each other, and the same applies to $R^4$, $R^5$, and $R^6$.

The organic compound represented by General Formula (G1) above is preferably any one of compounds represented by General Formulae (G2-1) to (G2-6) below.

[Chemical Formula 12]

(G2-1)

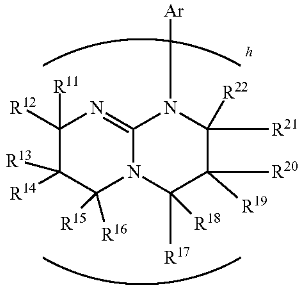

-continued (G2-2)

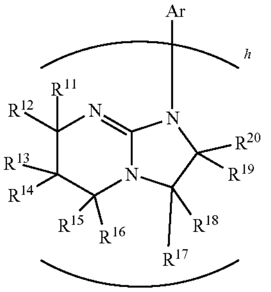

(G2-3)

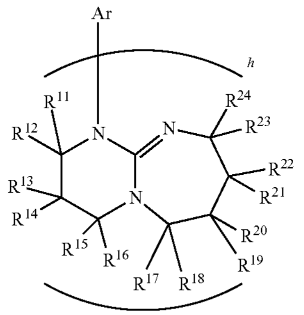

(G2-4)

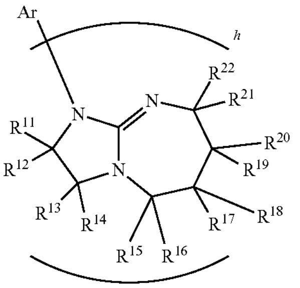

(G2-5)

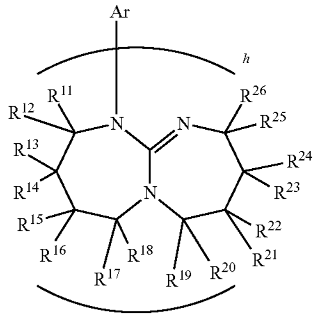

(G2-6)

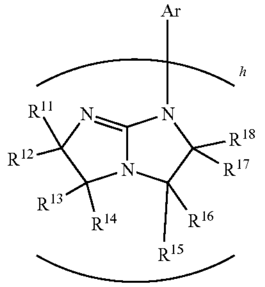

$R^{11}$ to $R^{26}$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

In General Formula (G1) and General Formulae (G2-1) to (G2-6) above, the substituted or unsubstituted heteroaromatic ring having 2 to 30 carbon atoms in the ring that is represented by Ar is specifically a pyridine ring, a bipyridine ring, a pyrimidine ring, a bipyrimidine ring, a pyrazine ring, a bipyrazine ring, a triazine ring, a quinoline ring, an isoquinoline ring, a benzoquinoline ring, a phenanthroline ring, a quinoxaline ring, a benzoquinoxaline ring, a dibenzoquinoxaline ring, an azofluorene ring, a diazofluorene ring, a carbazole ring, a benzocarbazole ring, a dibenzocarbazole ring, a dibenzofuran ring, a benzonaphthofuran ring, a dinaphthofuran ring, a dibenzothiophene ring, a benzonaphthothiophene ring, a dinaphthothiophene ring, a benzofuropyridine ring, a benzofuropyrimidine ring, a benzothiopyridine ring, a benzothiopyrimidine ring, a naphthofuropyridine ring, a naphthofuropyrimidine ring, a naphthothiopyridine ring, a naphthothiopyrimidine ring, an acridine ring, a xanthene ring, a phenothiazine ring, a phenoxazine ring, a phenazine ring, a triazole ring, an oxazole ring, an oxadiazole ring, a thiazole ring, a thiadiazole ring, an imidazole ring, a benzimidazole ring, a pyrazole ring, a pyrrole ring, or the like. In General Formula (G1) and General Formulae (G2-1) to (G2-6) above, the substituted or unsubstituted aromatic hydrocarbon ring having 6 to 30 carbon atoms in the ring that is represented by Ar is specifically a benzene ring, a naphthalene ring, a fluorene ring, a dimethylfluorene ring, a diphenylfluorene ring, a spirofluorene ring, an anthracene ring, a phenanthrene ring, a triphenylene ring, a pyrene ring, a tetracene ring, a chrysene ring, a benzo[a]anthracene ring, or the like. Ar is especially preferably the ring represented by any one of Structural Formulae (Ar-1) to (Ar-27) below.

[Chemical Formula 13]

(Ar-1)

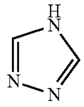

(Ar-2)

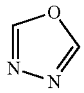

(Ar-3)

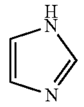

(Ar-4)

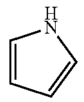

(Ar-5)

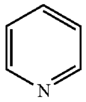

(Ar-6)

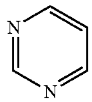

-continued (Ar-7)

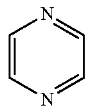

(Ar-8)

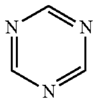

(Ar-9)

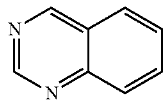

(Ar-10)

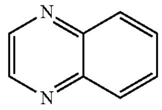

(Ar-11)

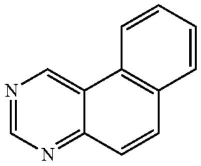

(Ar-12)

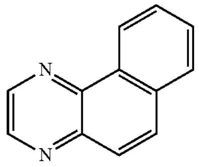

(Ar-13)

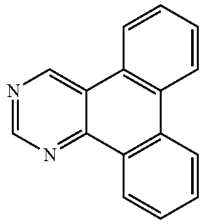

(Ar-14)

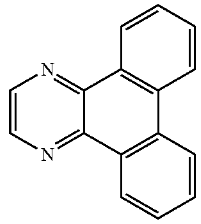

(Ar-15)

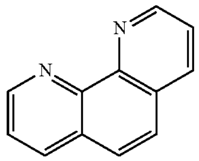

(Ar-16)

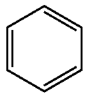

-continued (Ar-17)

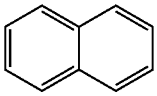

(Ar-18)

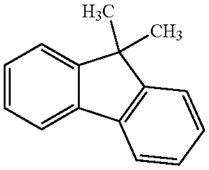

(Ar-19)

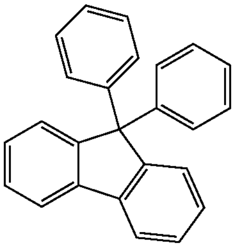

(Ar-20)

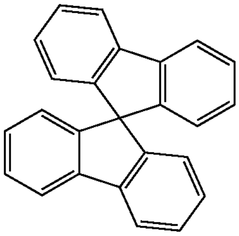

(Ar-21)

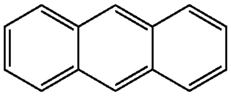

(Ar-22)

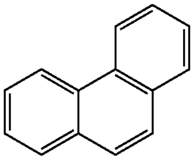

(Ar-23)

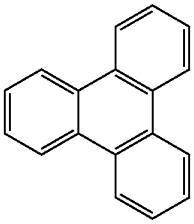

(Ar-24)

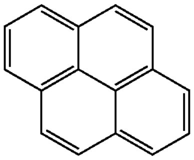

(Ar-25)

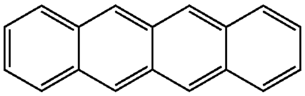

-continued (Ar-26)

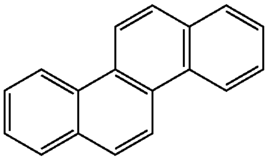

(Ar-27)

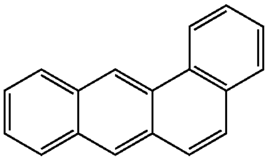

Note that Ar preferably has a nitrogen atom in its ring and is preferably bonded to the skeleton within parentheses in General Formula (G1) above by a bond of the nitrogen atom or a carbon atom adjacent to the nitrogen atom.

As specific examples of the organometallic compounds represented by General Formula (G1) and General Formulae (G2-1) to (G2-6) above, organic compounds represented by Structural Formulae (100) to (117) below, such as 1,1'-pyridine-2,6-diyl-bis(1,3,4,6,7,8-hexahydro-2H-pyrimido[1,2-a]pyrimidine) (abbreviation: hpp2Py) (Structural Formula 100), 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) (Structural Formula 108), and 1-(9,9'-spirobi[9H-fluoren]-2-yl)-1,3,4,6,7,8-hexahydro-2H-pyrimido[1,2-a]pyrimidine (abbreviation: 2hppSF) (Structural Formula 109), can be given.

[Chemical Formula 14]

(100)

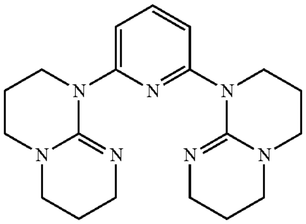

(101)

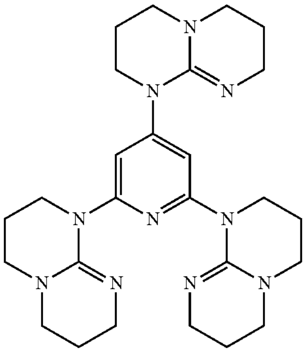

-continued
(102)
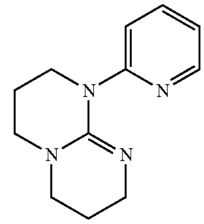
(103)
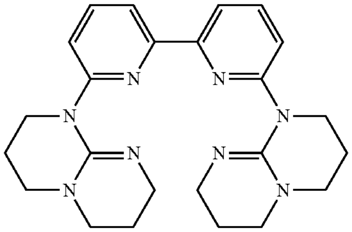
(104)
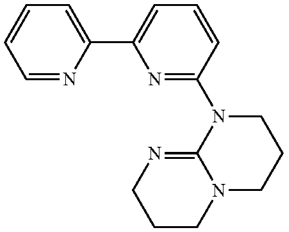
(105)
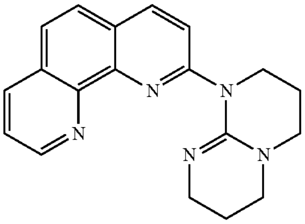
(106)
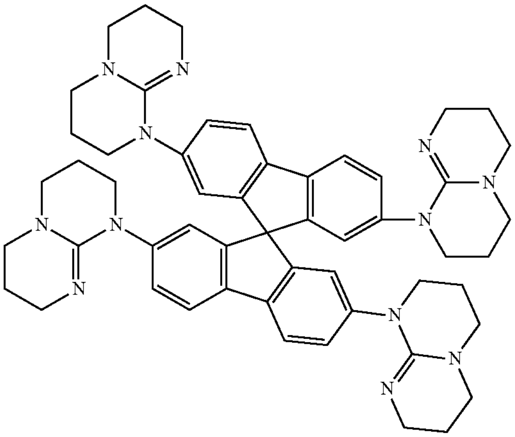
-continued
(107)
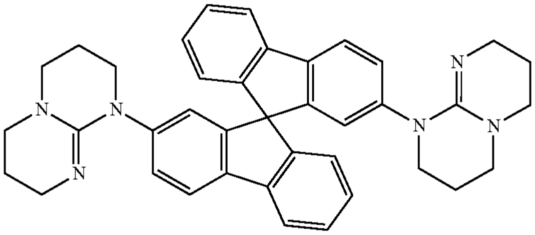
(108)
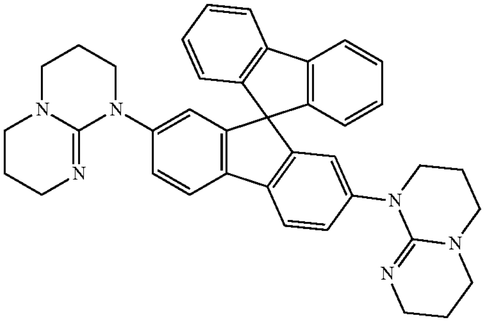
(109)
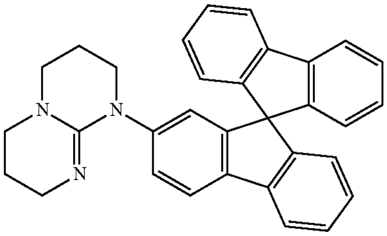
(110)
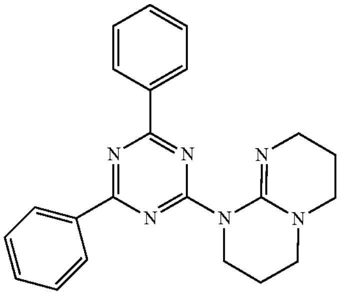
(111)
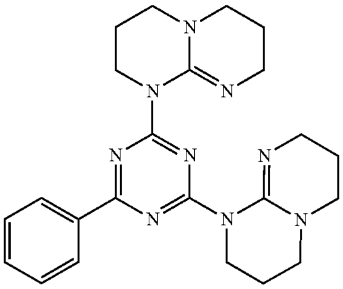

-continued (112)

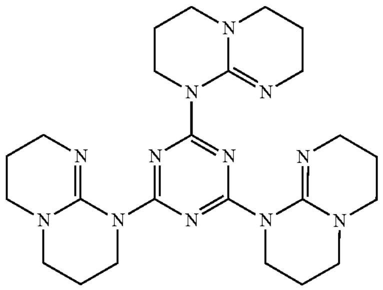

(113)

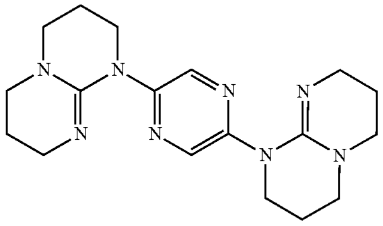

(114)

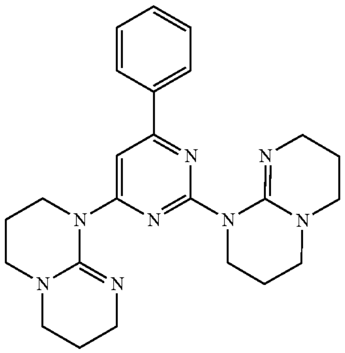

(115)

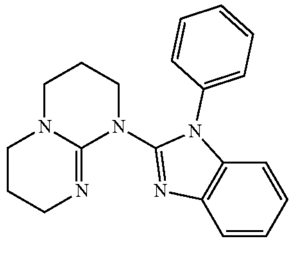

(116)

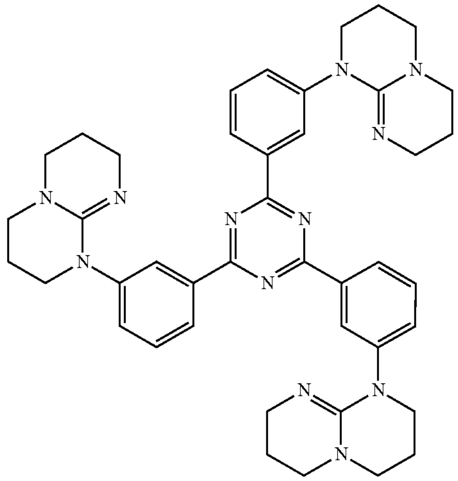

-continued (117)

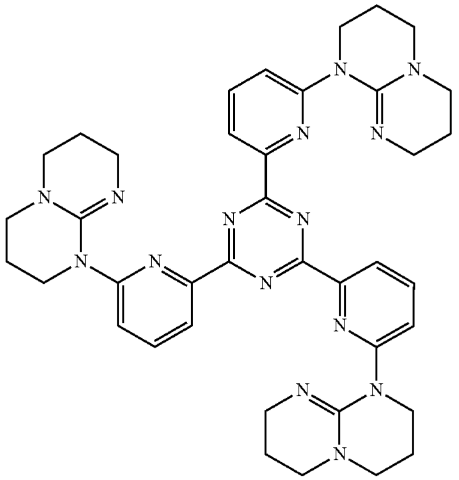

The second electrode is provided in contact with the electron-injection layer. As the second electrode, a material having a low work function is preferably used and aluminum is particularly preferable. Note that the second electrode may have a stacked-layer structure; in this case, the material having a low work function is used in a layer positioned closest to the organic compound layer, that is, a layer in contact with the electron-injection layer. Furthermore, the layer positioned closest to the organic compound layer in the second electrode is preferably a layer containing aluminum.

In the case where the light-emitting element has a structure where light is extracted from the second electrode side, the second electrode preferably has a stacked-layer structure. The layer positioned closest to the organic compound layer in the second electrode is preferably formed using a material having a low work function and is further preferably formed using an alloy of aluminum or silver and magnesium. The thickness of the layer positioned closest to the organic compound layer in the second electrode is preferably less than or equal to 1 nm, further preferably less than or equal to 0.5 nm. In particular, in the case where the layer positioned closest to the organic compound layer in the second electrode is aluminum, the thickness of the layer is preferably less than or equal to 1 nm, further preferably less than or equal to 0.5 nm. The layer other than the layer positioned closest to the organic compound layer in the second electrode having the stacked-layer structure is preferably a conductive material having a visible-light-transmitting property.

Note that the electron-injection layer including the above-described organic compound and any one or more of a metal, a metal compound, and a metal complex may be a mixed layer of the above-described organic compound and any one or more of a metal, a metal compound, and a metal complex or have a stacked-layer structure of a layer containing the above-described organic compound and a layer containing any one or more of a metal, a metal compound, and a metal complex. In this case, the layer containing any one or more of a metal, a metal compound, and a metal complex is preferably positioned closest to the second electrode.

In the light-emitting element of one embodiment of the present invention, since the organic compound layer is processed by a photolithography technique, the organic compound layer can be processed with a sufficient accuracy to manufacture a high-resolution display device. Furthermore, since a lithography step can be performed on the electron-injection layer far from the light-emitting layer without contamination by an alkali metal, the light-emitting element can have favorable characteristics. As described above, the light-emitting element of one embodiment of the present invention having the above-described structure enables a high-resolution display device and can have favorable characteristics.

Since the organic compound layer in the light-emitting element of one embodiment of the present invention is processed at once with a photolithography technique, all the layers included in the organic compound layer have substantially the same contour. Here, "substantially the same" in this specification means, supposing that the organic compound layer includes a layer A and a layer B, a difference between a contour A of the layer A and a contour B of the layer B is within 5% of the width of the organic compound layer along a line perpendicular to the compared portions of the contours. In the case where an end surface of the organic compound layer has a tapered shape, a continuous change of the contour is allowed.

The structure of this embodiment can be used in combination with any of the other structures as appropriate.

Embodiment 2

FIG. 1 illustrates an embodiment of a light-emitting element 130 of the present invention. The light-emitting element 130 is provided over a surface (insulating surface) of an insulating layer 175 and includes an organic compound layer 103 between a first electrode 101 and a second electrode 102. The organic compound layer 103 includes at least a light-emitting layer 113 and an electron-injection layer 115. Although FIG. 1 illustrates a hole-injection layer 111, a hole-transport layer 112, and an electron-transport layer 114 as the other layers, other layers may be included or any of the above-described three layers may be eliminated. Furthermore, one layer may serve a plurality of functions.

The electron-injection layer 115 is a layer in contact with the second electrode 102 and has the structure described in Embodiment 1.

The electron-injection layer 115 may include a first layer containing the above-described organic compound having an acid dissociation constant pKa of greater than or equal to 1 and a second layer containing any one or more of a metal, a metal compound, and a metal complex. The electron-injection layer 115 may have a single-layer structure including a mixed material of the organic compound and any one or more of the metal, the metal compound, and the metal complex.

With such a structure, the organic compound having an acid dissociation constant pKa of greater than or equal to 1 and any one or more of the metal, the metal compound, and the metal complex interact with each other to improve the electron injection property; thus, a light-emitting element in which an increase in drive voltage is inhibited without using an alkali metal or the like can be provided.

Since the layers up to the electron-injection layer 115 are formed and then the functional layers included in the organic compound layer 103 are subjected to processing into an island shape by a photolithography technique in manufacturing the light-emitting element 130, all the functional layers have substantially the same contour. In other words, end portions of the layers, which are part of the contour, are aligned in a direction substantially perpendicular to the surface of the insulating layer 175 as indicated by a region 135, for example.

Here, "substantially the same" in this specification means, supposing that the organic compound layer includes a layer A and a layer B, a difference between a contour A of the layer A and a contour B of the layer B is within 5% of the width of the organic compound layer along a line perpendicular to the compared portions of the contours. In the case where an end surface of the organic compound layer has a tapered shape, a continuous change of the contour along the tapered shape is allowed.

In the example illustrated in FIG. 1, after the first electrode 101 is formed, the layers up to the electron-injection layer of the organic compound layer are formed and processed into a shape covering the first electrode. An insulating layer 127 having an opening portion over the first electrode 101 is formed, and then the second electrode 102 is formed. Other processing examples are described with reference to FIGS. 4A to 4C.

Figure 4A:
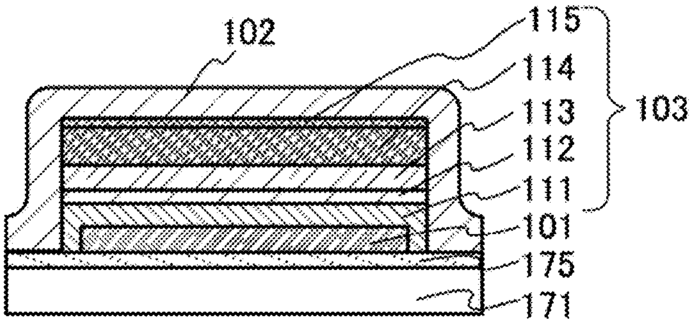
FIGS. 4A to 4C each illustrate a light-emitting element.
Figure 4B:
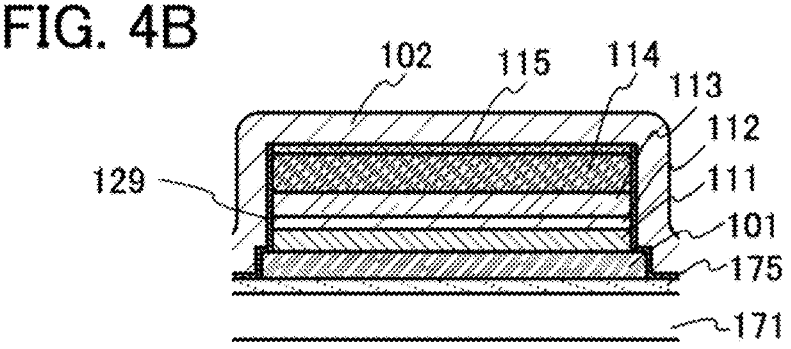
Figure 4C:
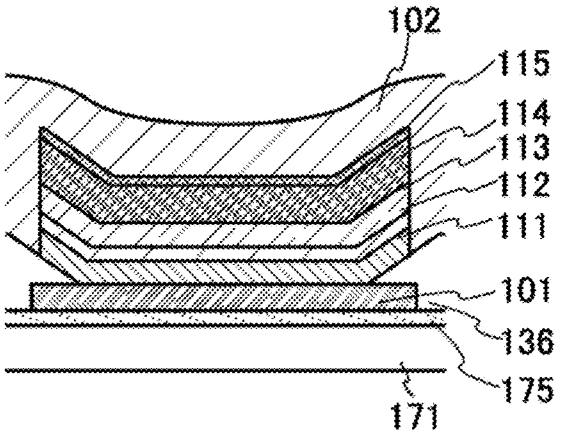

In the example illustrated in FIG. 4A, after the first electrode 101 is formed, the layers up to the electron-injection layer 115 of the organic compound layer 103 are formed and processed into a shape covering the first electrode, and then, the second electrode 102 is formed. In the example illustrated in FIG. 4B, after the first electrode 101 is formed, the layers up to the electron-injection layer 115 of the organic compound layer 103 are formed, and the organic compound layer 103 is processed so as to be positioned within the area of the first electrode. Then, an insulating layer 129 is formed and a top portion of the insulating layer is removed, followed by formation of the second electrode 102. The insulating layer 129 is provided to prevent a short circuit between the first electrode 101 and the second electrode 102. In the example illustrated in FIG. 4C, after the first electrode 101 is formed, an insulating film 136 having an opening portion over the first electrode 101 is formed, and then the layers up to the electron-injection layer 115 of the organic compound layer 103 are formed, the organic compound layer 103 is processed, and the second electrode 102 is formed. Thus, one embodiment of the present invention can be used for various processing patterns. Although the shape of the processing pattern changes as appropriate depending on the surrounding conditions, any shape can benefit from the effect of using the organic compound described in Embodiment 1 for the electron-injection layer 115 and processing the organic compound layer 103 by photolithography after the layers up to the electron-injection layer 115 are formed.

Figure 5A:
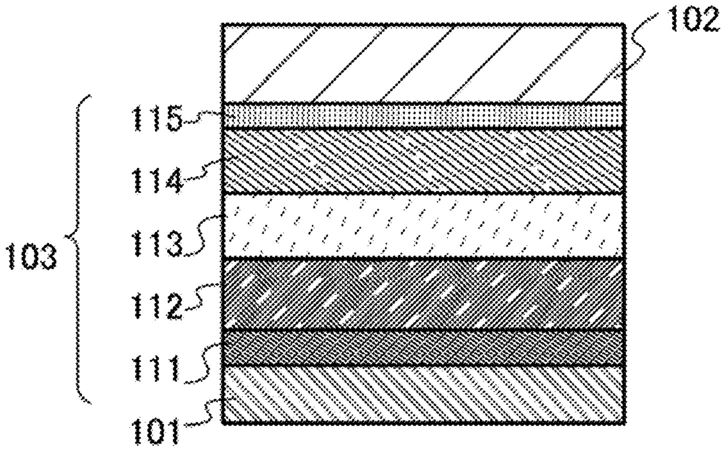
FIGS. 5A and 5B each illustrate a light-emitting element.
Figure 5B:
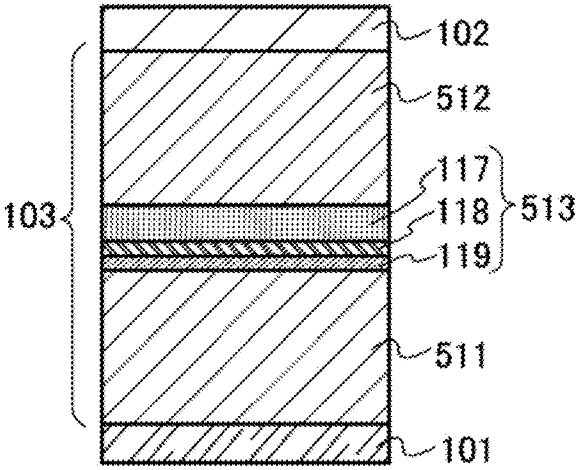

Next, a stacked-layer structure and materials of the light-emitting element are described in detail. FIG. 5A illustrates a structure example of a light-emitting element that can be used as the light-emitting element of one embodiment of the present invention. FIGS. 5A and 5B illustrate only the stacked-layer structure of the light-emitting element for simplicity. The light-emitting element of one embodiment of the present invention includes the organic compound layer (EL layer) 103 between the first electrode and the second electrode. The organic compound layer 103 includes at least the light-emitting layer 113 and the electron-injection layer 115.

The first electrode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, a film of indium oxide-zinc oxide is formed by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer that is in contact with the first electrode 101 in the organic compound layer 103, an electrode material can be selected regardless of its work function. Although described later, the first electrode may have any of the shapes and the stacked-layer structures illustrated in FIG. 1, FIGS. 2A and 2B, and FIGS. 3A to 3C.

In the case where the first electrode 101 is formed using a material having a visible-light-transmitting property, what is called a bottom-emission light-emitting element which emits light toward the first electrode 101 can be formed; while in the case of a top-emission light-emitting element, a layer formed using a material having a high visible-light-reflecting property is preferably included as the first electrode 101.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (e.g., a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) and copper phthalocyanine (abbreviation: CuPc), an aromatic amine compound such as 4,4'-bis[N-(4-diphenylaminophenyl)-N-phenylamino]biphenyl (abbreviation: DPAB) and N,N'-bis[4-bis(3-methylphenyl)aminophenyl]-N,N'-diphenyl-4,4'-diaminobiphenyl (abbreviation: DNTPD), or a high molecular compound such as poly(3,4-ethylenedioxythiophene)/poly(styrenesulfonic acid) (abbreviation: PEDOT/PSS). The substance having an acceptor property can extract electrons from an adjacent hole-transport layer (or hole-transport material) by application of an electric field.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the first electrode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds that can be used as the material having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), and 1,3,5-tris[N-(4-diphenylaminophenyl)-N-phenylamino]benzene (abbreviation: DPA3B). Specific examples of the carbazole derivative include 3[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)

biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N-bis(4-butylphenyl)-N,N'-bis(phenyl)benzidine] (abbreviation: poly-TPD).

The material having a hole-transport property that is used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to the nitrogen of the amine through an arylene group may be used. Note that the material having a hole-transport property preferably has an N,N-bis(4-biphenyl)amino group to obtain a light-emitting element having a long lifetime. Specific examples of the material having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA((βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Note that it is further preferable that the material having a hole-transport property used in the composite material have a relatively deep HOMO level higher than or equal to −5.7 eV and lower than or equal to −5.4 eV. Using the material with a hole-transport property which has a relatively deep HOMO level in the composite material makes it easy to inject holes into the hole-transport layer 112 and to obtain a light-emitting element having a long lifetime.

Note that mixing the above composite material with a fluoride of an alkali metal or an alkaline earth metal (the proportion of fluorine atoms in a layer using the mixed material is preferably greater than or equal to 20%) can lower the refractive index of the layer. This also enables a layer with a low refractive index to be formed in the organic compound layer 103, leading to higher external quantum efficiency of the light-emitting element.

The formation of the hole-injection layer 111 can improve the hole-injection property, which allows the light-emitting element to be driven at a low voltage. In addition, the organic compound having an acceptor property is easy to use because it is easily deposited by vapor deposition.

The hole-transport layer 112 is formed using a material having a hole-transport property. The material having a hole-transport property preferably has a hole mobility higher than or equal to $1\times10^{-6}$ $cm^2/Vs$.

Examples of the organic compound that can be used for the hole-transport layer 112 include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl) phenyl]fluoren-2-amine (abbreviation: PCBAF), and N-phenyl-N-[4-(9-phenyl-9H-carbazol-3-yl)phenyl]-9,9'-spirobi [9H-fluoren]-2-amine (abbreviation: PCBASF); compounds having a carbazole skeleton, such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in drive voltage. Note that any of the substances given as examples of the organic compound that can be used for the composite material in the hole-injection layer 111 can also be suitably used as the material included in the hole-transport layer 112.

Note that the organic compound used for the hole-transport layer is preferably an aromatic amine having an alkyl group, in which case the refractive index of the hole-transport layer 112 can be lowered and light extraction efficiency can be improved. It is further preferable to use an organic compound having a plurality of alkyl groups in one molecule. Preferable examples of such a material include N,N-bis(4-cyclohexylphenyl)-9,9-dimethyl-9H-fluoren-2-amine (abbreviation: dchPAF), N-[(4'-cyclohexyl)-biphenyl-4-yl]-N-(4-cyclohexylphenyl)-9,9-dimethyl-9H-fluoren-2-amine (abbreviation: chBichPAF), N,N-bis(4-cyclohexylphenyl)-N-(spiro[cyclohexane-1,9'-[9H]fluoren]-2'-yl)amine (abbreviation: dchPASchF), N-[(4'-cyclohexyl)biphenyl-4-yl]-N-(4-cyclohexylphenyl)-N-(spiro[cyclohexane-1,9'-[9H]fluoren]-2'-yl)amine (abbreviation: chBichPASchF), N-(4-cyclohexylphenyl)bis(spiro[cyclohexane-1,9'-[9H]fluoren]-2'-yl)amine (abbreviation: SchFB1chP), N-[(3',5'-ditertiarybutyl)biphenyl-4-yl]-N-(4-cyclohexylphenyl)-9,9-dimethyl-9H-fluoren-2-amine (abbreviation: mmtBuBichPAF), N,N-bis(3',5'-ditertiarybutylbiphenyl-4-yl)-9,9-dimethyl-9H-fluoren-2-amine (abbreviation: dmmtBuBiAF), N-(3,5-ditertiarybutylphenyl)-N-(3',5'-ditertiarybutyl-biphenyl-4-yl)-9,9-dimethyl-9H-fluoren-2-amine (abbreviation: mmtBuBimmtBuPAF), N,N-bis(4-cyclohexylphenyl)-9,9-dipropyl-9H-fluoren-2-amine (abbreviation: dchPAPrF), N-[(3',5'-dicyclohexyl)biphenyl-4-yl]-N-(4-cyclohexylphenyl)-9,9-dimethyl-9H-fluoren-2-amine (abbreviation: mmchBichPAF), N-(3,3",5,5"-tetra-t-butyl-1,1':3',1"-terphenyl-5'-yl)-N-(4-cyclohexylphenyl)-9,9-dimethyl-9H-fluoren-2-amine (abbreviation: mmtBumTPchPAF), N-(4-cyclododecylphenyl)-N-(4-cyclohexylphenyl)-9,9-dimethyl-9H-fluoren-2-amine (abbreviation: CdoPchPAF), N-(3,3",5,5"-tetra-t-butyl-1,1':3',1"-terphenyl-5'-yl)-N-phenyl-9,9-dimethyl-9H-fluoren-2-amine (abbreviation: mmtBumTPFA), N-(biphenyl-4-yl)-N-(3,3",5,5"-tetra-t-butyl-1,1':3',1"-terphenyl-5'-yl)-9,9-dimethyl-9H-fluoren-2-amine (abbreviation: mmtBumTPFBi), N-(biphenyl-2-yl)-N-(3,3",5,5"-tetra-t-butyl-1,1':3',1"-terphenyl-5'-yl)-9,9-dimethyl-9H-fluoren-2-amine (abbreviation: mmtBumTPoFBi), N-[(3,3',5'-tri-t-butyl)biphenyl-5-yl]-N-(4-cyclohexylphenyl)-9,9-dimethyl-9H-fluoren-2-amine (abbreviation: mmtBumBichPAF), N-(biphenyl-2-yl)-N-[(3,3',5'-tri-t-butyl)biphenyl-5-yl]-9,9-dimethyl-9H-fluoren-2-amine (abbreviation: mmtBumBioFBi), N-(4-tert-butylphenyl)-N-(3,3",5,5"-tetra-t-butyl-1,1':3',1"-terphenyl-5'-yl)-9,9-dimethyl-9H-fluoren-2-amine (abbreviation: mmtBumTPtBuPAF), N-(3,3",5',5"-tetra-tert-butyl-1,1':3',1"-terphenyl-5-yl)-N-phenyl-9,9-dimethyl-9H-fluoren-2-amine (abbreviation: mmtBumTPFA-02), N-(biphenyl-4-yl)-N-(3,3",5',5"-tetra-tert-butyl-1,1':3',1"-terphenyl-5-yl)-9,9-dimethyl-9H-fluoren-2-amine (abbreviation: mmtBumTPFBi-02), N-(biphenyl-2-yl)-N-(3,3",5',5"-tetra-tert-butyl-1,1':3',1"-terphenyl-5-yl)-9,9-dimethyl-9H-fluoren-2-amine (abbreviation: mmtBumTPoFBi-02), N-(4-cyclohexylphenyl)-N-(3,3",5',5"-tetra-tert-butyl-1,1':3',1"-terphenyl-5-yl)-9,9-dimethyl-9H-fluoren-2-amine (abbreviation: mmtBumTPchPAF-02), N-(biphenyl-2-yl)-N-(3",5',5"-tri-tert-butyl-1,1':3',1"-terphenyl-5-yl)-9,9-dimethyl-9H-fluoren-2-amine (abbreviation: mmtBumTPoFBi-03), N-(4-cycl ohexylphenyl)-N-(3",5',5"-tri-tert-butyl-1,1':3',1"-terphenyl-5-yl)-9,9-dimethyl-9H-fluoren-2-amine (abbreviation: mmtBumTPchPAF-03), N-(biphenyl-2-yl)-N-(3",5',5"-tri-tert-butyl-1,1':3',1"-terphenyl-4-yl)-9,9-dimethyl-9H-fluoren-2-amine (abbreviation: mmtBumTPoFBi-04), N-(4-cyclohexylphenyl)-N-(3",5',5"-tri-tert-butyl-1,1':3',1"-terphenyl-4-yl)-9,9-dimethyl-9H-fluoren-2-amine (abbreviation: mmtBumTPchPAF-04), N-(biphenyl-2-yl)-N-(3,3",5"-tri-tert-butyl-1,1':4',1"-terphenyl-5-yl)-9,9-dimethyl-9H-fluoren-2-amine (abbreviation: mmtBumTPoFBi-05), N-(4-cyclohexylphenyl)-N-(3,3",5"-tri-tert-butyl-1,1':4',1"-terphenyl-5-yl)-9,9-dimethyl-9H-fluoren-2-amine (abbreviation: mmtBumTPchPAF-05), and N-(3',5'-ditertiarybutylbiphenyl-4-yl)-N-(biphenyl-2-yl)-9,9-dimethyl-9H-fluoren-2-amine (abbreviation: mmtBuBioFBi).

Alternatively, the organic compound used for the hole-transport layer 112 preferably has a fluorene skeleton or a spirofluorene skeleton.

Alternatively, the organic compound used for the hole-transport layer 112 preferably has a carbazole skeleton.

The organic compound in the hole-transport layer 112 preferably has a HOMO level in the range of −5.45 eV to −5.20 eV, in which case a property of hole injection from the hole-injection layer or the first electrode 101 as an anode can be favorable. This enables the light-emitting element to be driven at low voltage.

The light-emitting layer 113 includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used.

Examples of the material that can be used as a fluorescent substance in the light-emitting layer 113 are as follows. Other fluorescent substances can also be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^2$]iridium(III) picolinate (abbreviation: Flrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), and bis[2-(4',6'-difluorophenyl)pyridinato-N,$C^{2'}$]iridium(III) acetylacetonate (abbreviation: FIr(acac)). These compounds emit blue phosphorescent light and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetyl acetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetyl acetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), and bis(2-phenylquinolinato-N,$C^{2'}$)iridium(III) acetyl acetonate (abbreviation: [Ir(pq)$_2$(acac)]); and a rare earth metal complex such as tris(acetylacetonato) (monophenanthroline)terbium(III) (abbreviation: [Tb(acac)$_3$(Phen)]). These are mainly compounds that emit green phosphorescent light and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6- bis(3-methylphenyl)pyrimidinato](dipivaloylmethanato)iridium(III) (abbreviation: $[Ir(5mdppm)_2(dpm)]$), and bis[4,6-di(naphthalen-1-yl)pyrimidinato](dipivaloylmethanato)iridium(III) (abbreviation: $[Ir(d1npm)_2(dpm)]$); organometallic iridium complexes having a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), and (acetylacetonato)bis[2,3-bis(4-fluorophenyl)quinoxalinato]iridium(III) (abbreviation: $[Ir(Fdpq)_2(acac)]$); organometallic iridium complexes having a pyridine skeleton, such as tris(1-phenylisoquinolinato-N,$C^{2'}$)iridium(III) (abbreviation: $[Ir(piq)_3]$) and bis(1-phenylisoquinolinato-N,$C^{2'}$)iridium(III) acetyl acetonate (abbreviation: $[Ir(piq)_2(acac)]$); platinum complexes such as 2,3,7,8,12,13,17,18-octaethyl-21H,23H-porphyrinplatinum (II) (abbreviation: PtOEP); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$). These compounds emit red phosphorescent light and have an emission peak at 600 nm to 700 nm. Furthermore, the organometallic iridium complexes having a pyrazine skeleton can provide red light emission with favorable chromaticity.

Besides the above phosphorescent compounds, known phosphorescent substances may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 15]

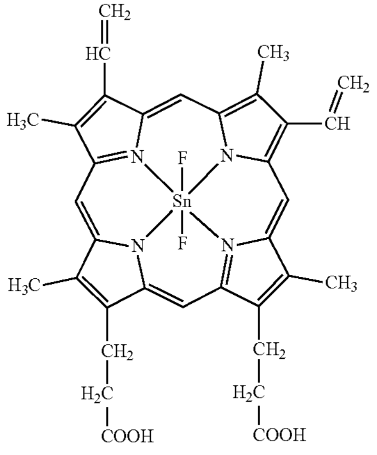

$SnF_2$(Proto IX)

-continued

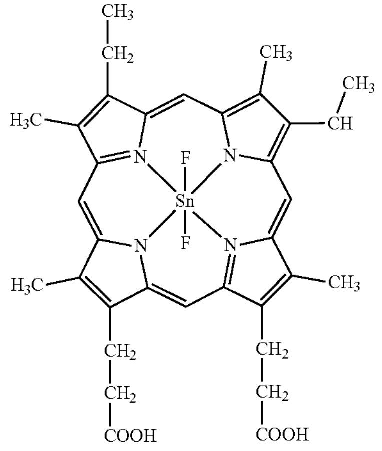

$SnF_2$(Meso IX)

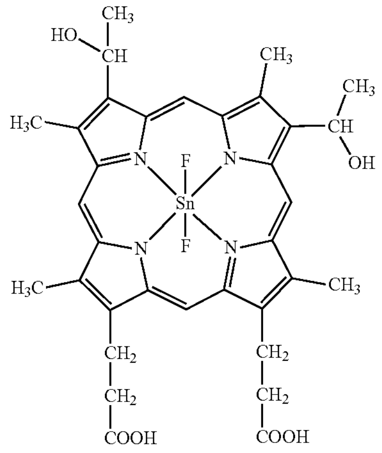

$SnF_2$(Hemato IX)

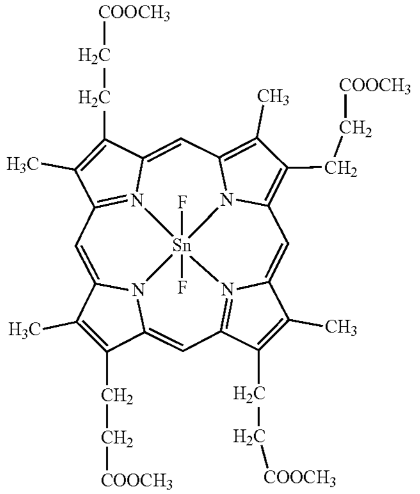

$SnF_2$(Copro III-4Me)

-continued

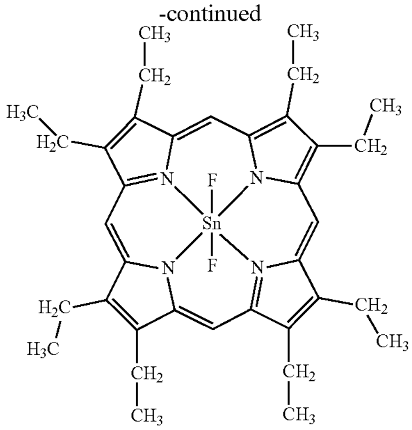

$SnF_2(OEP)$

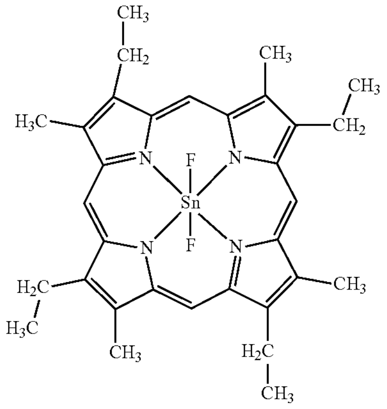

$SnF_2$(Etio I)

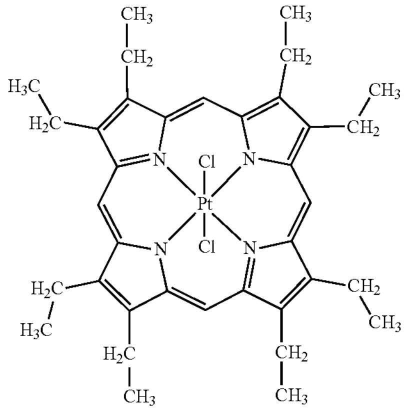

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both enhanced, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 16]
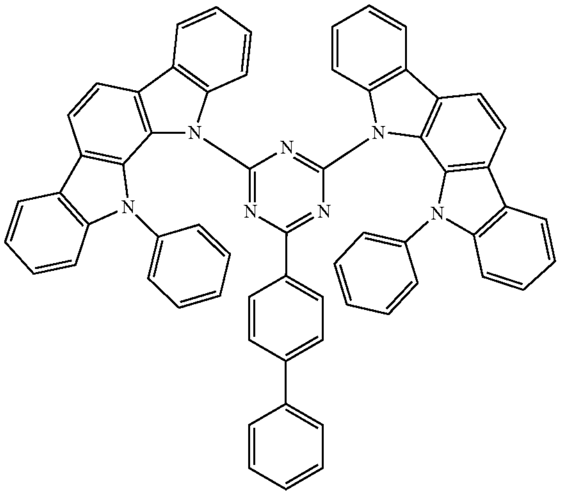
PIC-TRZ
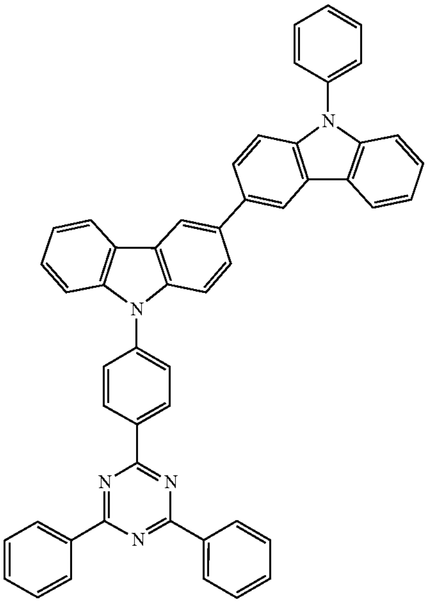
PCCzPTzn
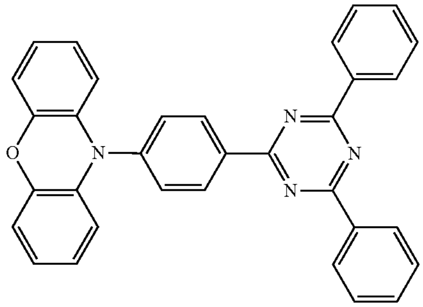
PXZ-TRZ
-continued
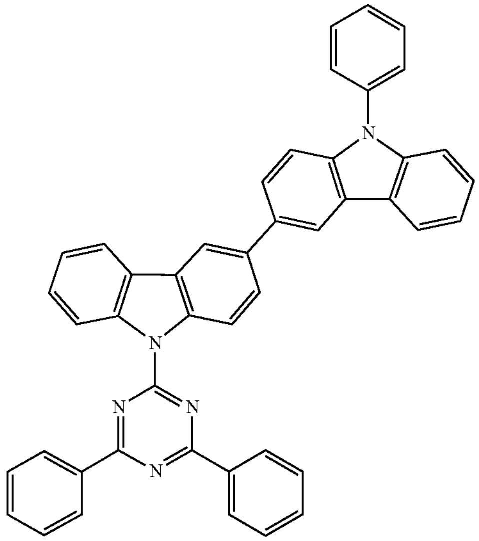
PCCzTzn
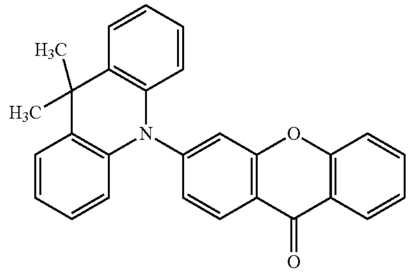
ACRXTN
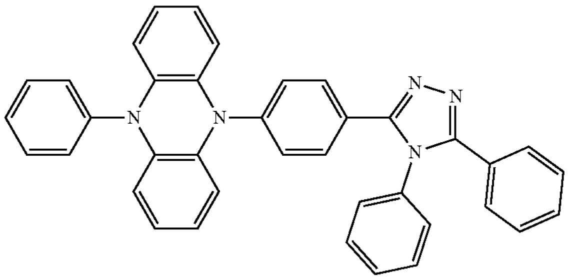
PPZ-3TPT
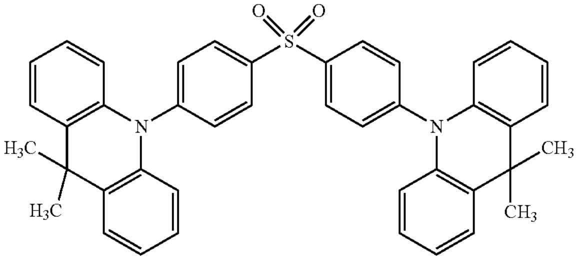
DMAC-DPS -continued

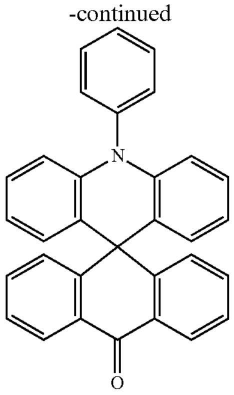

ACRSA

Note that a TADF material is a material having a small difference between the S1level and the T1level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light.

An exciplex whose excited state is formed by two kinds of substances has an extremely small difference between the S1level and the T1level and functions as a TADF material capable of converting triplet excitation energy into singlet excitation energy.

A phosphorescent spectrum observed at a low temperature (e.g., 77 K to 10 K) is used for an index of the T1level. When the level of energy with a wavelength of the line obtained by extrapolating a tangent to the fluorescent spectrum at a tail on the short wavelength side is the S1level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an amine skeleton or a π-electron rich heteroaromatic ring skeleton, for example. Examples of the material include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in drive voltage.

As the material having an electron-transport property, for example, metal complexes such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[fh]quinoxaline (abbreviation: 2mDBTPDBq-II), 2-[3'-(dibenzothiophen-4-yl)biphenyl-3-yl]dibenzo[fh]quinoxaline (abbreviation: 2mDBTBPDBq-II), 2-[3'-(9H-carbazol-9-yl)biphenyl-3-yl]dibenzo[fh]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); heterocyclic compounds having a triazine skeleton, such as 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), and 2-{3-[3-(benzo[b]naphtho[1,2-d]furan-6-yl)phenyl]phenyl}-4,6-diphenyl-1,3,5-triazine (abbreviation: mBnfBPTzn-02); and heterocyclic compounds having a pyridine skeleton, such as 3,5-bis[3-(9H-carbazol-9-yl)phenyl]pyridine (abbreviation: 35DCzPPy)

and 1,3,5-tri[3-(3-pyridyl)phenyl]benzene (abbreviation: TmPyPB). Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (e.g., pyrimidine or pyrazine) skeleton has a high electron-transport property to contribute to a reduction in drive voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting element can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency can be achieved. Furthermore, the T1level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps the wavelength on a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transport or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton, in which case the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps the wavelength on a lowest-energy-side absorption band of the light-emitting substance, in which case energy can be transferred smoothly and light emission can be obtained efficiently. Such a structure is preferably employed to reduce the drive voltage.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The electron-transport layer 114 contains a substance having an electron-transport property. As the substance having an electron-transport property, it is possible to use any of the above-listed substances having electron-transport properties that can be used as the host material.

Note that the electron-transport layer preferably includes a material having an electron-transport property and an alkali metal, an alkaline earth metal, a compound thereof, or a complex thereof. The electron mobility of the electron-transport layer 114 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level of −5.7 eV or higher and −5.4 eV or lower, in which case a long lifetime can be achieved. In this case, the material having an electron-transport property preferably has a HOMO level of −6.0 eV or higher. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof have an 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) thereof can also be used, for example. There is preferably a difference in the concentration (including 0) of the alkali metal, the alkaline earth metal, the compound thereof, or the complex thereof in the electron-transport layer in the thickness direction.

The electron-injection layer 115 is included between the electron-transport layer 114 and the second electrode 102.

The electron-injection layer 115 contains the organic compound having a basic skeleton and an acid dissociation constant pKa of greater than or equal to 1. With this electron-injection layer 115 not containing an alkali metal or a compound of an alkali metal, electron injection from the electrode to the organic compound layer can be achieved without largely increasing drive voltage. Accordingly, contamination is not caused by the photolithography step performed after formation of the electron-injection layer and the photolithography step can be performed at a position farther from the light-emitting layer; thus, a light-emitting element with more favorable characteristics can be obtained.

Note that the organic compound having an acid dissociation constant pKa of greater than or equal to 1 preferably has a basic skeleton with an acid dissociation constant pKa of greater than 10. The acid dissociation constant pKa of the basic skeleton is further preferably greater than 13, still further preferably greater than 14.

It is preferable that the organic compound having a basic skeleton and an acid dissociation constant pKa of greater than or equal to 1 be specifically an organic compound which includes a bicyclo ring structure having 2 or more nitrogen atoms in the bicyclo ring and a heteroaromatic ring having 2 to 30 carbon atoms in the ring or an aromatic hydrocarbon ring having 6 to 30 carbon atoms in the ring, and more specifically be an organic compound which includes a 1,3,4,6,7,8-hexahydro-2H-pyrimido[1,2-a]pyridine skeleton and a heteroaromatic ring having 2 to 30 carbon atoms in the ring or an aromatic hydrocarbon ring having 6 to 30 carbon atoms in the ring. An organic compound which includes a bicyclo ring structure having 2 or more nitrogen atoms in the bicyclo ring and a heteroaromatic ring having 2 to 30 carbon atoms in the ring, more specifically an organic compound which includes a 1,3,4,6,7,8-hexahydro-2H-pyrimido[1,2-a]pyridine skeleton and a heteroaromatic ring having 2 to 30 carbon atoms in the ring is further preferred.

Further specifically, the organic compound having a basic skeleton and an acid dissociation constant pKa of greater than or equal to 1 is preferably an organic compound represented by General Formula (G1) below.

[Chemical Formula 17]

(G1)

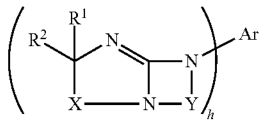

In the organic compound represented by General Formula (G1) above, X represents a group represented by General Formula (G1-1) below, and Y represents a group represented by General Formula (G1-2) below. R' and $R^2$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

[Chemical Formula 18]

(G1-1)

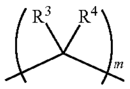

(G1-2)

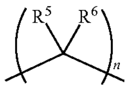

In General Formulae (G1-1) and (G1-2) above, $R^3$ to $R^6$ each independently represent hydrogen or deuterium, m represents an integer of 0 to 4, n represents an integer of 1 to 5, and $m+1 \geq n$ is satisfied. In the case where m or n is 2 or more, $R^3$s may be the same or different from each other, and the same applies to $R^4$, $R^5$, and $R^6$.

The organic compound represented by General Formula (G1) above is preferably any one of compounds represented by General Formulae (G2-1) to (G2-6) below.

[Chemical Formula 19]

(G2-1)

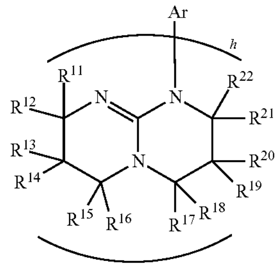

-continued (G2-2)

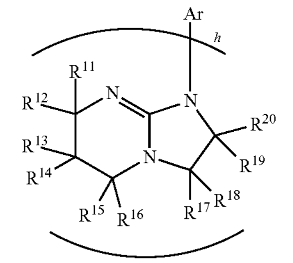

(G2-3)

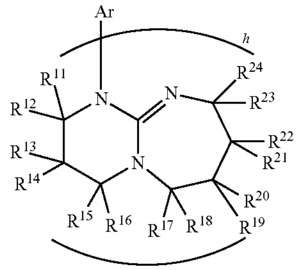

(G2-4)

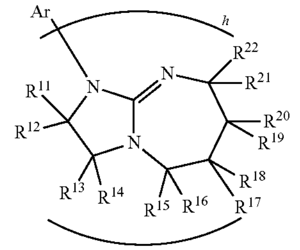

(G2-5)

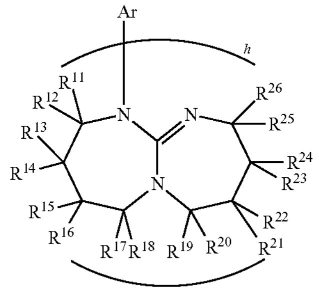

G2-6)

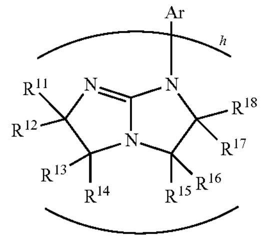

$R^{11}$ to $R^{26}$ each independently represent hydrogen or deuterium, h represents an integer of 1 to 6, and Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

In General Formula (G1) and General Formulae (G2-1) to (G2-6) above, Ar represents a substituted or unsubstituted heteroaromatic ring having 2 to 30 carbon atoms in the ring or a substituted or unsubstituted aromatic hydrocarbon ring having 6 to 30 carbon atoms in the ring. Ar is preferably the substituted or unsubstituted heteroaromatic ring having 2 to 30 carbon atoms in the ring.

In General Formula (G1) and General Formulae (G2-1) to (G2-6) above, the substituted or unsubstituted heteroaromatic ring having 2 to 30 carbon atoms in the ring that is represented by Ar is specifically a pyridine ring, a bipyridine ring, a pyrimidine ring, a bipyrimidine ring, a pyrazine ring, a bipyrazine ring, a triazine ring, a quinoline ring, an isoquinoline ring, a benzoquinoline ring, a phenanthroline ring, a quinoxaline ring, a benzoquinoxaline ring, a dibenzoquinoxaline ring, an azofluorene ring, a diazofluorene ring, a carbazole ring, a benzocarbazole ring, a dibenzocarbazole ring, a dibenzofuran ring, a benzonaphthofuran ring, a dinaphthofuran ring, a dibenzothiophene ring, a benzonaphthothiophene ring, a dinaphthothiophene ring, a benzofuropyridine ring, a benzofuropyrimidine ring, a benzothiopyridine ring, a benzothiopyrimidine ring, a naphthofuropyridine ring, a naphthofuropyrimidine ring, a naphthothiopyridine ring, a naphthothiopyrimidine ring, an acridine ring, a xanthene ring, a phenothiazine ring, a phenoxazine ring, a phenazine ring, a triazole ring, an oxazole ring, an oxadiazole ring, a thiazole ring, a thiadiazole ring, an imidazole ring, a benzimidazole ring, a pyrazole ring, a pyrrole ring, or the like. In General Formula (G1) and General Formulae (G2-1) to (G2-6) above, the substituted or unsubstituted aromatic hydrocarbon ring having 6 to 30 carbon atoms in the ring that is represented by Ar is specifically a benzene ring, a naphthalene ring, a fluorene ring, a dimethylfluorene ring, a diphenylfluorene ring, a spirofluorene ring, an anthracene ring, a phenanthrene ring, a triphenylene ring, a pyrene ring, a tetracene ring, a chrysene ring, a benzo[a]anthracene ring, or the like. Ar is especially preferably the ring represented by any one of Structural Formulae (Ar-1) to (Ar-27) below.

[Chemical Formula 20]

(Ar-1)

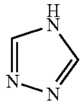

(Ar-2)

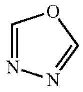

(Ar-3)

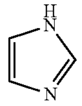

(Ar-4)

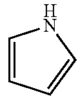

(Ar-5)

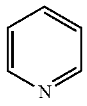

(Ar-6)

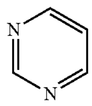

-continued (Ar-7)

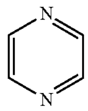

(Ar-8)

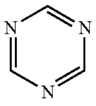

(Ar-9)

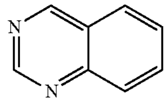

(Ar-10)

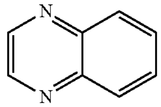

(Ar-11)

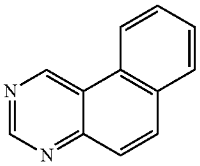

(Ar-12)

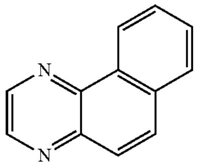

(Ar-13)

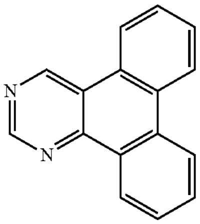

(Ar-14)

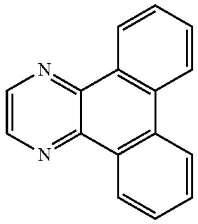

(Ar-15)

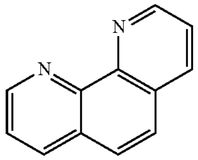

(Ar-16)

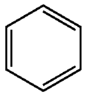

-continued (Ar-17)

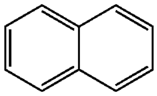

(Ar-18)

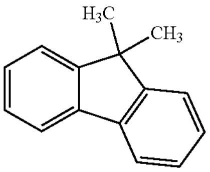

(Ar-19)

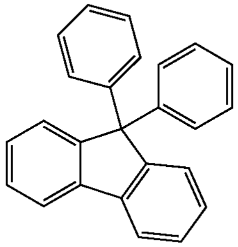

(Ar-20)

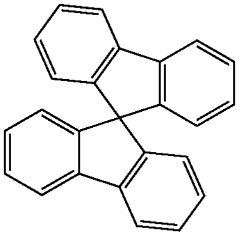

(Ar-21)

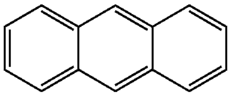

(Ar-22)

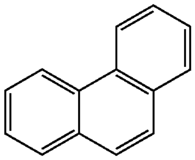

(Ar-23)

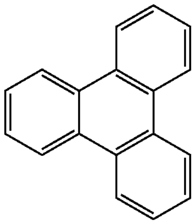

(Ar-24)

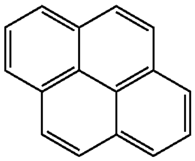

(Ar-25)

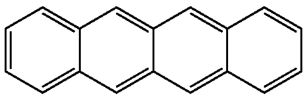

-continued (Ar-26)

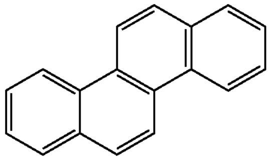

(Ar-27)

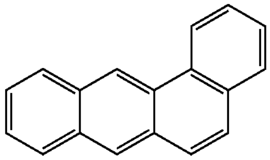

Note that Ar preferably has a nitrogen atom in its ring and is preferably bonded to the skeleton within parentheses in General Formula (G1) above by a bond of the nitrogen atom or a carbon atom adjacent to the nitrogen atom.

As specific examples of the organometallic compounds represented by General Formula (G1) and General Formulae (G2-1) to (G2-6) above, organic compounds represented by Structural Formulae (100) to (117) below, such as 1,1'-pyridine-2,6-diyl-bis(1,3,4,6,7,8-hexahydro-2H-pyrimido[1,2-a]pyrimidine) (abbreviation: hpp2Py) (Structural Formula 100), 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) (Structural Formula 108), and 1-(9,9'-spirobi[9H-fluoren]-2-yl)-1,3,4,6,7,8-hexahydro-2H-pyrimido[1,2-a]pyrimidine (abbreviation: 2hppSF) (Structural Formula 109), can be given.

[Chemical Formula 21]

(100)

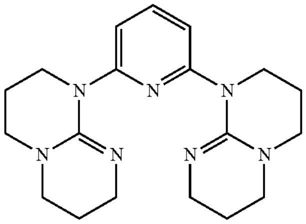

(101)

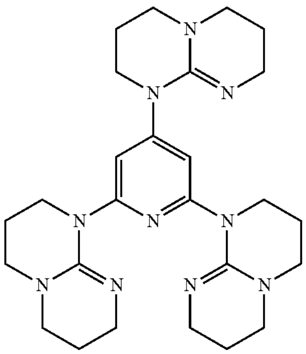

-continued
(102)
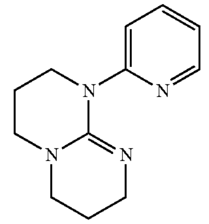
(103)
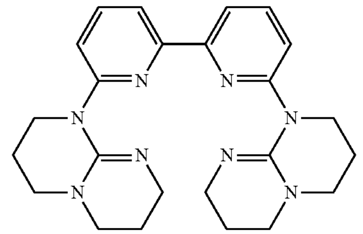
(104)
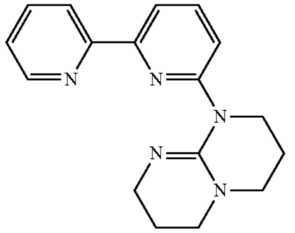
(105)
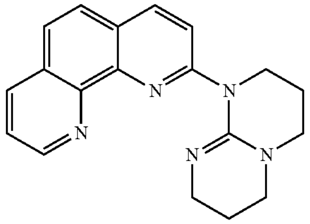
(106)
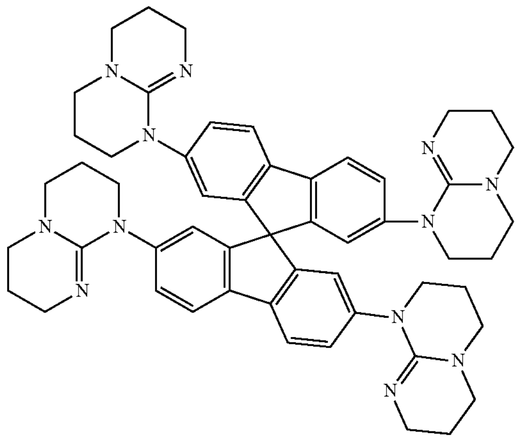
-continued
(107)
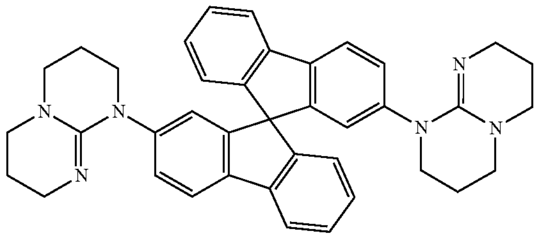
(108)
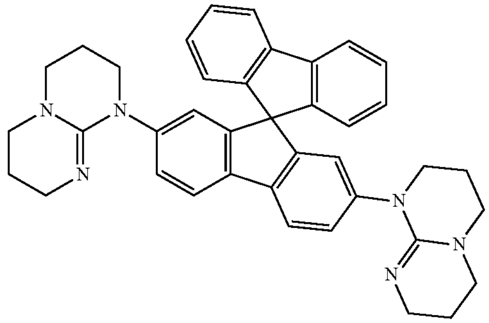
(109)
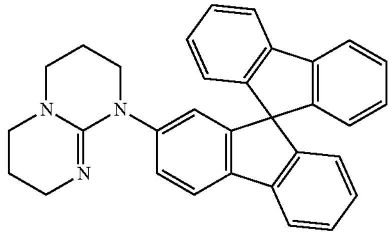
(110)
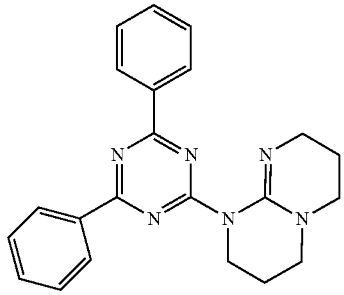
(111)
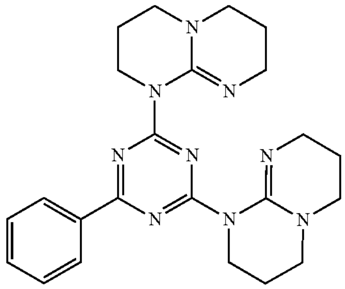

-continued (112)

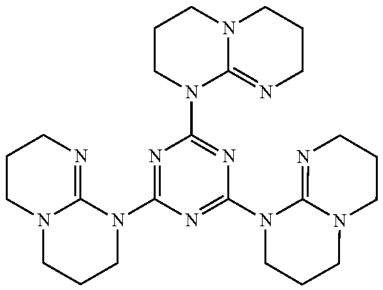

(113)

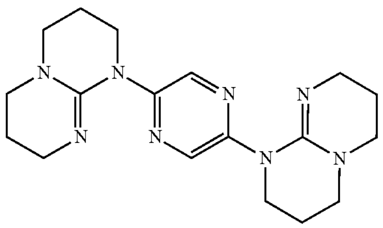

(114)

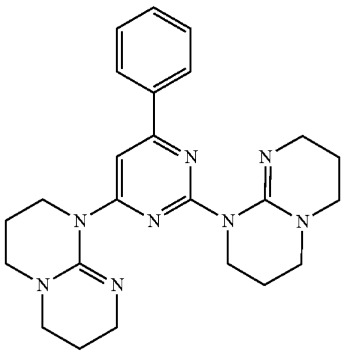

(115)

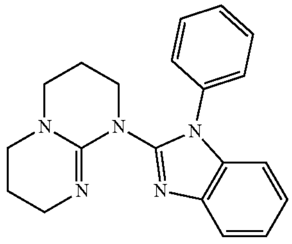

(116)

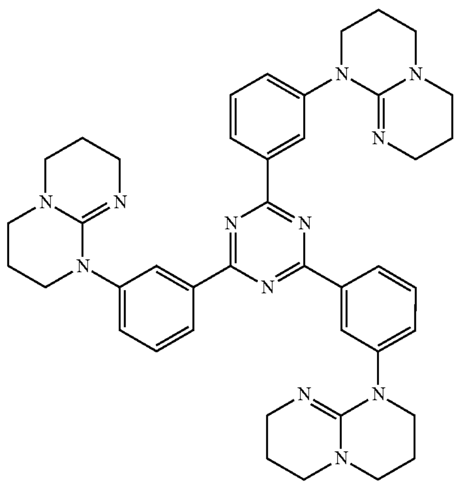

-continued (117)

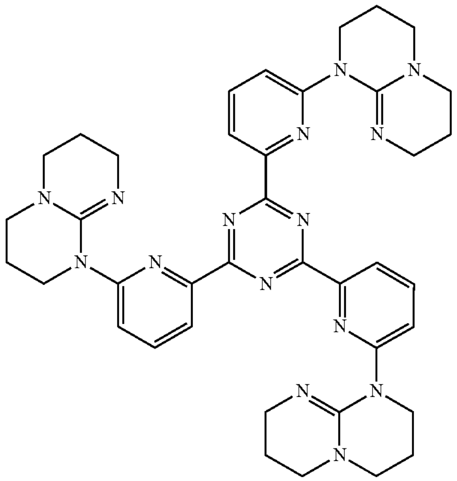

As a substance forming the second electrode 102, a metal, an alloy, an electrically conductive compound, or a mixture thereof each having a low work function (specifically, lower than or equal to 3.8 eV) or the like can be used. Specific examples of such a cathode material include elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the second electrode 102 and the electron-transport layer, a variety of conductive materials such as Al, Ag, ITO, or indium oxide-tin oxide containing silicon or silicon oxide can be used for the second electrode 102 regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Figure 6:
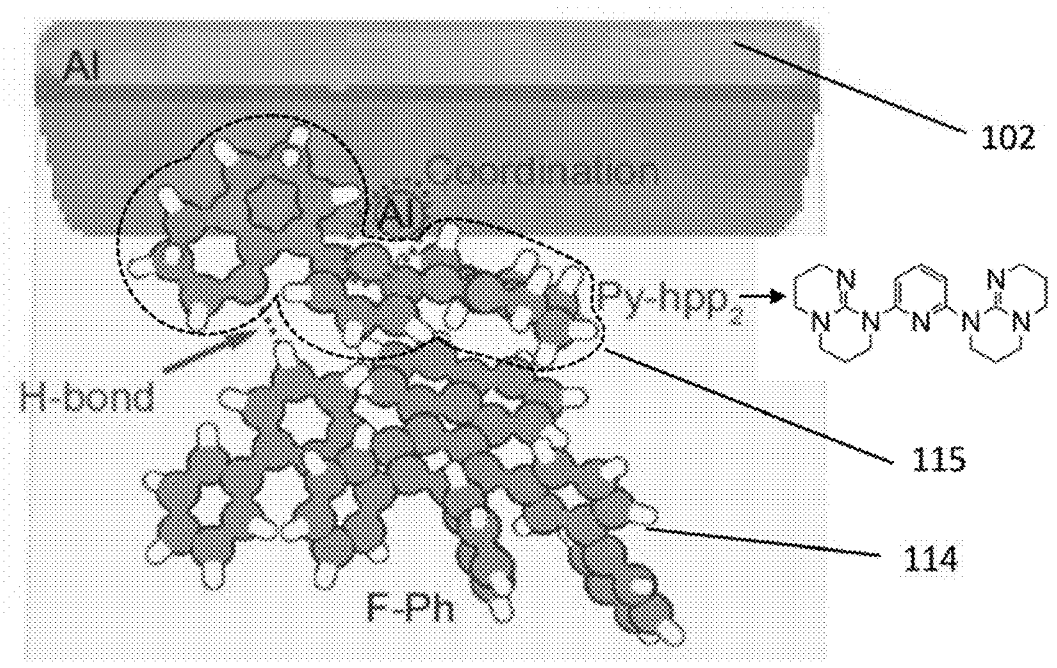
FIG. 6 illustrates an interaction between an organic compound represented by General Formula (G1) and aluminum.

Note that the second electrode 102 is preferably aluminum. Alternatively, the second electrode may have a stacked-layer structure in which the layer in contact with the electron-injection layer 115 is aluminum. Aluminum contained in the second electrode 102 that is in contact with the electron-injection layer 115 and the organic compound represented by General Formula (G1) above interact with each other as illustrated in FIG. 6 to improve the electron injection property, leading to a lower drive voltage of the light-emitting element.

In the case of a top-emission display device, the thickness of the layer containing aluminum is preferably less than or equal to 1 nm, further preferably less than or equal to 0.5 nm, and the other layers are preferably formed using visible-light-transmitting conductive films.

Furthermore, any of a variety of methods can be used for forming the organic compound layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to inhibit quenching due to the proximity of the light-emitting region and a metal used for electrodes or carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting element with a structure in which a plurality of light-emitting units are stacked (this type of light-emitting element is also referred to as a stacked or tandem element) is described with reference to FIG. 5B. This light-emitting element includes a plurality of light-emitting units between an anode and a cathode. One light-emitting unit has substantially the same structure as the organic compound layer 103 illustrated in FIG. 5A. In other words, the light-emitting element illustrated in FIG. 5B includes a plurality of light-emitting units, and the light-emitting element illustrated in FIG. 5A includes a single light-emitting unit.

In FIG. 5B, a first light-emitting unit 511 and a second light-emitting unit 512 are stacked between the first electrode 101 and the second electrode 102, and a charge-generation layer 513 is provided between the first light-emitting unit 511 and the second light-emitting unit 512. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when voltage is applied between the first electrode 101 and the second electrode 102. That is, in FIG. 5B, the charge-generation layer 513 injects electrons into the first light-emitting unit 511 and holes into the second light-emitting unit 512 when voltage is applied such that the potential of the anode becomes higher than the potential of the cathode.

The charge-generation layer 513 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the first light-emitting unit 511 and holes are injected into the second light-emitting unit 512; thus, the light-emitting element operates.

Note that the charge-generation layer 513 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the acceptor substance in the p-type layer 117 and the LUMO level of a substance contained in a layer of the first light-emitting unit that is in contact with the charge-generation layer 513. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)).

As the electron-injection buffer layer 119, a material similar to the above-described material for the electron-injection layer 115 can be used. In this case, processing of the charge-generation layer 513 is free from contamination by a metal or the like, whereby a light-emitting element with favorable characteristics can be provided.

In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side; thus, an electron-injection layer is not necessarily formed in the light-emitting unit on the anode side.

The light-emitting element having two light-emitting units is described with reference to FIG. 5B; however, one embodiment of the present invention can also be applied to a light-emitting element in which three or more light-emitting units are stacked. With a plurality of light-emitting units partitioned by the charge-generation layer 513 between a pair of electrodes, it is possible to provide a long-life element that can emit light with high luminance at a low current density. A display device that can be driven at a low voltage and has low power consumption can be provided.

When the emission colors of the light-emitting units are different, light emission of a desired color can be obtained from the light-emitting element as a whole. For example, in a light-emitting element having two light-emitting units, the emission colors of the first light-emitting unit may be red and green and the emission color of the second light-emitting unit may be blue, so that the light-emitting element can emit white light as the whole.

The above-described layers and electrodes such as the organic compound layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

The structure of this embodiment can be used in combination with any of the other structures as appropriate.

Embodiment 3

Figure 2A:
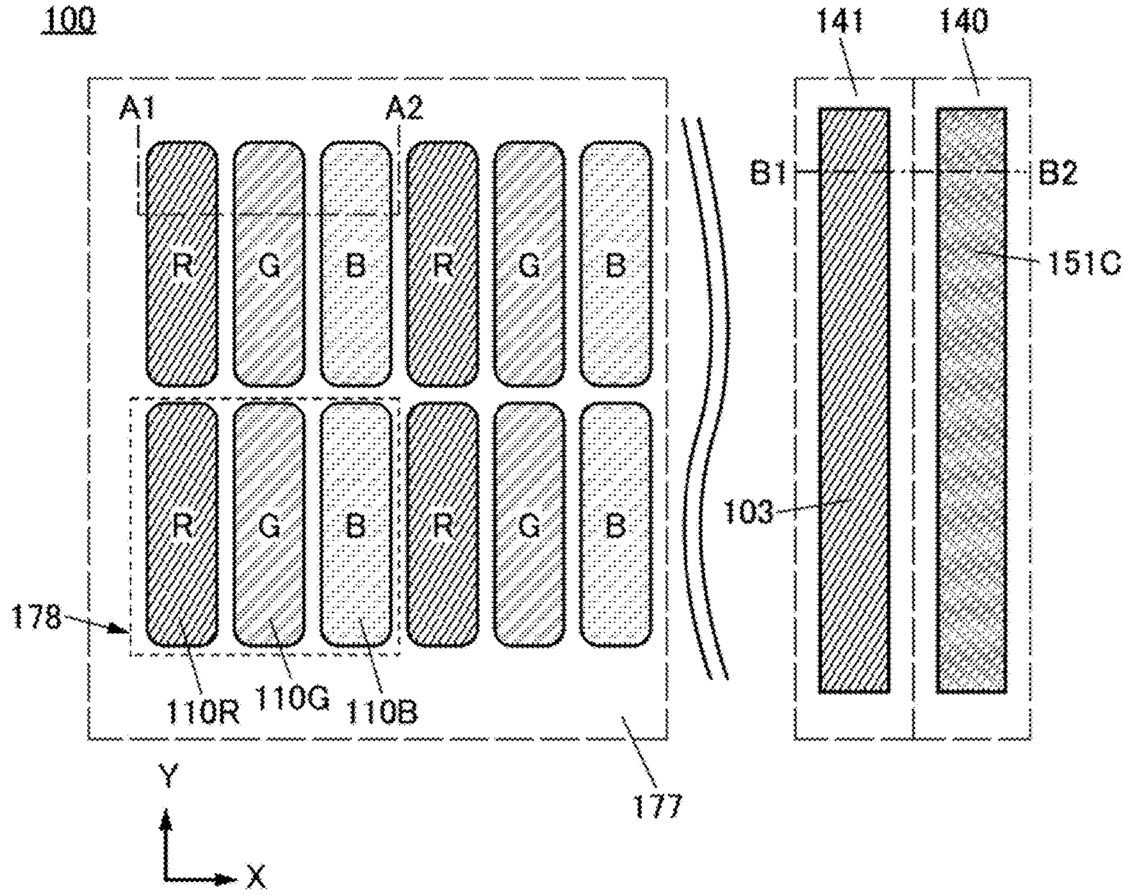
FIGS. 2A and 2B are a top view and a cross-sectional view of a display device.
Figure 2B:
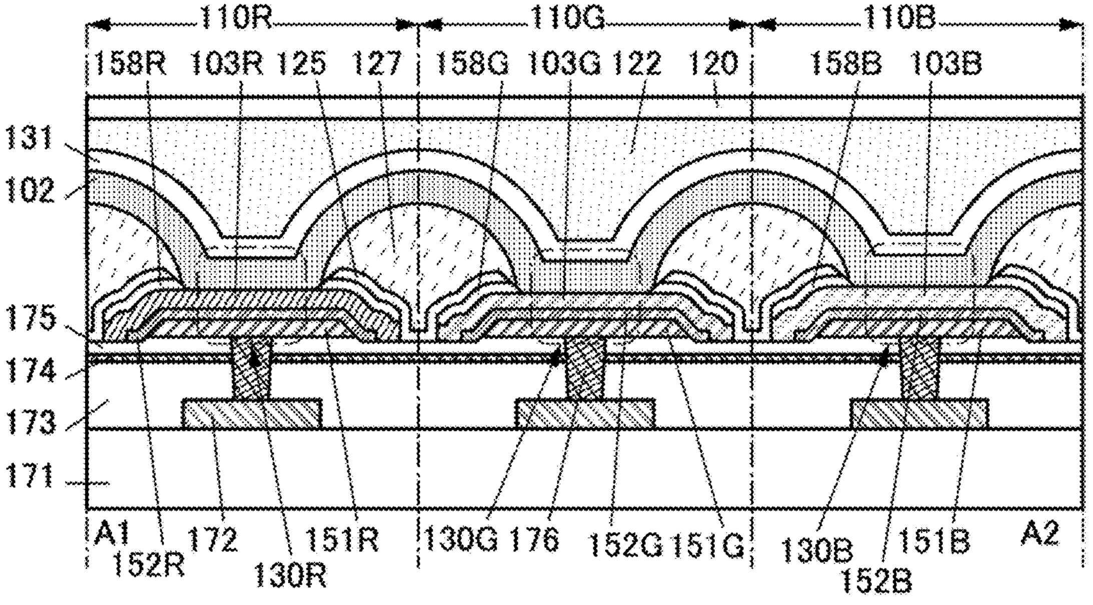

As illustrated in FIGS. 2A and 2B, a plurality of the light-emitting elements 130 are formed over the insulating layer 175 to constitute a display device. In this embodiment, the display device of one embodiment of the present invention will be described in detail.

A display device 100 includes a pixel portion 177 in which a plurality of pixels 178 are arranged in matrix. The pixel 178 includes a subpixel 110R, a subpixel 110G, and a subpixel 110B. FIG. 2A illustrates subpixels 110 arranged in two rows and six columns, which form pixels 178 in two rows and two columns.

In this specification and the like, for example, description common to the subpixels 110R, 110G, and 110B is sometimes made using the collective term "subpixel 110". As for other components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. The pixel portion 177 can therefore be referred to as a display portion. Note that in this embodiment, three colors of red (R), green (G), and blue (B) are given as examples of colors of light emitted by subpixels; however, the subpixels may emit light of three colors of yellow (Y), cyan (C), and magenta (M), for example. The number of types of subpixels is not limited to three, and four or more types of subpixels may be used. Examples of four subpixels include subpixels emitting light of four colors of R, G, B, and white (W), subpixels emitting light of four colors of R, G, B, and Y, and four subpixels emitting light of R, G, and B and infrared light (IR).

It can also be said that stripe arrangement is employed for the pixels 178 illustrated in FIGS. 2A and 2B. Note that the arrangement applicable to the pixels 178 is not limited thereto; another arrangement such as a stripe, S-stripe, delta, Bayer, zigzag, pentile, or diamond arrangement can also be employed.

In this specification and the like, the row direction and the column direction are sometimes referred to as the X direction and the Y direction, respectively. The X direction and the Y direction intersect with each other and are perpendicular to each other, for example.

FIG. 2A illustrates an example where subpixels of different colors are arranged in the X direction and subpixels of the same color are arranged in the Y direction. Note that subpixels of different colors may be arranged in the Y direction, and subpixels of the same color may be arranged in the X direction.

A region 141 and a connection portion 140 are provided outside the pixel portion 177, and the region 141 is positioned between the pixel portion 177 and the connection portion 140. The organic compound layer 103 is provided in the region 141. A conductive layer 151C is provided in the connection portion 140.

Although FIG. 2A illustrates an example where the region 141 and the connection portion 140 are positioned on the right side of the pixel portion 177, the positions of the region 141 and the connection portion 140 are not particularly limited. The region 141 and the connection portion 140 are provided in at least one of the upper side, the right side, the left side, and the lower side of the pixel portion 177, and may be provided so as to surround the four sides of the pixel portion 177. The top surface shape of the region 141 and the connection portion 140 can be a belt-like shape, an L shape, a U shape, a frame-like shape, or the like. The number of regions 141 and the number of connection portions 140 can each be one or more.

FIG. 2B is a cross-sectional view along the dashed-dotted line A1-A2 in FIG. 2A and illustrates a structure example of the pixel 178 provided in the pixel portion 177. As illustrated in FIG. 2B, the display device 100 includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is provided over a substrate (not illustrated). An opening reaching the conductive layer 172 is provided in the insulating layers 175, 174, and 173, and a plug 176 is provided to fill the opening.

In the pixel portion 177, the light-emitting element 130 is provided over the insulating layer 175 and the plug 176. A protective layer 131 is provided to cover the light-emitting element 130. A substrate 120 is bonded to the protective layer 131 with a resin layer 122. An insulating layer 125 and the insulating layer 127 over the insulating layer 125 are provided between the adjacent light-emitting elements 130.

Although FIG. 2B shows cross sections of a plurality of the insulating layers 125 and a plurality of the insulating layers 127, the insulating layers 125 are connected to each other and the insulating layers 127 are connected to each other when the display device 100 is seen from above. In other words, the display device 100 can be configured to include one insulating layer 125 and one insulating layer 127, for example. The insulating layer 127 can be regarded as an insulating layer that includes opening portions over the pixel electrodes (first electrodes) of the light-emitting elements. Note that the display device 100 may include the plurality of insulating layers 125 that are separated from each other and the plurality of insulating layers 127 that are separated from each other.

In FIG. 2B, a light-emitting element 130R, a light-emitting element 130G, and a light-emitting element 130B are shown as the light-emitting element 130. The light-emitting elements 130R, 130G, and 130B emit light of different colors. For example, the light-emitting element 130R can emit red light, the light-emitting element 130G can emit green light, and the light-emitting element 130B can emit blue light. Alternatively, the light-emitting element 130R, the light-emitting element 130G, or the light-emitting element 130B may emit cyan light, magenta light, yellow light, white light, infrared light, or the like.

The display device of one embodiment of the present invention can be, for example, a top-emission display device where light is emitted in the direction opposite to a substrate over which light-emitting elements are formed. Note that the display device of one embodiment of the present invention may be of a bottom emission type.

Examples of a light-emitting substance included in the light-emitting element 130 include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material).

The light-emitting element 130R includes a conductive layer 151R over the plug 176 and the insulating layer 175, a conductive layer 152R covering the top surface and the side surface of the conductive layer 151R, an organic compound layer 103R covering the top surface and the side surface of the conductive layer 152R, and the second electrode (common electrode) 102 over the organic compound layer 103R. Here, the conductive layers 151R and 152R form a pixel electrode of the light-emitting element 130R.

The light-emitting element 130G includes a conductive layer 151G over the plug 176 and the insulating layer 175, a conductive layer 152G covering the top surface and the side surface of the conductive layer 151G, an organic compound layer 103G covering the top surface and the side surface of the conductive layer 152G, and the second electrode 102 over the organic compound layer 103G. Here, the conductive layers 151G and 152G form a pixel electrode of the light-emitting element 130G.

The light-emitting element 130B includes a conductive layer 151B over the plug 176 and the insulating layer 175, a conductive layer 152B covering the top surface and the side surface of the conductive layer 151B, an organic compound layer 103B covering the top surface and the side surface of the conductive layer 152B, and the second electrode 102 over the organic compound layer 103B. Here, the conductive layers 151B and 152B form a pixel electrode of the light-emitting element 130B.

In the light-emitting element, one of the pixel electrode and the common electrode functions as an anode and the other functions as a cathode. Hereinafter, the pixel electrode may function as the anode and the common electrode may function as the cathode unless otherwise specified.

Each of the organic compound layers 103R, 103G, and 103B includes at least a light-emitting layer. For example, the organic compound layer 103R, the organic compound layer 103G, and the organic compound layer 103B can respectively include a light-emitting layer that emits red light, a light-emitting layer that emits green light, and a light-emitting layer that emits blue light. The organic compound layer 103R, the organic compound layer 103G, or the organic compound layer 103B may emit cyan light, magenta light, yellow light, white light, infrared light, or the like.

The organic compound layers 103R, the organic compound layers 103G, and the organic compound layers 103B are island-shaped layers that are independent of each other. Alternatively, an organic compound layer of the light-emitting elements of one emission color may be independent of an organic compound layer of the light-emitting elements of another emission color. Providing the island-shaped organic compound layer 103 in each of the light-emitting elements 130 can suppress a leakage current between the adjacent light-emitting elements 130. This can prevent crosstalk, so that a display device with extremely high contrast can be obtained. Specifically, a display device having high current efficiency at low luminance can be obtained.

The island-shaped organic compound layer 103 can be formed by forming an EL film and processing the EL film by a photolithography technique.

The organic compound layer 103 is preferably provided to cover the top surface and the side surface of the pixel electrode of the light-emitting element 130. In this case, the aperture ratio of the display device 100 can be easily increased as compared to the structure where the end portion of the organic compound layer 103 is positioned inward from the end portion of the pixel electrode. Covering the side surface of the pixel electrode of the light-emitting element 130 with the organic compound layer 103 can inhibit the pixel electrode from being in contact with the second electrode 102; hence, a short circuit of the light-emitting element 130 can be inhibited. Furthermore, the distance between the light-emitting region (i.e., the region overlapping the pixel electrode) in the organic compound layer 103 and the end portion of the organic compound layer 103 can be increased. Since the end portion of the organic compound layer 103 might be damaged by processing, using a region that is away from the end portion of the organic compound layer 103 as the light-emitting region may increase the reliability of the light-emitting element 130.

In the display device of one embodiment of the present invention, the pixel electrode (the first electrode) of the light-emitting element is preferably a stack of a plurality of layers. For example, in the example illustrated in FIG. 2B, the pixel electrode of the light-emitting element 130 is a stack of the conductive layer 151 and the conductive layer 152. In the case where the display device 100 is of a top emission type and the pixel electrode of the light-emitting element 130 functions as an anode, for example, the conductive layer 151 can have higher visible light reflectance than the conductive layer 152, and the conductive layer 152 can have a visible-light-transmitting property and a work function higher than that of the conductive layer 151. In the case where the display device 100 is of a top emission type, the higher the visible light reflectance of the pixel electrode is, the higher the efficiency of extraction of the light emitted by the organic compound layer 103 is. In the case where the pixel electrode functions as an anode, the higher the work function of the pixel electrode is, the easier it is to inject holes into the organic compound layer 103. Accordingly, when the pixel electrode of the light-emitting element 130 is a stack of the conductive layer 151 with high visible light reflectance and the conductive layer 152 with a high work function, the light-emitting element 130 can have high light extraction efficiency and a low drive voltage.

In the case where the conductive layer 151 has higher visible light reflectance than the conductive layer 152, the visible light reflectance of the conductive layer 151 is preferably higher than or equal to 40% and lower than or equal to 100%, further preferably higher than or equal to 70% and lower than or equal to 100%, for example. The conductive layer 152 can be a transparent electrode and can have a visible light transmittance of, for example, higher than or equal to 40%.

The conductive layer 151 of the light-emitting element 130 has high reflectance with respect to the light emitted by the organic compound layer 103. For example, in the case where the organic compound layer 103 emits infrared light, the conductive layer 151 can have high reflectance with respect to infrared light. In the case where the pixel electrode of the light-emitting element 130 functions as a cathode, the conductive layer 152 preferably has a lower work function than the conductive layer 151, for example.

On the other hand, such a pixel electrode being a stack of a plurality of layers might change in quality as a result of, for example, a reaction occurring between the plurality of layers. For example, in the case where a film formed after formation of the pixel electrode is removed by a wet etching method in manufacture of the display device 100, a chemical solution sometimes comes into contact with the pixel electrode. In the pixel electrode being a stack of a plurality of layers, contact of the plurality of layers with a chemical solution might cause galvanic corrosion. As a result, at least one layer of the pixel electrode sometimes changes in quality. This might reduce the yield of the display device and increase the manufacturing cost thereof. Moreover, the reliability of the display device is lowered in some cases.

In view of the above, the conductive layer 152 is formed to cover the top surface and the side surface of the conductive layer 151 in the display device 100. This can inhibit a chemical solution from coming into contact with the conductive layer 151 when a film that is formed after formation of the pixel electrode including the conductive layer 151 and the conductive layer 152 is removed by a wet etching method, for example. Accordingly, occurrence of galvanic corrosion in the pixel electrode can be inhibited, for example. This allows the display device 100 to be manufactured by a high-yield method and to be accordingly inexpensive. In addition, generation of a defect in the display device 100 can be inhibited, which makes the display device 100 highly reliable.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, indium tin oxide containing silicon can be suitably used for the conductive layer 152 because of having a work function of higher than or equal to 4.0 eV, for example.

The conductive layer 151 and the conductive layer 152 may each be a stack of a plurality of layers containing different materials. In this case, the conductive layer 151 may include a layer formed using a material that can be used for the conductive layer 152, such as a conductive oxide. Furthermore, the conductive layer 152 may include a layer formed using a material that can be used for the conductive layer 151, such as a metal material. In the case where the conductive layer 152 is a stack of two or more layers, for example, a layer in contact with the conductive layer 151 can be formed using a material that can be used for the conductive layer 151, such as a metal material.

The conductive layer 151 preferably has a side surface with a tapered shape. Specifically, the side surface of the conductive layer 151 preferably has a tapered shape with a taper angle of less than 90°. In this case, the conductive layer 152 provided along the side surface of the conductive layer 151 also has a tapered shape. Accordingly, the organic compound layer 103 provided along the side surface of the conductive layer 152 also has a tapered shape. When the side surface of the conductive layer 152 has a tapered shape, coverage with the organic compound layer 103 provided along the side surface of the conductive layer 152 can be improved.

FIG. 1 illustrates the case where the conductive layer 151 has a stacked-layer structure of a plurality of layers containing different materials. As illustrated in FIG. 1, the conductive layer 151 includes a conductive layer 151*a*, a conductive layer 151*b* over the conductive layer 151*a*, and a conductive layer 151*c* over the conductive layer 151*b*. In other words, the conductive layer 151 illustrated in FIG. 1 has a three-layer structure. In the case where the conductive layer 151 is a stack of a plurality of layers as described above, the visible light reflectance of at least one of the layers included in the conductive layer 151 is made higher than that of the conductive layer 152.

In the example illustrated in FIG. 1, the conductive layer 151*b* is interposed between the conductive layers 151*a* and 151*c*. A material that is less likely to change in quality than the conductive layer 151*b* is preferably used for the conductive layers 151*a* and 151*c*. The conductive layer 151*a* can be formed using, for example, a material that is less likely to migrate owing to contact with the insulating layer 175 than the material for the conductive layer 151*b*. The conductive layer 151*c* can be formed using a material an oxide of which has lower electrical resistivity than an oxide of the material used for the conductive layer 151*b* and which is less likely to be oxidized than the conductive layer 151*b*.

In this manner, the structure in which the conductive layer 151*b* is interposed between the conductive layers 151*a* and 151*c* can expand the range of choices for the material for the conductive layer 151*b*. The conductive layer 151*b*, for example, can thus have higher visible light reflectance than at least one of the conductive layers 151*a* and 151*c*. For example, aluminum can be used for the conductive layer 151*b*. The conductive layer 151*b* may be formed using an alloy containing aluminum. The conductive layer 151*a* can be formed using titanium; titanium has lower visible light reflectance than aluminum but is less likely to migrate by contact with the insulating layer 175 than aluminum. Furthermore, the conductive layer 151*c* can be formed using titanium; titanium is less likely to be oxidized than aluminum and an oxide of titanium has lower electrical resistivity than aluminum oxide, although titanium has lower visible light reflectance than aluminum.

The conductive layer 151*c* may be formed using silver or an alloy containing silver. Silver is characterized by its visible light reflectance higher than that of titanium. In addition, silver is characterized by being less likely to be oxidized than aluminum, and silver oxide is characterized by its electrical resistivity lower than that of aluminum oxide. Thus, the conductive layer 151*c* formed using silver or an alloy containing silver can suitably increase the visible light reflectance of the conductive layer 151 and inhibit an increase in the electric resistance of the pixel electrode due to oxidation of the conductive layer 151*b*. Here, as the alloy containing silver, an alloy of silver, palladium, and copper (also referred to as Ag—Pd—Cu or APC) can be used, for example. When the conductive layer 151*c* is formed using silver or an alloy containing silver and the conductive layer 151*b* is formed using aluminum, the visible light reflectance of the conductive layer 151*c* can be higher than that of the conductive layer 151*b*. Here, the conductive layer 151*b* may be formed using silver or an alloy containing silver. The conductive layer 151*a* may be formed using silver or an alloy containing silver.

Meanwhile, a film formed using titanium has better processability in etching than a film formed using silver. Thus, use of titanium for the conductive layer 151*c* can facilitate formation of the conductive layer 151*c*. Note that a film formed using aluminum also has better processability in etching than a film formed using silver.

The conductive layer 151 having a stacked-layer structure of a plurality of layers as described above can improve the characteristics of the display device. For example, the display device 100 can have high light extraction efficiency and high reliability.

Here, in the case where the light-emitting element 130 has a microcavity structure, use of silver or an alloy containing silver, i.e., a material with high visible light reflectance, for the conductive layer 151*c* can favorably increase the light extraction efficiency of the display device 100.

As already described above, the conductive layer 151 preferably has a side surface with a tapered shape. Specifically, the side surface of the conductive layer 151 preferably has a tapered shape with a taper angle of less than 90°. For example, in the conductive layer 151 illustrated in FIG. 1, the side surface of at least one of the conductive layer 151*a*, the conductive layer 151*b*, and the conductive layer 151*c* preferably has a tapered shape.

The conductive layer 151 shown in FIG. 1 can be formed by a photolithography technique. Specifically, first, a conductive film to be the conductive layer 151*a*, a conductive film to be the conductive layer 151*b*, and a conductive film to be the conductive layer 151*c* are sequentially formed. Next, a resist mask is formed over the conductive film to be the conductive layer 151*c*. Then, the conductive films in the region not overlapped by the resist mask are removed by etching. Here, when the conductive films are processed under conditions where the resist mask is easily recessed (reduced in size) as compared to the case where the conductive layer 151 is formed such that the side surface does not have a tapered shape (i.e., the conductive layer 151 is formed to have a perpendicular side surface), the side surface of the conductive layer 151 can have a tapered shape.

Here, when the conductive films are processed under conditions where the resist mask is easily recessed (reduced in size), the conductive films might be easily processed in the horizontal direction. That is, the etching sometimes becomes less anisotropic, i.e., more isotropic, than in the case where the conductive layer 151 is formed to have a perpendicular side surface, for example. In the case where the conductive layer 151 is a stack of a plurality of layers and is formed to have a side surface with a tapered shape, the plurality of layers are sometimes different in readiness to be processed in the horizontal direction. For example, the conductive layer 151*a*, the conductive layer 151*b*, and the conductive layer 151*c* are sometimes different in readiness to be processed in the horizontal direction. The conductive layer 151*b* is more readily processed in the horizontal direction than the conductive layers 151*a* and 151*c* in some cases, for example. In the case where the conductive layers 151*a* and 151*c* are formed using titanium, silver, or an alloy containing silver and the conductive layer 151*b* is formed using aluminum, for example, the conductive layer 151*b* is sometimes more readily processed in the horizontal direction than the conductive layers 151*a* and 151*c*. In this case, as illustrated in FIG. 1, the side surface of the conductive layer 151*b* is sometimes positioned inward from the side surface of the conductive layers 151*a* in a cross-sectional view. In some cases, the side surface of the conductive layer 151*c* is positioned outward from the side surface of the conductive layer 151*b*. As a result, the conductive layer 151*c* might have a protruding portion 121 (see FIG. 7B2) that is a region extending beyond the side surface of the conductive layer 151*b*. This might impair coverage of the conductive layer 151 with the conductive layer 152 to cause a step-cut in the conductive layer 152.

In view of this, an insulating layer 156 is provided to include a region overlapping the side surface of the conductive layer 151, in one embodiment of the present invention. FIG. 1 illustrates an example in which the insulating layer 156 is provided over the conductive layer 151*a* to include a region overlapping the side surface of the conductive layer 151*b*. In this case, occurrence of a step-cut in the conductive layer 152 can be inhibited, which inhibits poor connection. The conductive layer 152 can also be inhibited from being locally thinned and thereby having increased electric resistance. As described above, the display device 100 can be manufactured by a high-yield method. Moreover, the display device 100 can have high reliability since generation of defects is inhibited therein. Although FIG. 1 illustrates the structure in which the side surface of the conductive layer 151*b* is entirely covered with the insulating layer 156, one embodiment of the present invention is not limited thereto. For example, part of the side surface of the conductive layer 151*b* is not necessarily covered with the insulating layer 156. Also in a pixel electrode with a later-described structure, part of the side surface of the conductive layer 151*b* is not necessarily covered with the insulating layer 156.

In the case where the conductive layer 151 has the structure illustrated in FIG. 1, the conductive layer 152 is provided to cover the conductive layers 151*a*, 151*b*, and 151*c* and the insulating layer 156 and to be electrically connected to the conductive layers 151*a*, 151*b*, and 151*c*. This can prevent a chemical solution from coming into contact with the conductive layers 151*a*, 151*b*, and 151*c* when a film formed after formation of the conductive layer 152 is removed by a wet etching method, for example. It is thus possible to inhibit occurrence of corrosion in the conductive layers 151*a*, 151*b*, and 151*c*. Hence, the display device 100 can be manufactured by a high-yield method. Moreover, the display device 100 can have high reliability since generation of defects is inhibited therein.

Here, the insulating layer 156 preferably has a curved surface as illustrated in FIG. 1. In this case, a step-cut in the conductive layer 152 covering the insulating layer 156 is less likely to occur than in the case where the insulating layer 156 has a perpendicular side surface (a side surface parallel to the Z direction), for example. In addition, a step-cut in the conductive layer 152 covering the insulating layer 156 is less likely to occur also in the case where the side surface of the insulating layer 156 has a tapered shape, or specifically, a tapered shape with a taper angle of less than 90°, than in the case where the insulating layer 156 has a perpendicular side surface, for example. As described above, the display device 100 can be manufactured by a high-yield method. Moreover, the display device 100 can have high reliability since generation of defects is inhibited therein.

FIG. 1 illustrates a structure in which the side surface of the conductive layer 151*b* is positioned inward from that of the conductive layer 151*a* and the side surface of the conductive layer 151*c* is positioned inward from that of the conductive layer 151*b*; however, one embodiment of the present invention is not limited thereto. For example, the side surface of the conductive layer 151*b* may be positioned outward from that of the conductive layer 151*a*. The side surface of the conductive layer 151*c* may be positioned outward from that of the conductive layer 151*b*.

Figure 3A:
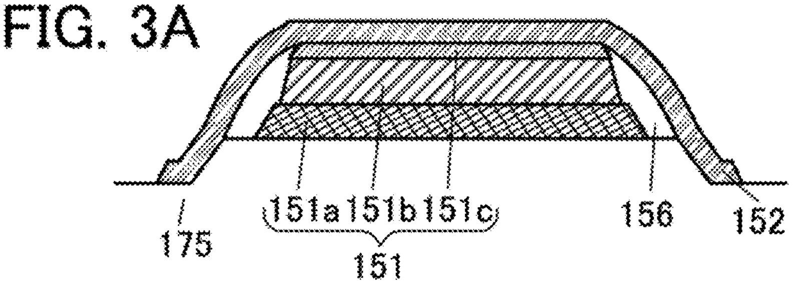
FIGS. 3A to 3C each illustrate a first electrode of a light-emitting element.
Figure 3B:
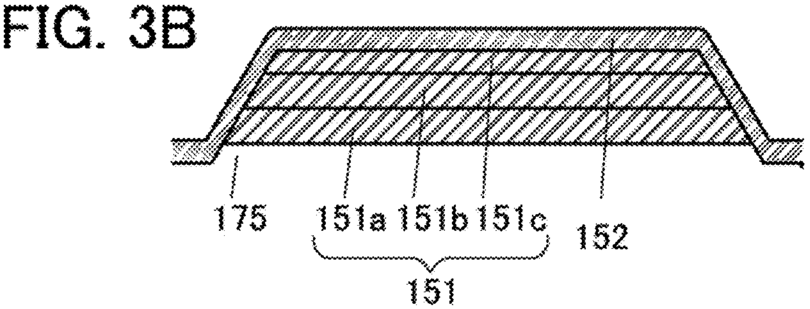
Figure 3C:
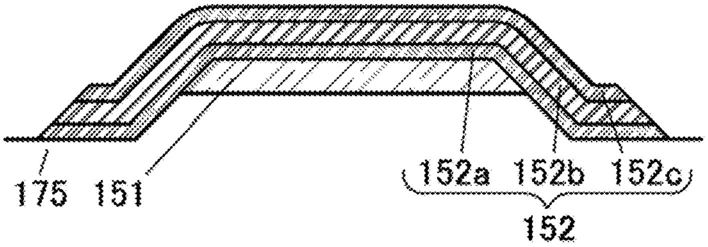

FIGS. 3A to 3C illustrate other structures of the first electrode 101. FIG. 3A illustrates a variation structure of the first electrode 101 in FIG. 1, in which the insulating layer 156 covers the side surfaces of the conductive layers 151*a*, 151*b*, and 151*c* instead of covering only the side surface of the conductive layer 151*b*.

FIG. 3B illustrates a variation structure of the first electrode 101 in FIG. 1, in which the insulating layer 156 is not provided.

FIG. 3C illustrates a variation structure of the first electrode 101 in FIG. 1, in which the conductive layer 151 does not have a stacked-layer structure but the conductive layer 152 has a stacked-layer structure.

A conductive layer 152*a* has higher adhesion to a conductive layer 152*b* than the insulating layer 175 does, for example. For the conductive layer 152*a*, an oxide containing one or more selected from indium, tin, zinc, gallium, titanium, aluminum, and silicon, for example, can be used. For example, it is preferable to use a conductive oxide containing one or more of indium oxide, indium tin oxide, indium zinc oxide, zinc oxide, zinc oxide containing gallium, titanium oxide, indium titanium oxide, zinc titanate, aluminum zinc oxide, indium zinc oxide containing gallium, indium zinc oxide containing aluminum, indium tin oxide containing silicon, indium zinc oxide containing silicon, and the like. Accordingly, peeling of the conductive layer 152*b* can be inhibited. The conductive layer 152*b* is not in contact with the insulating layer 175.

The conductive layer 152*b* is a layer whose visible light reflectance (e.g., reflectance with respect to light with a predetermined wavelength in a range greater than or equal to 400 nm and less than 750 nm) is higher than that of the conductive layers 151, 152*a*, and 152*c*. The visible light reflectance of the conductive layer 152*b* can be, for example, higher than or equal to 70% and lower than or equal to 100%, and is preferably higher than or equal to 80% and lower than or equal to 100%, further preferably higher than or equal to 90% and lower than or equal to 100%. For the conductive layer 152*b*, a material having higher visible light reflectance than aluminum can be used, for example. Specifically, for the conductive layer 152*b*, silver or an alloy containing silver can be used, for example. An example of the alloy containing silver is an alloy of silver, palladium, and copper (APC). In the above manner, the display device 100 can have high light extraction efficiency. Note that a metal other than silver may be used for the conductive layer 152*b*.

When the conductive layers 151 and 152 serve as the anode, a layer having a high work function is preferably used as the conductive layer 152*c*. The conductive layer 152*c* has a higher work function than the conductive layer 152*b*, for example. For the conductive layer 152*c*, a material similar to the material usable for the conductive layer 152*a* can be used, for example. For example, the conductive layers 152*a* and 152*c* can be formed using the same kind of material. For example, in the case where indium tin oxide is used for the conductive layer 152*a*, indium tin oxide can also be used for the conductive layer 152*c*.

When the conductive layers 151 and 152 serve as the cathode, a layer having a low work function is preferably used as the conductive layer 152*c*. The conductive layer 152*c* has a lower work function than the conductive layer 152*b*, for example.

The conductive layer 152*c* is preferably a layer having high visible light transmittance (e.g., transmittance with respect to light with a predetermined wavelength in a range greater than or equal to 400 nm and less than 750 nm). For example, the visible light transmittance of the conductive layer 152*c* is preferably higher than that of the conductive layers 151 and 152*b*. The visible light transmittance of the conductive layer 152*c* can be, for example, higher than or equal to 60% and lower than or equal to 100%, and is preferably higher than or equal to 70% and lower than or equal to 100%, further preferably higher than or equal to 80% and lower than or equal to 100%. Accordingly, the amount of light absorbed by the conductive layer 152*c* among light emitted from the organic compound layer 103 can be reduced. As described above, the conductive layer 152*b* under the conductive layer 152*c* can be a layer having high visible light reflectance. Thus, the display device 100 can have high light extraction efficiency.

Next, an exemplary method for manufacturing the display device 100 having the structure illustrated in FIGS. 2A and 2B is described with reference to FIGS. 7A1 to 17B.

Manufacturing Method Example 1

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of a CVD method include a plasma-enhanced CVD (PECVD) method and a thermal CVD method. An example of a thermal CVD method is a metal organic CVD (MOCVD) method.

Thin films included in the display device (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Specifically, for fabrication of the light-emitting element, a vacuum process such as an evaporation method and a solution process such as a spin coating method or an ink-jet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, the functional layers (e.g., the hole-injection layer, the hole-transport layer, the hole-blocking layer, the light-emitting layer, the electron-blocking layer, the electron-transport layer, and the electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., ink-jetting, screen printing (stencil), offset printing (planography), flexography (relief printing), gravure printing, or micro-contact printing), or the like.

Thin films included in the display device can be processed by a photolithography technique, for example. Alternatively, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography techniques. In one of the methods, a resist mask is formed over a thin film that is to be processed, the thin film is processed by etching, for example, and then the resist mask is removed. In the other method, a photosensitive thin film is formed and then processed into a desired shape by light exposure and development.

As light used for exposure in the photolithography technique, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet rays, KrF laser light, ArF laser light, or the like can be used. Exposure may be performed by liquid immersion exposure technique. As the light for exposure, extreme ultraviolet (EUV) light or X-rays may also be used. Furthermore, instead of the light used for exposure, an electron beam can be used. It is preferable to use EUV light, X-rays, or an electron beam to perform extremely minute processing. Note that when exposure is performed by scanning of a beam such as an electron beam, a photomask is not needed.

For etching of thin films, a dry etching method, a wet etching method, a sandblast method, or the like can be used.

First, as illustrated in FIG. 7A1, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. When an insulating substrate is used, it is possible to use a glass substrate, a quartz substrate, a sapphire substrate, a ceramic substrate, an organic resin substrate, or the like. Alternatively, it is possible to use a semiconductor substrate such as a single crystal semiconductor substrate or a polycrystalline semiconductor substrate of silicon, silicon carbide, or the like; a compound semiconductor substrate of silicon germanium or the like; or an SOI substrate.

Next, as illustrated in FIG. 7A1, openings reaching the conductive layer 172 are formed in the insulating layers 175, 174, and 173. Then, the plugs 176 are formed to fill the openings.

Next, as illustrated in FIG. 7A1, a conductive film 151*f* to be the conductive layers 151R, 151G, 151B, and 151C is formed over the plugs 176 and the insulating layer 175. The conductive film 151*f* can be formed by a sputtering method or a vacuum evaporation method, for example. A metal material can be used for the conductive film 151*f*, for example.

FIG. 7A2, which is an enlarged view of the cross-sectional view of FIG. 7A1, illustrates a specific structure example of the conductive film 151*f*. As illustrated in FIG. 7A2, the conductive film 151*f* can have a three-layer structure composed of a conductive film 151*af* to be the conductive layer 151*a*, a conductive film 151*bf* to be the conductive layer 151*b*, and a conductive film 151*cf* to be the conductive layer 151*c*. For example, titanium, aluminum, and titanium can be used for the conductive film 151*af*, the conductive film 151*bf*, and the conductive film 151*cf*, respectively. Alternatively, silver or an alloy containing silver can be used for the conductive film 151*cf*. Alternatively, the conductive film 151*f* can have a four-layer structure in which a film formed using a conductive oxide is provided over the conductive film 151*cf*, for example. Further alternatively, the conductive film 151*f* can have a two-layer structure composed of the conductive film 151*af* and the conductive film 151*bf*.

After formation of the conductive film 151*cf*, the top surface of the conductive film 151*cf* is preferably oxidized. For example, the top surface of the conductive film 151*cf* can be oxidized by heat treatment performed in an oxygen atmosphere. Note that as the oxidizing atmosphere in which thermal oxidation treatment is performed, an atmospheric atmosphere, a dried oxygen atmosphere, a mixed atmosphere of oxygen and a rare gas, or the like can be used. The oxidation of the top surface of the conductive film 151*cf* leads to improved visible light reflectance of the pixel electrode that is to be formed in a later step.

Then, as illustrated in FIGS. 7A1 and 7A2, a resist mask 191 is formed over the conductive film 151*f*, or specifically, over the conductive film 151*cf*, for example. The resist mask 191 can be formed by application of a photosensitive material (photoresist), light exposure, and development.

Subsequently, as illustrated in FIG. 7B1, the conductive film 151*f* in a region that is not overlapped by the resist mask 191, for example, is removed by an etching method, specifically, a dry etching method, for instance. Note that in the case where the conductive film 151*f* includes a layer formed using a conductive oxide such as indium tin oxide, for example, the layer may be removed by a wet etching method. In this manner, the conductive layer 151 is formed. In the case where part of the conductive film 151*f* is removed by a dry etching method, for example, a recessed portion may be formed in a region of the insulating layer 175 that is not overlapped by the conductive layer 151.

FIG. 7B2 is an enlarged view of the conductive layer 151 and a region around the conductive layer 151 in the cross-sectional view of FIG. 7B1. As illustrated in FIG. 7B2, the conductive layers 151*a*, 151*b*, and 151*c*, for example, are formed by a photolithography technique.

Here, when the conductive film 151*f* is processed under conditions where the resist mask 191 is easily recessed (reduced in size) as compared to the case where the conductive layer 151 is formed such that its side surface does not have a tapered shape (i.e., the conductive layer 151 is formed to have a perpendicular side surface), the side surface of the conductive layer 151 can have a tapered shape. Specifically, the side surface of the conductive layer 151 can have a tapered shape with a taper angle less than 90°. In FIGS. 7B1 and 7B2, the shape of the resist mask 191 before processing of the conductive film 151*f* is indicated by dotted lines.

When the conductive film 151*f* is processed under conditions where the resist mask 191 is easily recessed (reduced in size), the conductive film 151*f* might be easily processed in the horizontal direction. That is, the etching sometimes becomes less anisotropic, i.e., more isotropic, than in the case where the conductive layer 151 is formed to have a perpendicular side surface, for example. In the case where the conductive layer 151 is a stack of a plurality of layers and the conductive layer 151 is formed to have a side surface with a tapered shape as illustrated in FIG. 7B2, the plurality of layers are sometimes different in readiness to be processed in the horizontal direction. In the case where the conductive layers 151*a* and 151*c* are formed using titanium, silver, or an alloy containing silver and the conductive layer 151*b* is formed using aluminum, for example, the conductive layer 151*b* is sometimes more likely to be processed in the horizontal direction than the conductive layers 151*a* and 151*c*. In this case, the side surface of the conductive layer 151*b* is sometimes positioned inward from the side surfaces of the conductive layers 151*a* and 151*c* in a cross-sectional view. As a result, the conductive layer 151*c* might have the protruding portion 121.

Next, the resist mask 191 is removed as illustrated in FIG. 8A. The resist mask 191 can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a Group 18 element such as He may be used. Alternatively, the resist mask 191 may be removed by wet etching.

Then, as illustrated in FIG. 8B, an insulating film 156*f* to be an insulating layer 156R, an insulating layer 156G, an insulating layer 156B, and an insulating layer 156C is formed over the conductive layer 151R, the conductive layer 151G, the conductive layer 151B, the conductive layer 151C, and the insulating layer 175. The insulating film 156*f* can be formed by a CVD method, an ALD method, a sputtering method, or a vacuum evaporation method, for example.

For the insulating film 156*f*, an inorganic material can be used. As the insulating film 156*f*, an inorganic insulating film such as an oxide insulating film, a nitride insulating film, an oxynitride insulating film, or a nitride oxide insulating film can be used, for example. For example, an oxide insulating film containing silicon, a nitride insulating film containing silicon, an oxynitride insulating film containing silicon, a nitride oxide insulating film containing silicon, or the like can be used as the insulating film 156*f*For the insulating film 156*f*, silicon oxynitride can be used, for example.

Subsequently, as illustrated in FIG. 8C1, the insulating film 156*f* is processed to form the insulating layers 156R, 156G, 156B, and 156C. The insulating layer 156 can be formed by performing etching substantially uniformly on the top surface of the insulating film 156*f*, for example. Such uniform etching for planarization is also referred to as etch back treatment. Note that the insulating layer 156 may be formed by a photolithography technique.

FIG. 8C2 is an enlarged view of the conductive layer 151, the insulating layer 156, and a region around them in the cross-sectional view of FIG. 8C1. FIG. 8C2 illustrates an example in which the insulating layer 156 is formed over the conductive layer 151*a* to overlap the side surface of the conductive layer 151*b*. In other words, FIG. 8C2 illustrates an example in which the insulating layer 156 has the structure illustrated in FIG. 3A. Note that the insulating layer 175 may have any of the structures illustrated in FIGS. 3B to 4B, depending on the taper angles of the side surface of the recessed portion in the insulating layer 175 and the side surfaces of the conductive layers 151*a*, 151*b*, and 151*c* and the positional relationship between the side surfaces of the conductive layers 151*a*, 151*b*, and 151*c*, for example.

The etch back treatment performed on the insulating layer 156 sometimes causes the insulating layer 156 to have a curved surface as illustrated in FIG. 8C2.

Then, as illustrated in FIG. 9A, a conductive film 152*f* to be the conductive layers 152R, 152G, and 152B and a conductive layer 152C is formed over the conductive layers 151R, 151G, 151B, and 151C and the insulating layers 156R, 156G, 156B, 156C, and 175. Specifically, the conductive film 152*f* is formed to cover the conductive layers 151R, 151G, 151B, and 151C and the insulating layers 156R, 156G, 156B, and 156C, for example.

The conductive film 152*f* can be formed by a sputtering method or a vacuum evaporation method, for example. A conductive oxide can be used for the conductive film 152*f*, for example. The conductive film 152*f* can be a stack of a film formed using a metal material and a film formed thereover using a conductive oxide. For example, the conductive film 152*f* can be a stack of a film formed using titanium, silver, or an alloy containing silver and a film formed thereover using a conductive oxide.

The conductive film 152*f* can be formed by an ALD method. In this case, for the conductive film 152*f*, an oxide containing one or more selected from indium, tin, zinc, gallium, titanium, aluminum, and silicon can be used. In this case, the conductive film 152*f* can be formed by repeating a cycle of introduction of a precursor (generally referred to as a metal precursor or the like in some cases), purge of the precursor, introduction of an oxidizer (generally referred to as a reactant, a non-metal precursor, or the like in some cases), and purge of the oxidizer. Here, in the case where an oxide film containing a plurality of kinds of metals (e.g., an indium tin oxide film) is formed as the conductive film 152*f*, the composition of the metals can be controlled by varying the number of cycles for different kinds of precursors.

For example, in the case where an indium tin oxide film is formed as the conductive film 152*f*, after a precursor containing indium is introduced, the precursor is purged, and an oxidizer is introduced to form an In—O film, and then a precursor containing tin is introduced, the precursor is purged, and an oxidizer is introduced to form a Sn—O film. Here, when the number of cycles of forming an In—O film is larger than the number of cycles of forming a Sn—O film, the number of In atoms contained in the conductive film 152*f* can be larger than the number of Sn atoms contained therein.

For example, to form a zinc oxide film as the conductive film 152*f*, a Zn—O film is formed in the above procedure. As another example, to form an aluminum zinc oxide film as the conductive film 152*f*, a Zn—O film and an Al—O film are formed in the above procedure. As another example, to form a titanium oxide film as the conductive film 152*f*, a Ti—O film is formed in the above procedure. As another example, to form an indium tin oxide film containing silicon as the conductive film 152*f*, an In—O film, a Sn—O film, and a Si—O film are formed in the above procedure. As another example, to form a zinc oxide film containing gallium, a Ga—O film and a Zn—O film are formed in the above procedure.

As a precursor containing indium, it is possible to use, for example, triethylindium, trimethylindium, or [1,1,1-trimethyl-N-(trimethyl silyl)amide]-indium. As a precursor containing tin, it is possible to use, for example, tin chloride or tetrakis(dimethylamido)tin. As a precursor containing zinc, it is possible to use, for example, diethylzinc or dimethylzinc. As a precursor containing gallium, it is possible to use, for example, triethylgallium. As a precursor containing titanium, it is possible to use, for example, titanium chloride, tetrakis(dimethylamido)titanium, or tetraisopropyl titanate. As a precursor containing aluminum, it is possible to use, for example, aluminum chloride or trimethylaluminum. As a precursor containing silicon, it is possible to use, for example, trisilylamine, bis(diethylamino)silane, tris(dimethylamino)silane, bis(tert-butylamino)silane, or bis(ethylmethylamino)silane. As the oxidizer, water vapor, oxygen plasma, or an ozone gas can be used.

Here, in the case of the conductive layer 151 not including the conductive layer 151*c*, a surface of the conductive layer 151*b* is sometimes oxidized after formation of the conductive layer 151*b* and before formation of the conductive film 152*f*, for example. When the conductive layer 151*b* is formed by processing the conductive film 151*bf* and is then exposed to the air, for example, a surface of the conductive layer 151*b* is sometimes oxidized owing to oxygen contained in the air. Here, in the case where the conductive layer 151*b* is formed using a metal whose electrical resistivity would be significantly increased by oxidation, e.g., a metal an oxide of which is an insulator, the electric resistance at the contact interface between the conductive layer 151 and the conductive layer 152 is sometimes higher than that in the case where the conductive layer 151*c* is provided. For example, aluminum oxide functions as an insulator. Thus, in the case where aluminum is used for the conductive layer 151*b*, the electric resistance at the contact interface between the conductive layer 151 and the conductive layer 152 is sometimes higher than that in the case where the conductive layer 151*c* is provided. Accordingly, the display device manufactured might suffer from defects and have low reliability.

It is thus preferable to remove an oxide on a surface of the conductive layer 151*b* after formation of the conductive layer 151*b* and before formation of the conductive film 152*f*. It is preferable that the formation of the conductive film 152*f* follow the removal of the oxide without exposure to the air. In this case, the electric resistance at the contact interface between the conductive layer 151 and the conductive layer 152 can be made low. As a result, generation of defects can be inhibited and the display device 100 can have high reliability. The oxide on a surface of the conductive layer 151*b* can be removed by a reverse sputtering method, for example.

Then, as illustrated in FIG. 9B1, the conductive film 152*f* is processed by a photolithography technique, for example, whereby the conductive layers 152R, 152G, 152B, and 152C are formed. Specifically, after a resist mask is formed, part of the conductive film 152*f* is removed by an etching method, for example. The conductive film 152*f* can be removed by a wet etching method, for example. The conductive film 152*f* may be removed by a dry etching method. Through the above steps, the pixel electrode including the conductive layer 151 and the conductive layer 152 is formed.

FIG. 9B2 is an enlarged view of the conductive layers 151 and 152 and the insulating layer 156 and a region around them in the cross-sectional view of FIG. 9B1. As illustrated in FIG. 9B2, the conductive layer 152 can be formed to cover the conductive layers 151*a*, 151*b*, and 151*c* and to be electrically connected to the conductive layers 151*a*, 151*b*, and 151*c*. As already described above, the visible light reflectance of the conductive layer 152 is lower than that of the conductive layer 151. For example, the visible light reflectance of the conductive layer 152 is lower than that of at least one of the conductive layers 151*a*, 151*b*, and 151*c*.

As illustrated in FIG. 9B2, the conductive layer 151*c* sometimes has the protruding portion 121, for example. Even in such a case, the insulating layer 156 provided to include a region overlapping the side surface of the conductive layer 151 can inhibit a step-cut from occurring in the conductive layer 152. For example, the insulating layer 156 provided to include a region overlapping the side surface of the conductive layer 151*b* can inhibit a step-cut from occurring in the conductive layer 152. Accordingly, poor connection can be inhibited. The conductive layer 152 can also be inhibited from being locally thinned owing to the protruding portion 121 and thereby having increased electric resistance. As described above, the display device 100 can be manufactured by a high-yield method. Moreover, the display device 100 can have high reliability since generation of defects is inhibited therein.

Here, in the case where the conductive layer 152 is a stack of a first conductive layer and a second conductive layer, a film to be the conductive layer 152*a*, which is included in the conductive film 152*f*, can be formed using a metal material such as titanium, silver, or an alloy containing silver. A film to be the conductive layer 152*b*, which is included in the conductive film 152*f*, can be formed using a conductive oxide such as indium tin oxide, for example. Since titanium has better processability in etching than silver as described above, using titanium for the film to be the conductive layer 152*a* enables easy processing of the film in formation of the conductive layer 152*a*. On the other hand, using silver or an alloy containing silver for the conductive layer 152*a* enables the pixel electrode to have high visible light reflectance as described above.

Next, hydrophobization treatment is preferably performed on the conductive layer 152. The hydrophobization treatment can change the hydrophilic properties of the subject surface to hydrophobic properties or increase the hydrophobic properties of the subject surface. The hydrophobization treatment for the conductive layer 152 can increase the adhesion between the conductive layer 152 and an EL layer 153 formed in a later step and suppress film peeling. Note that the hydrophobization treatment is not necessarily performed.

Next, as illustrated in FIG. 10A1, an EL film 153Rf to be an EL layer 153R is formed over the conductive layers 152R, 152G, and 152B and the insulating layer 175.

As illustrated in FIG. 10A1, the EL film 153Rf is not formed over the conductive layer 152C. For example, a mask for specifying a film formation area (also referred to as an area mask, a rough metal mask, or the like to distinguish from a fine metal mask) is used, so that the EL film 153Rf can be formed only in a desired region. Employing a film formation step using an area mask and a processing step using a resist mask enables a light-emitting element to be manufactured by a relatively easy process.

The EL film 153Rf can be formed by an evaporation method, specifically a vacuum evaporation method, for example. The EL film 153Rf may be formed by a transfer method, a printing method, an ink-jet method, a coating method, or the like.

FIG. 10A2 is a cross-sectional view illustrating a structure example of the EL film 153Rf in FIG. 10A1 and its periphery. As illustrated in FIG. 10A2, the EL film 153Rf includes a functional film 181Rf to be a functional layer 181R, a light-emitting film 182Rf to be a light-emitting layer 182R over the functional film 181Rf, and a functional film 183Rf to be a functional layer 183R over the light-emitting film 182Rf. The functional film 181Rf includes a region in contact with the conductive layer 152R.

In the case where the conductive layers 151R and 152R function as the anode, the functional film 181Rf includes one or both of a film to be a hole-injection layer and a film to be a hole-transport layer. For example, the functional film 181Rf includes a film to be a hole-injection layer and a film thereover to be a hole-transport layer. The functional film 183Rf includes, for example, a film to be an electron-transport layer and a film to be an electron-injection layer.

In the case where the conductive layers 151R and 152R function as the cathode, the functional film 181Rf includes, for example, a film to be an electron-transport layer and a film to be an electron-injection layer. For example, the functional film 181Rf includes a film to be an electron-injection layer and a film thereover to be an electron-transport layer. The functional film 183Rf includes, for example, one or both of a film to be a hole-injection layer and a film to be a hole-transport layer.

The conductive layer 152R includes a region in contact with the undermost film, for example, among the films provided in the functional film 181Rf. For example, in the case where the functional film 181Rf has a stacked-layer structure of a film to be a hole-injection layer and a film thereover to be a hole-transport layer, the conductive layer 152R includes a region in contact with the film to be the hole-injection layer. As another example, in the case where the functional film 181Rf has a stacked-layer structure of a film to be an electron-injection layer and a film thereover to be an electron-transport layer, the conductive layer 152R includes a region in contact with the film to be the electron-injection layer.

Providing the functional film 183Rf over the light-emitting film 182Rf can prevent the light-emitting film 182Rf from being at the uppermost surface of the EL film 153Rf. This makes it possible to reduce damage to the light-emitting film 182Rf in a later step. Thus, a highly reliable display device can be manufactured. Specifically, the functional film 183Rf can have a stacked-layer structure of a film to be an electron-transport layer and a film thereover to be an electron-injection layer because the organic compound as described in Embodiment 1 is used as a material for the electron-injection layer in the method for manufacturing the light-emitting element of one embodiment of the present invention. As a result, damage to the light-emitting film 182Rf can be reduced, so that the light-emitting element can have favorable characteristics.

Next, as illustrated in FIG. 10A1, a sacrificial film 158Rf to be a sacrificial layer 158R and a mask film 159Rf to be a mask layer 159R are sequentially formed over the EL film 153Rf, the conductive layer 152C, and the insulating layer 175.

Although this embodiment shows an example where a mask film having a two-layer structure of the sacrificial film 158Rf and the mask film 159Rf is formed, a mask film may have a single-layer structure or a stacked-layer structure of three or more layers.

Providing the sacrificial layer over the EL film 153Rf can reduce damage to the EL film 153Rf in the manufacturing process of the display device, resulting in an increase in reliability of the light-emitting element.

As the sacrificial film 158Rf, a film that is highly resistant to the process conditions for the EL film 153Rf, specifically, a film having high etching selectivity with respect to the EL film 153Rf is used. For the mask film 159Rf, a film having high etching selectivity with respect to the sacrificial film 158Rf is used.

The sacrificial film 158Rf and the mask film 159Rf are formed at a temperature lower than the upper temperature limit of the EL film 153Rf. The typical substrate temperatures in formation of the sacrificial film 158Rf and the mask film 159Rf are each lower than or equal to 200° C., preferably lower than or equal to 150° C., further preferably lower than or equal to 120° C., still further preferably lower than or equal to 100° C., yet still further preferably lower than or equal to 80° C.

The sacrificial film 158Rf and the mask film 159Rf are preferably films that can be removed by a wet etching method. The use of a wet etching method can reduce damage to the EL film 153Rf in processing of the sacrificial film 158Rf and the mask film 159Rf, as compared to the case of using a dry etching method.

In the case where a wet etching method is employed, it is particularly preferable to use an acidic chemical solution. As an acidic chemical solution, a chemical solution containing one or more of phosphoric acid, hydrofluoric acid, nitric acid, acetic acid, oxalic acid, sulfuric acid, and the like or a mixed chemical solution (also referred to as a mixed acid) that contains two or more of these acids is preferably used.

The sacrificial film 158Rf and the mask film 159Rf can be formed by a sputtering method, an ALD method (including a thermal ALD method or a PEALD method), a CVD method, or a vacuum evaporation method, for example. Alternatively, the sacrificial film 158Rf and the mask film 159Rf may be formed by the above-described wet process.

Note that the sacrificial film 158Rf that is formed over and in contact with the EL film 153Rf is preferably formed by a formation method that is less likely to damage the EL film 153Rf than a formation method of the mask film 159Rf. For example, the sacrificial film 158Rf is preferably formed by an ALD method or a vacuum evaporation method rather than a sputtering method.

As each of the sacrificial film 158Rf and the mask film 159Rf, one or more of a metal film, an alloy film, a metal oxide film, a semiconductor film, an organic insulating film, and an inorganic insulating film, for example, can be used.

For each of the sacrificial film 158Rf and the mask film 159Rf, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. It is preferable to use a metal material that can block ultraviolet rays for one or both of the sacrificial film 158Rf and the mask film 159Rf, in which case the EL film 153Rf can be inhibited from being irradiated with ultraviolet rays and deterioration of the EL film 153Rf can be suppressed.

The sacrificial film 158Rf and the mask film 159Rf can each be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used. In particular, M is preferably one or more of gallium, aluminum, and yttrium.

As each of the sacrificial film and the mask film, a film containing a material having a light-blocking property, particularly with respect to ultraviolet rays, can be used. For example, a film having a property of reflecting ultraviolet rays or a film absorbing ultraviolet rays can be used. Although a variety of materials such as a metal, an insulator, a semiconductor, and a metalloid that have a property of blocking ultraviolet rays can be used as a light-blocking material, each of the sacrificial film and the mask film is preferably a film capable of being processed by etching and is particularly preferably a film having good processability because part or the whole of each of the sacrificial film and the mask film is removed in a later step.

For example, a semiconductor material such as silicon or germanium can be used as a material with an affinity for the semiconductor manufacturing process. An oxide or a nitride of the semiconductor material can be used. A non-metallic material such as carbon or a compound thereof can be used. A metal such as titanium, tantalum, tungsten, chromium, or aluminum or an alloy containing at least one of these metals can be used. Alternatively, an oxide containing the above-described metal, such as titanium oxide or chromium oxide, or a nitride such as titanium nitride, chromium nitride, or tantalum nitride can be used.

When a film containing a material having a property of blocking ultraviolet rays is used as each of the sacrificial film and the mask film, the EL layer can be inhibited from being irradiated with ultraviolet rays in a light exposure step, for example. The EL layer is inhibited from being damaged by ultraviolet rays, so that the reliability of the light-emitting element can be improved.

Note that the same effect is obtained when a film containing a material having a property of blocking ultraviolet rays is used for an after-mentioned inorganic insulating film 125*f*.

As each of the sacrificial film 158Rf and the mask film 159Rf, a variety of inorganic insulating films that can be used as the protective layer 131 can be used. In particular, an oxide insulating film is preferable because its adhesion to the EL film 153Rf is higher than that of a nitride insulating film. For example, an inorganic insulating material such as aluminum oxide, hafnium oxide, or silicon oxide can be used for the sacrificial film 158Rf and the mask film 159Rf. As the sacrificial film 158Rf and the mask film 159Rf, aluminum oxide films can be formed by an ALD method, for example. An ALD method is preferably used, in which case damage to a base (in particular, the EL layer) can be reduced.

For example, an inorganic insulating film (e.g., an aluminum oxide film) formed by an ALD method can be used as the sacrificial film 158Rf, and an inorganic film (e.g., an In—Ga—Zn oxide film, an aluminum film, or a tungsten film) formed by a sputtering method can be used as the mask film 159Rf.

Note that the same inorganic insulating film can be used for both the sacrificial film 158Rf and an inorganic insulating layer 125 that is to be formed later. For example, an aluminum oxide film formed by an ALD method can be used for both the sacrificial film 158Rf and the inorganic insulating layer 125. For the sacrificial film 158Rf and the inorganic insulating layer 125, the same deposition conditions may be used or different deposition conditions may be used. For example, when the sacrificial film 158Rf is formed under conditions similar to those of the inorganic insulating layer 125, the sacrificial film 158Rf can be an insulating layer having a high barrier property against at least one of water and oxygen. Meanwhile, since the sacrificial film 158Rf is a layer a large part or the whole of which is to be removed in a later step, it is preferable that the processing of the sacrificial film 158Rf be easy. Therefore, the sacrificial film 158Rf is preferably formed with a substrate temperature lower than that for formation of the inorganic insulating layer 125.

One or both of the sacrificial film 158Rf and the mask film 159Rf may be formed using an organic material. For example, as the organic material, a material that can be dissolved in a solvent chemically stable with respect to at least the uppermost film of the EL film 153Rf may be used. Specifically, a material that will be dissolved in water or an alcohol can be suitably used. In forming a film of such a material, it is preferable to apply the material dissolved in a solvent such as water or an alcohol by a wet process and then perform heat treatment for evaporating the solvent. At this time, the heat treatment is preferably performed in a reduced-pressure atmosphere, in which case the solvent can be removed at a low temperature in a short time and thermal damage to the EL film 153Rf can be reduced accordingly.

The sacrificial film 158Rf and the mask film 159Rf may be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluorine resin like perfluoropolymer.

For example, an organic film (e.g., a PVA film) formed by an evaporation method or any of the above wet processes can be used as the sacrificial film 158Rf, and an inorganic film (e.g., a silicon nitride film) formed by a sputtering method can be used as the mask film 159Rf.

Subsequently, a resist mask 190R is formed over the mask film 159Rf as illustrated in FIG. 10A1. The resist mask 190R can be formed by application of a photosensitive material (photoresist), light exposure, and development.

The resist mask 190R may be formed using either a positive resist material or a negative resist material.

The resist mask 190R is provided at a position overlapping the conductive layer 152R. The resist mask 190R is preferably provided also at a position overlapping the conductive layer 152C. This can inhibit the conductive layer 152C from being damaged during the process of manufacturing the display device. Note that the resist mask 190R is not necessarily provided over the conductive layer 152C. The resist mask 190R is preferably provided to cover the area from the end portion of the EL film 153Rf to the end portion of the conductive layer 152C (the end portion closer to the EL film 153Rf), as illustrated in the cross-sectional view along the line B1-B2 in FIG. 10A1.

Next, as illustrated in FIG. 10B1, part of the mask film 159Rf is removed using the resist mask 190R, whereby the mask layer 159R is formed. The mask layer 159R remains over the conductive layers 152R and 152C. After that, the resist mask 190R is removed. Then, part of the sacrificial film 158Rf is removed using the mask layer 159R as a mask (also referred to as a hard mask), whereby the sacrificial layer 158R is formed.

Each of the sacrificial film 158Rf and the mask film 159Rf can be processed by a wet etching method or a dry etching method. The sacrificial film 158Rf and the mask film 159Rf are preferably processed by isotropic etching.

The use of a wet etching method can reduce damage to the EL film 153Rf in processing of the sacrificial film 158Rf and the mask film 159Rf, as compared to the case of using a dry etching method. In the case of using a wet etching method, it is preferable to use a chemical solution of a developer, an aqueous solution of tetramethylammonium hydroxide (TMAH), dilute hydrofluoric acid, oxalic acid, phosphoric acid, acetic acid, nitric acid, or a mixed solution thereof, for example.

Since the EL film 153Rf is not exposed in the processing of the mask film 159Rf, the range of choice for a processing method for the mask film 159Rf is wider than that for the sacrificial film 158Rf. Specifically, even in the case where a gas containing oxygen is used as the etching gas in the processing of the mask film 159Rf, deterioration of the EL film 153Rf can be suppressed.

A wet etching method is preferably employed for the processing of the sacrificial film 158Rf. It is particularly preferable to perform treatment using an acidic chemical solution. As an acidic chemical solution, a chemical solution containing one or more of phosphoric acid, hydrofluoric acid, nitric acid, acetic acid, oxalic acid, sulfuric acid, and the like or a mixed chemical solution (also referred to as a mixed acid) that contains two or more of these acids is preferably used.

In the case of using a dry etching method to process the sacrificial film 158Rf, deterioration of the EL film 153Rf can be suppressed by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, or a Group 18 element such as He, for example, as the etching gas.

For example, in the case where an aluminum oxide film formed by an ALD method is used as the sacrificial film 158Rf, part of the sacrificial film 158Rf can be removed by a dry etching method using $CHF_3$ and He or a combination of $CHF_3$, He, and $CH_4$. In the case where an In—Ga—Zn oxide film formed by a sputtering method is used as the mask film 159Rf, part of the mask film 159Rf can be removed by a wet etching method using diluted phosphoric acid. Alternatively, part of the mask film 159Rf may be removed by a dry etching method using $CH_4$ and Ar. Alternatively, part of the mask film 159Rf can be removed by a wet etching method using diluted phosphoric acid. In the case where a tungsten film formed by a sputtering method is used as the mask film 159Rf, part of the mask film 159Rf can be removed by a dry etching method using a combination of $SF_6$, $CF_4$, and $O_2$ or a combination of $CF_4$, $Cl_2$, and $O_2$.

The resist mask 190R can be removed by a method similar to that for the resist mask 191. For example, the resist mask 190R can be removed by ashing using oxygen plasma. Alternatively, an oxygen gas and any of $CF_4$, $C_4F_8$, $SF_6$, $CHF_3$, $Cl_2$, $H_2O$, $BCl_3$, and a Group 18 element such as He may be used. Alternatively, the resist mask 190R may be removed by wet etching. At this time, the sacrificial film 158Rf is positioned on the outermost surface, and the EL film 153Rf is not exposed; thus, the EL film 153Rf can be inhibited from being damaged in the step of removing the resist mask 190R. In addition, the range of choice of the method for removing the resist mask 190R can be widened.

Next, as illustrated in FIG. 10B1, the EL film 153Rf is processed, so that the EL layer 153R is formed. For example, part of the EL film 153Rf is removed using the mask layer 159R and the sacrificial layer 158R as a hard mask, whereby the EL layer 153R is formed.

Accordingly, as illustrated in FIG. 10B1, the stacked-layer structure of the EL layer 153R, the sacrificial layer 158R, and the mask layer 159R remains over the conductive layer 152R. The conductive layers 152G and 152B are exposed.

In the example illustrated in FIG. 10B1, the end portion of the EL layer 153R is positioned outward from the end portion of the conductive layer 152R. Such a structure can increase the aperture ratio of the pixel. Although not illustrated in FIG. 10B1, by the above etching treatment, a recessed portion may be formed in the insulating layer 175 in a region not overlapped by the EL layer 153R.

Since the EL layer 153R covers the top surface and the side surface of the conductive layer 152R, the subsequent steps can be performed without exposure of the conductive layer 152R. If the end portion of the conductive layer 152R is exposed, there is a possibility that corrosion is caused in an etching step, for example. A product generated by corrosion of the conductive layer 152R may be unstable, and for example, might be dissolved in a solution when wet etching is performed and might be scattered in an atmosphere when dry etching is performed. By dissolution of the product in a solution or scattering of the product in the atmosphere, the product might be attached to a subject surface and the side surface of the EL layer 153R, for example, which might adversely affect the characteristics of the light-emitting element or form a leak path between a plurality of light-emitting elements. In a region where the end portion of the conductive layer 152R is exposed, adhesion between layers in contact with each other might be lowered, which might be likely to cause peeling of the EL layer 153R or the conductive layer 152R.

Accordingly, the structure where the EL layer 153R covers the top surface and the side surface of the conductive layer 152R can improve the yield and characteristics of the light-emitting element, for example.

As described above, the resist mask 190R is preferably provided to cover the area from the end portion of the EL layer 153R to the end portion of the conductive layer 152C (the end portion closer to the EL layer 153R) in the cross section B1-B2. Thus, as illustrated in FIG. 10B1, the sacrificial layer 158R and the mask layer 159R are provided to cover the area from the end portion of the EL layer 153R to the end portion of the conductive layer 152C (the end portion closer to the EL layer 153R) in the cross section B1-B2. Hence, the insulating layer 175 can be inhibited from being exposed in the cross section B1-B2, for example. This can prevent the insulating layers 175, 174, and 173 from being partly removed by etching and thus prevent the conductive layer 179 from being exposed. Accordingly, the conductive layer 179 can be inhibited from being unintentionally electrically connected to another conductive layer. For example, a short circuit between the conductive layer 179 and a common electrode 155 formed in a later step can be suppressed.

The EL film 153Rf is preferably processed by anisotropic etching. Anisotropic dry etching is particularly preferable. Alternatively, wet etching may be used.

In the case of using a dry etching method, deterioration of the EL film 153Rf can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Accordingly, damage to the EL film 153Rf can be reduced. Furthermore, a defect such as attachment of a reaction product generated during the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a Group 18 element such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

As described above, in one embodiment of the present invention, the mask layer 159R is formed in the following manner: the resist mask 190R is formed over the mask film 159Rf and part of the mask film 159Rf is removed using the resist mask 190R. After that, part of the EL film 153Rf is removed using the mask layer 159R as a hard mask, so that the EL layer 153R is formed. In other words, the EL layer 153R is formed by processing the EL film 153Rf by a photolithography technique. Note that part of the EL film 153Rf may be removed using the resist mask 190R. Then, the resist mask 190R may be removed.

FIG. 10B2 is a cross-sectional view illustrating a structure example of the EL layer 153R in FIG. 10B1 and its periphery. As illustrated in FIG. 10B2, the EL layer 153R includes the functional layer 181R, the light-emitting layer 182R over the functional layer 181R, and the functional layer 183R over the light-emitting layer 182R. The functional layer 181R includes a region in contact with the conductive layer 152R.

In the case where the conductive layers 151R and 152R function as the anode, the functional layer 181R includes one or both of a hole-injection layer and a hole-transport layer. For example, the functional layer 181R includes a hole-injection layer and a hole-transport layer over the hole-injection layer. The functional layer 183R includes an electron-transport layer and an electron-injection layer.

In the case where the conductive layers 151R and 152R function as the cathode, the functional layer 181R includes one or both of an electron-injection layer and an electron-transport layer. For example, the functional layer 181R includes an electron-injection layer and an electron-transport layer over the electron-injection layer. The functional layer 183R includes a hole-transport layer and a hole-injection layer, for example.

The conductive layer 152R includes a region in contact with the undermost layer, for example, among the layers provided in the functional layer 181R. For example, in the case where the functional layer 181R has a stacked-layer structure of a hole-injection layer and a hole-transport layer over the hole-injection layer, the conductive layer 152R includes a region in contact with the hole-injection layer. As another example, in the case where the functional layer 181R has a stacked-layer structure of an electron-injection layer and an electron-transport layer over the electron-injection layer, the conductive layer 152R includes a region in contact with the electron-injection layer.

Next, hydrophobization treatment for the conductive layer 152G, for example, is preferably performed. At the time of processing the EL film 153Rf, a surface of the conductive layer 152G changes to have hydrophilic properties in some cases, for example. The hydrophobization treatment for the conductive layer 152G, for example, can increase the adhesion between the conductive layer 152G and a layer to be formed in a later step (which is the EL layer 153G here) and suppress film peeling. Note that the hydrophobization treatment is not necessarily performed.

Figure 11A:
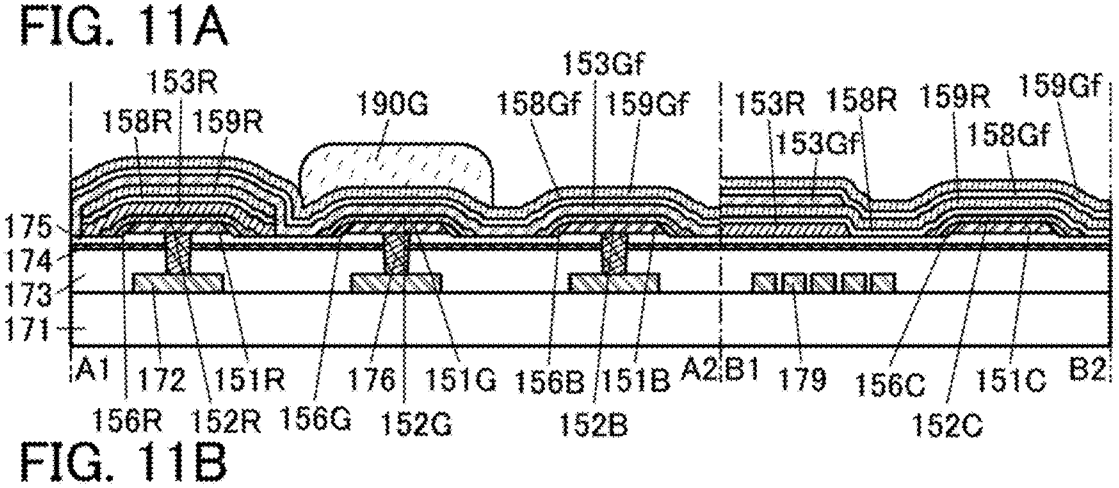
FIGS. 11A to 11D are cross-sectional views illustrating an example of a method for manufacturing a display device.

Next, as illustrated in FIG. 11A, an EL film 153Gf to be the EL layer 153G is formed over the conductive layer 152G, the conductive layer 152B, the mask layer 159R, and the insulating layer 175.

The EL film 153Gf can be formed by a method similar to that for forming the EL film 153Rf. The EL film 153Gf can have a structure similar to that of the EL film 153Rf.

Then, as illustrated in FIG. 11A, a sacrificial film 158Gf to be a sacrificial layer 158G and a mask film 159Gf to be a mask layer 159G are sequentially formed over the EL film 153Gf and the mask layer 159R. After that, a resist mask 190G is formed. The materials and the formation methods of the sacrificial film 158Gf and the mask film 159Gf are similar to those for the sacrificial film 158Rf and the mask film 159Rf. The material and the formation method of the resist mask 190G are similar to those for the resist mask 190R.

The resist mask 190G is provided at a position overlapping the conductive layer 152G.

Figure 11B:
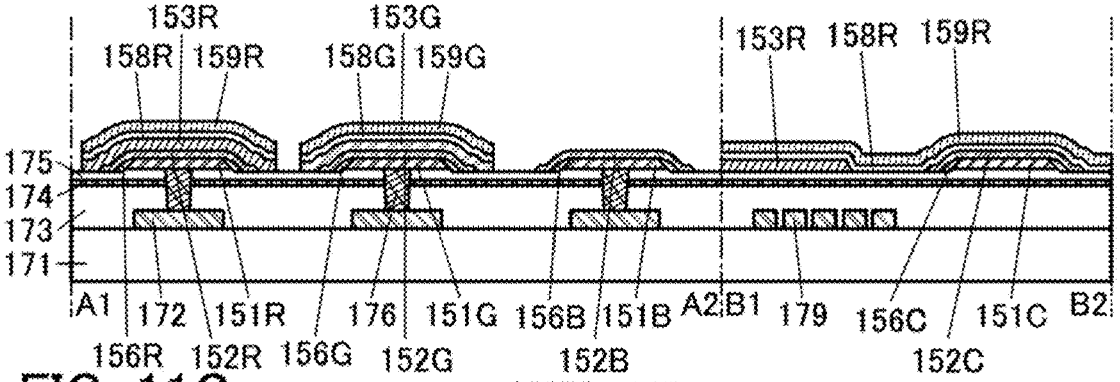

Subsequently, as illustrated in FIG. 11B, part of the mask film 159Gf is removed using the resist mask 190G, whereby the mask layer 159G is formed. The mask layer 159G remains over the conductive layer 152G. After that, the resist mask 190G is removed. Then, part of the sacrificial film 158Gf is removed using the mask layer 159G as a mask, whereby the sacrificial layer 158G is formed. Next, the EL film 153Gf is processed to form the EL layer 153G. For example, part of the EL film 153Gf is removed using the mask layer 159G and the sacrificial layer 158G as a hard mask to form the EL layer 153G.

Accordingly, as illustrated in FIG. 11B, the stacked-layer structure of the EL layer 153G, the sacrificial layer 158G, and the mask layer 159G remains over the conductive layer 152G. The mask layer 159R and the conductive layer 152B are exposed.

Next, hydrophobization treatment for the conductive layer 152B, for example, is preferably performed. At the time of processing the EL film 153Gf, a surface of the conductive layer 152B changes to have hydrophilic properties in some cases, for example. The hydrophobization treatment for the conductive layer 152B, for example, can increase the adhesion between the conductive layer 152B and a layer to be formed in a later step (which is the EL layer 153B here) and suppress film peeling. Note that the hydrophobization treatment is not necessarily performed.

Figure 11C:
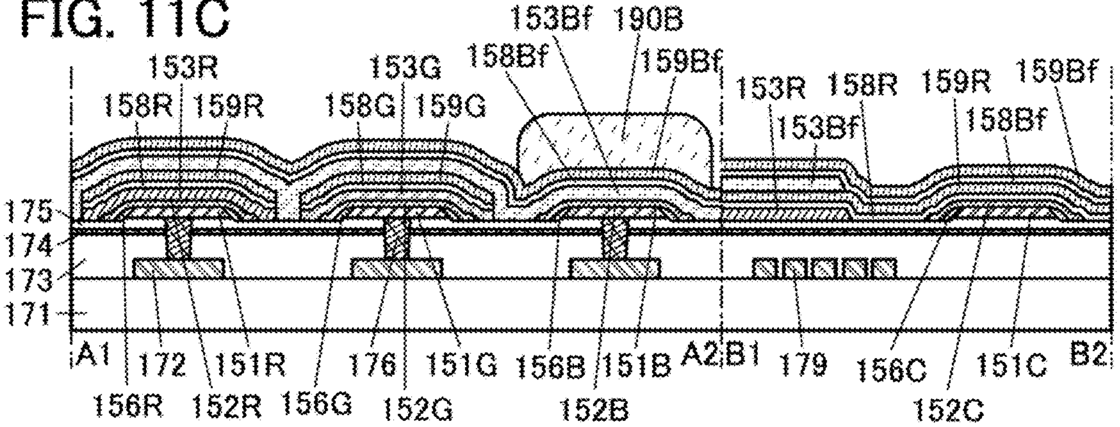

Next, as illustrated in FIG. 11C, an EL film 153Bf to be the EL layer 153B is formed over the conductive layer 152B, the mask layer 159R, the mask layer 159G, and the insulating layer 175.

The EL film 153Bf can be formed by a method similar to that for forming the EL film 153Rf. The EL film 153Bf can have a structure similar to that of the EL film 153Rf.

Then, as illustrated in FIG. 11C, a sacrificial film 158Bf to be a sacrificial layer 158B and a mask film 159Bf to be a mask layer 159B are sequentially formed over the EL film 153Bf and the mask layer 159R. After that, a resist mask 190B is formed. The materials and the formation methods of the sacrificial film 158Bf and the mask film 159Bf are similar to those for the sacrificial film 158Rf and the mask film 159Rf. The material and the formation method of the resist mask 190B are similar to those for the resist mask 190R.

The resist mask 190B is provided at a position overlapping the conductive layer 152B.

Figure 11D:
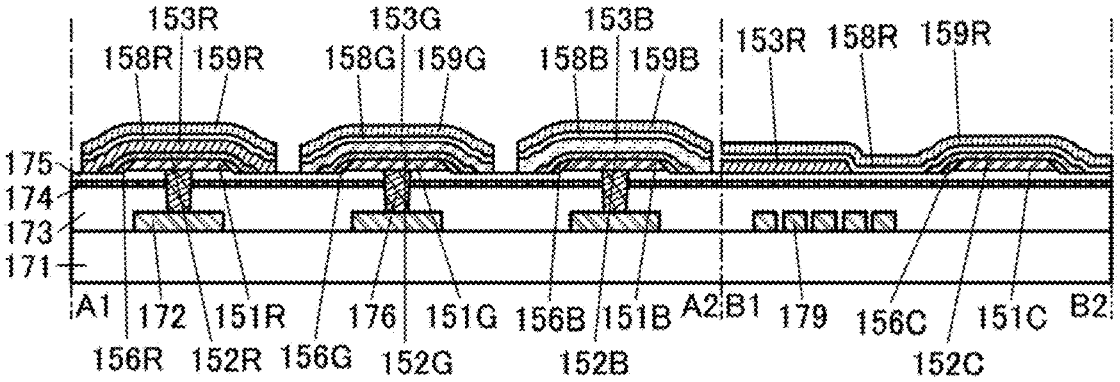

Subsequently, as illustrated in FIG. 11D, part of the mask film 159Bf is removed using the resist mask 190B, whereby the mask layer 159B is formed. The mask layer 159B remains over the conductive layer 152B. After that, the resist mask 190B is removed. Then, part of the sacrificial film 158Bf is removed using the mask layer 159B as a mask, whereby the sacrificial layer 158B is formed. Next, the EL film 153Bf is processed to form the EL layer 153B. For example, part of the EL film 153Bf is removed using the mask layer 159B and the sacrificial layer 158B as a hard mask to form the EL layer 153B.

Accordingly, as illustrated in FIG. 11D, the stacked-layer structure of the EL layer 153B, the sacrificial layer 158B, and the mask layer 159B remains over the conductive layer 152B. The mask layers 159R and 159G are exposed.

Note that the side surfaces of the EL layers 153R, 153G, and 153B are preferably perpendicular or substantially perpendicular to their formation surfaces. For example, the angle between the formation surfaces and these side surfaces is preferably greater than or equal to 60° and less than or equal to 90°.

The distance between two adjacent layers among the EL layers 153R, 153G, and 153B, which are formed by a photolithography technique as described above, can be reduced to less than or equal to 8 μm, less than or equal to 5 μm, less than or equal to 3 μm, less than or equal to 2 μm, or less than or equal to 1 μm. Here, the distance can be specified, for example, by a distance between opposite end portions of two adjacent layers among the EL layers 153R, 153G, and 153B. Reducing the distance between the island-shaped EL layers can provide a display device having high resolution and a high aperture ratio.

Figure 12A:
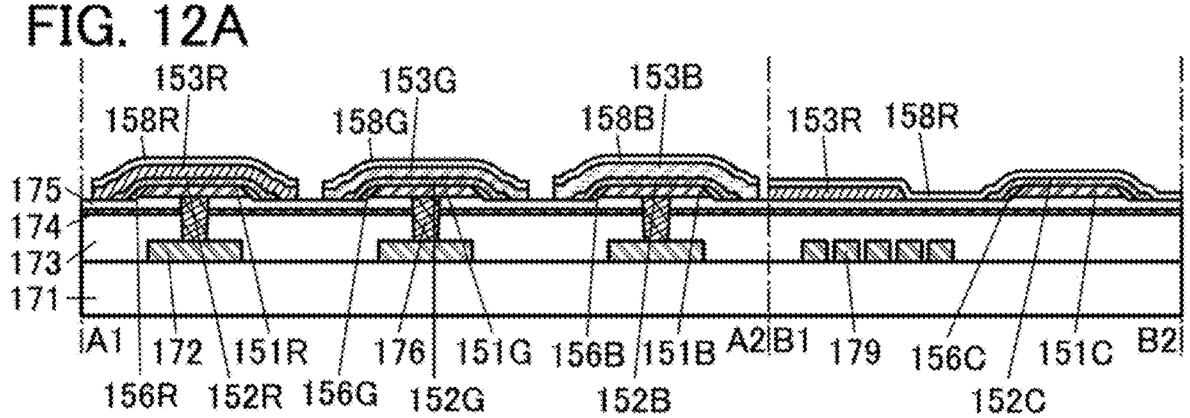
FIGS. 12A to 12C are cross-sectional views illustrating an example of a method for manufacturing a display device.

Next, as illustrated in FIG. 12A, the mask layers 159R, 159G, and 159B are preferably removed. The sacrificial layers 158R, 158G, and 158B and the mask layers 159R, 159G, and 159B remain in the display device in some cases depending on the subsequent steps. Removing the mask layers 159R, 159G, and 159B at this stage can inhibit the mask layers 159R, 159G, and 159B from being left in the display device. For example, in the case where a conductive material is used for the mask layers 159R, 159G, and 159B, removing the mask layers 159R, 159G, and 159B in advance can suppress generation of a leakage current, formation of a capacitor, and the like due to the remaining mask layers 159R, 159G, and 159B.

This embodiment shows an example where the mask layers 159R, 159G, and 159B are removed; however, it is possible that the mask layers 159R, 159G, and 159B are not removed. For example, in the case where the mask layers 159R, 159G, and 159B contain the above-described material having a property of blocking ultraviolet rays, the procedure preferably proceeds to the next step without removing the mask layers 159R, 159G, and 159B, in which case the EL layer can be protected from ultraviolet rays.

The step of removing the mask layers can be performed by a method similar to that for the step of processing the mask layers. Specifically, by using a wet etching method, damage applied to the EL layers 153R, 153G, and 153B at the time of removing the mask layers can be reduced as compared to the case of using a dry etching method.

The mask layers may be removed by being dissolved in a solvent such as water or an alcohol. Examples of an alcohol include ethyl alcohol, methyl alcohol, isopropyl alcohol (IPA), and glycerin.

After the mask layers are removed, drying treatment may be performed in order to remove water included in the EL layers 153R, 153G, and 153B and water adsorbed on the surfaces of the EL layers 153R, 153G, and 153B. For example, heat treatment in an inert gas atmosphere or a reduced-pressure atmosphere can be performed. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 12B:
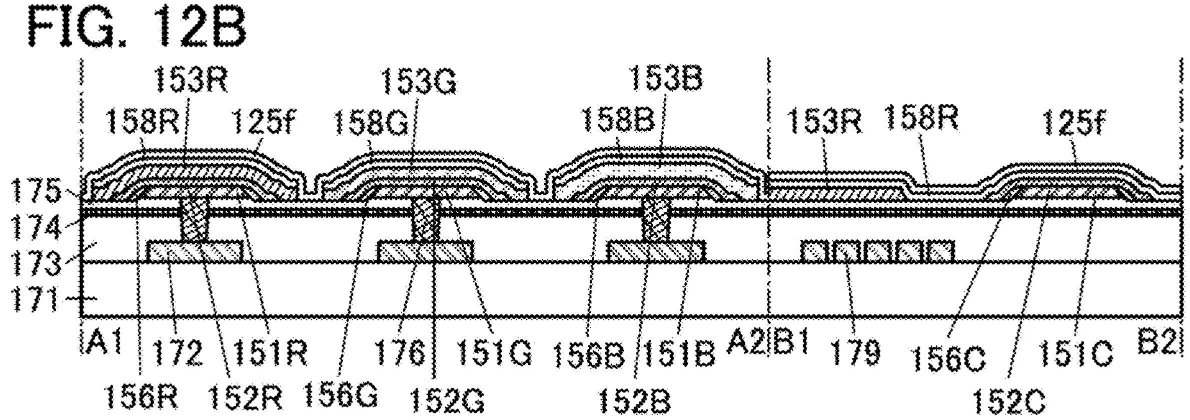

Next, as illustrated in FIG. 12B, the inorganic insulating film 125*f* to be the inorganic insulating layer 125 is formed to cover the EL layers 153R, 153G, and 153B and the sacrificial layers 158R, 158G, and 158B.

As described later, an insulating film to be the insulating layer 127 is formed in contact with the top surface of the inorganic insulating film 125*f*. Therefore, the top surface of the inorganic insulating film 125*f* preferably has a high affinity for the material used for the insulating film (e.g., a photosensitive resin composition containing an acrylic resin). To improve the affinity, surface treatment is preferably performed so that the top surface of the inorganic insulating film 125*f* is made hydrophobic or its hydrophobic properties are improved. For example, it is preferable to perform the treatment using a silylation agent such as hexamethyldisilazane (HMDS). By making the top surface of the inorganic insulating film 125*f* hydrophobic in such a manner, the above insulating film can be formed with favorable adhesion. Note that the above-described hydrophobization treatment may be performed as the surface treatment.

Figure 12C:
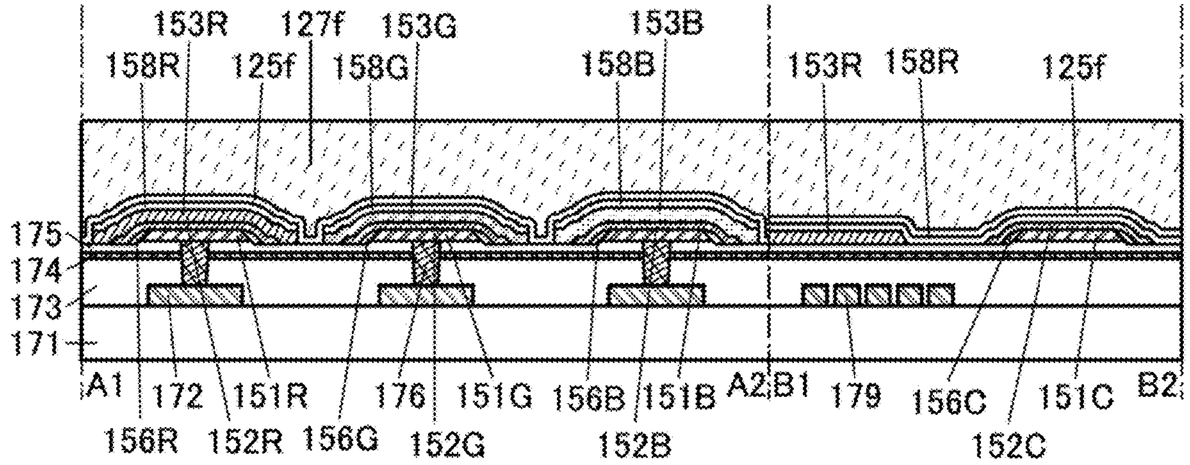

Then, as illustrated in FIG. 12C, an insulating film 127*f* to be the insulating layer 127 is formed over the inorganic insulating film 125*f*.

The inorganic insulating film 125*f* and the insulating film 127*f* are preferably formed by a formation method by which the EL layers 153R, 153G, and 153B are less damaged. The inorganic insulating film 125*f*, which is formed in contact with the side surfaces of the EL layers 153R, 153G, and 153B, is particularly preferably formed by a formation method that causes less damage to the EL layers 153R, 153G, and 153B than the method of forming the insulating film 127*f*.

Each of the insulating films 125*f* and 127*f* is formed at a temperature lower than the upper temperature limit of the EL layers 153R, 153G, and 153B. When the insulating film 125*f* is formed at a high substrate temperature, the formed insulating film 125*f*, even with a small thickness, can have a low impurity concentration and a high barrier property against at least one of water and oxygen.

The substrate temperature at the time of forming the inorganic insulating film 125*f* and the insulating film 127*f* is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film 125*f*, an insulating film having a thickness of greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed in the above-described range of the substrate temperature.

The inorganic insulating film 125*f* is preferably formed by an ALD method, for example. An ALD method is preferably used, in which case deposition damage is reduced and a film with good coverage can be formed. As the inorganic insulating film 125*f*, an aluminum oxide film is preferably formed by an ALD method, for example.

Alternatively, the inorganic insulating film 125*f* may be formed by a sputtering method, a CVD method, or a PECVD method, each of which has a higher deposition rate than an ALD method. In that case, a highly reliable display device can be manufactured with high productivity.

The insulating film 127*f* is preferably formed by the aforementioned wet process. The insulating film 127*f* is preferably formed by spin coating using a photosensitive material, for example, and specifically preferably formed using a photosensitive resin composition containing an acrylic resin.

The insulating film 127*f* is preferably formed using a resin composition containing a polymer, an acid-generating agent, and a solvent, for example. The polymer is formed using one or more kinds of monomers and has a structure where one or more kinds of structural units (also referred to as building blocks) are repeated regularly or irregularly. As the acid-generating agent, one or both of a compound that generates an acid by light irradiation and a compound that generates an acid by heating can be used. The resin composition may also include one or more of a photosensitizing agent, a sensitizer, a catalyst, an adhesive aid, a surface-active agent, and an antioxidant.

Heat treatment (also referred to as prebaking) is preferably performed after the insulating film 127*f* is formed. The heat treatment is performed at a temperature lower than the upper temperature limit of the EL layers 153R, 153G, and 153B. The substrate temperature in the heat treatment is preferably higher than or equal to 50° C. and lower than or equal to 200° C., further preferably higher than or equal to 60° C. and lower than or equal to 150° C., still further preferably higher than or equal to 70° C. and lower than or equal to 120° C. Accordingly, the solvent contained in the insulating film 127*f* can be removed.

Then, part of the insulating film 127*f* is exposed to visible light or ultraviolet rays. Here, when a positive photosensitive resin composition containing an acrylic resin is used for the insulating film 127*f*, a region where the insulating layer 127 is not formed in a later step is irradiated with visible light or ultraviolet rays. The insulating layer 127 is formed in regions that are sandwiched between any two of the conductive layers 152R, 152G, and 152B and around the conductive layer 152C. Thus, the top surfaces of the conductive layers 152R, 152G, 152B, and 152C are irradiated with visible light or ultraviolet rays. Note that when a negative photosensitive material is used for the insulating film 127*f*, the region where the insulating layer 127 is to be formed is irradiated with visible light or ultraviolet rays.

The width of the insulating layer 127 formed later can be controlled in accordance with the exposed region of the insulating film 127*f*. In this embodiment, processing is performed such that the insulating layer 127 includes a portion overlapping the top surface of the conductive layer 151.

Light used for exposure preferably includes the i-line (wavelength: 365 nm). Furthermore, light used for exposure may include at least one of the g-line (wavelength: 436 nm) and the h-line (wavelength: 405 nm).

Here, when a barrier insulating layer against oxygen (e.g., an aluminum oxide film) is provided as one or both of the sacrificial layer 158 (the sacrificial layers 158R, 158G, and 158B) and the inorganic insulating film 125*f*, diffusion of oxygen to the EL layers 153R, 153G, and 153B can be suppressed. When the EL layer is irradiated with light (visible light or ultraviolet rays), the organic compound contained in the EL layer is brought into an excited state and a reaction between the organic compound and oxygen in the atmosphere is promoted in some cases. Specifically, when the EL layer is irradiated with light (visible light or ultraviolet rays) in an atmosphere including oxygen, oxygen might be bonded to the organic compound contained in the EL layer. By providing the sacrificial layer 158 and the inorganic insulating film 125*f* over the island-shaped EL layer, bonding of oxygen in the atmosphere to the organic compound contained in the EL layer can be suppressed.

Figure 13A:
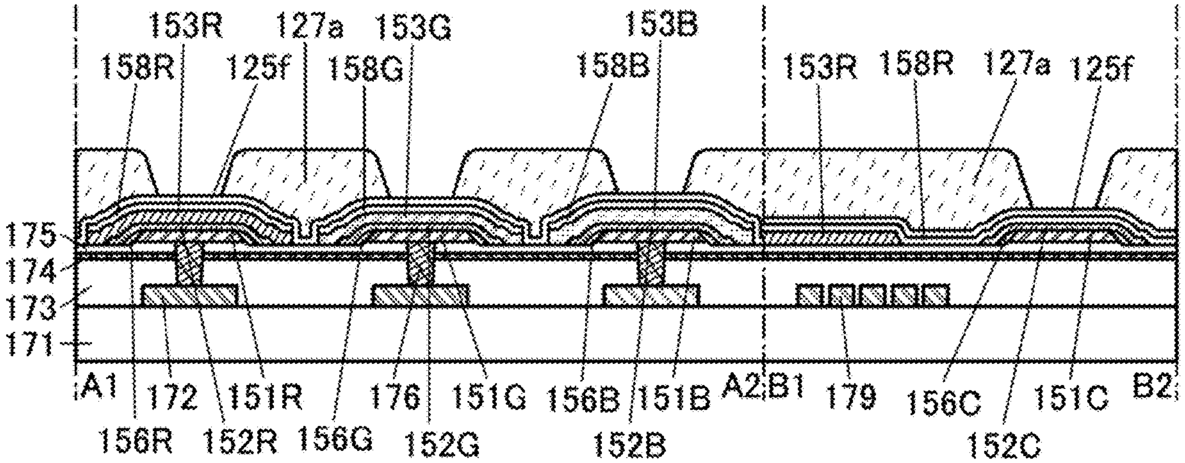
FIGS. 13A and 13B are cross-sectional views illustrating an example of a method for manufacturing a display device.
Figure 13B:
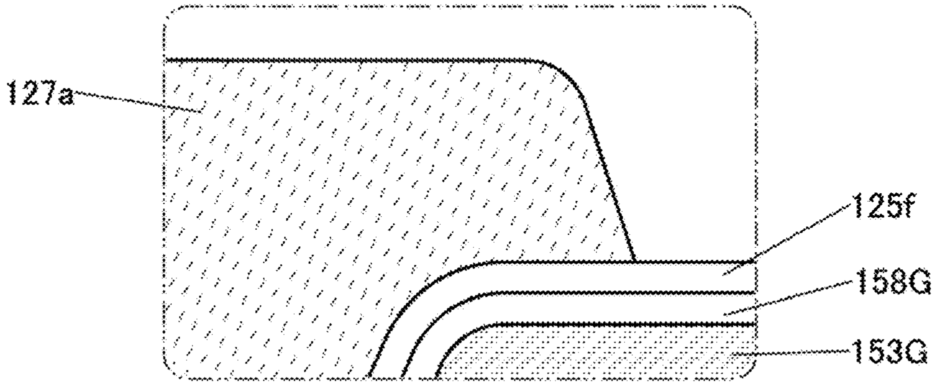

Next, as illustrated in FIGS. 13A and 13B, development is performed to remove the exposed region of the insulating film 127*f*, whereby an insulating layer 127*a* is formed. FIG. 13B is an enlarged view of the end portions of the EL layer 153G and the insulating layer 127*a* illustrated in FIG. 13A and their vicinity. The insulating layer 127*a* is formed in regions that are sandwiched between any two of the conductive layers 152R, 152G, and 152B and a region surrounding the conductive layer 152C. Here, when an acrylic resin is used for the insulating film 127*f*, an alkaline solution, such as TMAH, can be used as a developer.

Then, a residue (scum) due to the development may be removed. For example, the residue can be removed by ashing using oxygen plasma.

Etching may be performed so that the surface level of the insulating layer 127*a* is adjusted. The insulating layer 127*a* may be processed by ashing using oxygen plasma, for example. In the case where a non-photosensitive material is used for the insulating film 127*f*, the surface level of the insulating film 127*f* can be adjusted by the ashing, for example.

Figure 14A:
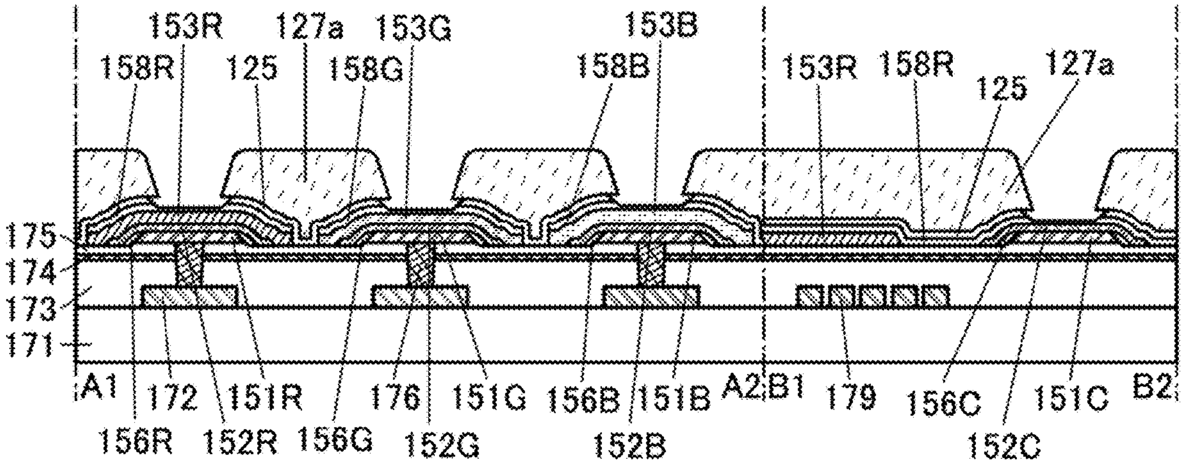
FIGS. 14A and 14B are cross-sectional views illustrating an example of a method for manufacturing a display device.
Figure 14B:
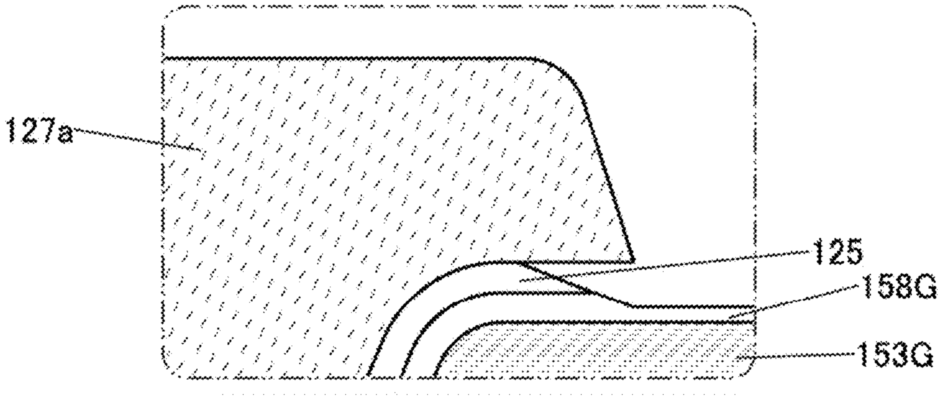

Next, as illustrated in FIGS. 14A and 14B, etching treatment is performed with the insulating layer 127*a* as a mask to remove part of the inorganic insulating film 125*f* and reduce the thickness of part of the sacrificial layers 158R, 158G, and 158B. Thus, the inorganic insulating layer 125 is formed under the insulating layer 127*a*. Moreover, the surfaces of the thin portions in the sacrificial layers 158R, 158G, and 158B are exposed. FIG. 14B is an enlarged view of the end portions of the EL layer 153G and the insulating layer 127*a* illustrated in FIG. 14A and their vicinity. Note that the etching treatment using the insulating layer 127*a* as a mask may be hereinafter referred to as first etching treatment.

The first etching treatment can be performed by dry etching or wet etching.

Note that the inorganic insulating film 125*f* is preferably formed using a material similar to that of the sacrificial layers 158R, 158G, and 158B, in which case the first etching treatment can be performed concurrently.

By etching using the insulating layer 127*a* with a tapered side surface as a mask as illustrated in FIG. 14B, the side surface of the inorganic insulating layer 125 and upper end portions of the side surfaces of the sacrificial layers 158R, 158G, and 158B can be made to have a tapered shape relatively easily.

The first etching treatment is preferably performed by wet etching. The use of a wet etching method can reduce damage to the EL layers (the EL layers 153R, 153G, and 153B), as compared to the case of using a dry etching method.

In the case where a wet etching method is employed, a chemical solution having high selectivity with respect to the insulating layer 127*a* is preferably used. For example, an alkaline chemical solution sometimes dissolves an organic substance to cause a shape defect in a structure body formed using an organic substance. Thus, in the case where the insulating layer 127*a* is formed using a positive photosensitive resin composition containing an acrylic resin, an acidic chemical solution is preferably used. Use of an acidic chemical solution can inhibit the insulating layer 127*a* from being dissolved and losing its shape. As an acidic chemical solution, a chemical solution containing one or more of phosphoric acid, hydrofluoric acid, nitric acid, acetic acid, oxalic acid, sulfuric acid, and the like or a mixed chemical solution that contains two or more of these acids is preferably used.

The wet etching can be performed using an alkaline solution. For instance, TMAH, which is an alkaline solution, can be used for the wet etching of an aluminum oxide film. In this case, puddle wet etching can be performed. Note that the inorganic insulating film 125*f* is preferably formed using a material similar to that of the sacrificial layers 158R, 158G, and 158B, in which case the above etching treatment can be performed concurrently.

In the case of performing dry etching, a chlorine-based gas is preferably used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158R, 158G, and 158B can be formed with favorable in-plane uniformity.

As a dry etching apparatus, a dry etching apparatus including a high-density plasma source can be used. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, the capacitively coupled plasma etching apparatus may have a structure in which different high-frequency voltages are applied to one of the parallel-plate electrodes. Alternatively, the capacitively coupled plasma etching apparatus may have a structure in which high-frequency voltages with the same frequency are applied to the parallel-plate electrodes. Alternatively, the capacitively coupled plasma etching apparatus may have a structure in which high-frequency voltages with different frequencies are applied to the parallel-plate electrodes.

In the case of performing dry etching, a by-product or the like generated by the dry etching might be deposited on the top surface and the side surface of the insulating layer 127*a*, for example. Accordingly, a constituent of the etching gas, a constituent of the inorganic insulating film 125*f*, a constituent of the sacrificial layers 158R, 158G, and 158B, and the like might be included in the insulating layer 127 in the completed display device.

As illustrated in FIGS. 14A and 14B, the sacrificial layers 158R, 158G, and 158B are not removed completely by the first etching treatment, and the etching treatment is stopped when the thickness of the sacrificial layers 158R, 158G, and 158B is reduced. The corresponding sacrificial layers 158R, 158G, and 158B remain over the EL layers 153R, 153G, and 153B in this manner, whereby the EL layers 153R, 153G, and 153B can be prevented from being damaged by treatment in a later step.

Although the thickness of the sacrificial layers 158R, 158G, and 158B is reduced in FIGS. 14A and 14B, the present invention is not limited thereto. For example, depending on the thickness of the inorganic insulating film 125*f* and the thickness of the sacrificial layers 158R, 158G, and 158B, the first etching treatment may be stopped before the inorganic insulating film 125*f* is processed into the inorganic insulating layer 125. Specifically, the first etching treatment may be stopped after reducing the thickness of only part of the inorganic insulating film 125*f*. In the case where the inorganic insulating film 125*f* is formed using a material similar to that of the sacrificial layers 158R, 158G, and 158B, the boundary between the inorganic insulating film 125*f* and the sacrificial layers 158R, 158G, and 158B may be unclear; hence, whether the inorganic insulating layer 125 is formed and whether the thickness of the sacrificial layers 158R, 158G, and 158B is reduced cannot be determined in some cases.

Although FIGS. 14A and 14B show an example in which the shape of the insulating layer 127*a* is not changed from that in FIGS. 13A and 13B, the present invention is not limited thereto. For example, the end portion of the insulating layer 127*a* may droop to cover the end portion of the inorganic insulating layer 125. As another example, the end portion of the insulating layer 127*a* may be in contact with the top surfaces of the sacrificial layers 158R, 158G, and 158B. For example, when light exposure is not performed on the insulating layer 127*a* after the development, the shape of the insulating layer 127*a* may be likely to change.

Next, light exposure is preferably performed on the entire substrate so that the insulating layer 127*a* is irradiated with visible light or ultraviolet rays. The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after the development can sometimes increase the degree of transparency of the insulating layer 127*a*. In addition, it is sometimes possible to lower the substrate temperature required for subsequent heat treatment for changing the shape of the insulating layer 127*a* to a tapered shape.

Here, when a barrier insulating layer against oxygen (e.g., an aluminum oxide film) is provided as each of the sacrificial layers 158R, 158G, and 158B, diffusion of oxygen to the EL layers 153R, 153G, and 153B can be suppressed. When the EL layer is irradiated with light (visible light or ultraviolet rays), the organic compound contained in the EL layer is brought into an excited state and a reaction between the organic compound and oxygen in the atmosphere is promoted in some cases. Specifically, when the EL layer is irradiated with light (visible light or ultraviolet rays) in an atmosphere including oxygen, oxygen might be bonded to the organic compound contained in the EL layer. By providing the sacrificial layers 158R, 158G, and 158B over the island-shaped EL layer, bonding of oxygen in the atmosphere to the organic compound contained in the EL layer can be suppressed.

Meanwhile, as described later, when light exposure is not performed on the insulating layer 127*a*, it sometimes becomes easy to change the shape of the insulating layer 127*a* or change the shape of the insulating layer 127 to a tapered shape in a later step.

Figure 15A:
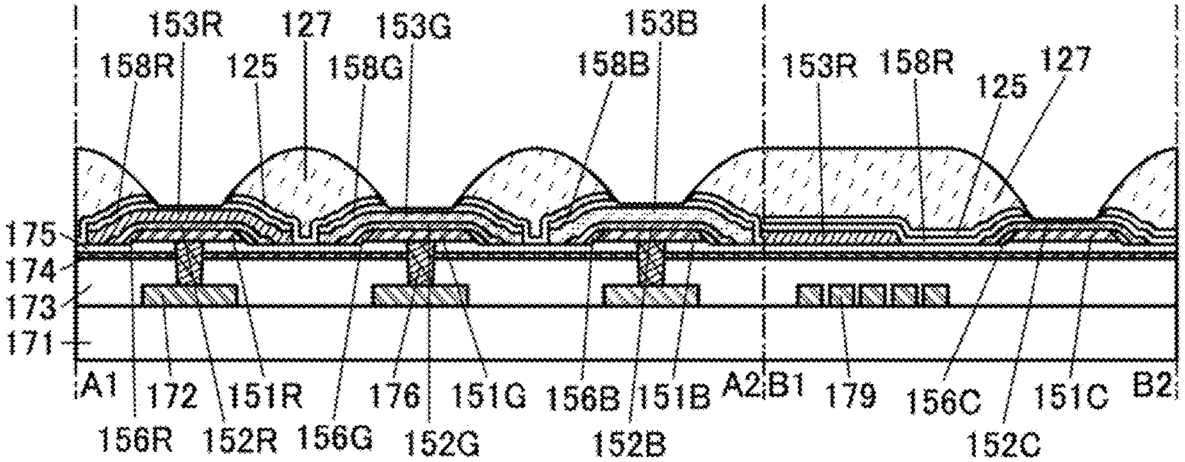
FIGS. 15A and 15B are cross-sectional views illustrating an example of a method for manufacturing a display device.
Figure 15B:
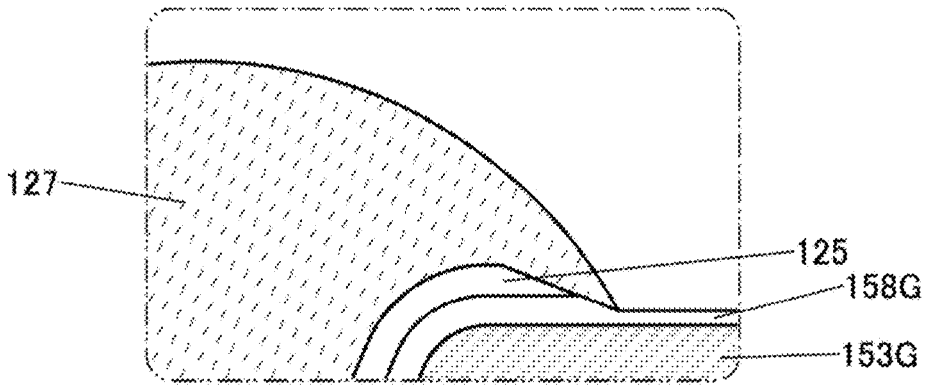

Then, heat treatment (also referred to as post-baking) is performed as illustrated in FIGS. 15A and 15B. As illustrated in FIGS. 15A and 15B, the heat treatment can change the insulating layer 127*a* into the insulating layer 127 having a tapered side surface. Note that as described above, in some cases, the insulating layer 127*a* is already changed in shape and has a tapered side surface at the moment when the first etching treatment ends. The heat treatment is conducted at a temperature lower than the upper temperature limit of the EL layer. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. The heating atmosphere is preferably a reduced-pressure atmosphere, in which case drying at a lower temperature is possible. The substrate temperature in the heat treatment of this step is preferably higher than that in the heat treatment (prebaking) after the formation of the insulating film 127*f*. Accordingly, adhesion between the insulating layer 127 and the inorganic insulating layer 125 can be improved, and corrosion resistance of the insulating layer 127 can be increased. FIG. 15B is an enlarged view of the end portions of the EL layer 153G and the insulating layer 127 illustrated in FIG. 15A and their vicinity.

When the sacrificial layers 158R, 158G, and 158B are not completely removed by the first etching treatment and the thinned sacrificial layers 158R, 158G, and 158B are left, the EL layers 153R, 153G, and 153B can be prevented from being damaged and deteriorating in the heat treatment. This increases the reliability of the light-emitting element.

Note that the side surface of the insulating layer 127 may have a concave shape depending on the material of the insulating layer 127 and the temperature, time, and atmosphere of the post-baking. For example, when the temperature of the post-baking is higher or the duration of the post-baking is longer, the shape of the insulating layer 127 is more likely to change and thus a concave shape may be more likely to be formed. As described above, when light exposure is not performed on the insulating layer 127*a* after the development, the shape of the insulating layer 127 may be likely to change in the post-baking.

Figure 16A:
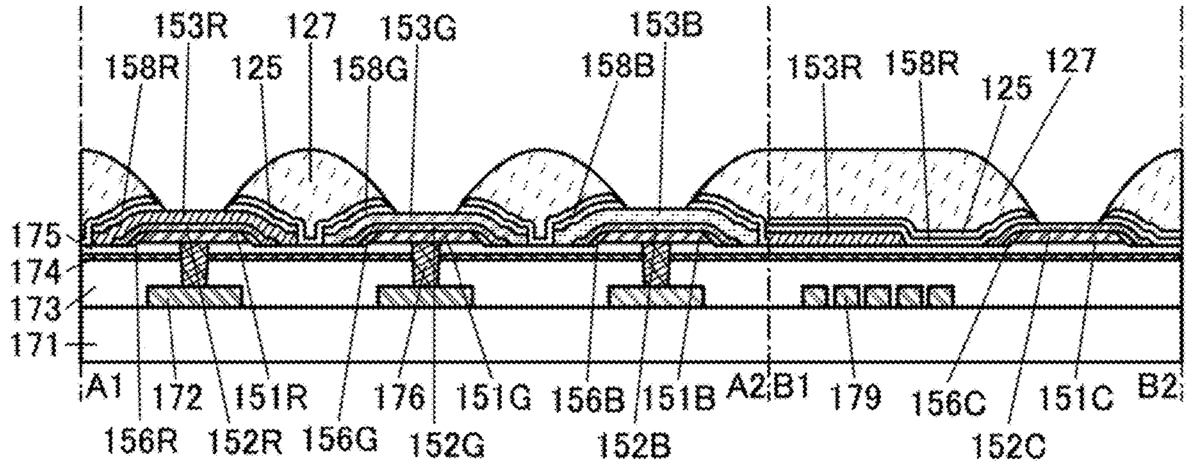
FIGS. 16A and 16B are cross-sectional views illustrating an example of a method for manufacturing a display device.
Figure 16B:
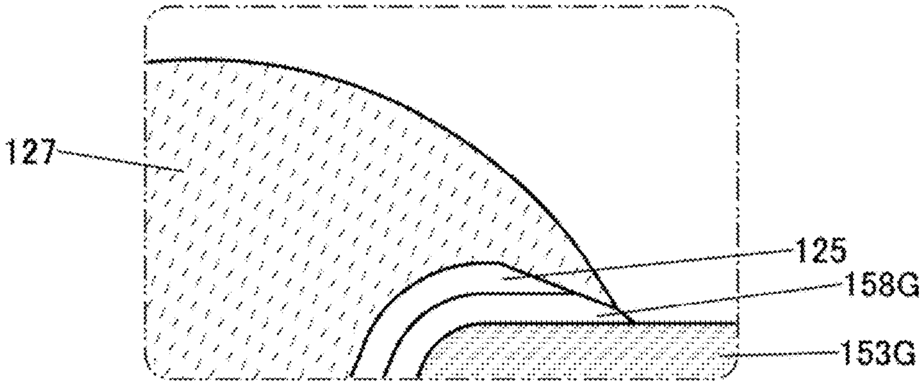

Next, as illustrated in FIGS. 16A and 16B, etching treatment is performed with the insulating layer 127 as a mask to remove part of the sacrificial layers 158R, 158G, and 158B. Note that part of the inorganic insulating layer 125 is also removed in some cases. Thus, openings are formed in the sacrificial layers 158R, 158G, and 158B, and the top surfaces of the EL layers 153R, 153G, and 153B and the conductive layer 152C are exposed. FIG. 16B is an enlarged view of the end portions of the EL layer 153G and the insulating layer 127 illustrated in FIG. 16A and their vicinity. Note that the etching treatment using the insulating layer 127 as a mask may be hereinafter referred to as second etching treatment.

The end portion of the inorganic insulating layer 125 is covered with the insulating layer 127. FIGS. 16A and 16B illustrate an example in which part of the end portion of the sacrificial layer 158G (specifically a tapered portion formed by the first etching treatment) is covered with the insulating layer 127 and a tapered portion formed by the second etching treatment is exposed.

If the first etching treatment is not performed and the inorganic insulating layer 125 and the sacrificial layer 158 are collectively etched after the post-baking, the inorganic insulating layer 125 and the sacrificial layer 158 under the end portion of the insulating layer 127 may disappear because of side-etching and a void may be formed. The void causes unevenness on the formation surface of the common electrode 155, so that a step-cut is more likely to be caused in the common electrode 155. Even when a void is formed owing to side-etching of the inorganic insulating layer 125 and the sacrificial layer 158 by the first etching treatment, the post-baking performed subsequently can make the insulating layer 127 fill the void. After that, the thinned sacrificial layer 158 is etched by the second etching treatment; thus, the amount of side-etching decreases, a void is less likely to be formed, and even if a void is formed, it can be extremely small. Consequently, the formation surface of the common electrode 155 can be made flatter.

Note that the insulating layer 127 may cover the entire end portion of the sacrificial layer 158G. For example, the end portion of the insulating layer 127 may droop to cover the end portion of the sacrificial layer 158G. As another example, the end portion of the insulating layer 127 may be in contact with the top surface of at least one of the EL layers 153R, 153G, and 153B. As described above, when light exposure is not performed on the insulating layer 127*a* after the development, the shape of the insulating layer 127 may be likely to change.

The second etching treatment is performed by wet etching. The use of a wet etching method can reduce damage to the EL layers 153R, 153G, and 153B, as compared to the case of using a dry etching method.

In the case where a wet etching method is employed, a chemical solution having high selectivity with respect to the insulating layer 127*a* and the EL layer is preferably used. For example, an alkaline chemical solution sometimes dissolves organic substances contained in the insulating layer 127*a* and the EL layer and causes a shape defect in a structure body formed using an organic substance or generation of an impurity by dissolution of an organic substance in some cases. Use of an acidic chemical solution can inhibit the insulating layer 127*a* or the EL layer from being dissolved and losing its shape. As an acidic chemical solution, a chemical solution containing one or more of phosphoric acid, hydrofluoric acid, nitric acid, acetic acid, oxalic acid, sulfuric acid, and the like or a mixed chemical solution that contains two or more of these acids is preferably used. The wet etching can also be performed using an alkaline solution such as TMAH, for example.

Meanwhile, in the case where the second etching treatment is performed by a wet etching method and gaps due to, for example, poor adhesion between the EL layer 153 and another layer exist at the interface between the EL layer 153 and the sacrificial layer 158, the interface between the EL layer 153 and the inorganic insulating layer 125, and the interface between the EL layer 153 and the insulating layer 175, the chemical solution used in the second etching treatment sometimes enters the gaps to come into contact with the pixel electrode. Here, when the chemical solution comes into contact with both the conductive layer 151 and the conductive layer 152, one of the conductive layers 151 and 152 that has a lower spontaneous potential than the other suffers from galvanic corrosion in some cases. For example, when the conductive layer 151 is formed using aluminum and the conductive layer 152 is formed using indium tin oxide, the conductive layer 152 sometimes corrodes. As a result, the yield of the display device decreases in some cases. Moreover, the reliability of the display device is lowered in some cases.

In the method for manufacturing the display device of one embodiment of the present invention, the conductive layer 152 is formed to cover the top surface and the side surface of the conductive layer 151 as described above. Thus, even when gaps exist at the interface between the EL layer 153 and the sacrificial layer 158, the interface between the EL layer 153 and the inorganic insulating layer 125, and the interface between the EL layer 153 and the insulating layer 175, for example, the chemical solution can be prevented from coming into contact with the conductive layer 151 in the second etching treatment. Thus, corrosion of the pixel electrode, e.g., the conductive layer 152, can be prevented.

However, such corrosion due to galvanic corrosion, for example, sometimes occurs even in a structure without the above-described gaps when the conductive layer 152 is disconnected owing to a step-cut by the conductive layer 151 or the like and a gap exists at the interface between the conductive layer 151 and the conductive layer 152 or the interface between the conductive layer 152 and the EL layer 153.

In view of this, in the method for manufacturing the display device of one embodiment of the present invention, the insulating layer 156 is formed to include a region overlapping the side surface of the conductive layer 151 and the conductive layer 152 is formed to cover the conductive layer 151 and the insulating layer 156 as described above. This can prevent a step-cut in the conductive layer 152, whereby the chemical solution can be prevented from coming into contact with the conductive layer 151 in the second etching treatment, for example. Thus, corrosion of the pixel electrode, e.g., the conductive layer 152, can be prevented.

As described above, the method for manufacturing the display device of one embodiment of the present invention can achieve high yield. In addition, the method for manufacturing the display device of one embodiment of the present invention can inhibit generation of defects.

As described above, by providing the insulating layer 127, the inorganic insulating layer 125, and the sacrificial layers 158R, 158G, and 158B, poor connection due to a disconnected portion and an increase in electric resistance due to a locally thinned portion can be inhibited from occurring in the common electrode 155 between the light-emitting elements. Thus, the display device of one embodiment of the present invention can have improved display quality.

Heat treatment may be performed after the EL layers 153R, 153G, and 153B are partly exposed. By the heat treatment, water included in the EL layer and water adsorbed on the surface of the EL layer, for example, can be removed. The shape of the insulating layer 127 may be changed by the heat treatment. Specifically, the insulating layer 127 may be widened to cover at least one of the end portion of the inorganic insulating layer 125, the end portions of the sacrificial layers 158R, 158G, and 158B, and the top surfaces of the EL layers 153R, 153G, and 153B.

Figure 17A:
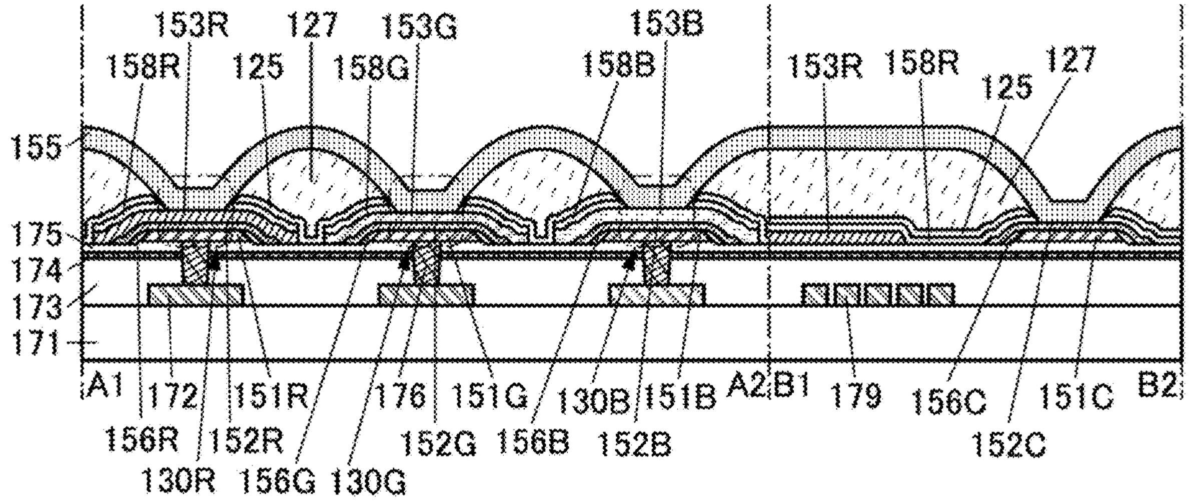
FIGS. 17A and 17B are cross-sectional views illustrating an example of a method for manufacturing a display device.

Next, as illustrated in FIG. 17A, the common electrode 155 is formed over the EL layers 153R, 153G, and 153B, the conductive layer 152C, and the insulating layer 127. The common electrode 155 can be formed by a sputtering method, a vacuum evaporation method, or the like. Alternatively, the common electrode 155 may be formed by stacking a film formed by an evaporation method and a film formed by a sputtering method.

Figure 17B:
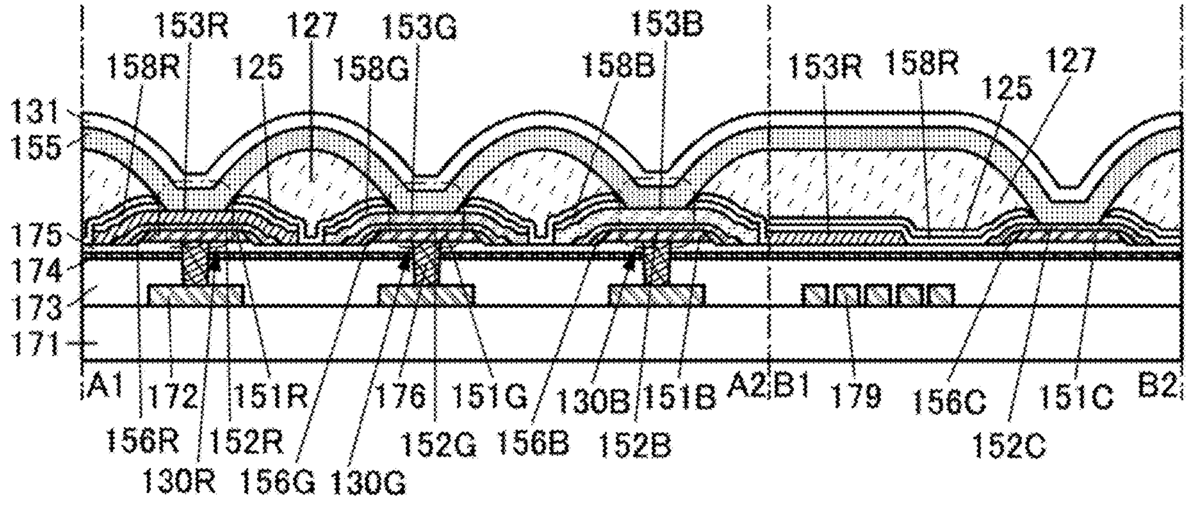

Next, as illustrated in FIG. 17B, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, whereby the display device can be manufactured. In the method for manufacturing the display device of one embodiment of the present invention, the insulating layer 156 is formed to include a region overlapping the side surface of the conductive layer 151 and the conductive layer 152 is formed to cover the conductive layer 151 and the insulating layer 156 as described above. This can increase the yield of the display device and inhibit generation of defects.

Here, after the insulating layer 127 is formed by the post-baking illustrated in FIGS. 15A and 15B, the insulating layer 127 may be exposed to light. For example, the insulating layer 127 may be exposed to light in the case where the aforementioned light exposure is not performed on the insulating layer 127*a*. For example, the insulating layer 127 may be exposed to light after the second etching treatment illustrated in FIGS. 16A and 16B and before the formation of the common electrode 155 illustrated in FIG. 17A. Alternatively, the insulating layer 127 may be exposed to light after the formation of the common electrode 155 illustrated in FIG. 17A and before the formation of the protective layer 131 illustrated in FIG. 17B. Alternatively, the insulating layer 127 may be exposed to light after the formation of the protective layer 131 illustrated in FIG. 17B. Here, for example, the conditions similar to those for the aforementioned light exposure on the insulating layer 127*a* can be used as the conditions for light exposure on the insulating layer 127. Note that the total number of times of light exposure on the insulating layer 127*a* and light exposure on the insulating layer 127 may be 0, 1, 2, or more.

For example, in the case where a photocurable resin is used for the insulating layer 127, light exposure on the insulating layer 127 can cure the insulating layer 127. Consequently, deformation of the insulating layer 127 can be suppressed. Thus, peeling of the layer over the insulating layer 127 can be inhibited, for example. Accordingly, the display device of one embodiment of the present invention can be a highly reliable display device.

As described above, in the method for manufacturing the display device of one embodiment of the present invention, the island-shaped EL layers 153R, 153G, and 153B are formed not by using a fine metal mask but by processing a film formed on the entire surface; thus, the island-shaped layers can be formed to have a uniform thickness. Consequently, a high-resolution display device or a display device with a high aperture ratio can be obtained. Furthermore, even when the resolution or the aperture ratio is high and the distance between the subpixels is extremely short, the EL layers 153R, 153G, and 153B can be inhibited from being in contact with each other in the adjacent subpixels. As a result, generation of a leakage current between the subpixels can be inhibited. This can prevent crosstalk, so that a display device with extremely high contrast can be obtained. Furthermore, when each of the EL layers 153R, 153G, and 153B includes the electron-injection layer 115 having the structure as described in Embodiments 1 and 2, a contamination-free display device having favorable characteristics can be manufactured.

In addition, the insulating layer 127 having a tapered side surface is provided between the adjacent island-shaped EL layers, whereby occurrence of a step-cut can be inhibited at the time of forming the common electrode 155, and a locally thinned portion can be prevented from being formed in the common electrode 155. Thus, poor connection due to a disconnected portion and an increase in electric resistance due to a locally thinned portion can be inhibited from occurring in the common electrode 155. Hence, the display device of one embodiment of the present invention achieves both high resolution and high display quality.

Manufacturing Method Example 2

Another exemplary method for manufacturing the display device 100 is described with reference to FIGS. 18A to 18E and FIGS. 19A to 19D. Note that steps different from those in the method described with FIGS. 7A1 to 17B will be mainly described, and the description of the same steps as those in the method described with FIGS. 7A1 to 17B will be omitted as appropriate.

Figure 18A:
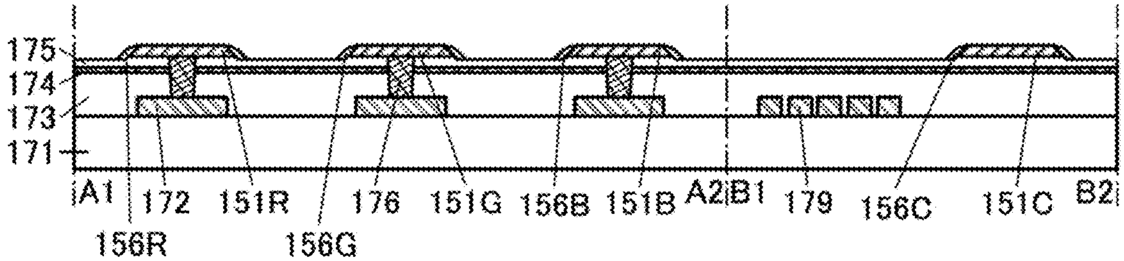
FIGS. 18A to 18E are cross-sectional views illustrating an example of a method for manufacturing a display device.

First, steps similar to those illustrated in FIGS. 7A1 to 8C2 are performed. Thus, as illustrated in FIG. 18A, the conductive layers 151R, 151G, 151B, and 151C are formed over the plugs 176 and the insulating layer 175. In addition, the insulating layer 156R is formed to include a region overlapping the side surface of the conductive layer 151R; the insulating layer 156G is formed to include a region overlapping the side surface of the conductive layer 151G; the insulating layer 156B is formed to include a region overlapping the side surface of the conductive layer 151B; and the insulating layer 156C is formed to include a region overlapping the side surface of the conductive layer 151C.

Figure 18B:
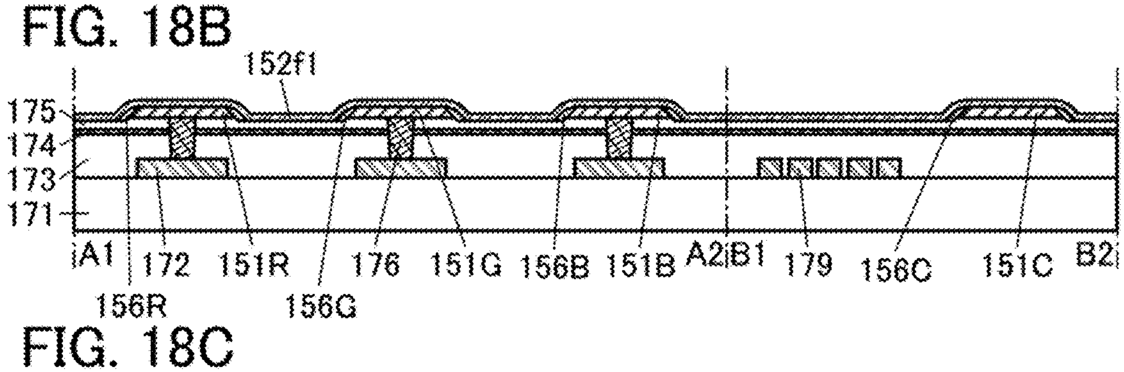

Next, as illustrated in FIG. 18B, a conductive film **152*f*1 is formed over the conductive layers 151R, 151G, 151B, and 151C and the insulating layers 156R, 156G, 156B, 156C, and 175. The conductive film 152*f*1 can be formed by a method similar to that for the conductive film 152*f* illustrated in FIG. 9A, for example, and formed using a material similar to that for the conductive film 152*f***.

Figure 18C:
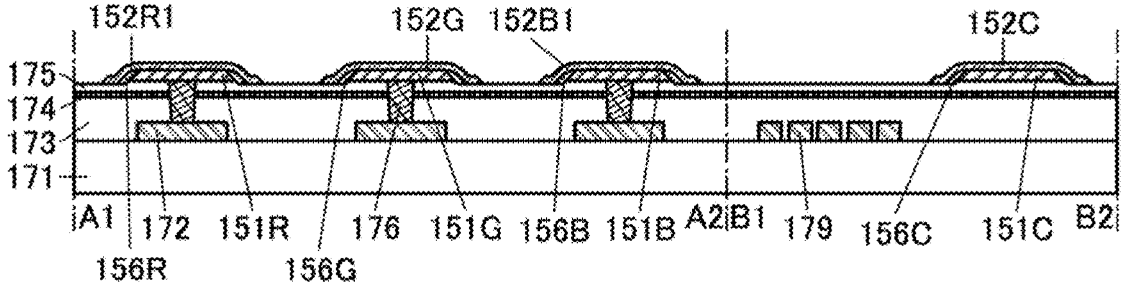

Then, as illustrated in FIG. 18C, the conductive film **152*f*1 is processed to form a conductive layer 152R1 covering the conductive layer 151R and the insulating layer 156R, the conductive layer 152G covering the conductive layer 151G and the insulating layer 156G, a conductive layer 152B1 covering the conductive layer 151B and the insulating layer 156B, and the conductive layer 152C covering the conductive layer 151C and the insulating layer 156C. The conductive film 152*f*1 can be processed by a method similar to that for processing the conductive film 152*f***.

Figure 18D:
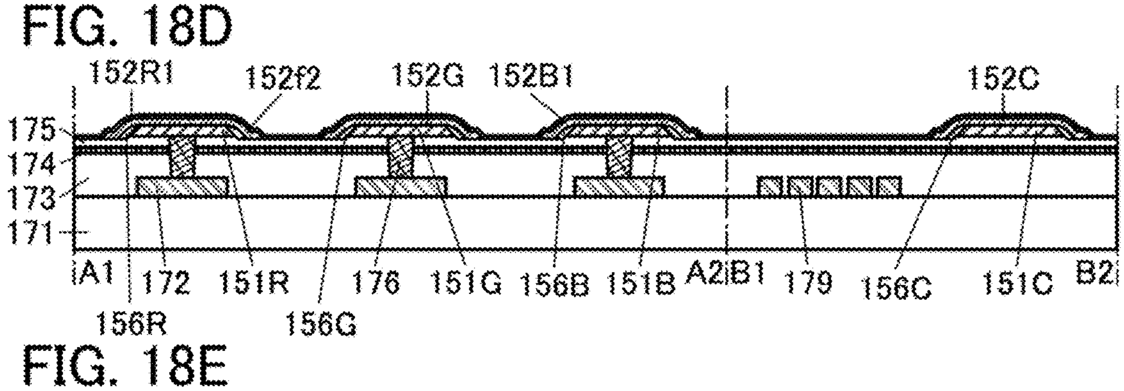

Next, as illustrated in FIG. 18D, a conductive film **152*f*2 is formed over the conductive layers 152R1, 152G, 152B1, and 152C. The conductive film 152*f*2 can be formed using a method and a material similar to those for the conductive film 152*f***.

Figure 18E:
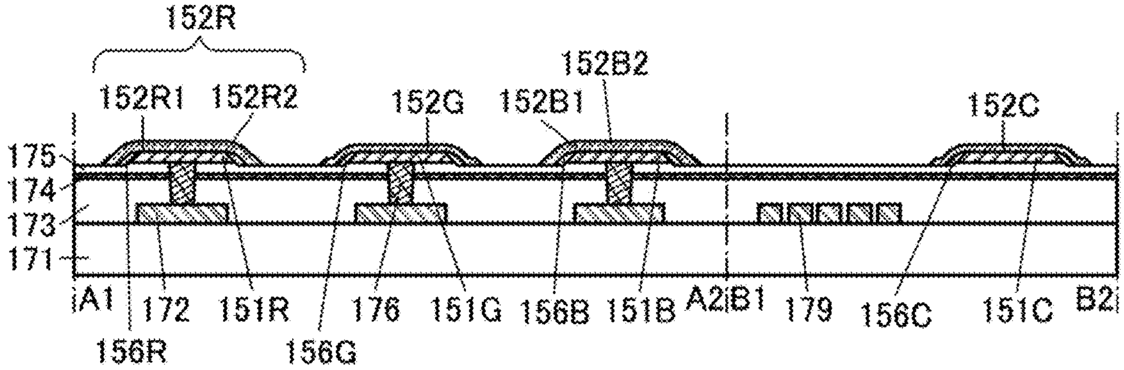

Then, as illustrated in FIG. 18E, the conductive film **152*f*2 is processed to form a conductive layer 152R2 over the conductive layer 152R1 and a conductive layer 152B2 over the conductive layer 152B1. The conductive layers 152R1 and 152R2 can constitute the conductive layer 152R. The conductive film 152*f*2 can be processed by a method similar to that for processing the conductive film 152*f*. Note that in FIG. 18E, the boundary between the conductive layer 152R1 and the conductive layer 152R2 and the boundary between the conductive layer 152B1 and the conductive layer 152B2** are denoted with dotted lines. The same applies to the following drawings.

Figure 19A:
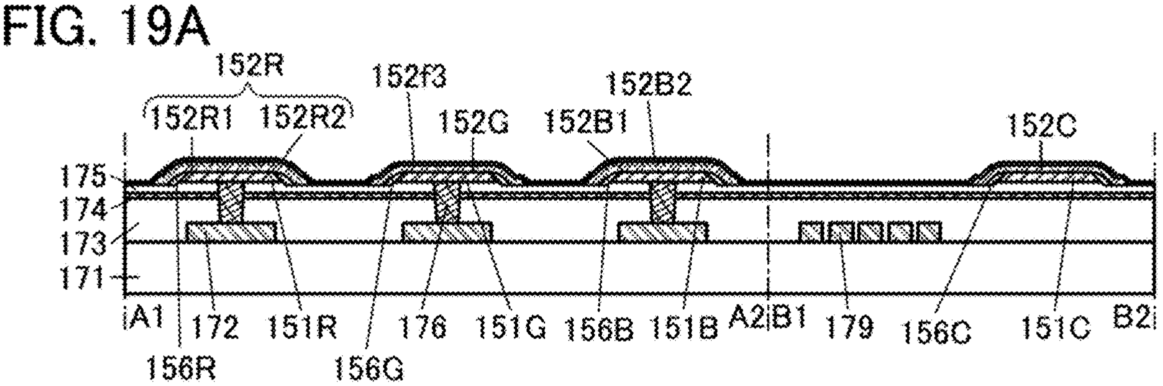
FIGS. 19A to 19D are cross-sectional views illustrating an example of a method for manufacturing a display device.

Next, as illustrated in FIG. 19A, a conductive film **152*f*3 is formed over the conductive layers 152R2, 152G, 152B2, and 152C. The conductive film 152*f*3 can be formed using a method and a material similar to those for the conductive film 152*f***.

Figure 19B:
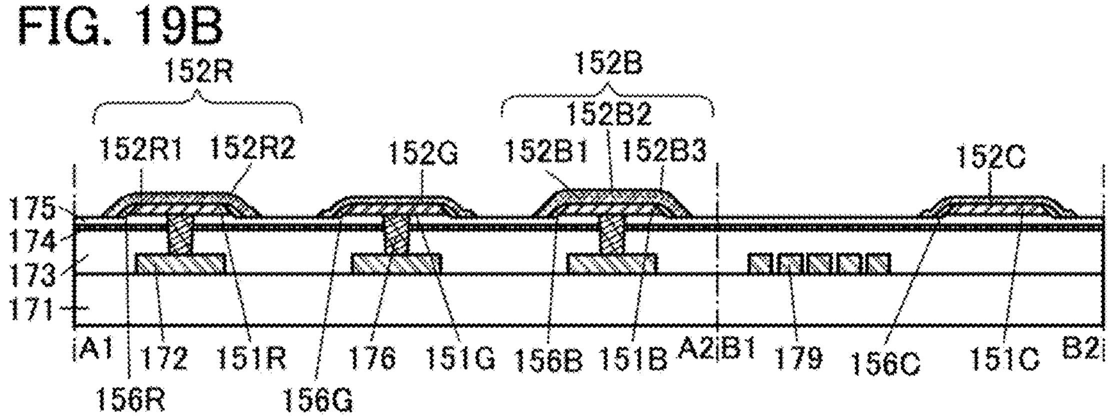

Then, as illustrated in FIG. 19B, the conductive film **152*f*3 is processed to form a conductive layer 152B3 over the conductive layer 152B2. The conductive layers 152B1, 152B2, and 152B3 can constitute the conductive layer 152B. The conductive film 152*f*3 can be processed by a method similar to that for processing the conductive film 152*f*. Note that in FIG. 19B, the boundary between the conductive layer 152B2 and the conductive layer 152B3** is denoted with a dotted line. The same applies to the following drawings.

In the above manner, the conductive layers 152R, 152G, and 152B can have different thicknesses. Note that among the conductive layers 152R, 152G, and 152B, the conductive layer 152B has the largest thickness and the conductive layer 152G has the smallest thickness; however, one embodiment of the present invention is not limited thereto, and the thicknesses of the conductive layers 152R, 152G, and 152B can be set as appropriate. For example, among the conductive layers 152R, 152G, and 152B, the conductive layer 152R may have the largest thickness, and the conductive layer 152B may have the smallest thickness.

Although the thickness of the conductive layer 152C is equal to that of the conductive layer 152G, one embodiment of the present invention is not limited thereto. For example, the thickness of the conductive layer 152C may be larger than that of the conductive layer 152G. For example, the conductive film **152*f*2 may remain over the conductive layer 152C illustrated in FIG. 18E at the time of being processed. Furthermore, the conductive film 152*f*3 may remain over the conductive layer 152C illustrated in FIG. 19**B at the time of being processed.

Figure 19C:
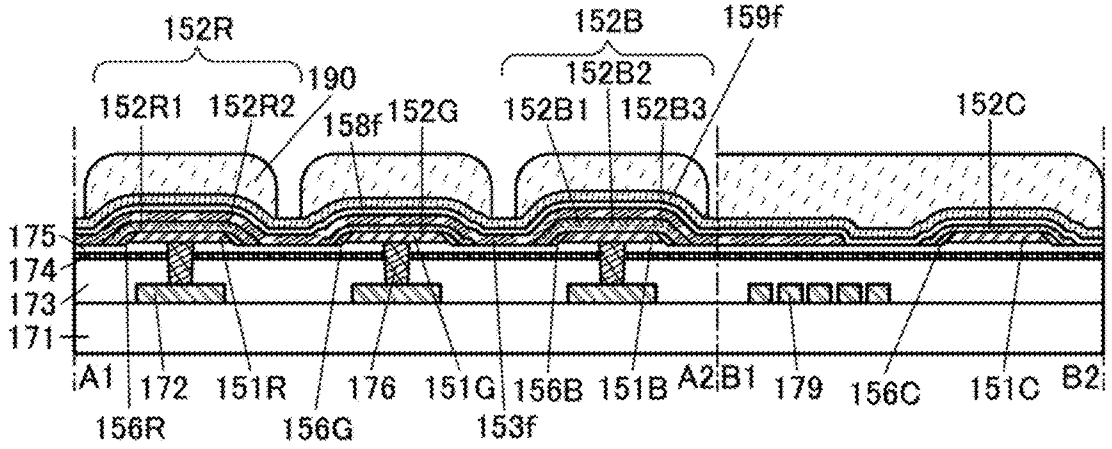

Next, as illustrated in FIG. 19C, an EL film **153*f* to be the EL layer 153 is formed over the conductive layers 152R, 152G, and 152B and the insulating layer 175. Then, a sacrificial film 158*f* to be the sacrificial layer 158 and a mask film 159*f* to be the mask layer 159 are sequentially formed over the EL film 153*f*, the conductive layer 152C, and the insulating layer 175**.

Next, as illustrated in FIG. 19C, the resist mask 190 is formed over the mask film **159*f*. The resist mask 190 is provided at a position overlapping the conductive layer 152R, a position overlapping the conductive layer 152G, and a position overlapping the conductive layer 152B. The resist mask 190 is preferably provided also at a position overlapping the conductive layer 152C. Furthermore, the resist mask 190 is preferably provided to cover the area from the end portion of the EL film 153*f* to the end portion of the conductive layer 152C (the end portion closer to the EL film 153*f*), as illustrated in the cross-sectional view along the line B1-B2 in FIG. 19**C.

Figure 19D:
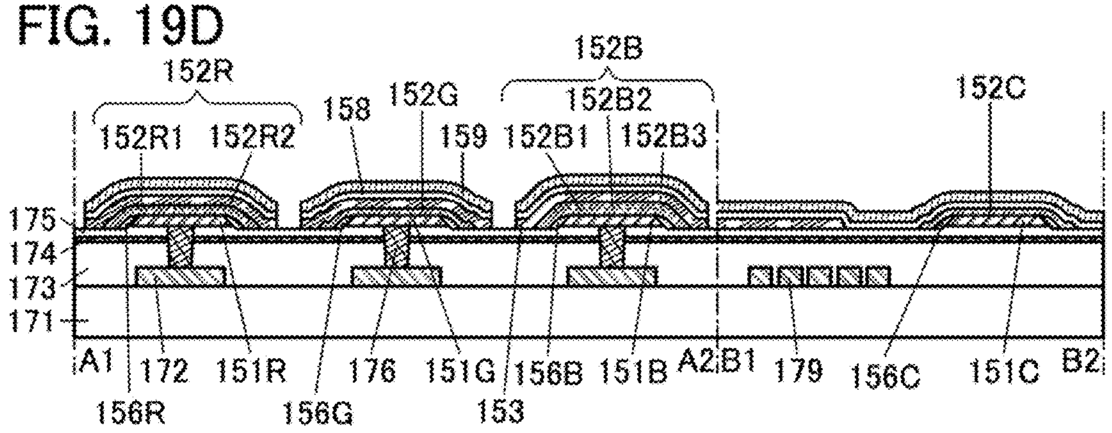

Subsequently, as illustrated in FIG. 19D, part of the mask film **159*f* is removed using the resist mask 190, whereby the mask layer 159 is formed. The mask layer 159 remains over the conductive layers 152R, 152G, 152B, and 152C. After that, the resist mask 190 is removed. Then, part of the sacrificial film 158*f* is removed using the mask layer 159 as a mask (also referred to as a hard mask), whereby the sacrificial layer 158** is formed.

Next, as illustrated in FIG. 19D, the EL film **153*f* is processed, so that the EL layer 153 is formed. For example, part of the EL film 153*f* is removed using the mask layer 159 and the sacrificial layer 158 as a hard mask, whereby the EL layer 153** is formed.

Thus, as illustrated in FIG. 19D, the stacked-layer structure of the EL layer 153, the sacrificial layer 158, and the mask layer 159 remains over each of the conductive layers 152R, 152G, and 152B. In addition, in the cross section B1-B2, the sacrificial layer 158 and the mask layer 159 can be provided to cover the area from the end portion of the EL layer 153 to the end portion of the conductive layer 152C (the end portion closer to the EL layer 153).

Next, steps similar to those illustrated in FIGS. 12A to 17B are performed. Then, coloring layers 132R, 132G, and 132B are formed over the protective layer 131. Subsequently, the substrate 120 is bonded over the coloring layer 132 using the resin layer 122, whereby the display device can be manufactured.

As described above, in the display device 100, the EL film **153*f*, the sacrificial film 158*f*, and the mask film 159*f* can each be completed by one formation step and one processing step, and do not need to be formed and processed separately for each color. Thus, the manufacturing process of the display device 100 can be simplified. This can reduce the manufacturing costs of the display device 100 and make the display device 100** inexpensive.

This embodiment can be combined as appropriate with the other embodiments or an example. In this specification, in the case where a plurality of structure examples are shown in one embodiment, the structure examples can be combined as appropriate.

Embodiment 4

In this embodiment, the display device of one embodiment of the present invention will be described with reference to FIGS. 20A to 20G and FIGS. 21A to 21I.

[Pixel Layout]

In this embodiment, pixel layouts different from that in FIGS. 2A and 2B will be mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

In this embodiment, the top surface shapes of the subpixels shown in the diagrams correspond to top surface shapes of light-emitting regions.

Examples of a top surface shape of the subpixel include polygons such as a triangle, a tetragon (including a rectangle and a square), and a pentagon; polygons with rounded corners; an ellipse; and a circle.

The circuit constituting the subpixel is not necessarily placed within the dimensions of the subpixel illustrated in the diagrams and may be placed outside the subpixel.

Figure 20A:
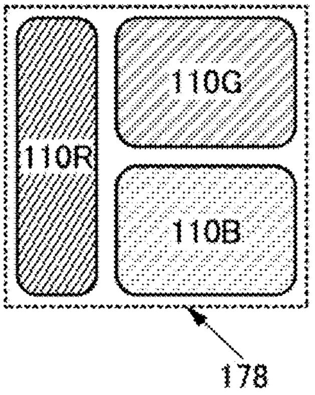
FIGS. 20A to 20G are top views illustrating structure examples of pixels.

The pixel 178 illustrated in FIG. 20A employs S-stripe arrangement. The pixel 178 illustrated in FIG. 20A includes three subpixels, the subpixel 110R, the subpixel 110G, and the subpixel 110B.

Figure 20B:
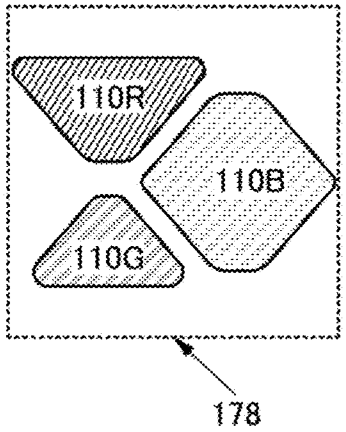

The pixel 178 illustrated in FIG. 20B includes the subpixel 110R whose top surface has a rough trapezoidal shape with rounded corners, the subpixel 110G whose top surface has a rough triangle shape with rounded corners, and the subpixel 110B whose top surface has a rough tetragonal or rough hexagonal shape with rounded corners. The subpixel 110R has a larger light-emitting area than the subpixel 110G. In this manner, the shapes and sizes of the subpixels can be determined independently. For example, the size of a subpixel including a light-emitting element with higher reliability can be smaller.

Figure 20C:
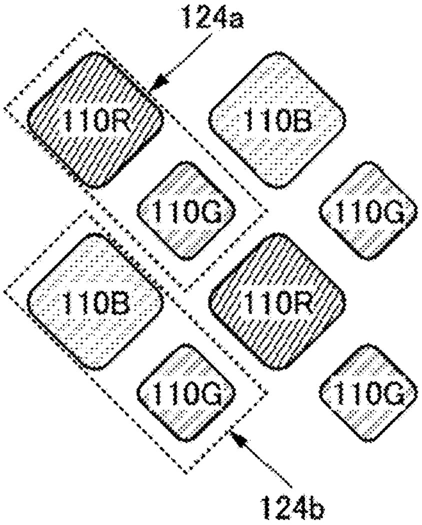

Pixels 124*a* and 124*b* illustrated in FIG. 20C employ PenTile arrangement. FIG. 20C shows an example in which the pixels 124*a* including the subpixels 110R and 110G and the pixels 124*b* including the subpixels 110G and 110B are alternately arranged.

Figure 20D:
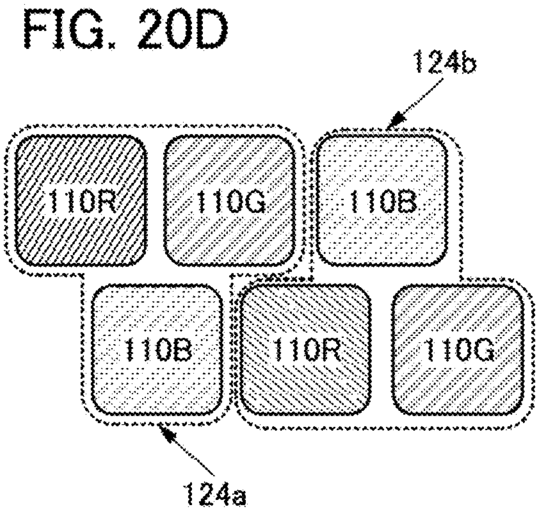
Figure 20E:
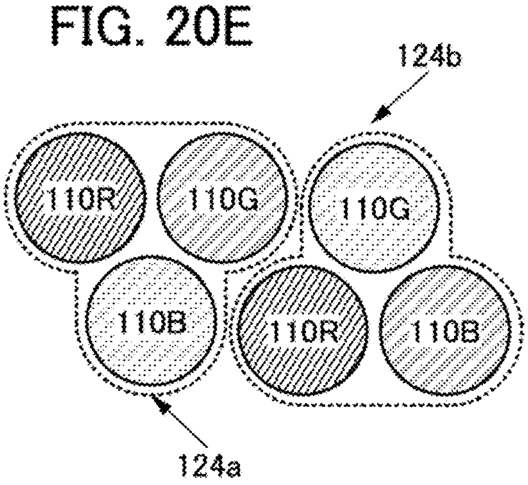
Figure 20G:
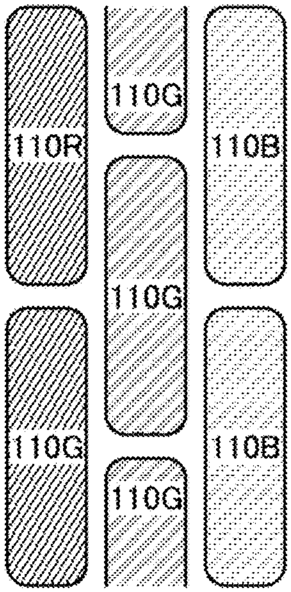
Figure 20F:
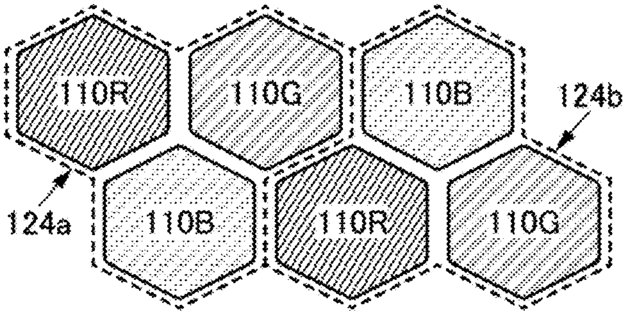

The pixels 124*a* and 124*b* illustrated in FIGS. 20D to 20F employ delta arrangement. The pixel 124*a* includes two subpixels (the subpixels 110R and 110G) in the upper row (first row) and one subpixel (the subpixel 110B) in the lower row (second row). The pixel 124*b* includes one subpixel (the subpixel 110B) in the upper row (first row) and two subpixels (the subpixels 110R and 110G) in the lower row (second row).

FIG. 20D illustrates an example where each subpixel has a rough tetragonal top surface with rounded corners. FIG. 20E illustrates an example where each subpixel has a circular top surface. FIG. 20F illustrates an example where each subpixel has a rough hexagonal top surface with rounded corners.

In FIG. 20F, each subpixel is placed inside one of close-packed hexagonal regions. Focusing on one of the subpixels, the subpixel is placed so as to be surrounded by six subpixels. The subpixels are arranged such that subpixels that emit light of the same color are not adjacent to each other. For example, focusing on the subpixel 110R, the subpixel 110R is surrounded by three subpixels 110G and three subpixels 110B that are alternately arranged.

FIG. 20G shows an example where subpixels of different colors are arranged in a zigzag manner. Specifically, the positions of the top sides of two subpixels arranged in the column direction (e.g., the subpixels 110R and 110G or the subpixels 110G and 110B) are not aligned in the top view.

In the pixels illustrated in FIGS. 20A to 20G, for example, it is preferred that the subpixel 110R be a subpixel R that emits red light, the subpixel 110G be a subpixel G that emits green light, and the subpixel 110B be a subpixel B that emits blue light. Note that the structures of the subpixels are not limited thereto, and the colors and the order of the subpixels can be determined as appropriate. For example, the subpixel 110G may be the subpixel R that emits red light, and the subpixel 110R may be the subpixel G that emits green light.

In a photolithography technique, as a pattern to be formed by processing becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

Furthermore, in the method for manufacturing the display device of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion of a figure on a mask pattern, for example.

As illustrated in FIGS. 21A to 21I, the pixel can include four types of subpixels.

Figure 21A:
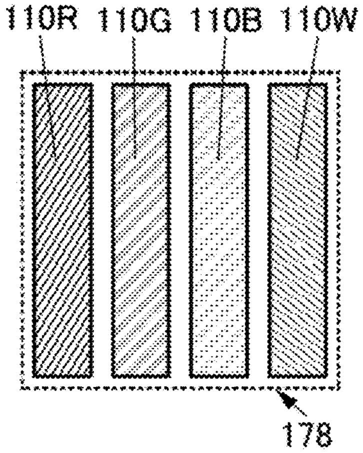
FIGS. 21A to 21I are top views illustrating structure examples of pixels.
Figure 21B:
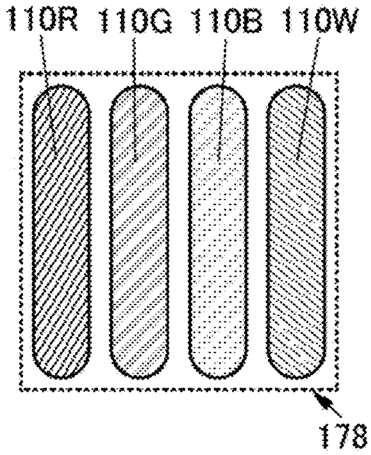
Figure 21C:
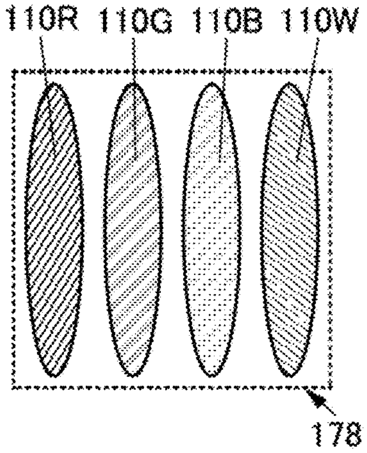

The pixels 178 illustrated in FIGS. 21A to 21C employ stripe arrangement.

FIG. 21A illustrates an example where each subpixel has a rectangular top surface. FIG. 21B illustrates an example where each subpixel has a top surface shape formed by combining two half circles and a rectangle. FIG. 21C illustrates an example where each subpixel has an elliptical top surface.

Figure 21D:
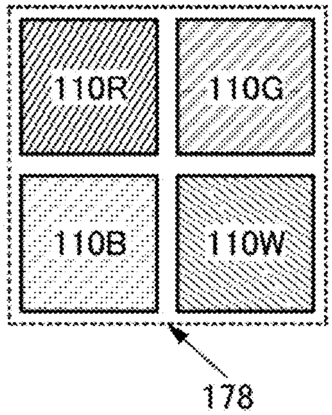
Figure 21E:
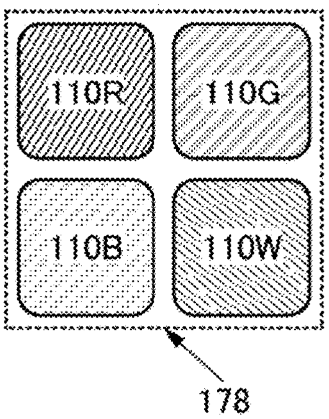
Figure 21F:
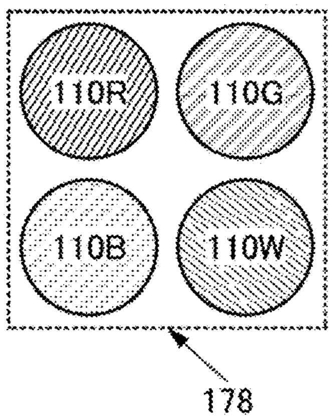

The pixels 178 illustrated in FIGS. 21D to 21F employ matrix arrangement.

FIG. 21D illustrates an example where each subpixel has a square top surface. FIG. 21E illustrates an example where each subpixel has a substantially square top surface with rounded corners. FIG. 21F illustrates an example where each subpixel has a circular top surface.

Figure 21G:
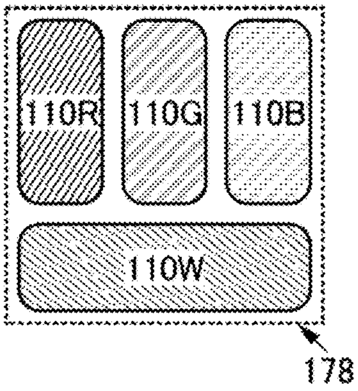
Figure 21H:
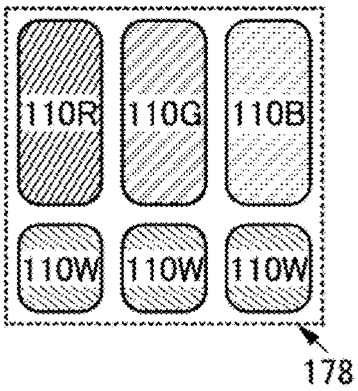

FIGS. 21G and 21H each illustrate an example where one pixel 178 is composed of two rows and three columns.

The pixel 178 illustrated in FIG. 21G includes three subpixels (the subpixels 110R, 110G, and 110B) in the upper row (first row) and one subpixel (a subpixel 110W) in the lower row (second row). In other words, the pixel 178 includes the subpixel 110R in the left column (first column), the subpixel 110G in the middle column (second column), the subpixel 110B in the right column (third column), and the subpixel 110W across these three columns.

The pixel 178 illustrated in FIG. 21H includes three subpixels (the subpixels 110R, 110G, and 110B) in the upper row (first row) and three of the subpixels 110W in the lower row (second row). In other words, the pixel 178 includes the subpixels 110R and 110W in the left column (first column), the subpixels 110G and 110W in the middle column (second column), and the subpixels 110B and 110W in the right column (third column). Matching the positions of the subpixels in the upper row and the lower row as illustrated in FIG. 21H enables dust that would be produced in the manufacturing process, for example, to be removed efficiently. Thus, a display device having high display quality can be provided.

In the pixel 178 illustrated in FIGS. 21G and 21H, the subpixels 110R, 110G, and 110B are arranged in a stripe pattern, whereby the display quality can be improved.

Figure 21I:
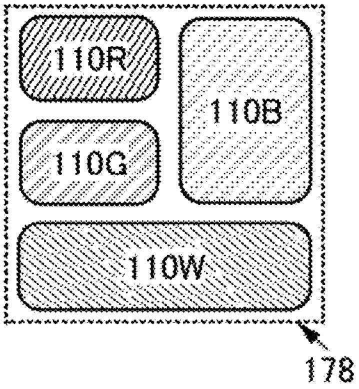

FIG. 21I illustrates an example where one pixel 178 is composed of three rows and two columns.

The pixel 178 illustrated in FIG. 21I includes the subpixel 110R in the upper row (first row), the subpixel 110G in the middle row (second row), the subpixel 110B across the first row and the second row, and one subpixel (the subpixel 110W) in the lower row (third row). In other words, the pixel 178 includes the subpixels 110R and 110G in the left column (first column), the subpixel 110B in the right column (second column), and the subpixel 110W across these two columns.

In the pixel 178 illustrated in FIG. 21I, the subpixels 110R, 110G, and 110B are arranged in what is called an S-stripe pattern, whereby the display quality can be improved.

The pixel 178 illustrated in each of FIGS. 21A to 21I is composed of four subpixels, which are the subpixels 110R, 110G, 110B, and 110W. For example, the subpixel 110R can be a subpixel that emits red light, the subpixel 110G can be a subpixel that emits green light, the subpixel 110B can be a subpixel that emits blue light, and the subpixel 110W can be a subpixel that emits white light. Note that at least one of the subpixels 110R, 110G, 110B, and 110W may be a subpixel that emits cyan light, magenta light, yellow light, or near-infrared light.

As described above, the pixel composed of the subpixels each including the light-emitting element can employ any of a variety of layouts in the display device of one embodiment of the present invention.

This embodiment can be combined as appropriate with the other embodiments or an example. In this specification, in the case where a plurality of structure examples are shown in one embodiment, the structure examples can be combined as appropriate.

Embodiment 5

In this embodiment, a display device of one embodiment of the present invention will be described.

The display device in this embodiment can be a high-resolution display device. Thus, the display device in this embodiment can be used for display portions of information terminals (wearable devices) such as watch-type and bracelet-type information terminals and display portions of wearable devices capable of being worn on a head, such as a VR device like a head mounted display (HMD) and a glasses-type AR device.

The display device in this embodiment can be a high-definition display device or a large-sized display device. Accordingly, the display device in this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, desktop and notebook personal computers, a monitor of a computer and the like, digital signage, and a large game machine such as a pachinko machine.

[Display Module]

Figure 22A:
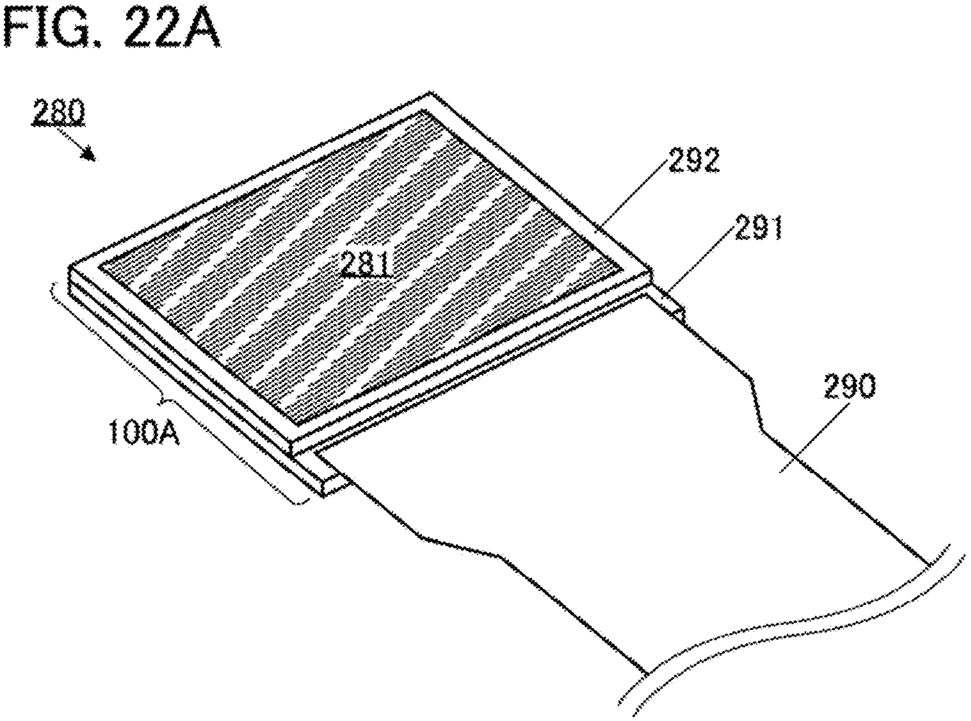
FIGS. 22A and 22B are perspective views illustrating a structure example of a display module.

FIG. 22A is a perspective view of a display module 280. The display module 280 includes a display device 100A and an FPC 290. Note that the display device included in the display module 280 is not limited to the display device 100A and may be any of display devices 100B to 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 22B:
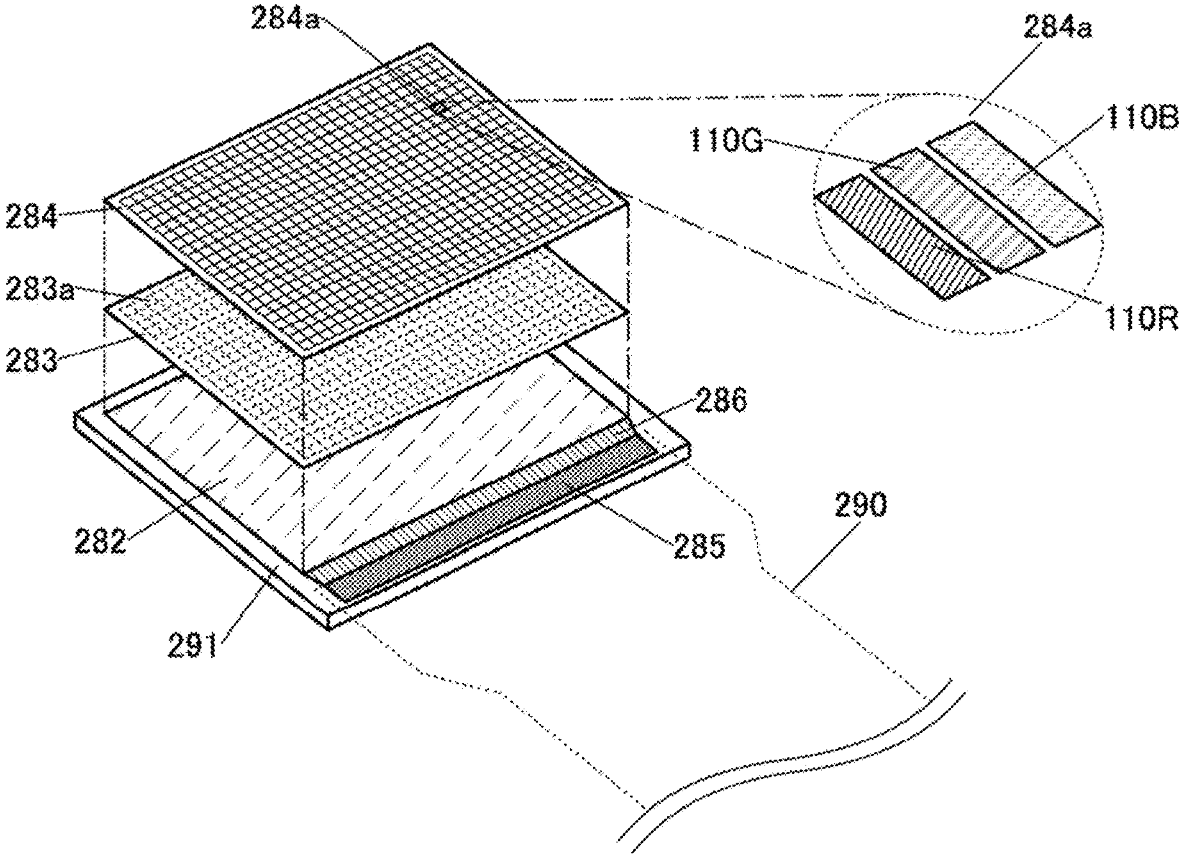

FIG. 22B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapped by the pixel portion 284 over the substrate 291. The terminal portion 285 and the circuit portion 282 are electrically connected to each other through a wiring portion 286 formed of a plurality of wirings.

The pixel portion 284 includes a plurality of pixels **284*a* arranged periodically. An enlarged view of one pixel 284*a* is illustrated on the right side in FIG. 22B. The pixels 284*a* can employ any of the structures described in the above embodiments. FIG. 22B illustrates an example where the pixel 284*a* has a structure similar to that of the pixel 178 illustrated in FIGS. 2A and 2**B.

The pixel circuit portion 283 includes a plurality of pixel circuits **283*a*** arranged periodically.

One pixel circuit **283*a* is a circuit that controls driving of a plurality of elements included in one pixel 284*a*. One pixel circuit 283*a* can be provided with three circuits each of which controls light emission of one light-emitting element. For example, the pixel circuit 283*a*** can include at least one selection transistor, one current control transistor (driving transistor), and a capacitor for one light-emitting element. A gate signal is input to a gate of the selection transistor, and a video signal is input to a source or a drain of the selection transistor. With such a structure, an active-matrix display device is achieved.

The circuit portion 282 includes a circuit for driving the pixel circuits **283*a* in the pixel circuit portion 283. For example, the circuit portion 282 preferably includes one or both of a gate line driver circuit and a source line driver circuit. The circuit portion 282** may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have significantly high resolution. For example, the pixels 284*a* are preferably arranged in the display portion 281 with a resolution of greater than or equal to 2000 ppi, further preferably greater than or equal to 3000 ppi, still further preferably greater than or equal to 5000 ppi, yet still further preferably greater than or equal to 6000 ppi, and less than or equal to 20000 ppi or less than or equal to 30000 ppi.

Such a display module 280 has extremely high resolution, and thus can be suitably used for a VR device such as a HMD or a glasses-type AR device. For example, even in the case of a structure in which the display portion of the display module 280 is seen through a lens, pixels of the extremely-high-resolution display portion 281 included in the display module 280 are prevented from being recognized when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 100A]

Figure 23A:
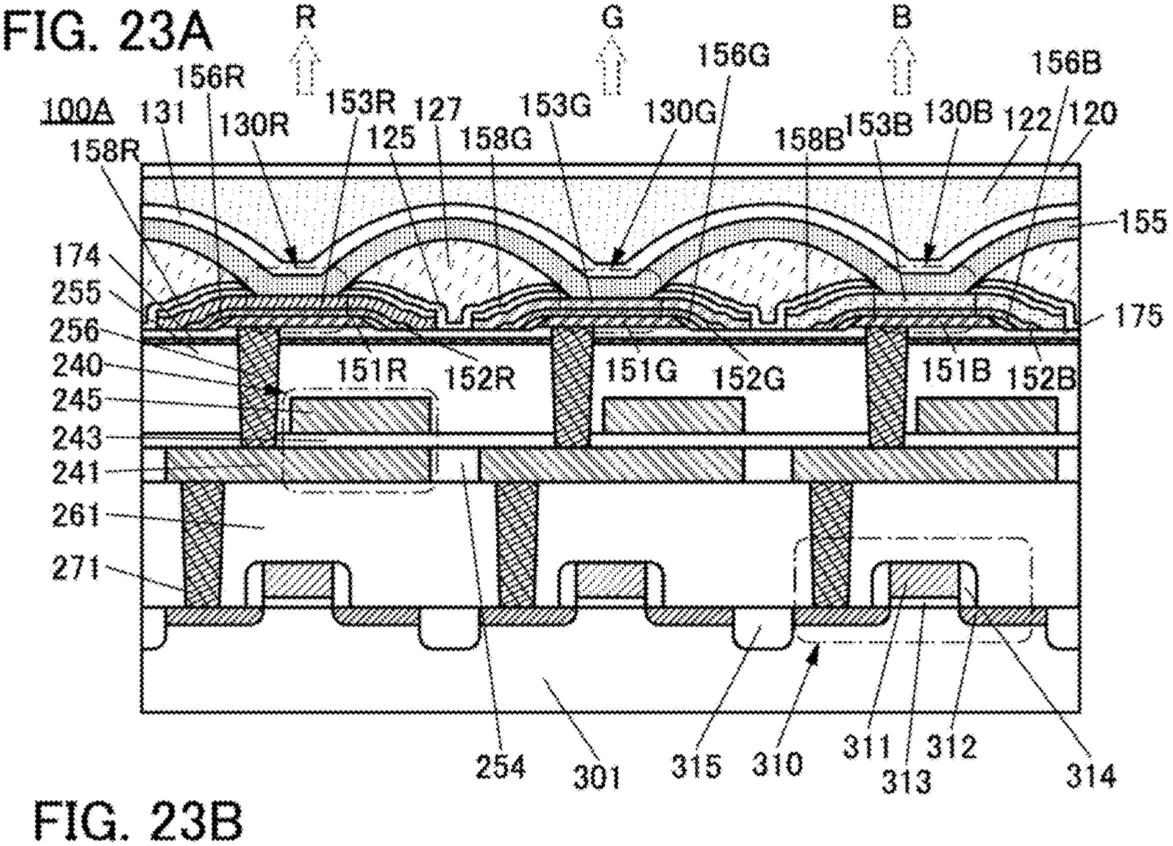
FIGS. 23A and 23B are cross-sectional views illustrating structure examples of a display device.

The display device 100A illustrated in FIG. 23A includes a substrate 301, the light-emitting elements 130R, 130G, and 130B, a capacitor 240, and a transistor 310.

The substrate 301 corresponds to the substrate 291 in FIGS. 22A and 22B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting elements 130R, 130G, and 130B are provided over the insulating layer 175. FIG. 23A illustrates an example in which the light-emitting elements 130R, 130G, and 130B each have the stacked-layer structure illustrated in FIG. 5A. An insulator is provided in regions between adjacent light-emitting elements. For example, in FIG. 23A, the inorganic insulating layer 125 and the insulating layer 127 over the inorganic insulating layer 125 are provided in those regions.

The insulating layer 156R is provided to include a region overlapping the side surface of the conductive layer 151R of the light-emitting element 130R. The insulating layer 156G is provided to include a region overlapping the side surface of the conductive layer 151G of the light-emitting element 130G. The insulating layer 156B is provided to include a region overlapping the side surface of the conductive layer 151B of the light-emitting element 130B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the EL layer 153R of the light-emitting element 130R. The sacrificial layer 158G is positioned over the EL layer 153G of the light-emitting element 130G. The sacrificial layer 158B is positioned over the EL layer 153B of the light-emitting element 130B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. The top surface of the insulating layer 175 and the top surface of the plug 256 are level with or substantially level with each other. Any of a variety of conductive materials can be used for the plugs.

The protective layer 131 is provided over the light-emitting elements 130R, 130G, and 130B. The substrate 120 is bonded to the protective layer 131 with the resin layer 122. Embodiments 1 and 2 can be referred to for the details of the light-emitting element 130 and the components thereover up to the substrate 120. The substrate 120 corresponds to the substrate 292 in FIG. 22A.

Figure 23B:
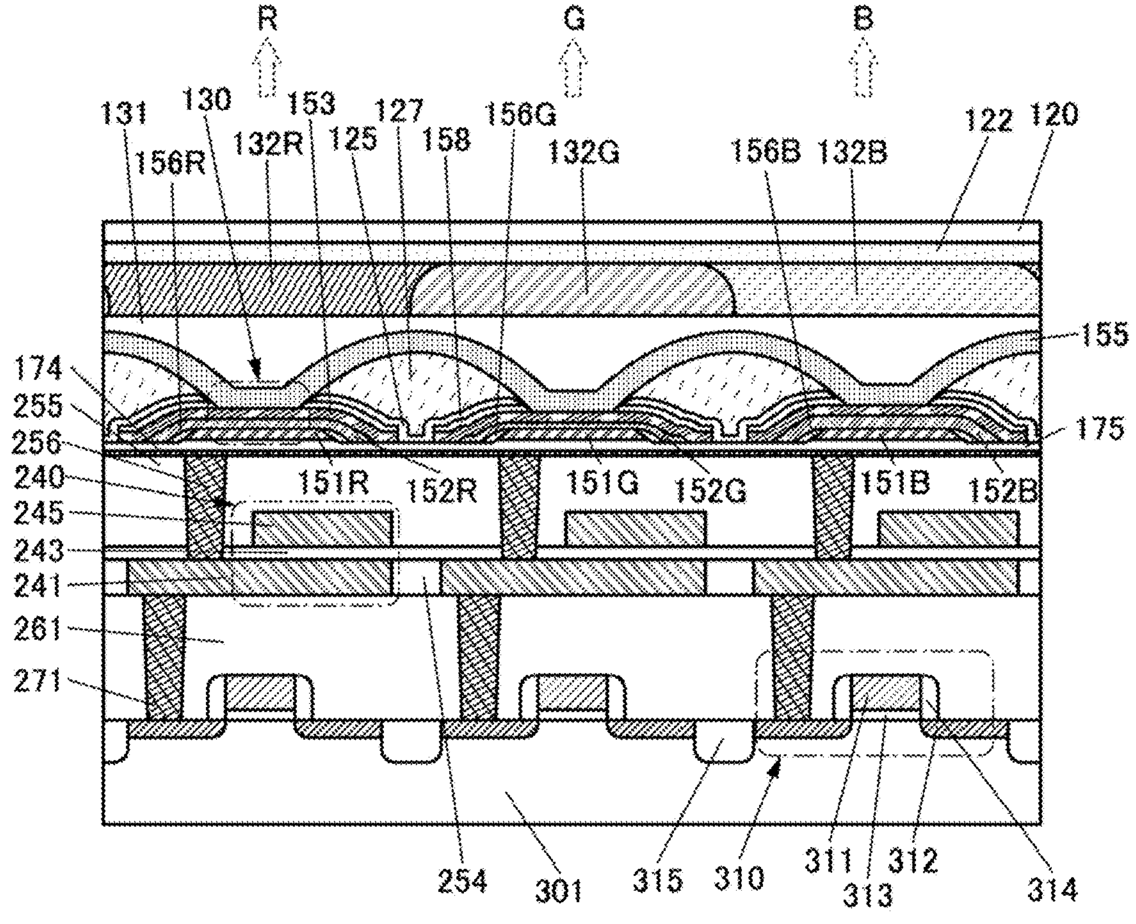

FIG. 23B illustrates a variation example of the display device 100A illustrated in FIG. 23A. The display device illustrated in FIG. 23B includes the coloring layers 132R, 132G, and 132B, and each of the light-emitting elements 130 includes a region overlapped by one of the coloring layers 132R, 132G, and 132B. In the display device illustrated in FIG. 23B, the light-emitting element 130 can emit white light, for example. For example, the coloring layer 132R, the coloring layer 132G, and the coloring layer 132B can transmit red light, green light, and blue light, respectively.

[Display Device 100B]

Figure 24:
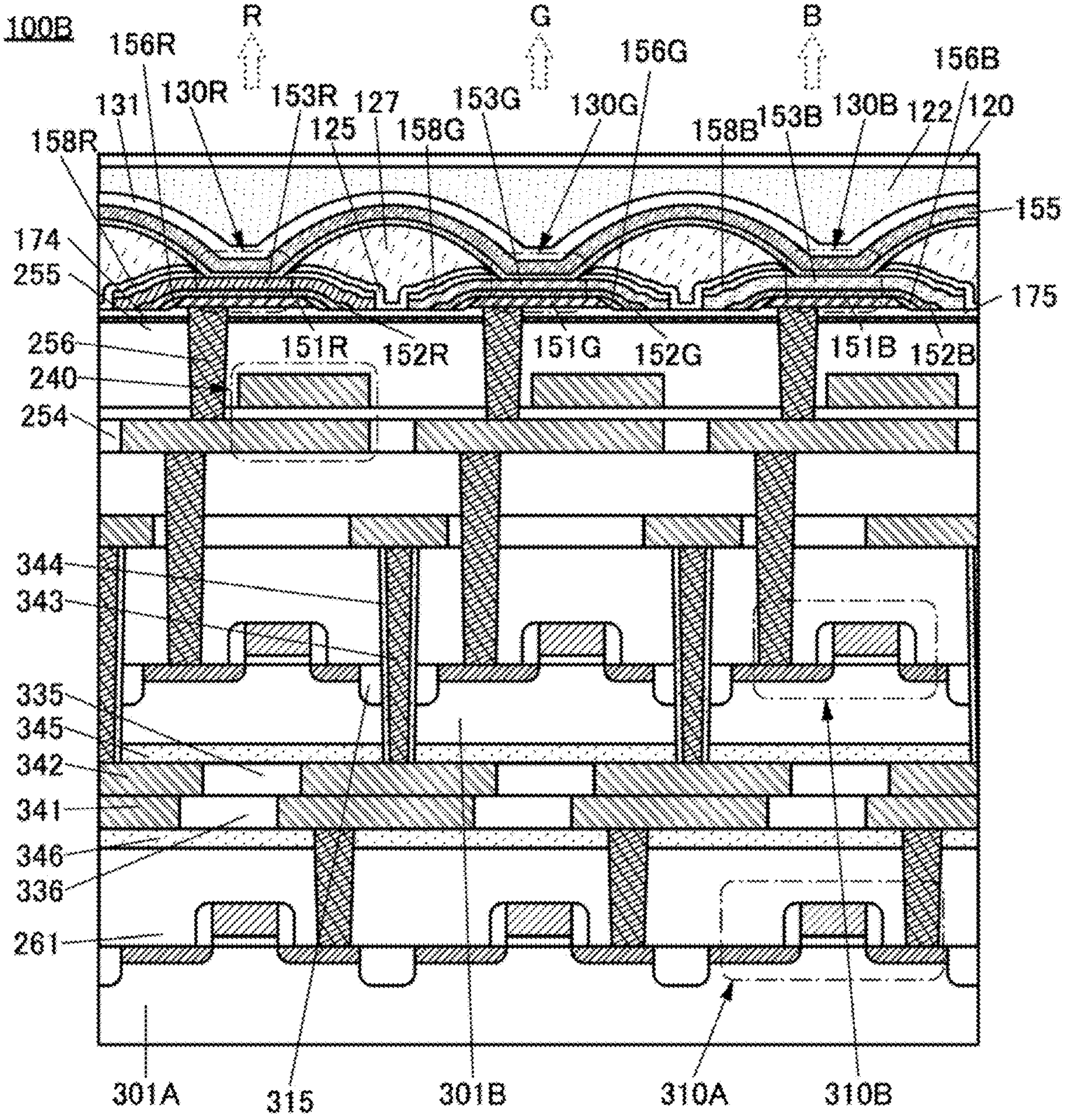
FIG. 24 is a cross-sectional view illustrating a structure example of a display device.

In the display device 100B illustrated in FIG. 24, a transistor 310A and a transistor 310B in each of which a channel is formed in a semiconductor substrate are stacked. Note that in the following description of display devices, the description of portions similar to those of the above-described display devices may be omitted.

In the display device 100B, a substrate 301B provided with the transistor 310B, the capacitor 240, and light-emitting elements is bonded to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities to the substrate 301B and the substrate 301A. As the insulating layers 345 and 346, an inorganic insulating film that can be used as the protective layer 131 or an insulating layer 332 can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities to the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 301A). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layers 341 and 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Device 100C]

Figure 25:
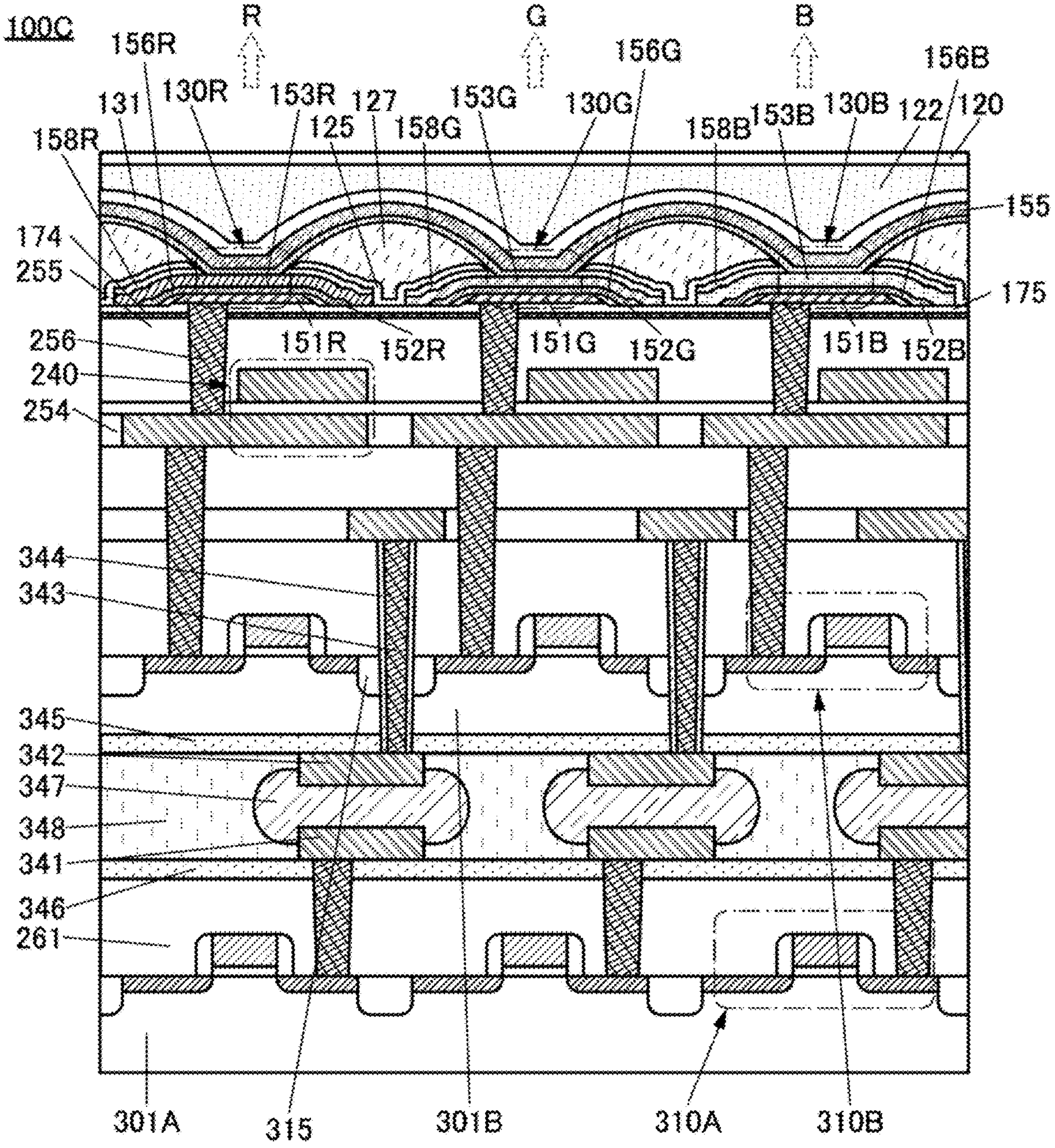
FIG. 25 is a cross-sectional view illustrating a structure example of a display device.

In the display device 100C illustrated in FIG. 25, the conductive layers 341 and 342 are bonded to each other with a bump 347.

As illustrated in FIG. 25, providing the bump 347 between the conductive layers 341 and 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Device 100D]

Figure 26:
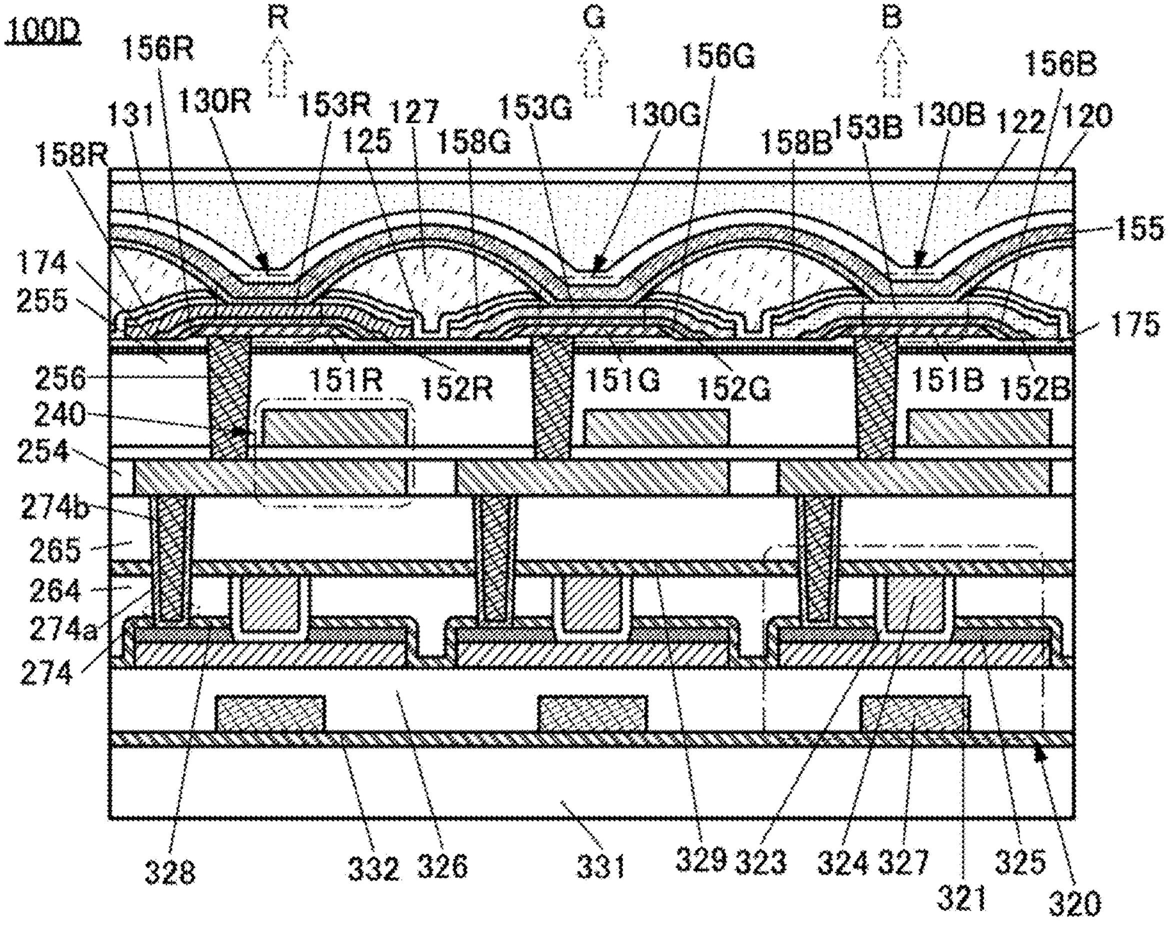
FIG. 26 is a cross-sectional view illustrating a structure example of a display device.

The display device 100D illustrated in FIG. 26 differs from the display device 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIGS. 22A and 22B. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 to the transistor 320 and release of oxygen from the semiconductor layer 321 to the insulating layer 332 side. As the insulating layer 332, for example, a film through which hydrogen or oxygen is less likely to diffuse than through a silicon oxide film can be used. Examples of such a film include an aluminum oxide film, a hafnium oxide film, and a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics is preferably used as the semiconductor layer 321. The pair of conductive layers 325 are provided over and in contact with the semiconductor layer 321, and function as a source electrode and a drain electrode.

An insulating layer 328 is provided to cover the top and side surfaces of the pair of conductive layers 325, the side surface of the semiconductor layer 321, and the like. An insulating layer 264 is provided over the insulating layer 328. The insulating layer 328 functions as a barrier layer that prevents diffusion of impurities such as water and hydrogen from the insulating layer 264 and the like to the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328 and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and an insulating layer 329 and an insulating layer 265 are provided to cover these layers.

The insulating layers 264 and 265 each function as an interlayer insulating layer. The insulating layer 329 functions as a barrier layer that prevents diffusion of impurities such as water and hydrogen from the insulating layer 265 and the like to the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, 264, and 328. Here, the plug 274 preferably includes a conductive layer **274*a* that covers the side surface of an opening formed in the insulating layers 265, 329, 264, and 328 and part of the top surface of the conductive layer 325, and a conductive layer 274*b* in contact with the top surface of the conductive layer 274*a*. For the conductive layer 274*a***, a conductive material through which hydrogen and oxygen are less likely to diffuse is preferably used.

[Display Device 100E]

Figure 27:
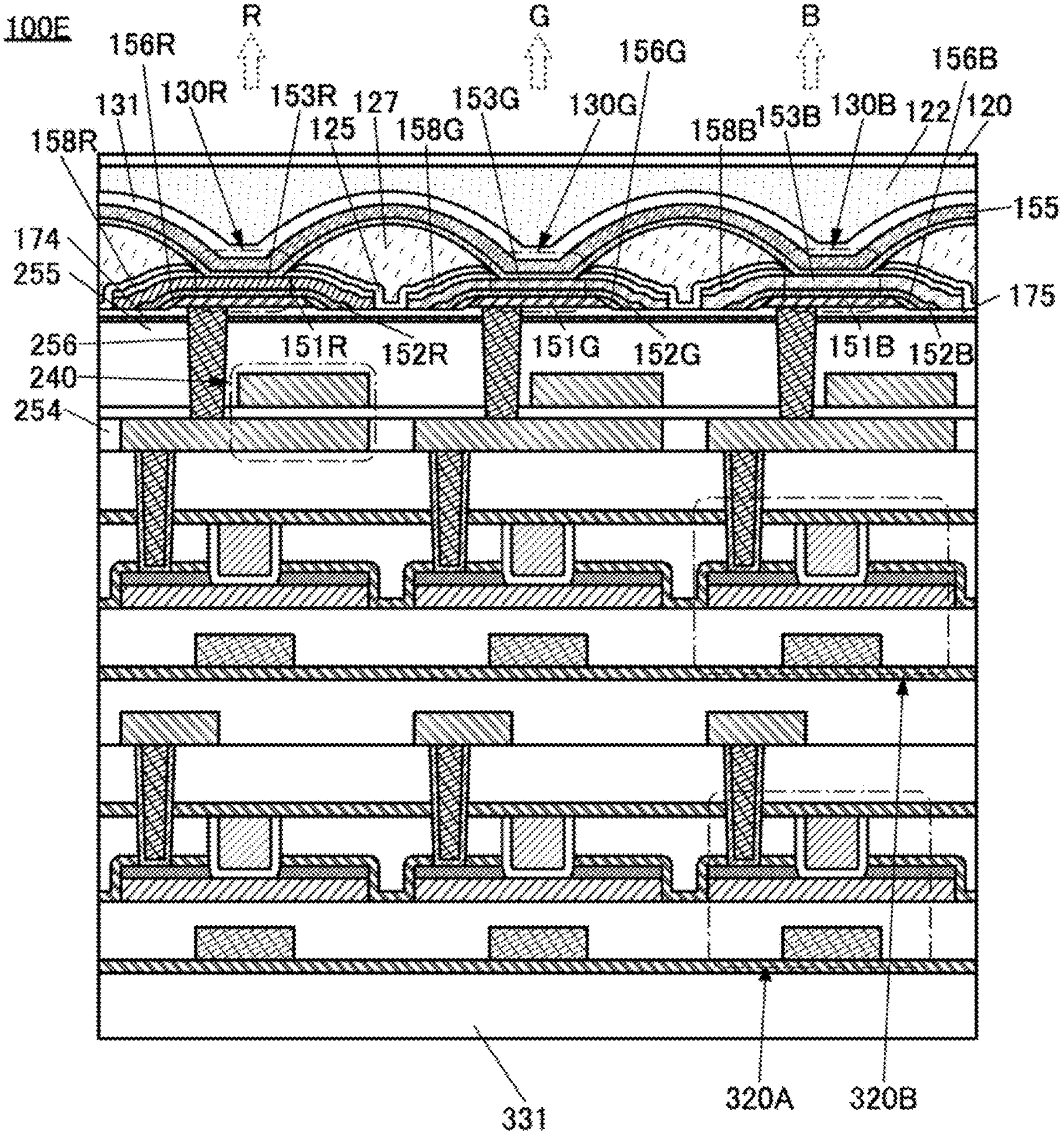
FIG. 27 is a cross-sectional view illustrating a structure example of a display device.

In the display device 100E illustrated in FIG. 27, a transistor 320A and a transistor 320B each including an oxide semiconductor in a semiconductor layer where a channel is formed are stacked.

The description of the display device 100D can be referred to for the transistor 320A, the transistor 320B, and other peripheral structures.

Although the structure in which two transistors each including an oxide semiconductor are stacked is described, one embodiment of the present invention is not limited thereto. For example, three or more transistors may be stacked.

[Display Device 100F]

Figure 28:
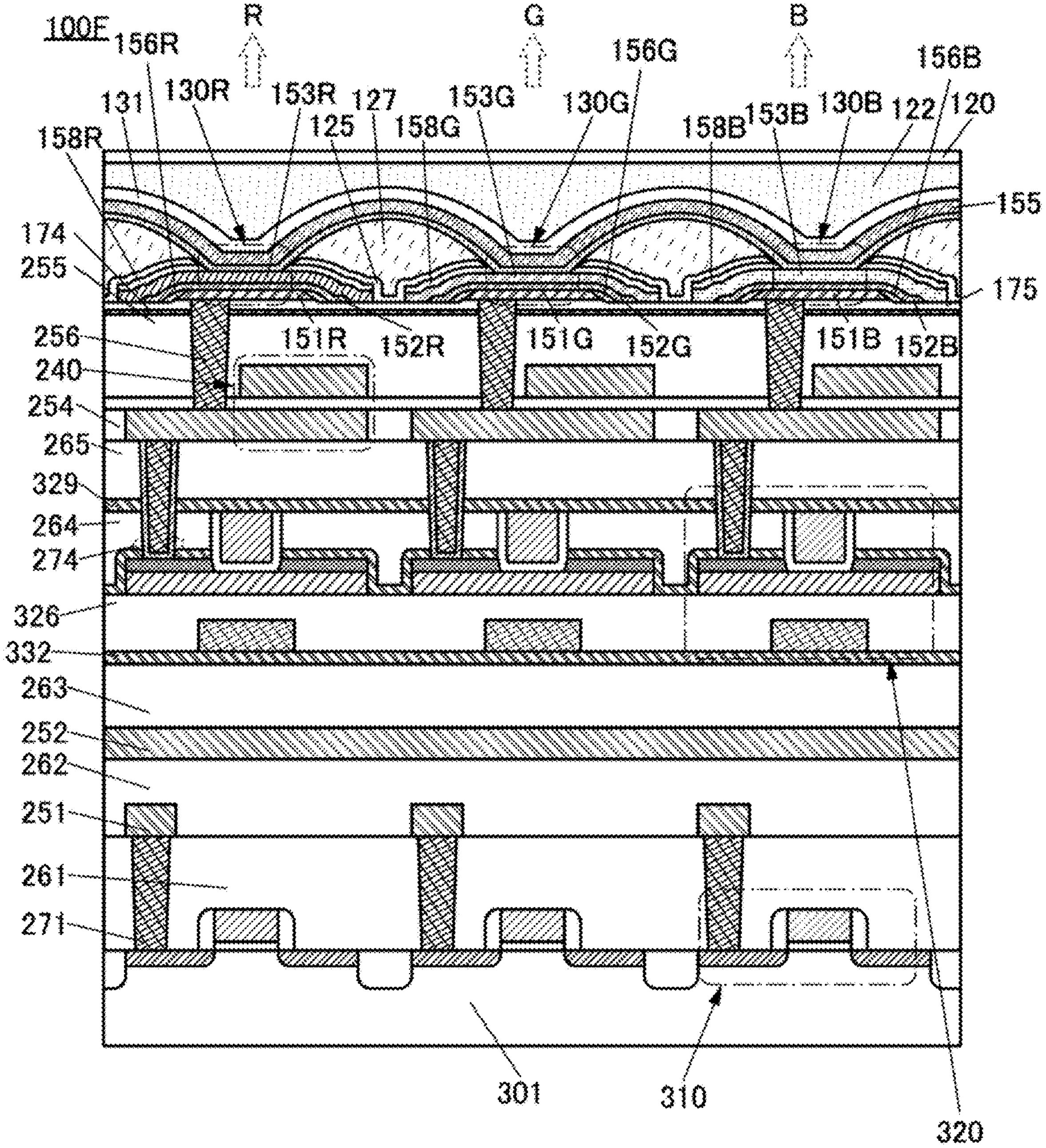
FIG. 28 is a cross-sectional view illustrating a structure example of a display device.

In the display device 100F illustrated in FIG. 28, the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided so as to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (e.g., a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit, for example, can be formed directly under the light-emitting element; thus, the display device can be downsized as compared to the case where the driver circuit is provided around a display region.

[Display Device 100G]

Figure 29:
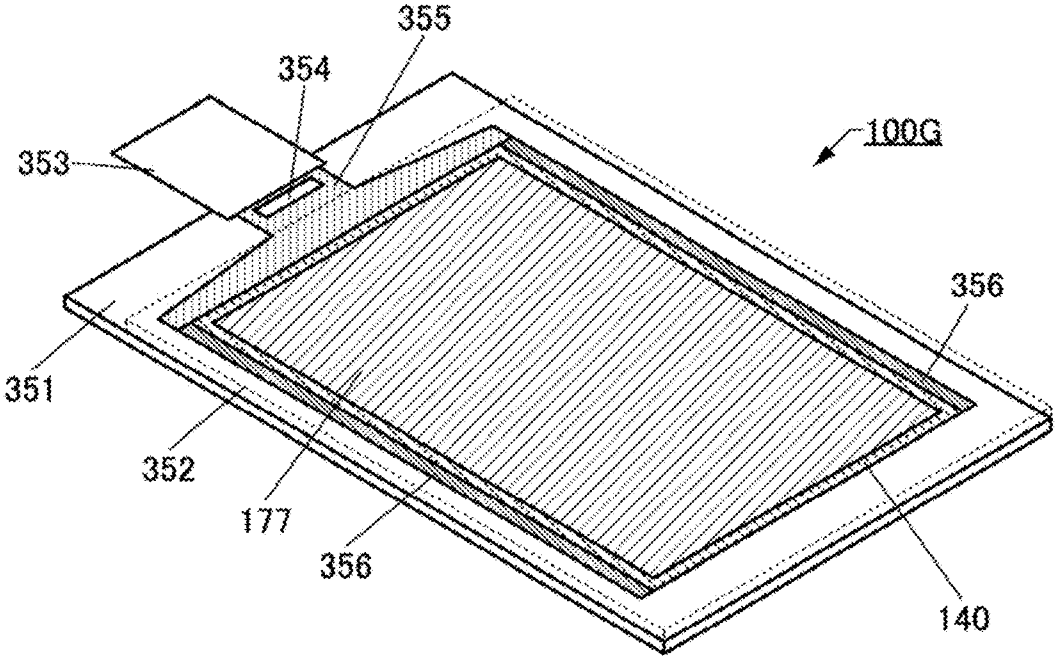
FIG. 29 is a perspective view illustrating a structure example of a display device.
Figure 30A:
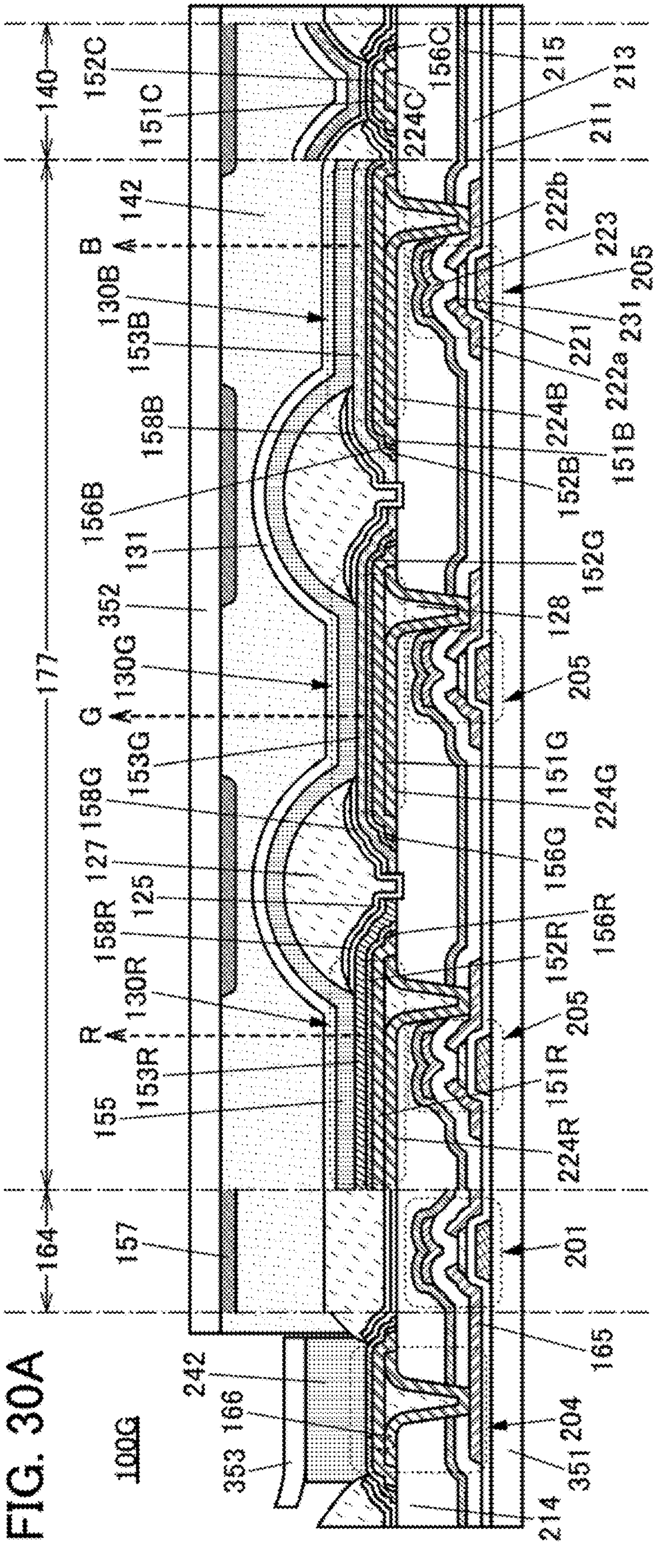
FIG. 30A is a cross-sectional view illustrating a structure example of a display device.

FIG. 29 is a perspective view of the display device 100G, and FIG. 30A is a cross-sectional view of the display device 100G.

In the display device 100G, a substrate 352 and a substrate 351 are bonded to each other. In FIG. 29, the substrate 352 is denoted by a dashed line.

The display device 100G includes the pixel portion 177, the connection portion 140, a circuit 356, a wiring 355, and the like. FIG. 29 illustrates an example in which an IC 354 and an FPC 353 are mounted on the display device 100G. Thus, the structure illustrated in FIG. 29 can be regarded as a display module including the display device 100G, the integrated circuit (IC), and the FPC. Here, a display device in which a substrate is equipped with a connector such as an FPC or mounted with an IC is referred to as a display module.

The connection portion 140 is provided outside the pixel portion 177. The connection portion 140 can be provided along one side or a plurality of sides of the pixel portion 177. The number of connection portions 140 may be one or more. FIG. 29 illustrates an example in which the connection portion 140 is provided to surround the four sides of the display portion. In the connection portion 140, a common electrode of a light-emitting element is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 29 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the display device 100G and the display module are not necessarily provided with an IC. Alternatively, the IC may be mounted on the FPC by a COF method, for example.

FIG. 30A illustrates an example of cross sections of part of a region including the FPC 353, part of the circuit 356, part of the pixel portion 177, part of the connection portion 140, and part of a region including an end portion of the display device 100G.

The display device 100G illustrated in FIG. 30A includes a transistor 201, a transistor 205, the light-emitting element 130R that emits red light, the light-emitting element 130G that emits green light, the light-emitting element 130B that emits blue light, and the like between the substrate 351 and the substrate 352.

The stacked-layer structure of each of the light-emitting elements 130R, 130G, and 130B is the same as that illustrated in FIG. 5A except for the structure of the pixel electrode. Embodiments 1 and 2 can be referred to for the details of the light-emitting elements.

The light-emitting element 130R includes a conductive layer 224R, the conductive layer 151R over the conductive layer 224R, and the conductive layer 152R over the conductive layer 151R. The light-emitting element 130G includes a conductive layer 224G, the conductive layer 151G over the conductive layer 224G, and the conductive layer 152G over the conductive layer 151G. The light-emitting element 130B includes a conductive layer 224B, the conductive layer 151B over the conductive layer 224B, and the conductive layer 152B over the conductive layer 151B. Here, the conductive layers 224R, 151R, and 152R can be collectively referred to as the pixel electrode of the light-emitting element 130R; the conductive layers 151R and 152R excluding the conductive layer 224R can also be referred to as the pixel electrode of the light-emitting element 130R. Similarly, the conductive layers 224G, 151G, and 152G can be collectively referred to as the pixel electrode of the light-emitting element 130G; the conductive layers 151G and 152G excluding the conductive layer 224G can also be referred to as the pixel electrode of the light-emitting element 130G. The conductive layers 224B, 151B, and 152B can be collectively referred to as the pixel electrode of the light-emitting element 130B; the conductive layers 151B and 152B excluding the conductive layer 224B can also be referred to as the pixel electrode of the light-emitting element 130B.

The conductive layer 224R is connected to a conductive layer 222*b* included in the transistor 205 through the opening provided in an insulating layer 214. The end portion of the conductive layer 151R is positioned outward from the end portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting element 130G are not described in detail because they are respectively similar to the conductive layers 224R, 151R, and 152R and the insulating layer 156R in the light-emitting element 130R; the same applies to the conductive layers 224B, 151B, and 152B and the insulating layer 156B in the light-emitting element 130B.

The conductive layers 224R, 224G, and 224B each have a depression portion covering an opening provided in the insulating layer 214. A layer 128 is embedded in the depression portion.

The layer 128 has a function of filling the depression portions of the conductive layers 224R, 224G, and 224B to obtain planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting elements 130R, 130G, and 130B. The protective layer 131 and the substrate 352 are bonded to each other with an adhesive layer 142. The substrate 352 is provided with a light-blocking layer 157. A solid sealing structure, a hollow sealing structure, or the like can be employed to seal the light-emitting element 130. In FIG. 30A, a solid sealing structure is employed, in which a space between the substrate 352 and the substrate 351 is filled with the adhesive layer 142. Alternatively, the space may be filled with an inert gas (e.g., nitrogen or argon), i.e., a hollow sealing structure may be employed. In that case, the adhesive layer 142 may be provided not to overlap the light-emitting element. Alternatively, the space may be filled with a resin other than the frame-like adhesive layer 142.

FIG. 30A illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 30A, the insulating layer 156C is provided to include a region overlapping the side surface of the conductive layer 151C.

The display device 100G has a top-emission structure. Light from the light-emitting element is emitted toward the substrate 352. For the substrate 352, a material having a high visible-light-transmitting property is preferably used. The pixel electrode contains a material that reflects visible light, and the counter electrode (the common electrode 155) contains a material that transmits visible light.

The transistor 201 and the transistor 205 are formed over the substrate 351. These transistors can be fabricated using the same materials in the same steps.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities to the transistors from the outside and increase the reliability of the display device.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably functions as an etching protective layer. This can inhibit formation of a recessed portion in the insulating layer 214 at the time of processing of the conductive layer 224R, 151R, or 152R or the like. Alternatively, a recessed portion may be provided in the insulating layer 214 at the time of processing of the conductive layer 224R, 151R, or 152R or the like.

Each of the transistors 201 and 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231.

The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of transistor characteristics can be suppressed.

The semiconductor layer of the transistor preferably includes a metal oxide. That is, a transistor including a metal oxide in its channel formation region (hereinafter, also referred to as an OS transistor) is preferably used in the display device of this embodiment.

Examples of an oxide semiconductor having crystallinity include a c-axis-aligned crystalline oxide semiconductor (CAAC-OS) and a nanocrystalline oxide semiconductor (nc-OS).

Alternatively, a transistor including silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed on the same substrate as the display portion. This allows for simplification of an external circuit mounted on the display device and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as an off-state current), and charge accumulated in a capacitor that is connected in series to the transistor can be held for a long period. Furthermore, the power consumption of the display device can be reduced with the OS transistor.

To increase the luminance of the light-emitting element included in the pixel circuit, the amount of current fed through the light-emitting element needs to be increased. To increase the current amount, the source-drain voltage of a driving transistor included in the pixel circuit needs to be increased. An OS transistor has a higher breakdown voltage between a source and a drain than a Si transistor; hence, a high voltage can be applied between the source and the drain of the OS transistor. Therefore, when an OS transistor is used as the driving transistor in the pixel circuit, the amount of current flowing through the light-emitting element can be increased, so that the luminance of the light-emitting element can be increased.

When transistors operate in a saturation region, a change in a source-drain current relative to a change in a gate-source voltage can be smaller in an OS transistor than in a Si transistor. Accordingly, when an OS transistor is used as the driving transistor in the pixel circuit, a current flowing between the source and the drain can be set minutely by a change in a gate-source voltage; hence, the amount of current flowing through the light-emitting element can be controlled. Consequently, the number of gray levels expressed by the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting elements even when the current-voltage characteristics of the light-emitting elements vary, for example. In other words, when the OS transistor operates in the saturation region, the source-drain current hardly changes with an increase in the source-drain voltage; hence, the luminance of the light-emitting element can be stable.

As described above, by using OS transistors as the driving transistors included in the pixel circuits, it is possible to inhibit black-level degradation, increase the luminance, increase the number of gray levels, and suppress variations in light-emitting elements, for example.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. It is preferable to use an oxide containing indium, tin, and zinc. It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistors included in the circuit 356 and the transistors included in the pixel portion 177 may have the same structure or different structures. One structure or two or more kinds of structures may be employed for a plurality of transistors included in the circuit 356. Similarly, one structure or two or more kinds of structures may be employed for a plurality of transistors included in the pixel portion 177.

All transistors included in the pixel portion 177 may be OS transistors, or all transistors included in the pixel portion 177 may be Si transistors. Alternatively, some of the transistors included in the pixel portion 177 may be OS transistors and the others may be Si transistors.

For example, when both an LTPS transistor and an OS transistor are used in the pixel portion 177, the display device can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling a current.

For example, one transistor included in the pixel portion 177 functions as a transistor for controlling a current flowing through the light-emitting element and can be referred to as a driving transistor. One of a source and a drain of the driving transistor is electrically connected to the pixel electrode of the light-emitting element. An LTPS transistor is preferably used as the driving transistor. In that case, the amount of current flowing through the light-emitting element can be increased in the pixel circuit.

Another transistor included in the pixel portion 177 functions as a switch for controlling selection or non-selection of a pixel and can be referred to as a selection transistor. A gate of the selection transistor is electrically connected to a gate line, and one of a source and a drain thereof is electrically connected to a source line (signal line). An OS transistor is preferably used as the selection transistor. In that case, the gray level of the pixel can be maintained even with an extremely low frame frequency (e.g., lower than or equal to 1 fps); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting element having a metal maskless (MML) structure. This structure can significantly reduce a leakage current that would flow through a transistor and a leakage current that would flow between adjacent light-emitting elements (sometimes referred to as a horizontal leakage current or a lateral leakage current). Displaying images on the display device having this structure can bring one or more of image crispness, image sharpness, high color saturation, and a high contrast ratio to the viewer. When a leakage current that would flow through the transistor and a lateral leakage current that would flow between the light-emitting elements are extremely low, leakage of light at the time of black display (black-level degradation) or the like can be minimized.

In particular, in the case where a light-emitting element having an MML structure employs the above-described side-by-side (SBS) structure, a layer provided between light-emitting elements (for example, also referred to as an organic layer or a common layer which is shared by the light-emitting elements) is disconnected; accordingly, a leakage current can be prevented or be made extremely low.

Figure 30B:
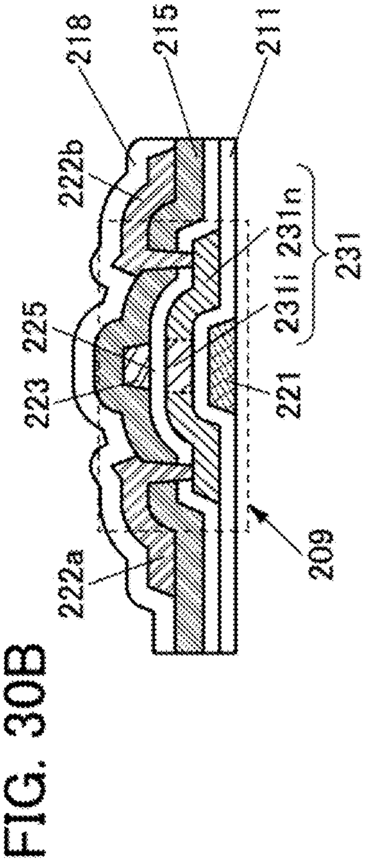
FIGS. 30B and 30C are cross-sectional views illustrating structure examples of a transistor.
Figure 30C:
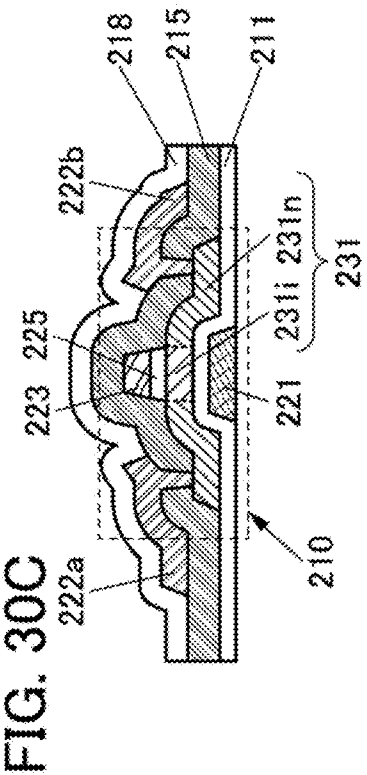

FIGS. 30B and 30C illustrate other structure examples of transistors.

Transistors 209 and 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 30B illustrates an example of the transistor 209 in which the insulating layer 225 covers the top and side surfaces of the semiconductor layer 231. The conductive layer 222*a* and the conductive layer 222*b* are connected to the corresponding low-resistance regions 231*n* through openings provided in the insulating layer 225 and the insulating layer 215. One of the conductive layers 222*a* and 222*b* functions as a source, and the other functions as a drain.

In the transistor 210 illustrated in FIG. 30C, the insulating layer 225 overlaps the channel formation region 231*i* of the semiconductor layer 231 and does not overlap the low-resistance regions 231*n*. The structure illustrated in FIG. 30C is obtained by processing the insulating layer 225 with the conductive layer 223 as a mask, for example. In FIG. 30C, the insulating layer 215 is provided to cover the insulating layer 225 and the conductive layer 223, and the conductive layer 222*a* and the conductive layer 222*b* are connected to the corresponding low-resistance regions 231*n* through openings in the insulating layer 215.

A connection portion 204 is provided in a region of the substrate 351 where the substrate 352 does not overlap. In the connection portion 204, a wiring 165 is electrically connected to the FPC 353 through a conductive layer 166 and a connection layer 242. As an example, the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

A light-blocking layer 157 is preferably provided on the surface of the substrate 352 on the substrate 351 side. The light-blocking layer 157 can be provided over a region between adjacent light-emitting elements, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, an anisotropic conductive film (ACF), an anisotropic conductive paste (ACP), or the like can be used.

[Display Device 100H]

Figures 31A, 31B, 31C, 31D:
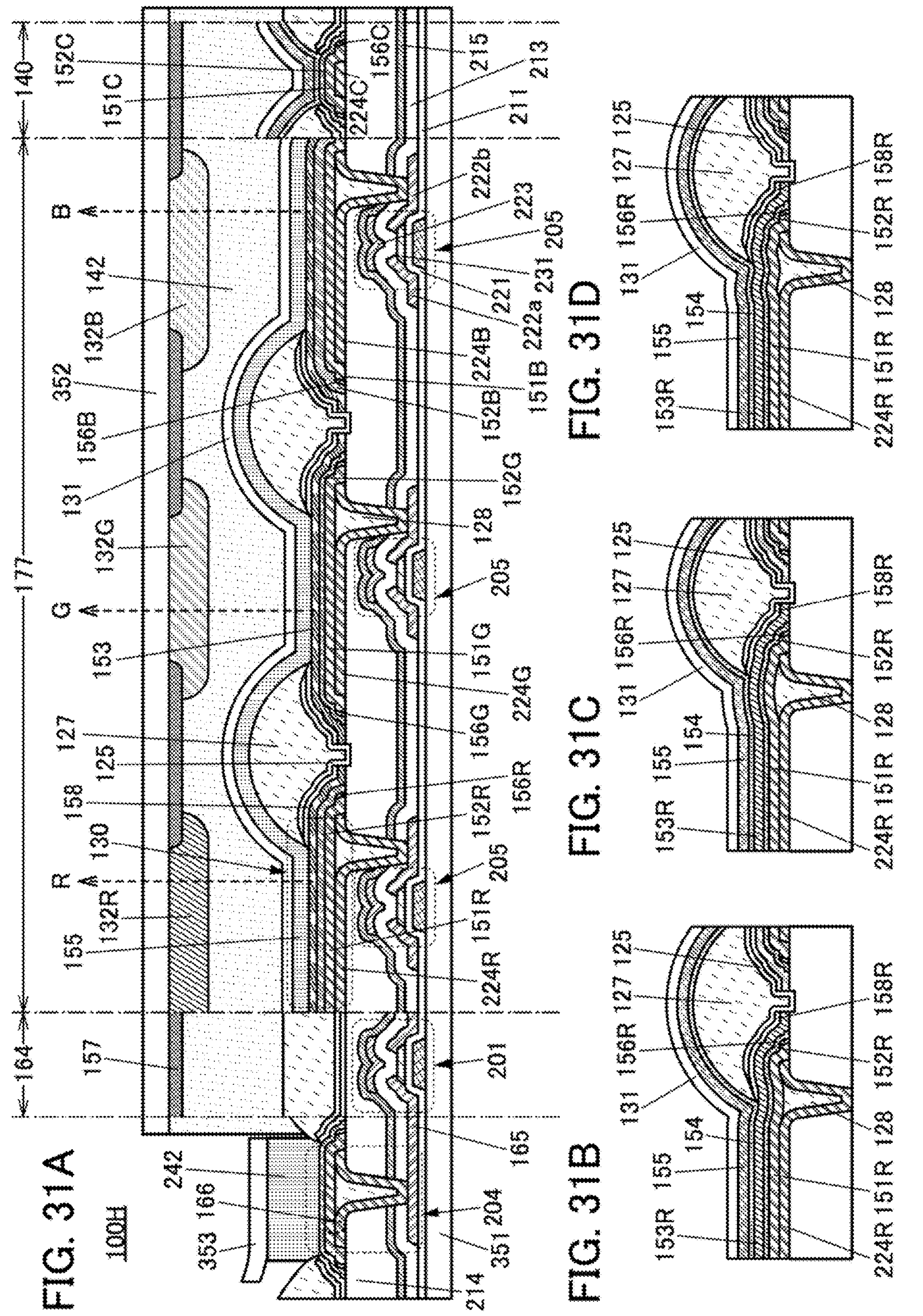
FIGS. 31A to 31D are cross-sectional views illustrating structure examples of a display device.

The display device 100H illustrated in FIG. 31A is a variation example of the display device 100G illustrated in FIG. 30A and differs from the display device 100G mainly in including the coloring layers 132R, 132G, and 132B.

In the display device 100H, the light-emitting element 130 includes a region overlapped by one of the coloring layers 132R, 132G, and 132B. The coloring layers 132R, 132G, and 132B can be provided on a surface of the substrate 352 on the substrate 351 side. The end portions of the coloring layers 132R, 132G, and 132B can overlap the light-blocking layer 157.

In the display device 100H, the light-emitting element 130 can emit white light, for example. The coloring layer 132R, the coloring layer 132G, and the coloring layer 132B can transmit red light, green light, and blue light, respectively, for example. Note that in the display device 100H, the coloring layers 132R, 132G, and 132B may be provided between the protective layer 131 and the adhesive layer 142.

Although FIG. 30A, FIG. 31A, and the like illustrate an example in which the top surface of the layer 128 includes a flat portion, the shape of the layer 128 is not particularly limited. FIGS. 31B to 31D illustrate variation examples of the layer 128.

As illustrated in FIGS. 31B and 31D, the top surface of the layer 128 can have a shape such that its middle and the vicinity thereof are depressed (i.e., a shape including a concave surface) in the cross section.

As illustrated in FIG. 31C, the top surface of the layer 128 can have a shape in which its center and vicinity thereof bulge, i.e., a shape including a convex surface, in the cross section.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 224R may be the same or substantially the same, or may be different from each other. For example, the level of the top surface of the layer 128 may be either lower or higher than the level of the top surface of the conductive layer 224R.

FIG. 31B can be regarded as illustrating an example in which the layer 128 fits in the depression portion of the conductive layer 224R. By contrast, as illustrated in FIG. 31D, the layer 128 may exist also outside the depression portion of the conductive layer 224R, i.e., the top surface of the layer 128 may extend beyond the depression portion.

This embodiment can be combined as appropriate with the other embodiments or an example. In this specification, in the case where a plurality of structure examples are shown in one embodiment, the structure examples can be combined as appropriate.

Embodiment 6

In this embodiment, a light-emitting element that can be used in the display device of one embodiment of the present invention will be described.

Figure 32A:
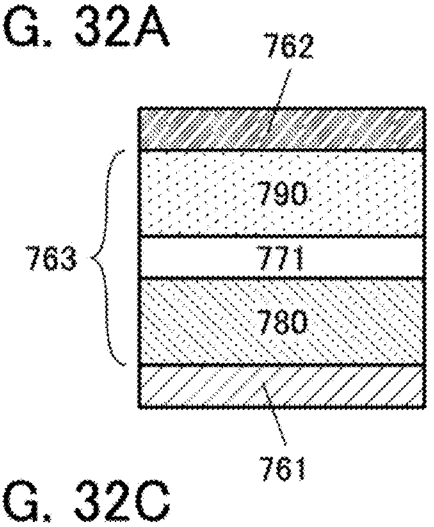
FIGS. 32A to 32F are cross-sectional views each illustrating a structure example of a light-emitting element.

As illustrated in FIG. 32A, the light-emitting element includes an organic compound layer 763 between a pair of electrodes (a lower electrode 761 and an upper electrode 762). The organic compound layer 763 can include a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance with a high hole-injection property (hole-injection layer), a layer containing a substance with a high hole-transport property (hole-transport layer), and a layer containing a substance with a high electron-blocking property (electron-blocking layer). The layer 790 includes one or more of a layer containing a substance with a high electron-injection property (electron-injection layer), a layer containing a substance with a high electron-transport property (electron-transport layer), and a layer containing a substance with a high hole-blocking property (hole-blocking layer). In the case where the lower electrode 761 is the cathode and the upper electrode 762 is the anode, the above structures of the layer 780 and the layer 790 are switched.

The structure including the layer 780, the light-emitting layer 771, and the layer 790, which is provided between a pair of electrodes, can function as a single light-emitting unit, and the structure in FIG. 32A is referred to as a single structure in this specification.

Figure 32B:
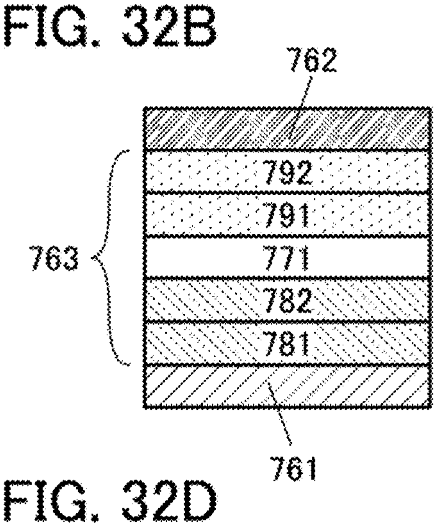

FIG. 32B shows a variation example of the organic compound layer 763 included in the light-emitting element illustrated in FIG. 32A. Specifically, the light-emitting element illustrated in FIG. 32B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is the anode and the upper electrode 762 is the cathode, for example, the layer 781 can be a hole-injection layer, the layer 782 can be a hole-transport layer, the layer 791 can be an electron-transport layer, and the layer 792 can be an electron-injection layer. In the case where the lower electrode 761 is the cathode and the upper electrode 762 is the anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Figure 32C:
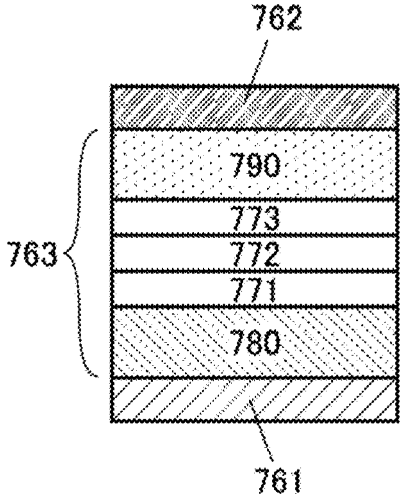
Figure 32D:
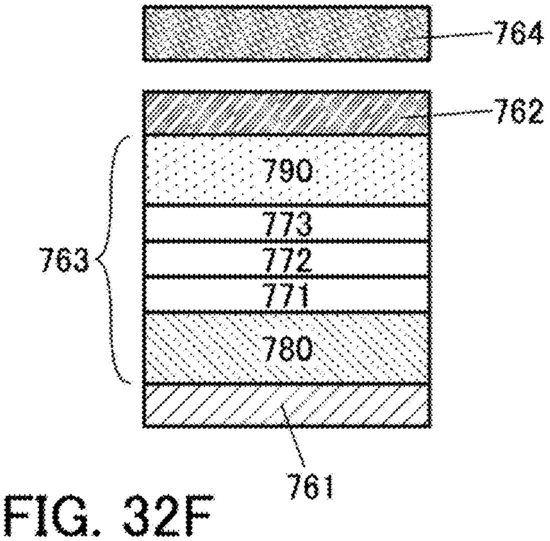

Note that structures in which a plurality of light-emitting layers (light-emitting layers 771, 772, and 773) are provided between the layer 780 and the layer 790 as illustrated in FIGS. 32C and 32D are variations of a single structure. Although FIGS. 32C and 32D illustrate examples including three light-emitting layers, the number of light-emitting layers in the light-emitting element having a single structure may be two or four or more. Moreover, the light-emitting element having a single structure may include a buffer layer between two light-emitting layers.

Figure 32E:
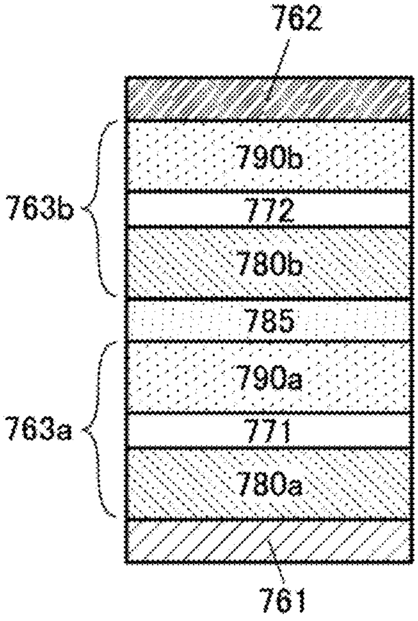
Figure 32F:
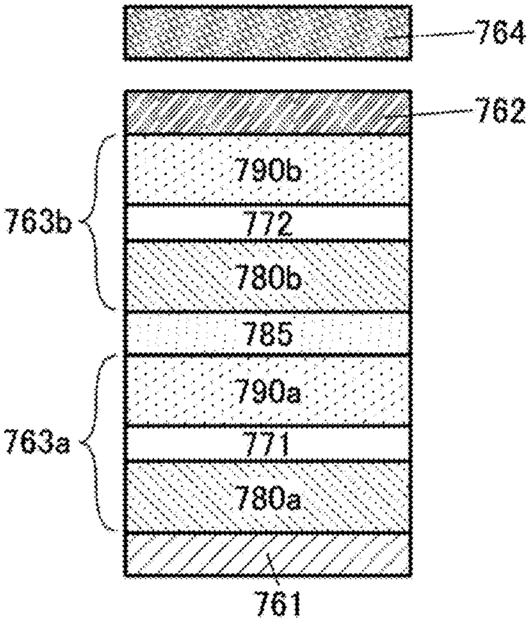

A structure in which a plurality of light-emitting units (light-emitting units 763*a* and 763*b*) are connected in series through a charge-generation layer 785 (also referred to as an intermediate layer) as illustrated in FIGS. 32E and 32F is referred to as a tandem structure in this specification. A tandem structure may be referred to as a stack structure. A tandem structure enables a light-emitting element capable of emitting light with high luminance. Furthermore, the amount of current needed for obtaining a predetermined luminance can be smaller in a tandem structure than in a single structure; thus, a tandem structure enables higher reliability.

Note that FIGS. 32D and 32F show examples where the display device includes a layer 764 overlapping the light-emitting element. FIG. 32D shows an example where the layer 764 overlaps the light-emitting element illustrated in FIG. 32C. FIG. 32F shows an example where the layer 764 overlaps the light-emitting element illustrated in FIG. 32E.

One or both of a color conversion layer and a color filter (coloring layer) can be used as the layer 764.

In FIGS. 32C and 32D, light-emitting substances that emit light of the same color, or moreover, the same light-emitting substance may be used for the light-emitting layers 771, 772, and 773. For example, a light-emitting substance that emits blue light may be used for the light-emitting layers 771, 772, and 773. In a subpixel that emits blue light, blue light emitted from the light-emitting element can be extracted. In a subpixel that emits red light and a subpixel that emits green light, by providing a color conversion layer as the layer 764 illustrated in FIG. 32D, blue light emitted from the light-emitting element can be converted into light with a longer wavelength, and red light or green light can be extracted.

The light-emitting layers 771, 772, and 773 may be formed using light-emitting substances that emit light of different colors. White light is obtained when the light-emitting layers 771, 772, and 773 emit light of complementary colors. For example, the light-emitting element having a single structure preferably includes a light-emitting layer containing a light-emitting substance that emits blue light and a light-emitting layer containing a light-emitting substance that emits visible light having a longer wavelength than blue light.

For example, in the case where the light-emitting element having a single structure includes three light-emitting layers, the light-emitting element preferably includes a light-emitting layer containing a light-emitting substance that emits red (R) light, a light-emitting layer containing a light-emitting substance that emits green (G) light, and a light-emitting layer containing a light-emitting substance that emits blue (B) light. The stacking order of the light-emitting layers can be R, G, and B from the anode side or R, B, and G from the anode side, for example. In such a case, a buffer layer may be provided between R and G or between R and B.

For example, in the case where the light-emitting element having a single structure includes two light-emitting layers, the light-emitting element preferably includes a light-emitting layer containing a light-emitting substance that emits blue (B) light and a light-emitting layer containing a light-emitting substance that emits yellow (Y) light. This structure may be referred to as a BY single structure.

As the layer 764 illustrated in FIG. 32D, a color filter may be provided. When white light passes through the color filter, light of a desired color can be obtained.

In the light-emitting element that emits white light, two or more kinds of light-emitting substances are preferably contained. To obtain white light emission, the two or more kinds of light-emitting substances are selected so as to emit light of complementary colors. For example, the emission colors of first and second light-emitting layers are complementary, so that a light-emitting element can emit white light as a whole. This can be applied to a light-emitting element including three or more light-emitting layers.

In FIGS. 32E and 32F, light-emitting substances that emit light of the same color or the same light-emitting substance may be used for the light-emitting layers 771 and 772.

For example, in light-emitting elements included in subpixels that emit light of different colors, a light-emitting substance that emits blue light may be used for the light-emitting layers 771 and 772. In a subpixel that emits blue light, blue light emitted from the light-emitting element can be extracted. In a subpixel that emits red light and a subpixel that emits green light, by providing a color conversion layer as the layer 764 illustrated in FIG. 32F, blue light emitted from the light-emitting element can be converted into light with a longer wavelength, and red light or green light can be extracted.

In the case where the light-emitting element having the structure illustrated in FIG. 32E or FIG. 32F is used in subpixels that emit light of different colors, different light-emitting substances may be used in the subpixels. Specifically, in the light-emitting element included in the subpixel that emits red light, a light-emitting substance that emits red light may be used for the light-emitting layers 771 and 772. Similarly, in the light-emitting element included in the subpixel that emits green light, a light-emitting substance that emits green light may be used for the light-emitting layers 771 and 772. In the light-emitting element included in the subpixel that emits blue light, a light-emitting substance that emits blue light may be used for the light-emitting layers 771 and 772. The display device with such a structure employs light-emitting elements having a tandem structure and is regarded as having an SBS structure. Thus, the display device can have both the advantage of a tandem structure and the advantage of an SBS structure. Accordingly, a highly reliable light-emitting element capable of emitting light with high luminance is obtained.

In FIGS. 32E and 32F, light-emitting substances that emit light of different colors may be used for the light-emitting layers 771 and 772. White light is obtained when the light-emitting layers 771 and 772 emit light of complementary colors. As the layer 764 illustrated in FIG. 32F, a color filter may be provided. When white light passes through the color filter, light of a desired color can be obtained.

Although FIGS. 32E and 32F illustrate examples in which the light-emitting unit 763*a* includes one light-emitting layer 771 and the light-emitting unit 763*b* includes one light-emitting layer 772, one embodiment of the present invention is not limited thereto. Each of the light-emitting units 763*a* and 763*b* may include two or more light-emitting layers.

Although FIGS. 32E and 32F illustrate examples in which the light-emitting element includes two light-emitting units, one embodiment of the present invention is not limited thereto. The light-emitting element may include three or more light-emitting units.

Figure 33A:
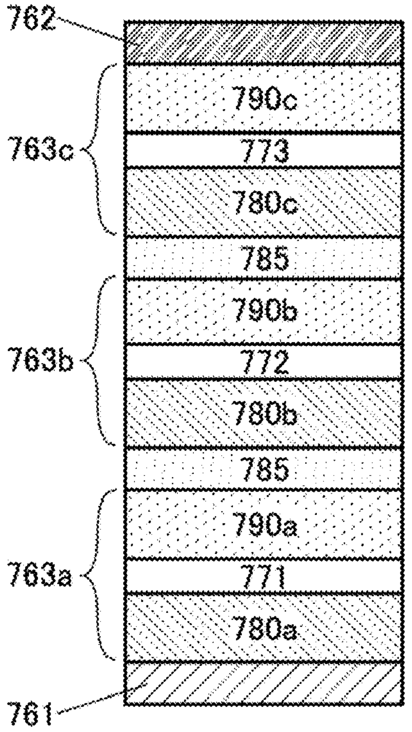
FIGS. 33A to 33C are cross-sectional views each illustrating a structure example of a light-emitting element.
Figure 33B:
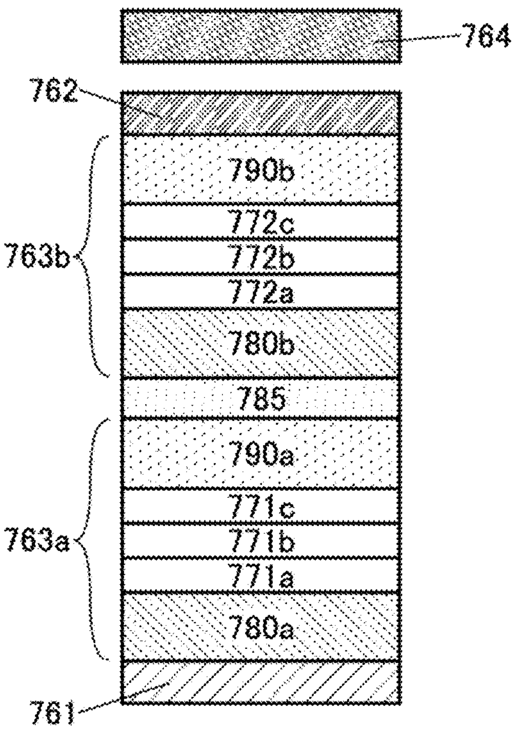
Figure 33C:
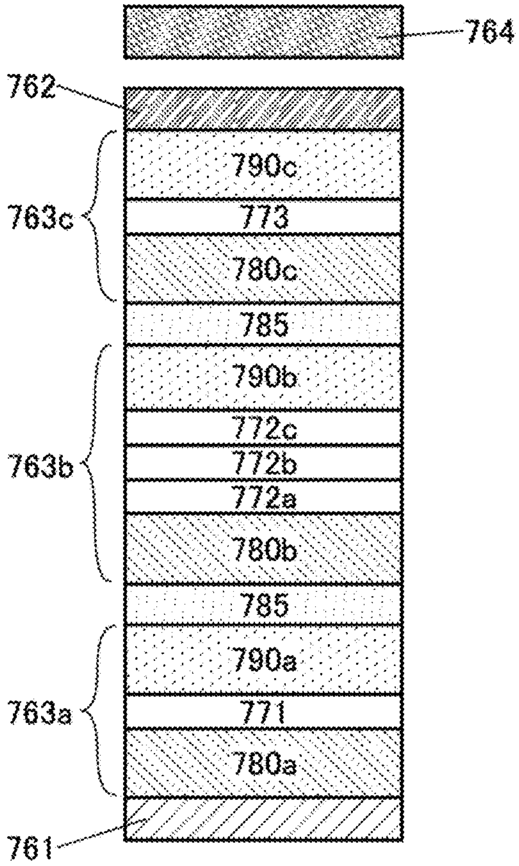

Specifically, the light-emitting device may have any of structures illustrated in FIGS. 33A to 33C.

FIG. 33A illustrates a structure including three light-emitting units. Note that a structure including two light-emitting units and a structure including three light-emitting units may be referred to as a two-unit tandem structure and a three-unit tandem structure, respectively.

Specifically, in the structure illustrated in FIG. 33A, a plurality of light-emitting units (the light-emitting units 763*a*, 763*b*, and 763*c*) are connected in series through the charge-generation layers 785. The light-emitting unit 763*a* includes a layer 780*a*, the light-emitting layer 771, and a layer 790*a*. The light-emitting unit 763*b* includes a layer 780*b*, the light-emitting layer 772, and a layer 790*b*. The light-emitting unit 763*c* includes a layer 780*c*, the light-emitting layer 773, and a layer 790*c*.

In the structure illustrated in FIG. 33A, the light-emitting layers 771, 772, and 773 preferably contain light-emitting substances that emit light of the same color. Specifically, the light-emitting layers 771, 772, and 773 can each contain a light-emitting substance that emits red (R) light (i.e., an R\R\R three-unit tandem structure), can each contain a light-emitting substance that emits green (G) light (i.e., a G\G\G three-unit tandem structure), or can each contain a light-emitting substance that emits blue (B) light (i.e., a B\B\B three-unit tandem structure).

Note that the structure containing the light-emitting substances that emit light of the same color is not limited to the above structure. For example, a light-emitting device with a tandem structure may be employed in which light-emitting units each containing a plurality of light-emitting substances are stacked as illustrated in FIG. 33B. FIG. 33B illustrates a structure in which a plurality of light-emitting units (light-emitting units 763*a* and 763*b*) are connected in series with the charge-generation layer 785 therebetween. The light-emitting unit 763*a* includes the layer 780*a*, a light-emitting layer 771*a*, a light-emitting layer 771*b*, a light-emitting layer 771*c*, and the layer 790*a*. The light-emitting unit 763*b* includes the layer 780*b*, a light-emitting layer 772*a*, a light-emitting layer 772*b*, a light-emitting layer 772*c*, and the layer 790*b*.

In the structure illustrated in FIG. 33B, light-emitting substances for the light-emitting layers 771*a*, 771*b*, and 771*c* are selected so as to emit light of complementary colors to obtain white (W) light emission. Furthermore, light-emitting substances for the light-emitting layers 772*a*, 772*b*, and 772*c* are selected so as to emit light of complementary colors to obtain white (W) light emission. That is, the structure illustrated in FIG. 33B is a two-unit tandem structure of W\W. Note that there is no particular limitation on the stacking order of the light-emitting layers 771*a*, 771*b*, and 771*c* containing light-emitting substances that emit light of complementary colors. The practitioner can select the optimal stacking order as appropriate. Although not illustrated, a W\W\W three-unit tandem structure or a tandem structure of four or more units may be employed.

In the case of a light-emitting device with a tandem structure, any of the following structures may be employed, for example: a two-unit tandem structure of B\Y including a light-emitting unit that emits yellow (Y) light and a light-emitting unit that emits blue (B) light; a two-unit tandem structure of RG\B including a light-emitting unit that emits red (R) and green (G) light and a light-emitting unit that emits blue (B) light; a three-unit tandem structure of B\Y\B including a light-emitting unit that emits blue (B) light, a light-emitting unit that emits yellow (Y) light, and a light-emitting unit that emits blue (B) light in this order; a three-unit tandem structure of B\YG\B including a light-emitting unit that emits blue (B) light, a light-emitting unit that emits yellow-green (YG) light, and a light-emitting unit that emits blue (B) light in this order; and a three-unit tandem structure of B\G\B including a light-emitting unit that emits blue (B) light, a light-emitting unit that emits green (G) light, and a light-emitting unit that emits blue (B) light in this order.

Alternatively, a light-emitting unit containing one light-emitting substance and a light-emitting unit containing a plurality of light-emitting substances may be used in combination as illustrated in FIG. 33C.

Specifically, in the structure illustrated in FIG. 33C, a plurality of light-emitting units (the light-emitting units 763*a*, 763*b*, and 763*c*) are connected in series through the charge-generation layers 785. The light-emitting unit 763*a* includes the layer 780*a*, the light-emitting layer 771, and the layer 790*a*. The light-emitting unit 763*b* includes the layer 780*b*, the light-emitting layer 772*a*, the light-emitting layer 772*b*, the light-emitting layer 772*c*, and the layer 790*b*. The light-emitting unit 763*c* includes the layer 780*c*, the light-emitting layer 773, and the layer 790*c*.

For example, the structure illustrated in FIG. 33C can be a B\R·G·YG\B three-unit tandem structure in which the light-emitting unit 763*a* emits blue (B) light, the light-emitting unit 763*b* emits red (R) light, green (G) light, and yellow green (YG) light, and the light-emitting unit 763*c* emits blue (B) light.

Examples of the number of stacked light-emitting units and the order of colors from the anode side include a two-unit structure of B and Y; a two-unit structure of B and a light-emitting unit X; a three-unit structure of B, Y, and B; and a three-unit structure of B, X, and B. Examples of the number of light-emitting layers stacked in the light-emitting unit X and the order of colors from the anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

In FIGS. 32C and 32D, each of the layers 780 and 790 may independently have a stacked-layer structure of two or more layers as in FIG. 32B.

In FIGS. 32E and 32F, the light-emitting unit 763*a* includes the layer 780*a*, the light-emitting layer 771, and the layer 790*a* and the light-emitting unit 763*b* includes the layer 780*b*, the light-emitting layer 772, and the layer 790*b*.

In the case where the lower electrode 761 is the anode and the upper electrode 762 is the cathode, each of the layers 780*a* and 780*b* includes one or more of a hole-injection layer, a hole-transport layer, and an electron-blocking layer. Each of the layers 790*a* and 790*b* includes one or more of an electron-injection layer, an electron-transport layer, and a hole-blocking layer. In the case where the lower electrode 761 is the cathode and the upper electrode 762 is the anode, the above structures of the layer 780*a* and the layer 790*a* are switched, and the above structures of the layer 780*b* and the layer 790*b* are switched.

In the case where the lower electrode 761 is the anode and the upper electrode 762 is the cathode, for example, the layer

780*a* includes a hole-injection layer and a hole-transport layer over the hole-injection layer and may also include an electron-blocking layer over the hole-transport layer. The layer 790*a* includes an electron-transport layer and may also include a hole-blocking layer between the light-emitting layer 771 and the electron-transport layer. The layer 780*b* includes a hole-transport layer and may also include an electron-blocking layer over the hole-transport layer. The layer 790*b* includes an electron-transport layer and an electron-injection layer over the electron-transport layer and may also include a hole-blocking layer between the light-emitting layer 772 and the electron-transport layer. In the case where the lower electrode 761 is the cathode and the upper electrode 762 is the anode, for example, the layer 780*a* includes an electron-injection layer and an electron-transport layer over the electron-injection layer and may also include a hole-blocking layer over the electron-transport layer. The layer 790*a* includes a hole-transport layer and may also include an electron-blocking layer between the light-emitting layer 771 and the hole-transport layer. The layer 780*b* includes an electron-transport layer and may also include a hole-blocking layer over the electron-transport layer. The layer 790*b* includes a hole-transport layer and a hole-injection layer over the hole-transport layer and may also include an electron-blocking layer between the light-emitting layer 772 and the hole-transport layer.

In the case of fabricating a light-emitting element having a tandem structure, two light-emitting units are stacked with the charge-generation layer 785 positioned therebetween. The charge-generation layer 785 includes at least a charge-generation region. The charge-generation layer 785 has a function of injecting electrons into one of the two light-emitting units and injecting holes to the other when a voltage is applied between the pair of electrodes.

A conductive film that transmits visible light is used as the electrode through which light is extracted, which is either the lower electrode 761 or the upper electrode 762. A conductive film that reflects visible light is preferably used as the electrode through which light is not extracted. In the case where the display device includes a light-emitting element that emits infrared light, a conductive film that transmits visible light and infrared light is preferably used as the electrode through which light is extracted, and a conductive film that reflects visible light and infrared light is preferably used as the electrode through which light is not extracted.

A conductive film that transmits visible light may be used also as the electrode through which light is not extracted. In that case, this electrode is preferably provided between a reflective layer and the organic compound layer 763. In other words, light emitted by the organic compound layer 763 may be reflected by the reflective layer to be extracted from the display device.

This embodiment can be combined as appropriate with the other embodiments or an example. In this specification, in the case where a plurality of structure examples are shown in one embodiment, the structure examples can be combined as appropriate.

Embodiment 7

In this embodiment, electronic devices of embodiments of the present invention will be described.

Electronic devices of this embodiment include the display device of one embodiment of the present invention in their display portions. The display device of one embodiment of the present invention is highly reliable and can be easily increased in resolution and definition. Thus, the display device of one embodiment of the present invention can be used for display portions of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the display device of one embodiment of the present invention can have high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the display device of one embodiment of the present invention is preferably higher than or equal to 100 ppi, further preferably higher than or equal to 300 ppi, further preferably higher than or equal to 500 ppi, further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device having one or both of high definition and high resolution, the electronic device can provide higher realistic sensation, sense of depth, and the like in personal use such as portable use or home use. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device in this embodiment can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIGS. 34A to 34D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 34A:
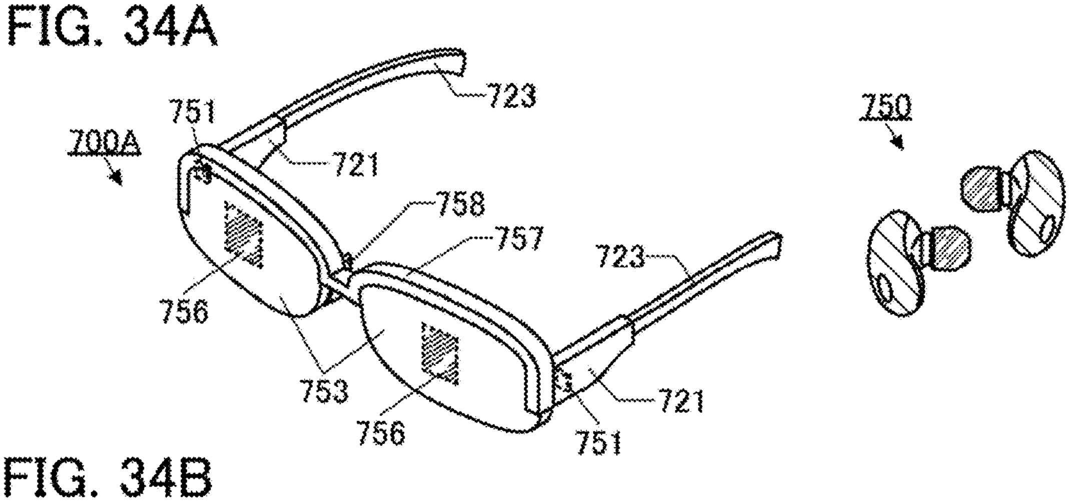
FIGS. 34A to 34D illustrate examples of electronic devices.
Figure 34B:
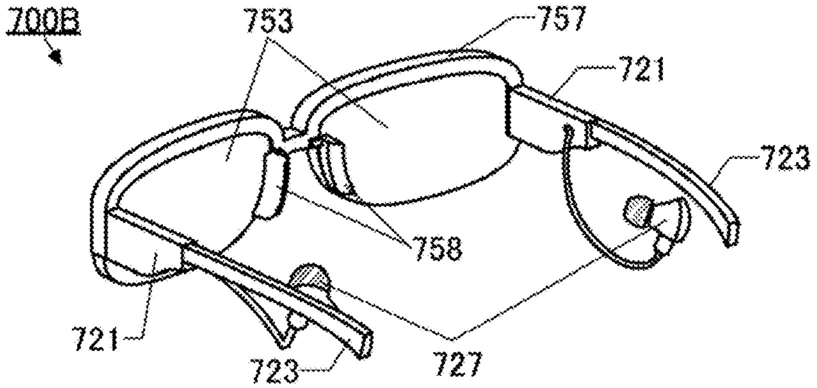

An electronic device 700A illustrated in FIG. 34A and an electronic device 700B illustrated in FIG. 34B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, a highly reliable electronic device is obtained.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 700A and 700B are provided with a battery, so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving element. One or both of an inorganic semiconductor and an organic semiconductor can be used for an active layer of the photoelectric conversion device.

Figure 34C:
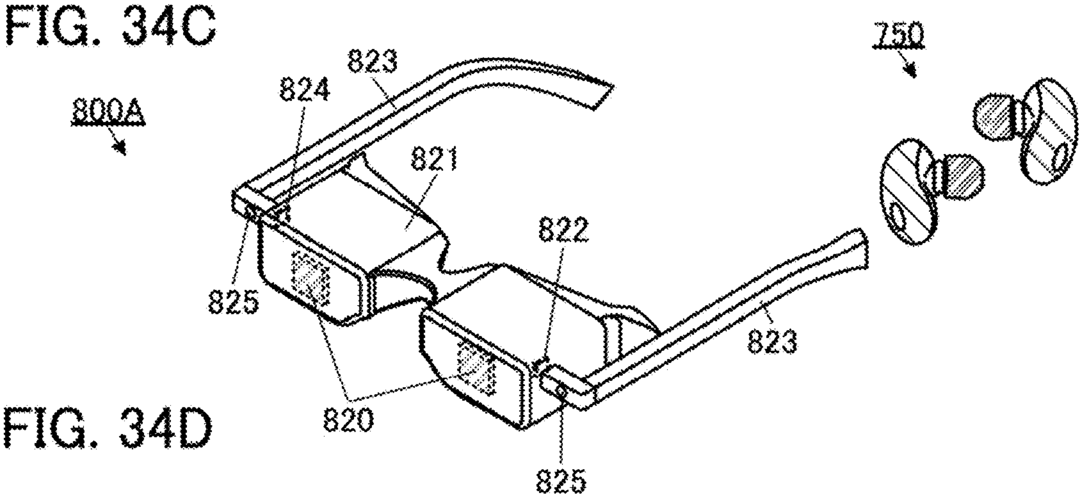
Figure 34D:
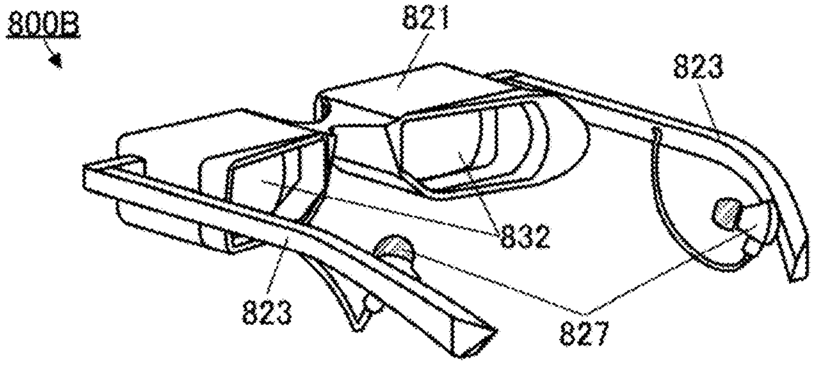

An electronic device 800A illustrated in FIG. 34C and an electronic device 800B illustrated in FIG. 34D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, a highly reliable electronic device is obtained.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 34C, for instance, shows an example where the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

Although an example where the image capturing portions 825 are provided is shown here, a range sensor (hereinafter also referred to as a sensing portion) capable of measuring a distance between the user and an object just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 34A has a function of transmitting information to the earphones 750 with the wireless communication function. As another example, the electronic device 800A in FIG. 34C has a function of transmitting information to the earphones 750 with the wireless communication function.

The electronic device may include an earphone portion. The electronic device 700B in FIG. 34B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 34D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Figure 35A:
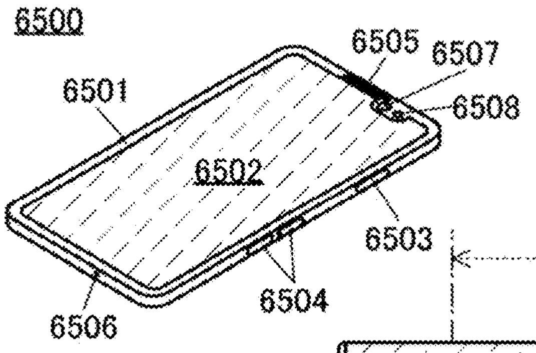
FIGS. 35A to 35F illustrate examples of electronic devices.

An electronic device 6500 illustrated in FIG. 35A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502. Thus, a highly reliable electronic device is obtained.

Figure 35B:
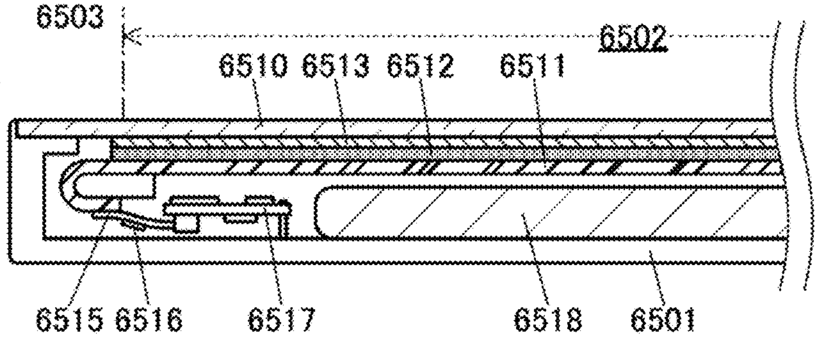

FIG. 35B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display device of one embodiment of the present invention can be used in the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 35C:
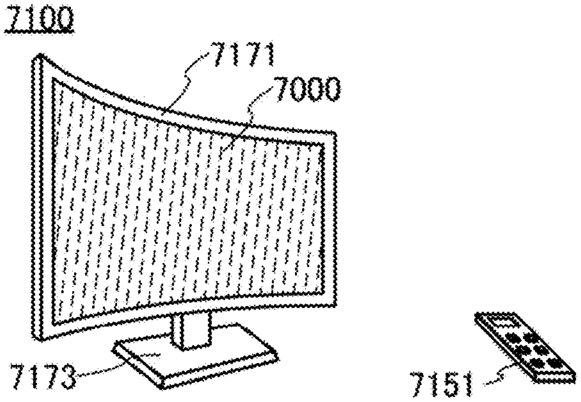

FIG. 35C illustrates an example of a television device. In a television device 7100, a display portion 7000 is incorporated in a housing 7171. Here, the housing 7171 is supported by a stand 7173.

The display device of one embodiment of the present invention can be used in the display portion 7000. Thus, a highly reliable electronic device is obtained.

Operation of the television device 7100 illustrated in FIG. 35C can be performed with an operation switch provided in the housing 7171 and a separate remote controller 7151. Alternatively, the display portion 7000 may include a touch sensor, and the television device 7100 may be operated by touch on the display portion 7000 with a finger or the like. The remote controller 7151 may be provided with a display portion for displaying information output from the remote controller 7151. With operation keys or a touch panel of the remote controller 7151, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 35D:
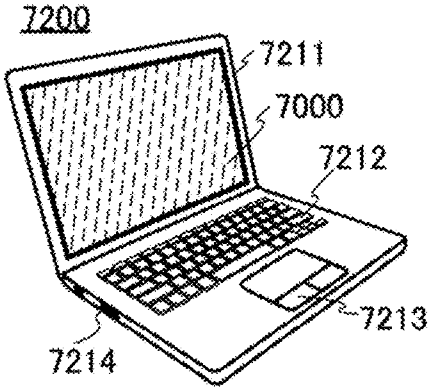

FIG. 35D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000. Thus, a highly reliable electronic device is obtained.

Figure 35E:
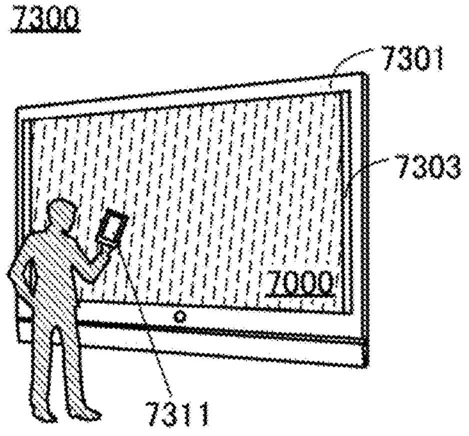
Figure 35F:
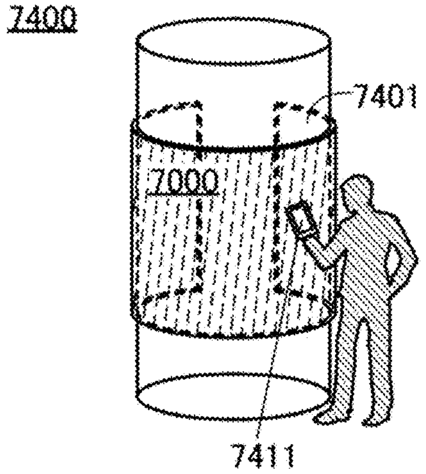

FIGS. 35E and 35F illustrate examples of digital signage.

Digital signage 7300 illustrated in FIG. 35E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 35F shows digital signage 7400 attached to a cylindrical pillar 7401. The digital signage 7400 includes the display portion 7000 provided along a curved surface of the pillar 7401.

In FIGS. 35E and 35F, the display device of one embodiment of the present invention can be used in the display portion 7000. Thus, a highly reliable electronic device is obtained.

A larger area of the display portion 7000 can increase the amount of information that can be provided at a time. The display portion 7000 having a larger area attracts more attention, so that the effectiveness of the advertisement can be increased, for example.

The touch panel is preferably used in the display portion 7000, in which case in addition to display of still or moving images on the display portion 7000, intuitive operation by a user is possible. Moreover, in the case of an application for providing information such as route information or traffic information, usability can be enhanced by intuitive operation.

As illustrated in FIGS. 35E and 35F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 36A to 36G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 36A to 36G have a variety of functions. For example, the electronic devices can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices in FIGS. 36A to 36G are described in detail below.

Figure 36A:
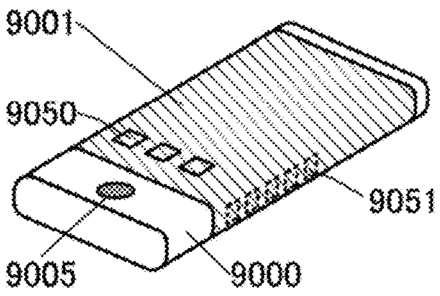
FIGS. 36A to 36G illustrate examples of electronic devices.

FIG. 36A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 36A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 36B:
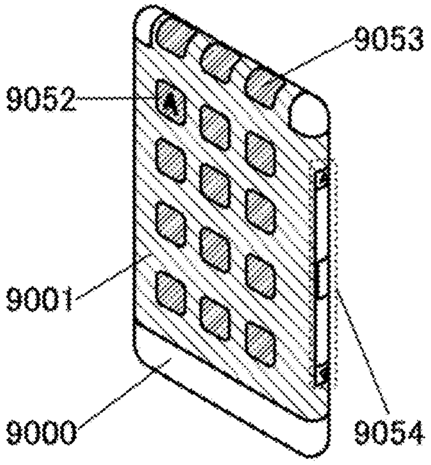

FIG. 36B is a perspective view of a portable information terminal 9172. The portable information terminal 9172 has a function of displaying information on three or more surfaces of the display portion 9001. Here, information 9052, information 9053, and information 9054 are displayed on different surfaces. For example, the user of the portable information terminal 9172 can check the information 9053 displayed such that it can be seen from above the portable information terminal 9172, with the portable information terminal 9172 put in a breast pocket of his/her clothes. Thus, the user can see the display without taking out the portable information terminal 9172 from the pocket and decide whether to answer the call, for example.

Figure 36C:
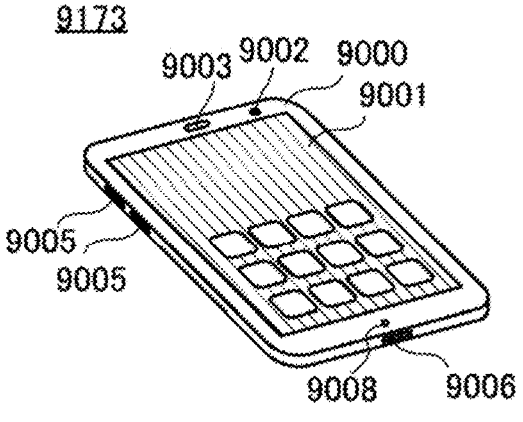

FIG. 36C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 36D:
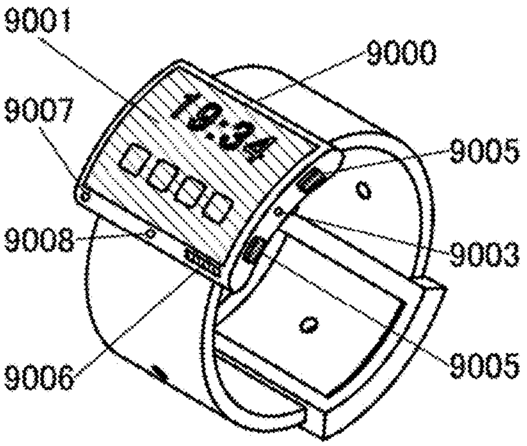

FIG. 36D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 36E:
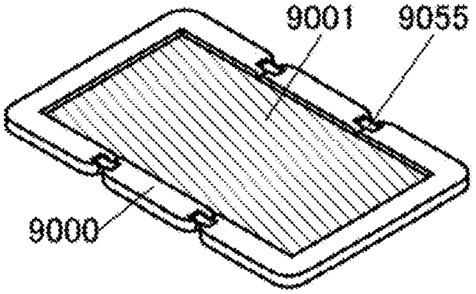
Figure 36F:
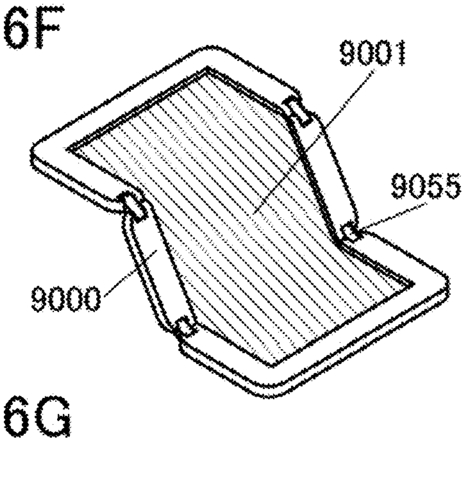
Figure 36G:
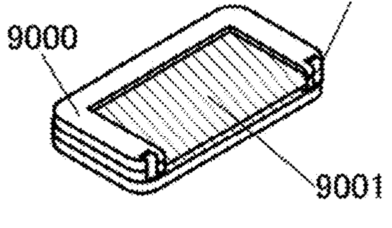

FIGS. 36E to 36G are perspective views of a foldable portable information terminal 9201. FIG. 36E is a perspective view showing the portable information terminal 9201 that is opened. FIG. 36G is a perspective view showing the portable information terminal 9201 that is folded. FIG. 36F is a perspective view showing the portable information terminal 9201 that is shifted from one of the states in FIGS. 36E and 36G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined as appropriate with the other embodiments or an example. In this specification, in the case where a plurality of structure examples are shown in one embodiment, the structure examples can be combined as appropriate.

Example 1

In this example, Display Device A and Display Device B as a reference were fabricated by the method for manufacturing the display device of one embodiment of the present invention described in Embodiment 3.

<Display Device>

Figure 37A:
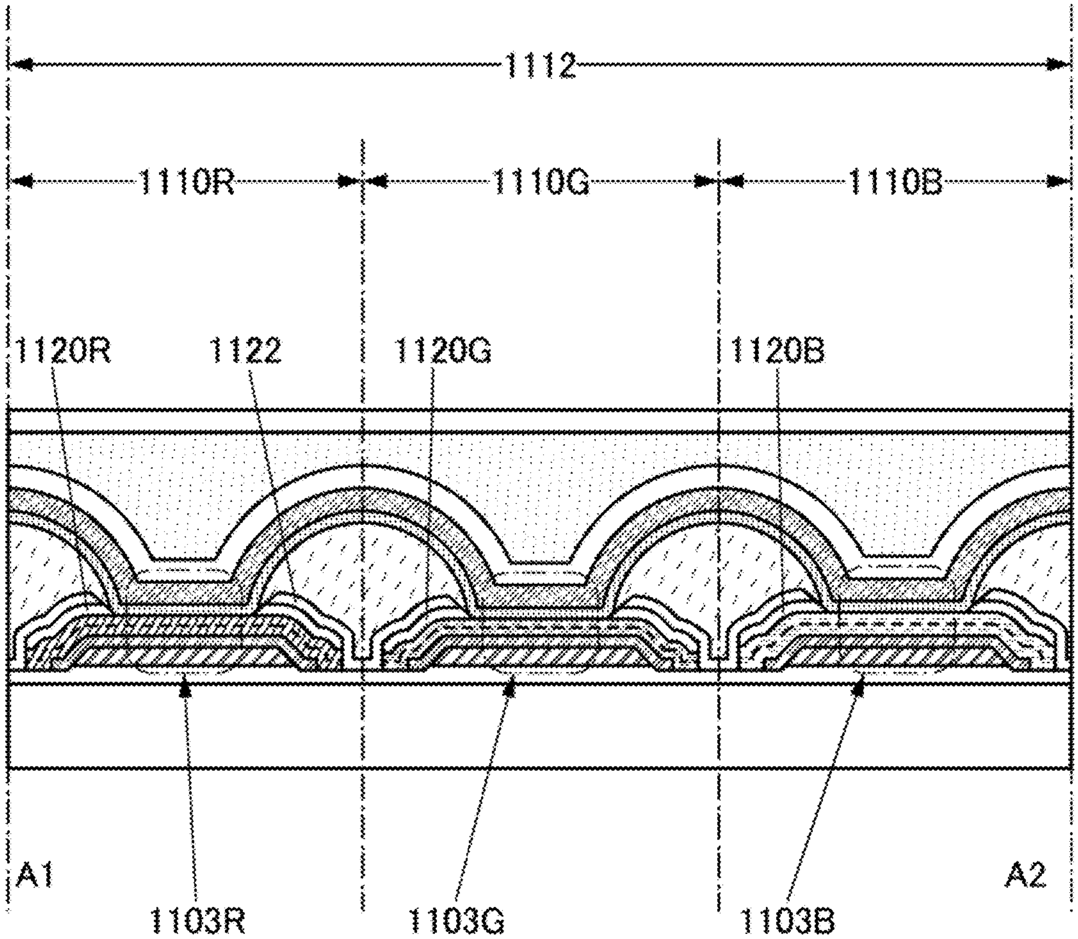
FIGS. 37A and 37B illustrate a display device and a light-emitting device of an example.

Display Device A and Display Device B each included a pixel 1112 formed over a substrate as illustrated in FIG. 37A. The pixel 1112 included a subpixel 1110R, a subpixel 1110G, and a subpixel 1110B. In the pixel 1112, the subpixel 1110R, the subpixel 1110G, and the subpixel 1110B respectively included a light-emitting device 1103R, a light-emitting device 1103G, and a light-emitting device 1103B, each of which is also referred to as a light-emitting device 1103.

Figure 37B:
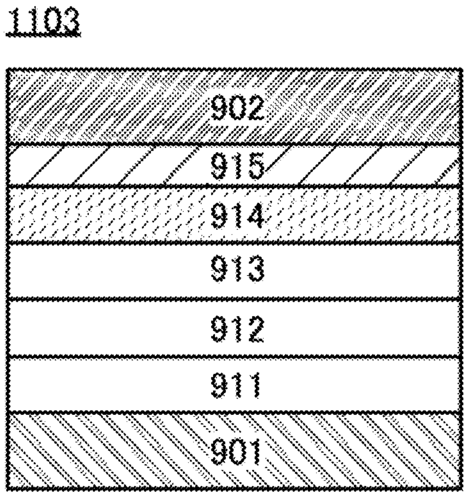

In each light-emitting device, as illustrated in FIG. 37B, a hole-injection layer 911, a hole-transport layer 912, a light-emitting layer 913, an electron-transport layer 914, and an electron-injection layer 915 were stacked in this order over a first electrode 901, and a second electrode 902 was stacked over the electron-injection layer 915.

Between adjacent light-emitting devices, an insulating layer 1120 (an insulating layer 1120R, an insulating layer 1120G, or an insulating layer 1120B) was provided. In a region between adjacent light-emitting devices, a structure body including an insulating layer 1122 was provided.

<Manufacturing Method of Display Device A>

Over the substrate, a conductor was formed as the first electrode 901. Then, the hole-injection layer 911, the hole-transport layer 912, and the light-emitting layer 913 were formed by an evaporation method.

Subsequently, in Display Device A, 2,2'-(1,3-phenylene)bis(9-phenyl-1,10-phenanthroline) (abbreviation: mPPhen2P) was deposited by evaporation over the light-emitting layer 913 to form the electron-transport layer 914.

Then, an aluminum oxide (abbreviation: $AlO_x$) film with a thickness of 30 nm was formed by an ALD method and was then processed to have an island shape within the region of each subpixel. Subsequently, an aluminum oxide film with a thickness of 15 nm was formed by an ALD method to cover the pixel 1112 entirely.

Then, the aluminum oxide films (total thickness: 45 nm) in the regions where the light-emitting devices were to be fabricated were removed. The aluminum oxide films were removed by wet etching using an acidic chemical solution.

Subsequently, over the electron-transport layer 914 exposed in the regions of the light-emitting devices, the electron-injection layer 915 was formed by an evaporation method. Next, aluminum (Al) was deposited by evaporation to a thickness of 200 nm over the electron-injection layer 915 using a resistance-heating method to form the second electrode 902, so that Display Device A was fabricated.

<Manufacturing Method of Display Device B>

Next, a manufacturing method of Display Device B is described.

Display Device B was different from Display Device A in the structure of the electron-transport layer 914. In Display Device B, over the light-emitting layer 913, 2-{3-[3-(N-phenyl-9H-carbazol-3-yl)-9H-carbazol-9-yl]phenyl}dibenzo[f,h]quinoxaline (abbreviation: 2mPCCzPDBq) was deposited by evaporation to a thickness of 15 nm and then, 2,9-di(2-naphthyl)-4,7-diphenyl-1,10-phenanthroline (abbreviation: NBPhen) was deposited by evaporation to a thickness of 20 nm to form the electron-transport layer 914.

The manufacturing method of Display Device B was different from that of Display Device A in the process of removing the aluminum oxide films (total thickness: 45 nm) to be the insulating layers 1120 and 1122. The aluminum oxide films to be the insulating layers 1120 and 1122 were removed by wet etching using an alkaline chemical solution. The other structures of Display Device B were fabricated in a manner similar to that of Display Device A.

The structure and process that were different between Display Devices A and B are shown below.

TABLE 1

| | Display Device A | Display Device B |
|---|---|---|
| Electron-transport layer | mPPhen2P | NBPhen |
| Insulating layer 1120 | $AlO_x$ (30 nm) | |
| Insulating layer 1122 | $AlO_x$ (15 nm) | |
| Chemical solution used for removal of insulating layers 1120 and 1122 | Acidic | Alkaline |

Display Device A and Display Device B were fabricated as described above.

<Observation of Display Device with Optical Microscope>

Figure 38A:
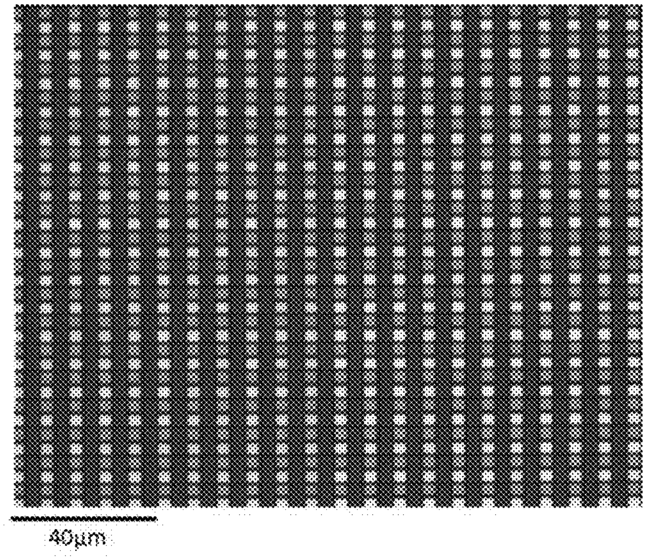
FIGS. 38A and 38B illustrate display devices of an example.
Figure 38B:
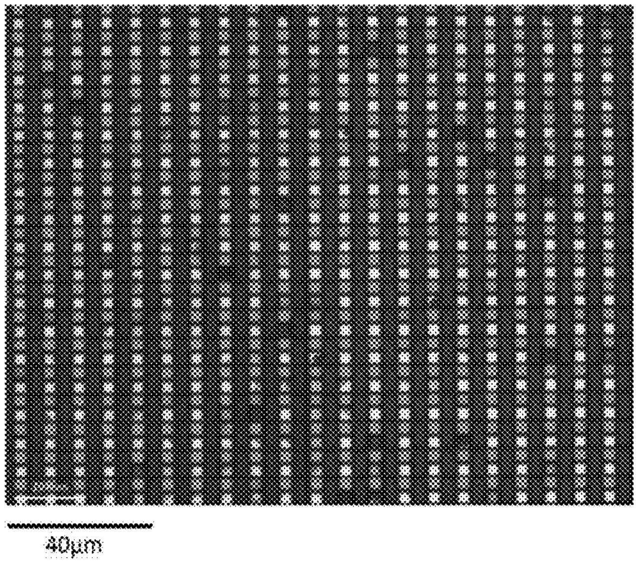

Display Device A and Display Device B described above were observed with an optical microscope. FIGS. 38A and 38B show the results for Display Device A and those for Display Device B, respectively.

No defect was observed in Display Device A. By contrast, defective light emission occurred in the display region of Display Device B.

Figure 39A:
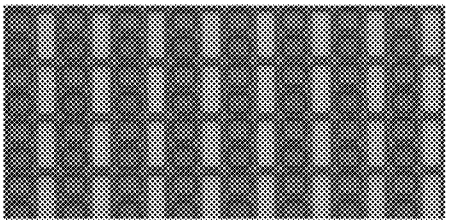
FIGS. 39A to 39H illustrate display devices of an example.
Figure 39B:
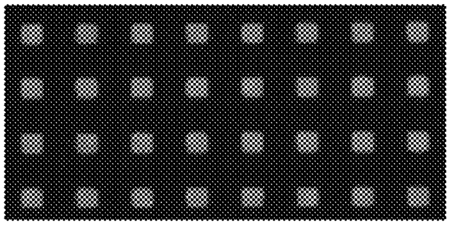
Figure 39C:
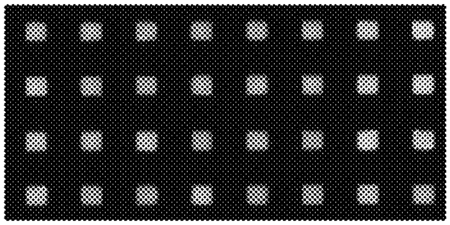
Figure 39D:
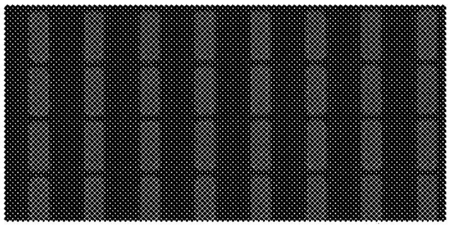
Figure 39E:
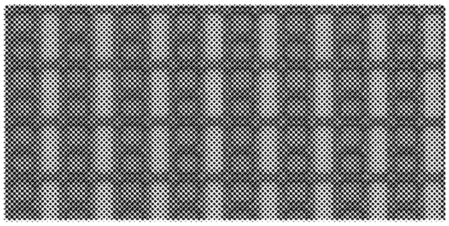
Figure 39F:
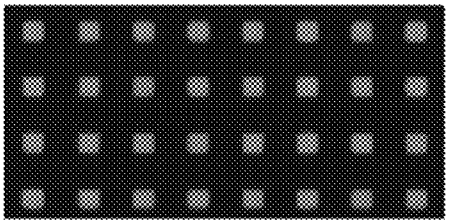
Figure 39G:
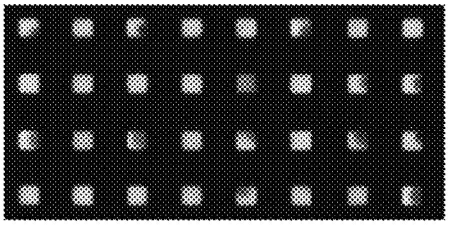
Figure 39H:
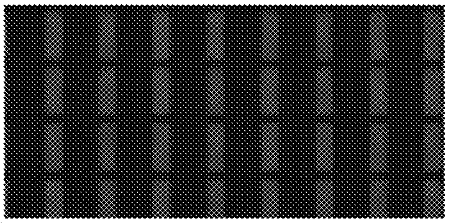

FIGS. 39A and 39E show the subpixels on which light was incident, and FIGS. 39B to 39D and FIGS. 39F to 39H show the subpixels emitting light. Note that FIGS. 39A to 39D show the display device fabricated by the process using the acidic solution, and FIGS. 39E to 39H show the display device fabricated by the process using the alkaline solution.

The results showed that in the display device fabricated by the process using the alkaline solution, a shape defect or defective light emission occurred in the subpixels. By contrast, in the display device fabricated by the process using the acidic solution, no distinctive defect occurred.

Figure 40A:
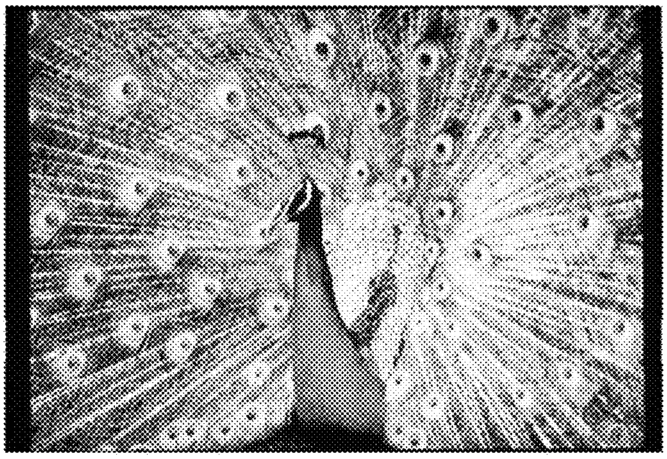
FIGS. 40A and 40B illustrate display devices of an example.
Figure 40B:
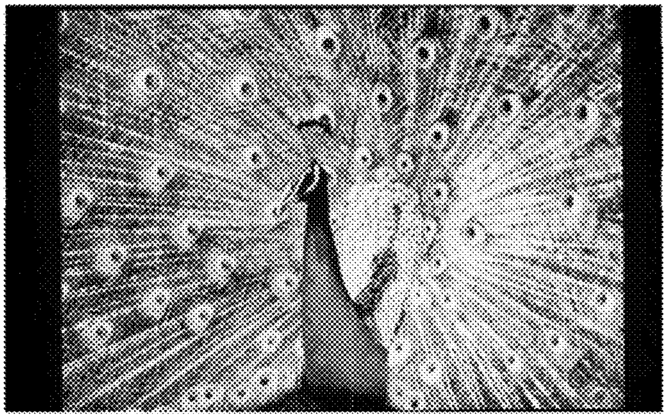

FIGS. 40A and 40B respectively show the screens of Display Device A and Display Device B each displaying an image. Display Device A successfully displayed the image. By contrast, display unevenness, a bright line, and a dark line were generated in Display Device B.

The above showed that employing one embodiment of the present invention makes it possible to provide a favorable display device.

This application is based on Japanese Patent Application Serial No. 2021-206530 filed with Japan Patent Office on Dec. 20, 2021 and Japanese Patent Application Serial No. 2021-206533 filed with Japan Patent Office on Dec. 20, 2021, the entire contents of which are hereby incorporated by reference.

What is claimed is:

1. A method for manufacturing a light-emitting element, the method comprising:

forming a first electrode over an insulating surface;

forming an organic compound layer over the first electrode, the organic compound layer comprising a light-emitting layer and an electron-injection layer over the light-emitting layer;

forming a sacrificial layer over the electron-injection layer;

processing the organic compound layer and the sacrificial layer into an island shape covering the first electrode by a photolithography technique;

removing part of the sacrificial layer having the island shape with an acidic chemical solution to expose a top surface of the electron-injection layer; and forming a second electrode over the electron-injection layer, wherein the electron-injection layer comprises an organic compound having a basic skeleton and an acid dissociation constant pKa of greater than or equal to 1.

2. The method for manufacturing the light-emitting element, according to claim 1, wherein the sacrificial layer comprises aluminum.

3. The method for manufacturing the light-emitting element, according to claim 1, wherein the acidic chemical solution comprises one or more of phosphoric acid, hydrofluoric acid, nitric acid, acetic acid, oxalic acid, and sulfuric acid.

4. The method for manufacturing the light-emitting element, according to claim 1, further comprising forming an organic insulating film over the sacrificial layer having the island shape, wherein the organic insulating film comprises an opening portion overlapping the part of the sacrificial layer having the island shape.

5. A method for manufacturing a light-emitting element, the method comprising:

forming a first electrode over an insulating surface;

forming an organic compound layer over the first electrode, the organic compound layer comprising a light-emitting layer and an electron-injection layer over the light-emitting layer;

forming a sacrificial layer over the electron-injection layer;

forming a resist mask over the sacrificial layer;

processing the sacrificial layer into an island shape using the resist mask;

processing the organic compound layer into an island shape using the sacrificial layer having the island shape as a mask;

removing part of the sacrificial layer having the island shape with an acidic chemical solution to expose a top surface of the electron-injection layer; and forming a second electrode over the electron-injection layer, wherein the electron-injection layer comprises an organic compound having a basic skeleton and an acid dissociation constant pKa of greater than or equal to 1.

6. The method for manufacturing the light-emitting element, according to claim 5, further comprising:

forming an insulating film covering the sacrificial layer having the island shape and a side surface of the organic compound layer having the island shape, wherein in the step of removing part of the sacrificial layer having the island shape, part of the insulating film is removed with the acidic chemical solution.

7. The method for manufacturing the light-emitting element, according to claim 5, wherein the sacrificial layer comprises aluminum.

8. The method for manufacturing the light-emitting element, according to claim 5, wherein the acidic chemical solution comprises one or more of phosphoric acid, hydrofluoric acid, nitric acid, acetic acid, oxalic acid, and sulfuric acid.

9. The method for manufacturing the light-emitting element, according to claim 5, further comprising forming an organic insulating film over the sacrificial layer having the island shape, wherein the organic insulating film comprises an opening portion overlapping the part of the sacrificial layer having the island shape.

10. A method for manufacturing a light-emitting device, the method comprising:

forming a first pixel electrode and a second pixel electrode over an insulating surface;

forming a first organic compound layer over the first pixel electrode and the second pixel electrode, the first organic compound layer comprising a first light-emitting layer and a first electron-injection layer over the first light-emitting layer;

forming a first sacrificial layer over the first electron-injection layer;

processing the first organic compound layer and the first sacrificial layer into an island shape covering the first pixel electrode by a photolithography technique;

forming a second organic compound layer over the first sacrificial layer having the island shape and the second pixel electrode, the second organic compound layer comprising a second light-emitting layer and a second electron-injection layer over the second light-emitting layer;

forming a second sacrificial layer over the second electron-injection layer;

processing the second organic compound layer and the second sacrificial layer into an island shape covering the second pixel electrode by the photolithography;

removing part of the first sacrificial layer having the island shape and part of the second sacrificial layer having the island shape with an acidic chemical solution to expose a top surface of the first electron-injection layer and a top surface of the second electron-injection layer; and forming a common electrode over the first electron-injection layer and the second electron-injection layer, wherein each of the first electron-injection layer and the second electron-injection layer comprises an organic compound having a basic skeleton and an acid dissociation constant pKa of greater than or equal to 1.

11. The method for manufacturing the light-emitting device, according to claim 10, wherein each of the first sacrificial layer and the second sacrificial layer comprises aluminum.

12. The method for manufacturing the light-emitting device, according to claim 10, wherein the acidic chemical solution comprises one or more of phosphoric acid, hydrofluoric acid, nitric acid, acetic acid, oxalic acid, and sulfuric acid.

13. The method for manufacturing the light-emitting device, according to claim 10, further comprising forming an organic insulating film over the first sacrificial layer having the island shape and the second sacrificial layer having the island shape, wherein the organic insulating film comprises an opening portion overlapping the part of the first sacrificial layer having the island shape and the part of the second sacrificial layer having the island shape.

* * * * *